(12) United States Patent
Umezaki

(10) Patent No.: US 10,311,960 B2
(45) Date of Patent: Jun. 4, 2019

(54) SHIFT REGISTER, SEMICONDUCTOR DEVICE, DISPLAY DEVICE, AND ELECTRONIC DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/584,117

(22) Filed: May 2, 2017

(65) Prior Publication Data

US 2017/0309345 A1    Oct. 26, 2017

Related U.S. Application Data

(63) Continuation of application No. 14/800,765, filed on Jul. 16, 2015, now Pat. No. 9,646,714, which is a
(Continued)

(30) Foreign Application Priority Data

Oct. 18, 2005 (JP) ................................. 2005-303771

(51) Int. Cl.
  *G11C 19/18*       (2006.01)
  *G09G 3/36*        (2006.01)
  *G09G 3/3266*      (2016.01)

(52) U.S. Cl.
  CPC ......... *G11C 19/184* (2013.01); *G09G 3/3648* (2013.01); *G09G 3/3677* (2013.01);
(Continued)

(58) Field of Classification Search
  CPC ...... G11C 19/18; G11C 19/184; G02F 1/1368
  See application file for complete search history.

(56) References Cited

U.S. PATENT DOCUMENTS 3,506,851 A    4/1970   Polkinghorn et al.
3,774,055 A    11/1973  Bapat
(Continued)

FOREIGN PATENT DOCUMENTS

EP    0535569 A    4/1993
EP    0651395 A    5/1995
(Continued)

OTHER PUBLICATIONS

Oh.J et al., "15.2: 2.0 Inch A-Si:H TFT-LCD With Low Noise Integrated Gate Driver", SID Digest '05 : SID International Symposium Digest of Technical Papers, May 24, 2005, vol. 36, pp. 942-945.
(Continued)

*Primary Examiner* — Hai L Nguyen
(74) *Attorney, Agent, or Firm* — Fish & Richardson P.C.

(57) ABSTRACT

The invention provides a semiconductor device and a shift register, in which low noise is caused in a non-selection period and a transistor is not always on. First to fourth transistors are provided. One of a source and a drain of the first transistor is connected to a first wire, the other of the source and the drain thereof is connected to a gate electrode of the second transistor, and a gate electrode thereof is connected to a fifth wire. One of a source and a drain of the second transistor is connected to a third wire and the other of the source and the drain thereof is connected to a sixth wire. One of a source and a drain of the third transistor is connected to a second wire, the other of the source and the drain thereof is connected to the gate electrode of the second transistor, and a gate electrode thereof is connected to a fourth wire. One of a source and a drain of the fourth
(Continued)

transistor is connected to the second wire, the other of the source and the drain thereof is connected to the sixth wire, and a gate electrode thereof is connected to the fourth wire.

20 Claims, 63 Drawing Sheets

Related U.S. Application Data continuation of application No. 11/539,429, filed on Oct. 6, 2006, now Pat. No. 9,153,341.

(52) U.S. Cl.
CPC ... *G09G 3/3266* (2013.01); *G09G 2300/0426* (2013.01); *G09G 2310/0267* (2013.01); *G09G 2310/0275* (2013.01); *G09G 2310/0286* (2013.01); *G09G 2310/0289* (2013.01); *G09G 2320/02* (2013.01); *G09G 2320/043* (2013.01); *G09G 2330/021* (2013.01); *G09G 2330/023* (2013.01)

(56) References Cited

U.S. PATENT DOCUMENTS

| | | | |
|---|---|---|---|
| 3,898,479 A | 8/1975 | Proebsting | |
| 4,090,096 A | 5/1978 | Nagami | |
| 4,390,803 A | 6/1983 | Koike | |
| 4,412,139 A | 10/1983 | Horninger | |
| 4,633,105 A | 12/1986 | Tsujimoto | |
| 4,804,870 A | 2/1989 | Mahmud | |
| 4,959,697 A | 9/1990 | Shier et al. | |
| 5,170,155 A | 12/1992 | Plus et al. | |
| 5,222,082 A | 6/1993 | Plus | |
| 5,410,583 A | 4/1995 | Weisbrod et al. | |
| 5,434,899 A | 7/1995 | Huq et al. | |
| 5,467,038 A | 11/1995 | Motley et al. | |
| 5,514,994 A | 5/1996 | Sawada | |
| 5,517,543 A | 5/1996 | Schleupen et al. | |
| 5,548,143 A | 8/1996 | Lee | |
| 5,604,704 A | 2/1997 | Atsumo | |
| 5,643,826 A | 7/1997 | Ohtani et al. | |
| 5,694,061 A | 12/1997 | Morosawa et al. | |
| 5,767,697 A | 6/1998 | Ueno et al. | |
| 5,812,284 A | 9/1998 | Mizutani et al. | |
| 5,870,071 A | 2/1999 | Kawahata | |
| 5,889,291 A | 3/1999 | Koyama et al. | |
| 5,949,271 A | 9/1999 | Fujikura | |
| 5,949,398 A | 9/1999 | Kim | |
| 5,952,991 A | 9/1999 | Akiyama | |
| 6,040,810 A | 3/2000 | Nishimura | |
| 6,049,228 A | 4/2000 | Moon | |
| 6,052,426 A | 4/2000 | Maurice | |
| 6,091,393 A | 7/2000 | Park | |
| 6,144,466 A | 11/2000 | Mizutani et al. | |
| 6,236,239 B1 | 5/2001 | Kogushi | |
| 6,295,046 B1 | 9/2001 | Hebiguchi | |
| 6,300,928 B1 | 10/2001 | Kim | |
| 6,339,631 B1 | 1/2002 | Yeo et al. | |
| 6,384,804 B1 | 5/2002 | Dodabalapur et al. | |
| 6,392,625 B1 | 5/2002 | Sato et al. | |
| 6,501,098 B2 | 12/2002 | Yamazaki | |
| 6,522,323 B1 | 2/2003 | Sasaki et al. | |
| 6,542,138 B1 | 4/2003 | Shannon et al. | |
| 6,563,174 B2 | 5/2003 | Kawasaki et al. | |
| 6,621,886 B2 | 9/2003 | Kawahata | |
| 6,674,245 B2 | 1/2004 | Ko et al. | |
| 6,686,899 B2 | 2/2004 | Miyazawa et al. | |
| 6,753,654 B2 | 6/2004 | Koyama | |
| 6,774,419 B2 | 8/2004 | Kimura | |
| 6,781,805 B1 | 8/2004 | Urakawa | |
| 6,789,514 B2 | 9/2004 | Suh et al. | |
| 6,813,332 B2 | 11/2004 | Nagao et al. | |
| 6,845,140 B2 | 1/2005 | Moon et al. | |
| 6,876,353 B2 | 4/2005 | Morosawa et al. | |
| 6,891,356 B2 | 5/2005 | Kimura et al. | |
| 6,919,874 B1 | 7/2005 | Maurice | |
| 6,922,217 B2 | 7/2005 | Kim | |
| 6,928,135 B2 | 8/2005 | Sasaki et al. | |
| 6,928,136 B2 | 8/2005 | Nagao et al. | |
| 7,023,410 B2 | 4/2006 | Lee et al. | |
| 7,038,653 B2 | 5/2006 | Moon | |
| 7,042,430 B2 | 5/2006 | Isami et al. | |
| 7,046,240 B2 | 5/2006 | Kimura | |
| 7,057,598 B2 | 6/2006 | Azami et al. | |
| 7,068,076 B2 | 6/2006 | Azami | |
| 7,098,882 B2 | 8/2006 | Kitani et al. | |
| 7,115,902 B1 | 10/2006 | Yamazaki | |
| 7,119,767 B1 | 10/2006 | Komiya et al. | |
| 7,202,863 B2 | 4/2007 | Kimura et al. | |
| 7,203,264 B2 | 4/2007 | Lo et al. | |
| 7,317,779 B2 | 1/2008 | Moon et al. | |
| 7,365,713 B2 | 4/2008 | Kimura | |
| 7,379,148 B2 | 5/2008 | Kim | |
| 7,382,347 B2 | 6/2008 | Sasaki et al. | |
| 7,403,038 B2 | 7/2008 | Azami | |
| 7,405,716 B2 | 7/2008 | Lee et al. | |
| 7,456,810 B2 | 11/2008 | Kimura | |
| 7,460,099 B2 | 12/2008 | Kubota et al. | |
| 7,486,269 B2 | 2/2009 | Moon | |
| 7,586,478 B2 | 9/2009 | Azami et al. | |
| 7,629,612 B2 | 12/2009 | Kimura | |
| 7,646,841 B2 | 1/2010 | Moon et al. | |
| 7,696,974 B2 | 4/2010 | Moon et al. | |
| 7,710,384 B2 | 5/2010 | Azami et al. | |
| 7,738,014 B2 | 6/2010 | Kwak et al. | |
| 7,786,985 B2 | 8/2010 | Kimura et al. | |
| 7,859,507 B2 | 12/2010 | Jang et al. | |
| 7,859,510 B2 | 12/2010 | Umezaki | |
| 8,044,906 B2 | 10/2011 | Kimura et al. | |
| 8,059,078 B2 | 11/2011 | Kimura et al. | |
| 8,102,340 B2 | 1/2012 | Lee et al. | |
| 8,212,257 B2 | 7/2012 | Kimura | |
| 8,264,445 B2 | 9/2012 | Azami et al. | |
| 8,456,396 B2 | 6/2013 | Umezaki | |
| 8,462,100 B2 | 6/2013 | Umezaki | |
| 8,526,567 B2 * | 9/2013 | Koyama | G09G 3/3266 377/64 |
| 8,564,523 B2 | 10/2013 | Moon | |
| 8,586,991 B2 | 11/2013 | Kimura | |
| 8,605,027 B2 | 12/2013 | Pak et al. | |
| 8,619,207 B2 | 12/2013 | Kim | |
| 8,643,586 B2 | 2/2014 | Umezaki | |
| 8,872,751 B2 * | 10/2014 | Kimura | G09G 3/20 345/100 |
| 9,001,020 B2 * | 4/2015 | Jinta | G09G 3/3233 345/100 |
| 9,036,767 B2 * | 5/2015 | Umezaki | G11C 19/184 377/64 |
| 9,153,341 B2 | 10/2015 | Umezaki | |
| 9,646,714 B2 * | 5/2017 | Umezaki | G09G 3/3677 |
| 2001/0002703 A1 | 6/2001 | Koyama | |
| 2001/0024186 A1 | 9/2001 | Kane et al. | |
| 2001/0045565 A1 | 11/2001 | Yamazaki | |
| 2001/0054999 A1 | 12/2001 | Azami | |
| 2002/0011973 A1 | 1/2002 | Komiya | |
| 2002/0044111 A1 | 4/2002 | Yamazaki et al. | |
| 2002/0044208 A1 | 4/2002 | Yamazaki et al. | |
| 2002/0056838 A1 | 5/2002 | Ogawa | |
| 2002/0097212 A1 | 7/2002 | Miyazawa et al. | |
| 2002/0097829 A1 | 7/2002 | Kawahata | |
| 2002/0118159 A1 | 8/2002 | Azami | |
| 2002/0158666 A1 | 10/2002 | Azami et al. | |
| 2002/0167026 A1 | 11/2002 | Azami et al. | |
| 2002/0190326 A1 | 12/2002 | Nagao et al. | |
| 2002/0196212 A1 | 12/2002 | Nishitoba et al. | |
| 2003/0011584 A1 | 1/2003 | Azami et al. | |
| 2003/0020520 A1 | 1/2003 | Miyake et al. | |
| 2003/0034806 A1 | 2/2003 | Azami | |
| 2003/0052324 A1 | 3/2003 | Kimura | |
| 2003/0052848 A1 | 3/2003 | Yamaguchi | |
| 2003/0052854 A1 | 3/2003 | Juang | |
| 2003/0103022 A1 | 6/2003 | Noguchi et al. | |

(56) References Cited

U.S. PATENT DOCUMENTS

| | | |
|---|---|---|
| 2003/0111677 A1 | 6/2003 | Miyake |
| 2003/0128200 A1 | 7/2003 | Yumoto |
| 2003/0179166 A1 | 9/2003 | Li |
| 2003/0214465 A1 | 11/2003 | Kimura |
| 2003/0231152 A1 | 12/2003 | Shin |
| 2004/0046729 A1 | 3/2004 | Moon |
| 2004/0080474 A1 | 4/2004 | Kimura |
| 2004/0165692 A1 | 8/2004 | Moon et al. |
| 2004/0239600 A1 | 12/2004 | Lin |
| 2004/0239608 A1 | 12/2004 | Chung |
| 2004/0257388 A1 | 12/2004 | Tobita |
| 2005/0008114 A1 | 1/2005 | Moon |
| 2005/0057556 A1 | 3/2005 | Kubota et al. |
| 2005/0156858 A1 | 7/2005 | Ahn et al. |
| 2005/0162354 A1 | 7/2005 | Osame et al. |
| 2005/0184946 A1 | 8/2005 | Pyoun et al. |
| 2005/0220263 A1 | 10/2005 | Moon |
| 2006/0001637 A1 | 1/2006 | Pak et al. |
| 2006/0001638 A1 | 1/2006 | Jeon et al. |
| 2006/0007216 A1 | 1/2006 | Sato et al. |
| 2006/0077198 A1 | 4/2006 | Okumura et al. |
| 2006/0145998 A1 | 7/2006 | Cho et al. |
| 2006/0256046 A1 | 11/2006 | Kimura |
| 2006/0291610 A1 | 12/2006 | Lo et al. |
| 2007/0217564 A1 | 9/2007 | Tobita |
| 2007/0242018 A1 | 10/2007 | Park |
| 2008/0062071 A1 | 3/2008 | Jeong |
| 2008/0062097 A1 | 3/2008 | Jeong et al. |
| 2010/0073348 A1 | 3/2010 | Azami et al. |
| 2010/0134234 A1 | 6/2010 | Liao et al. |
| 2010/0158188 A1 | 6/2010 | Lee et al. |
| 2011/0007044 A1 | 1/2011 | Kimura et al. |
| 2012/0163528 A1 | 6/2012 | Jang et al. |
| 2014/0106515 A1 | 4/2014 | Kim |

FOREIGN PATENT DOCUMENTS

| | | |
|---|---|---|
| EP | 0722223 A | 7/1996 |
| EP | 1063630 A | 12/2000 |
| EP | 1087441 A | 3/2001 |
| EP | 1139326 A | 10/2001 |
| EP | 1209748 A | 5/2002 |
| EP | 1445862 A | 8/2004 |
| EP | 1895545 A | 3/2008 |
| JP | 55-156427 A | 12/1980 |
| JP | 59-016424 A | 1/1984 |
| JP | 60-140924 A | 7/1985 |
| JP | 63-204815 A | 8/1988 |
| JP | 64-024504 A | 1/1989 |
| JP | 02-198216 A | 8/1990 |
| JP | 03-163911 A | 7/1991 |
| JP | 03-165171 A | 7/1991 |
| JP | 05-166393 A | 7/1993 |
| JP | 05-267636 A | 10/1993 |
| JP | 05-303354 A | 11/1993 |
| JP | 06-098081 A | 4/1994 |
| JP | 07-182891 A | 7/1995 |
| JP | 08-050790 A | 2/1996 |
| JP | 08-083486 A | 3/1996 |
| JP | 08-195670 A | 7/1996 |
| JP | 09-033887 A | 2/1997 |
| JP | 09-186312 A | 7/1997 |
| JP | 09-246936 A | 9/1997 |
| JP | 10-500243 | 1/1998 |
| JP | 10-301087 A | 11/1998 |
| JP | 11-086586 A | 3/1999 |
| JP | 2000-029436 A | 1/2000 |
| JP | 2000-049585 A | 2/2000 |
| JP | 2000-106617 A | 4/2000 |
| JP | 2000-112444 A | 4/2000 |
| JP | 3092506 | 7/2000 |
| JP | 2001-005426 A | 1/2001 |
| JP | 2001-109394 A | 4/2001 |
| JP | 2001-133431 A | 5/2001 |
| JP | 2001-160615 A | 6/2001 |
| JP | 2002-133890 A | 5/2002 |
| JP | 2002-175695 A | 6/2002 |
| JP | 2002-176162 A | 6/2002 |
| JP | 2002-197885 A | 7/2002 |
| JP | 3330746 | 7/2002 |
| JP | 2002-251164 A | 9/2002 |
| JP | 2002-328643 A | 11/2002 |
| JP | 2002-335153 A | 11/2002 |
| JP | 2003-016794 A | 1/2003 |
| JP | 2003-032096 A | 1/2003 |
| JP | 2003-043976 A | 2/2003 |
| JP | 2003-050405 A | 2/2003 |
| JP | 2003-058097 A | 2/2003 |
| JP | 2003-086808 A | 3/2003 |
| JP | 2003-101406 A | 4/2003 |
| JP | 2003-163586 A | 6/2003 |
| JP | 2003-216126 A | 7/2003 |
| JP | 2003-249848 A | 9/2003 |
| JP | 2004-103226 A | 4/2004 |
| JP | 2004-222256 A | 8/2004 |
| JP | 2004-246358 A | 9/2004 |
| JP | 2005-010282 A | 1/2005 |
| JP | 2005-050502 A | 2/2005 |
| JP | 2005-522734 | 7/2005 |
| JP | 2005-234580 A | 9/2005 |
| JP | 2005-251348 A | 9/2005 |
| JP | 2005-527856 | 9/2005 |
| JP | 2006-024350 A | 1/2006 |
| JP | 2008-083692 A | 4/2008 |
| JP | 2012-083770 A | 4/2012 |
| JP | 2013-041660 A | 2/2013 |
| JP | 2013-050717 A | 3/2013 |
| JP | 5779628 | 9/2015 |
| KR | 2001-0030516 A | 4/2001 |
| KR | 2002-0086298 A | 11/2002 |
| KR | 2007-0037793 A | 4/2007 |
| WO | WO-2003/087921 | 10/2003 |
| WO | WO-2003/100511 | 12/2003 |

OTHER PUBLICATIONS

Han.H et al., "15.3: Reliable Integrated A-Si Select Line Driver for 2.2-In. QVGA TFT-LCD", SID Digest '05 : SID International Symposium Digest of Technical Papers, 2005, vol. 36, pp. 946-949.

Stewart.R et al., "8.4: Circuit Design for a-Si AMLCDs with Integrated Drivers", SID Digest '95 : SID International Symposium Digest of Technical Papers, 1995, vol. 26, pp. 89-92.

Jeon.J et al., "3.2: Integrated a-Si Gate Driver Circuit for TFT-LCD Panel", SID Digest '04 : SID International Symposium Digest of Technical Papers, 2004, vol. 35, pp. 10-13.

Korean Office Action (Application No. 2011-0109738) dated Dec. 11, 2012.

Korean Office Action (Application No. 2006-0101455) dated Dec. 11, 2012.

Maurice.F et al., "High Resolution Projection Valve With the Amorphous Silicon AMLCD Technology", Proceedings of SPIE—Conference on Projection Displays IV, 1998, vol. 3296, pp. 92-99.

* cited by examiner

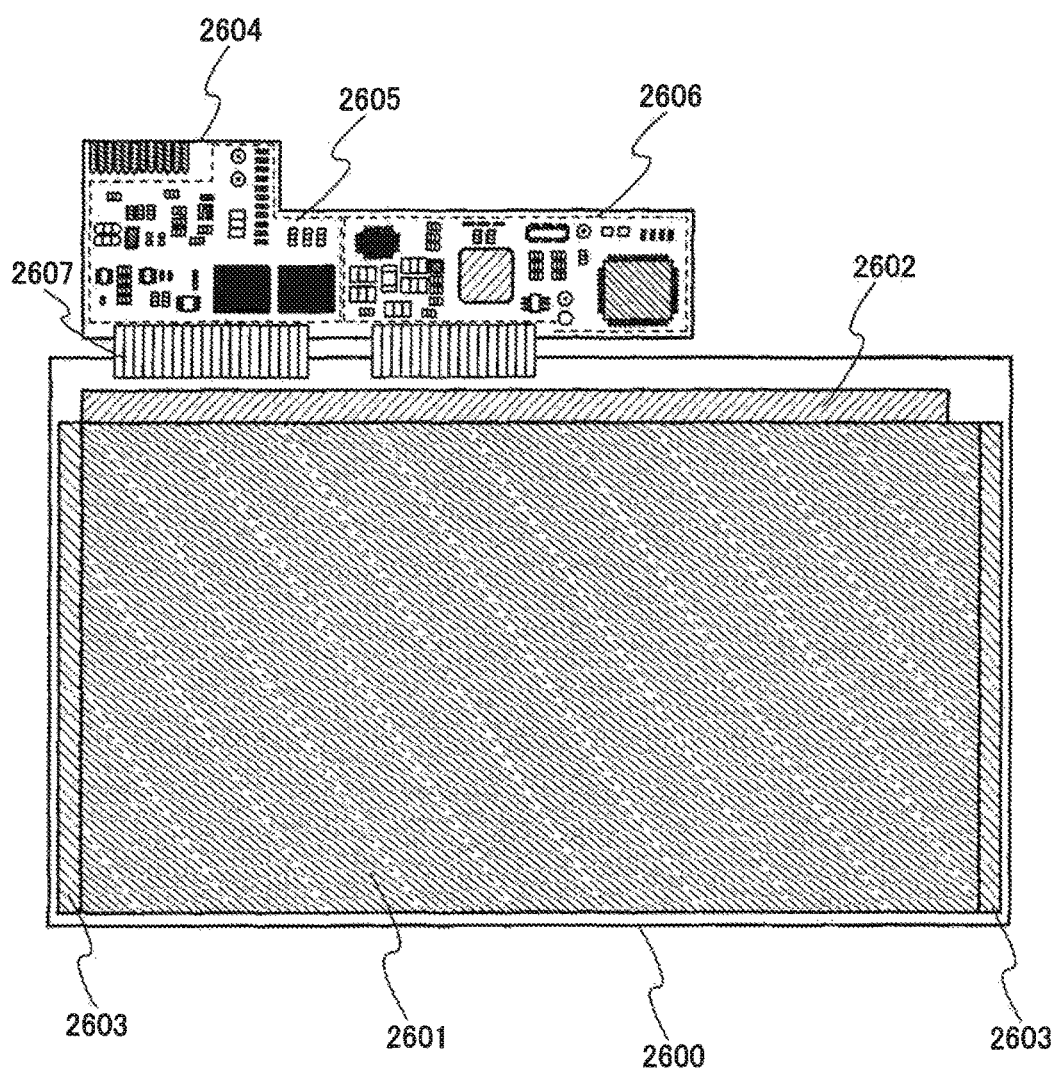

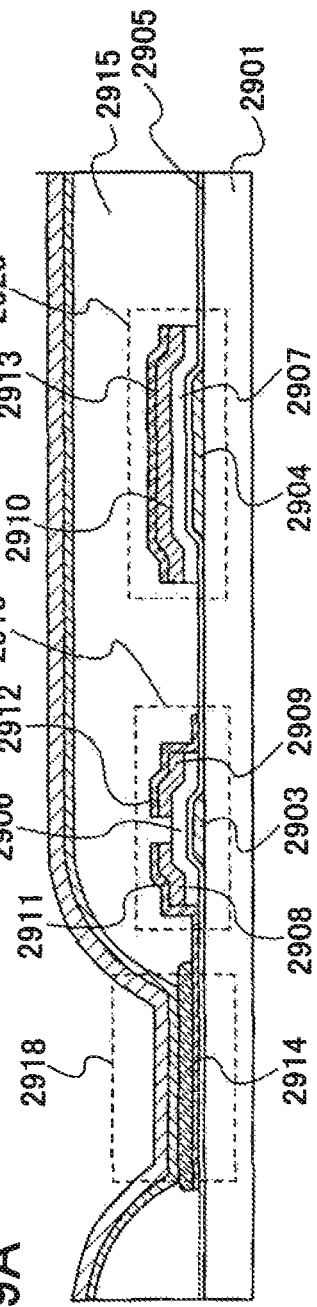
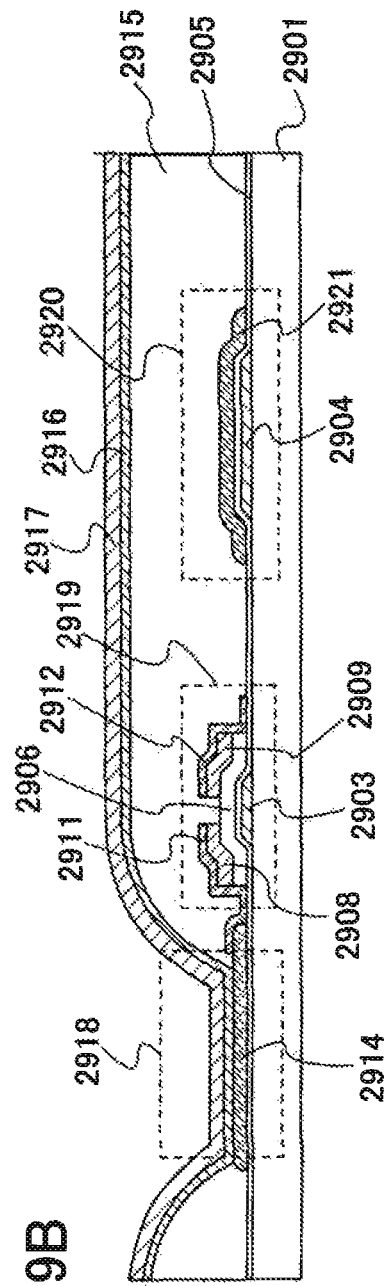

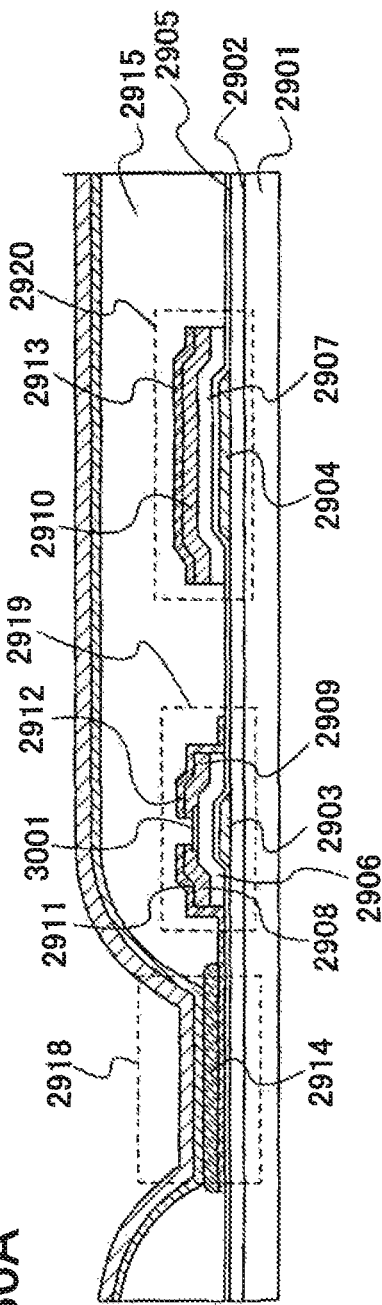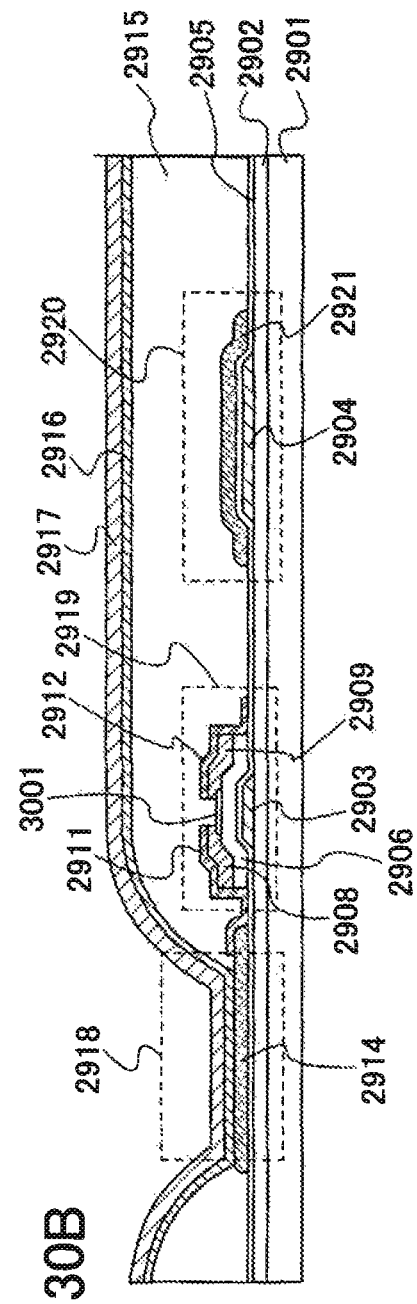
FIG. 30A
FIG. 30B

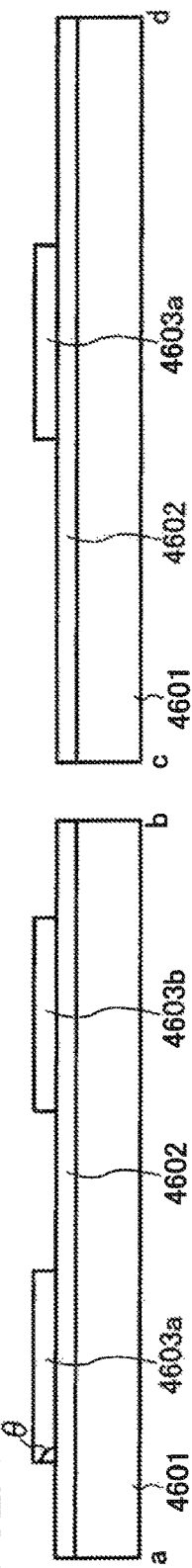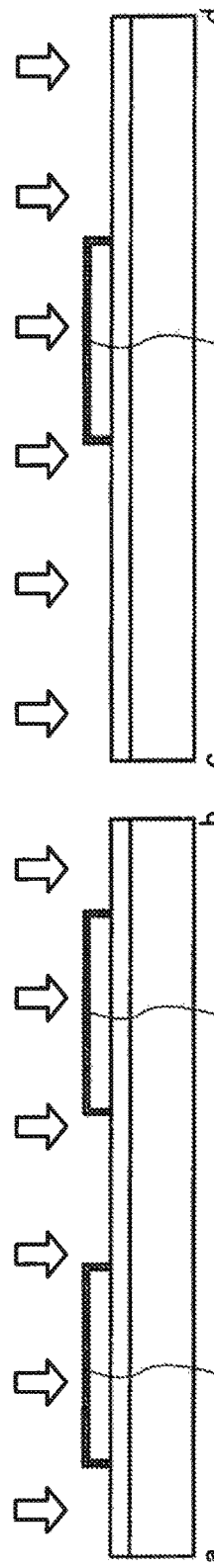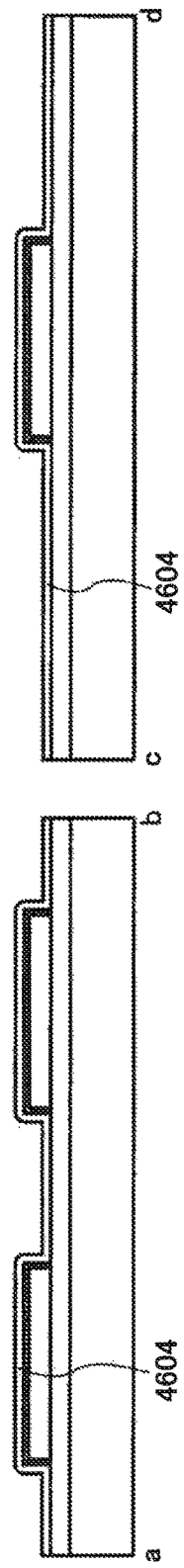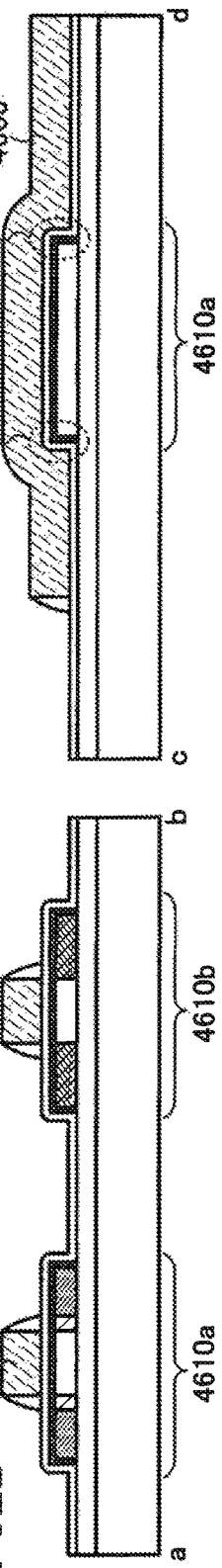

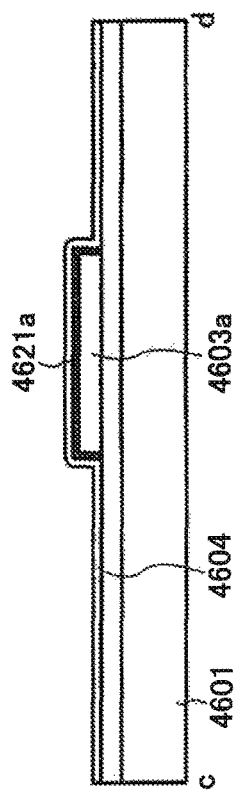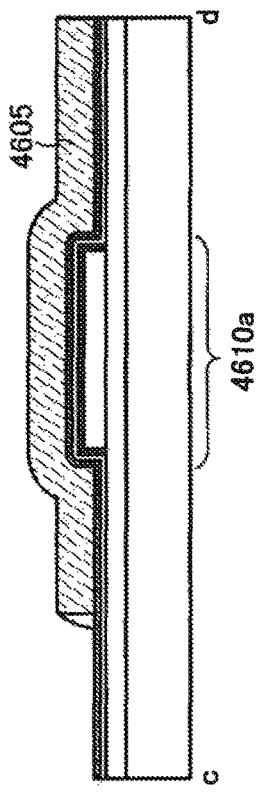
FIG. 33A
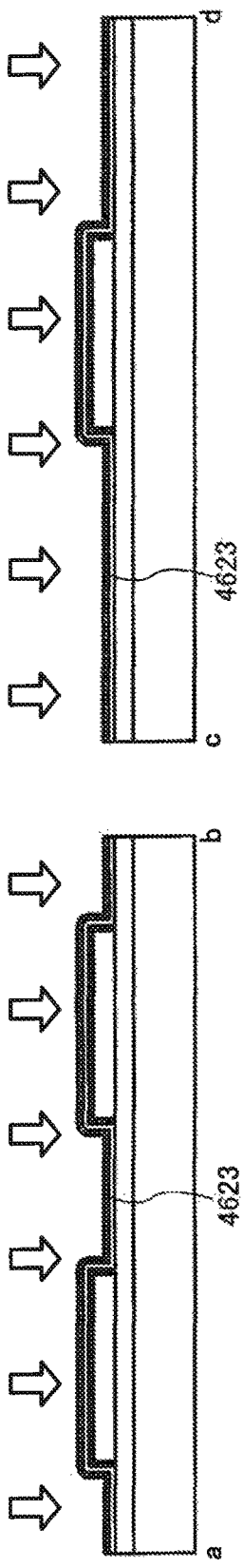
FIG. 33B
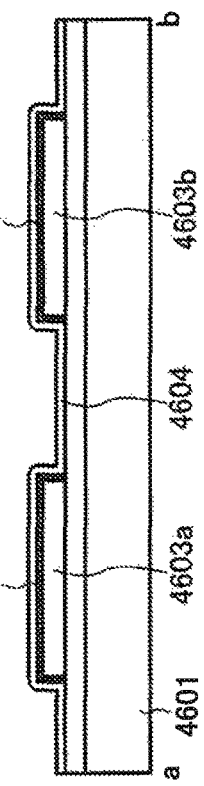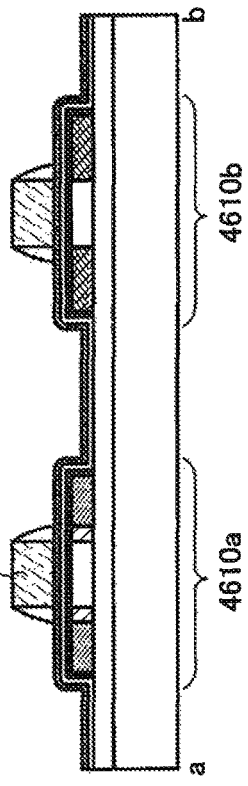
FIG. 33C

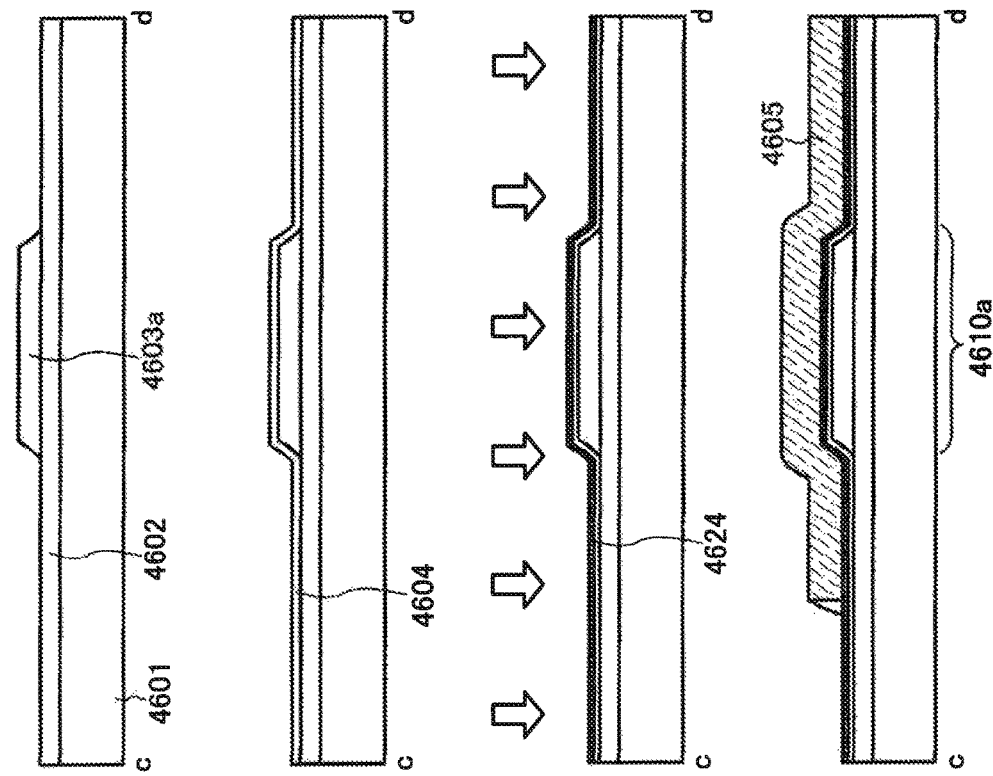

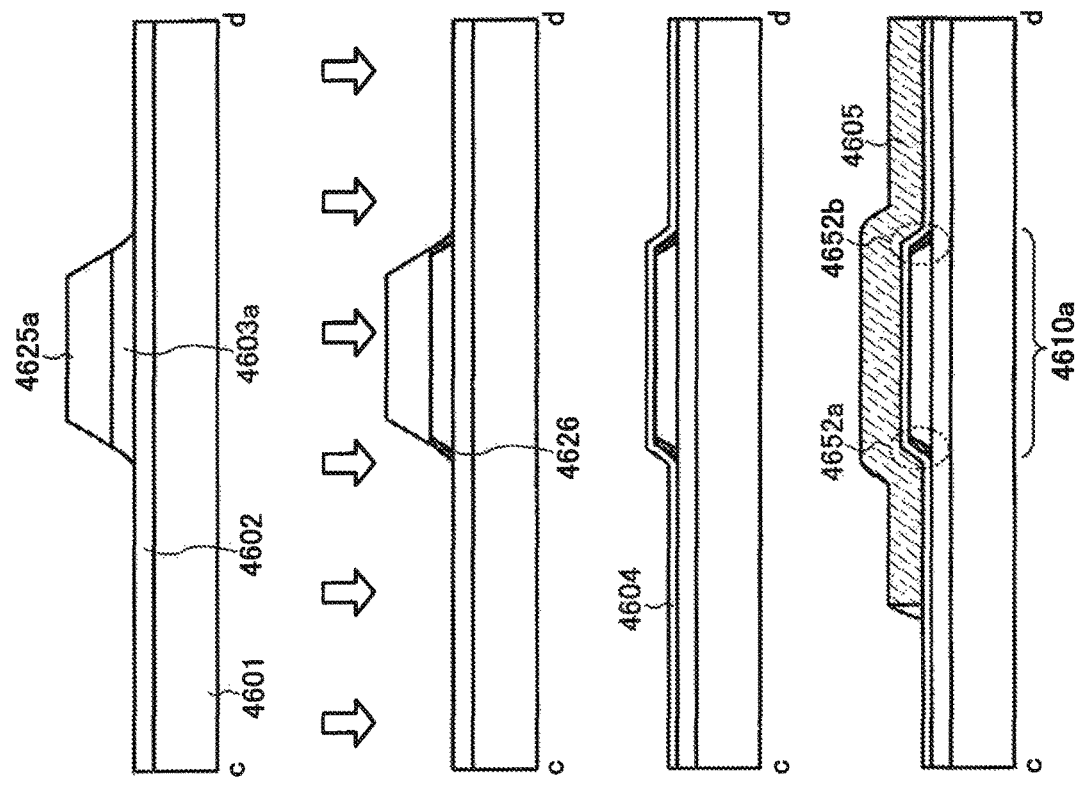

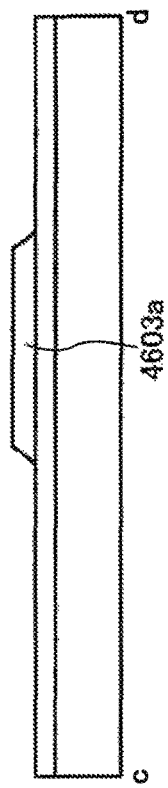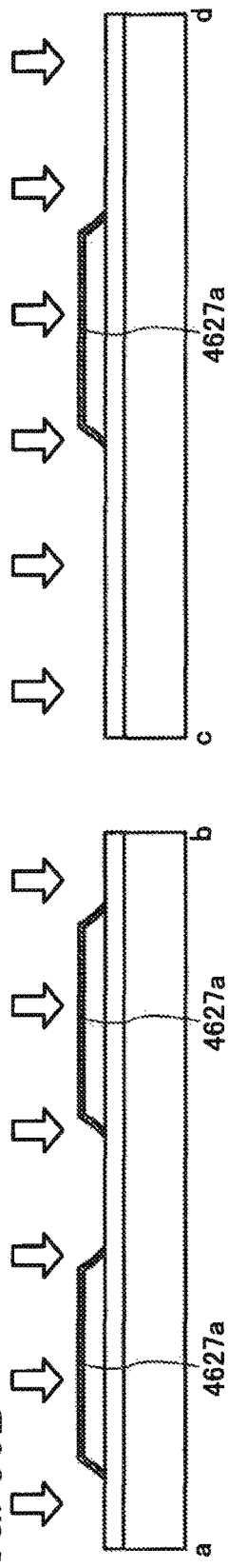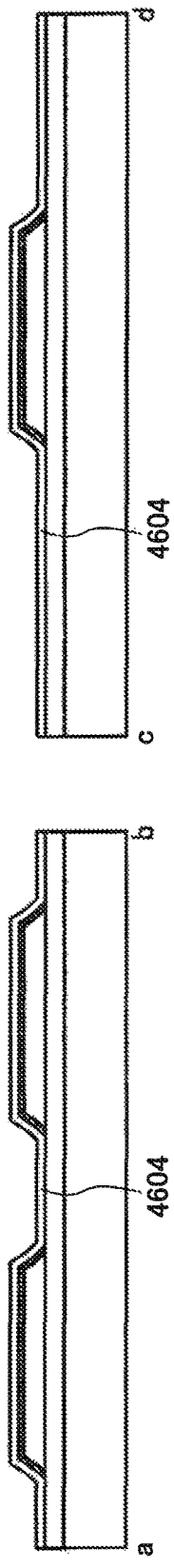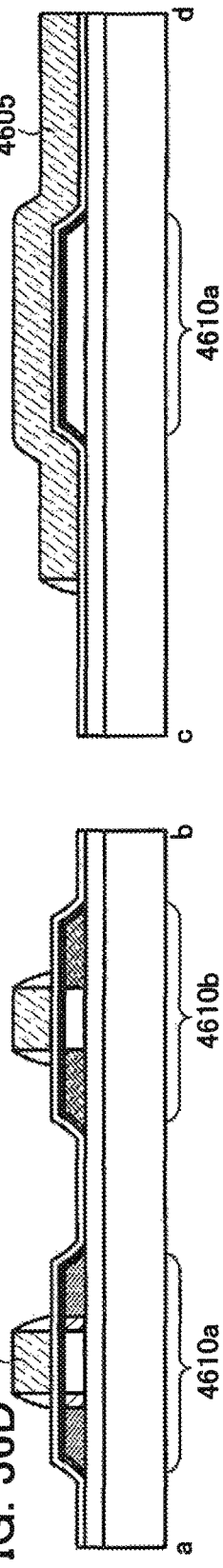

FIG. 45
 semiconductor layer
 gate wiring layer
 metal wiring layer
 contact hole
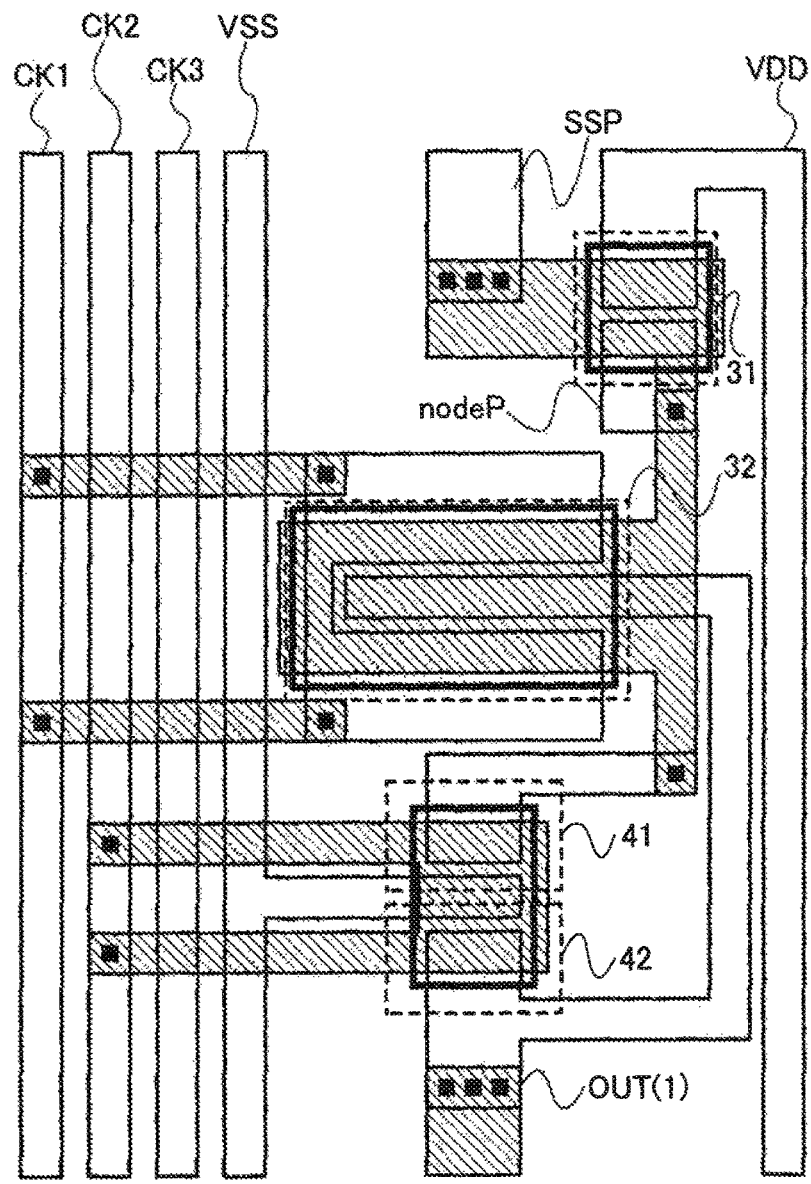

FIG. 47

| | n-th row | | | (n + 1)th row | | | |
|---|---|---|---|---|---|---|---|
| control signal line R | ⎍ | | | ⎍ | | | ⎍ |
| control signal line G | | ⎍ | | | ⎍ | | |
| control signal line B | | | ⎍ | | | ⎍ | |

| | | | | | | |
|---|---|---|---|---|---|---|
| SW1R | ON | OFF | | ON | OFF | | ON |
| SW1G | OFF | ON | OFF | | ON | OFF | |
| SW1B | OFF | | ON | OFF | | ON | OFF |
| S1(RBGB) | S1-Rn | S1-Gn | S1-Bn | S1-Rn+1 | S1-Gn+1 | S1-Bn+1 | S1-Rn+2 |
| S2(RBGB) | S2-Rn | S2-Gn | S2-Bn | S2-Rn+1 | S2-Gn+1 | S2-Bn+1 | S2-Rn+2 |
| S1-R | | S1-Rn | | | S1-Rn+1 | | S1-Rn+2 |
| S1-G | S1-Gn-1 | | S1-Gn | | | S1-Gn+1 | |
| S1-B | S1-Bn-1 | | S1-Bn | | | S1-Bn+1 | |
| S2-R | | S2-Rn | | | S2-Rn+1 | | S2-Rn+2 |
| S2-G | S2-Gn-1 | | S2-Gn | | | S2-Gn+1 | |
| S2-B | S2-Bn-1 | | S2-Bn | | | S2-Bn+1 | |

SHIFT REGISTER, SEMICONDUCTOR DEVICE, DISPLAY DEVICE, AND ELECTRONIC DEVICE

CROSS-REFERENCE TO RELATED APPLICATIONS

This application is a continuation of U.S. application Ser. No. 14/800,765, filed Jul. 16, 2015, now U.S. Pat. No. 9,646,714, issued May 9, 2017, which is a continuation of U.S. application Ser. No. 11/539,429, filed Oct. 6, 2006, now U.S. Pat. No. 9,153,341, which claims the benefit of foreign a priority application filed in Japan as Serial No. 2005-303771 on Oct. 18, 2005, all of which are incorporated by reference.

BACKGROUND OF THE INVENTION

1. Field of the Invention

The invention relates to a semiconductor device. In particular, the invention relates to a shift register constituted using a transistor. Further, the invention relates to a display device provided with the semiconductor device, and to an electronic device provided with the display device.

It is to be noted that the semiconductor device here refers to a general device which can function by utilizing semiconductor characteristics.

2. Description of the Related Art

In recent years, a display device such as a liquid crystal display device and a light emitting device is actively developed in accordance with the increase of large display devices such as a liquid crystal display. In particular, a technique to integrate a driver circuit (hereinafter referred to as an internal circuit) including a pixel circuit, a shift register circuit, and the like over an insulator by using transistors formed of an amorphous semiconductor is actively developed, which largely contributes to the reduction in power consumption and cost. The internal circuit formed over the insulator is connected to a controller IC or the like (hereinafter referred to as an external circuit) through an FPC or the like and controlled in its operation.

For example, a shift register circuit which is constituted using only n-channel transistors formed of an amorphous semiconductor is suggested (for example, see Patent Document 1). However, the circuit disclosed in Patent Document 1 has a problem in that a noise is generated in a non-selection period since an output of the shift register circuit becomes a floating state in the non-selection period.

In order to solve this problem, a shift register circuit in which an output thereof does not become a floating state in a non-selection period is suggested (for example, see Non-Patent Document 1).

Patent Document 1

Japanese Translation of PCT International Application No. Hei 10-500243

Non-Patent Document 1

2.0 inch a-Si:H TFT-LCD with Low Noise Integrated Gate Driver SID'05 Digest p. 942-945

SUMMARY OF THE INVENTION

In Non-Patent Document 1, a power source voltage is outputted by always turning on a transistor which is connected in series between an output and a power source in a non-selection period. Further, since as most of an operation period of the shift register circuit corresponds to the non-selection period, the transistor which is always on in the non-selection period is on in most of the operation period of the shift register circuit.

However, it is known that a transistor formed of an amorphous semiconductor deteriorates in characteristics in accordance with an applied voltage and time it is on. In particular, a shift in a threshold voltage is notable, in which a threshold voltage rises. It is one of the major causes of malfunction of the shift register circuit.

In view of such a problem, the invention provides a semiconductor device and a shift register circuit in which a noise is low in the non-selection period and a transistor is not always turned on, and provides a display device provided with such a semiconductor device and an electronic device provided with the display device.

A semiconductor device of the invention includes a first transistor, a second transistor, a third transistor, and a fourth transistor. A first signal is inputted to a gate of the first transistor, a predetermined potential is inputted to one of a source and a drain thereof, and the other of the source and the drain is connected to a gate of a second transistor and one of a source and a drain of a third transistor. A second signal is inputted to one of a source and a drain of the second transistor, the other of the source and the drain is connected to an output terminal. A third signal is inputted to a gate of the third transistor and a predetermined potential is inputted to the other of the source and the drain thereof. A third signal is inputted to a gate of the fourth transistor, a predetermined potential is inputted to one of a source and a drain thereof, and the other of the source and the drain is connected to an output terminal.

A shift register of the invention is a shift register constituted by a plurality of stages. Each stage of the shift register includes a first transistor which is turned on when an H-level output signal is inputted from a preceding stage and outputs a potential as high as the H-level, a second transistor which is turned on by an output of the first transistor and in which one of a source and a drain is connected to a first signal line and the other of the source and the drain is connected to the first transistor of a next stage, a first unit for outputting an L-level potential to a gate of the second transistor at regular intervals in a period when an L-level output signal is inputted from a preceding stage and the second transistor is not in a boot strap operation, and a second unit for outputting an L-level potential to the other of the source and the drain of the second transistor at regular intervals in a period when an L-level output signal is inputted from a preceding stage and the second transistor is not in a boot strap operation.

In a shift register of the invention with the aforementioned configuration, the first unit and the second unit are controlled by a second signal line.

In a shift register of the invention with the aforementioned configuration, the first unit includes a third transistor having a function to output an L-level potential when a second signal line is at H-level and output no potential when the second signal line is at L-level.

In a shift register of the invention with the aforementioned configuration, the second unit includes a fourth transistor having a function to output an L-level potential when the second signal line is at H-level and output nothing when the second signal line is at L-level.

In a shift register of the invention with the aforementioned configuration, the first unit is controlled by an output signal from a next stage and the second unit is controlled by the second signal line.

In a shift register of the invention with the aforementioned configuration, the first unit includes a fifth transistor having a function to output an L-level potential when a next stage outputs an H-level potential and output nothing when the next stage outputs an L-level potential.

In a shift register of the invention with the aforementioned configuration, the second unit includes a sixth transistor having a function to output an L-level potential when the second signal line is at H-level and output nothing when the second signal is at L-level.

In a shift register of the invention with the aforementioned configuration, the first unit is controlled by the second signal line and the second unit is controlled by the second signal line and a third signal line.

In a shift register of the invention with the aforementioned configuration, the first unit includes a seventh transistor having a function to output an L-level potential when a next stage outputs an H-level potential and output nothing when the next stage outputs an L-level potential.

In a shift register of the invention with the aforementioned configuration, the second unit includes a shift register including an eighth transistor having a function to output an L-level potential when the second signal line is at H-level and output nothing when the second signal line is at L-level, and a shift register including a ninth transistor having a function to output an L-level potential when the third signal line is at H-level and output nothing when the third signal line is at L-level.

A shift register of the invention is a shift register constituted by a plurality of stages. Each stage of the shift register circuit includes a first transistor which is turned on when an H-level output signal is inputted from a preceding stage and outputs a potential as high as the H-level, a second transistor which is turned on by an output of the first transistor and in which one of a source and a drain is connected to a first signal line and the other of the source and the drain is connected to the first transistor of a next stage, a first unit for outputting an L-level potential to a gate of the second transistor at regular intervals in a period when an L-level output signal is inputted from a preceding stage and the second transistor is not in a boot strap operation, and a third unit for outputting an L-level potential to the other of the source and the drain of the second transistor in a period when the second transistor is not in a boot strap operation.

In a shift register of the invention with the aforementioned configuration, the first unit is controlled by the second signal line and the third unit is controlled by a first signal, a second signal, a third signal, and an inverted signal of a gate potential of the second transistor.

In a shift register of the invention with the aforementioned configuration, the first unit includes a tenth transistor having a function to output an L-level potential when the second signal line is at H-level and output nothing when the second signal line is at L-level.

In a shift register of the invention with the aforementioned configuration, the second unit includes an eleventh transistor having a function to output an L-level potential when the second signal line is at H-level and output nothing when the second signal line is at L-level, a twelfth transistor having a function to output an L-level potential when the third signal line is at H-level and output nothing when the second signal line is at L-level, a thirteenth transistor having a function to output a signal of the first signal line when the inverted signal of the gate potential of the second transistor is at H-level and output nothing when the inverted signal of the gate potential of the second transistor is at L-level, and a fourteenth transistor having a function to output an L-level potential when the thirteenth transistor outputs a signal of the first signal line and the first signal line is at H-level, and output nothing when the first signal line is at L-level and the thirteenth transistor outputs nothing.

A shift register of the invention with the aforementioned configuration includes a fifteenth transistor having a function to output an L-level potential when the gate potential of the second transistor is at H-level and output nothing when the gate potential of the second transistor is at L-level, and an element with a resistive component, having one terminal connected to an H-level potential and the other terminal connected to an output of the fourteenth transistor.

In a shift register of the invention with the aforementioned configuration, the element with a resistive component is a sixteenth transistor which is diode-connected.

A shift register of the invention is a shift register constituted by a plurality of stages. Each stage of the shift register includes a first transistor which is turned on when an H-level output signal is inputted from a preceding stage and outputs a potential as high as the H-level, a second transistor which is turned on by the output of the first transistor, in which one of a source and a drain is connected to a first signal line and the other of the source and the drain is connected to a first transistor of a next stage, a fourth unit which outputs an L-level potential to a gate of the second transistor in a period when an L-level output signal is inputted from a preceding stage and the second transistor is not in a boot strap operation, and a third unit which outputs an L-level potential to the other of the source and the drain of the second transistor in a period when the second transistor is not in a boot strap operation.

In a shift register of the invention with the aforementioned configuration, the third unit and the fourth unit are controlled by the first signal line, the second signal line, the third signal line, and an inverted signal of a gate potential of the second transistor.

In a shift register of the invention with the aforementioned configuration, the second unit includes a seventeenth transistor having a function to output an L-level potential when the second signal line is at H-level and output nothing when the second signal line is at L-level, an eighteenth transistor having a function to output a signal of the first signal line when an inverted signal of a gate potential of the second transistor is at H-level and output nothing when the inverted signal of the gate potential of the second transistor is at L-level, a nineteenth transistor having a function to output a signal of the third signal line when the inverted signal of the gate potential of the second transistor is at H-level and output nothing when the inverted signal of the gate potential of the second transistor is at L-level, a twentieth transistor having a function to output an L-level when the eighteenth transistor outputs a signal of the first signal line and the first signal line is at H-level and output nothing when the first signal line is at L-level and the eighteenth transistor outputs nothing, and a twenty-first transistor having a function to output an L-level potential when the eighteenth transistor outputs a signal of the first signal line and the first signal line is at H-level and output nothing when the first signal line is at L-level and the nineteenth transistor outputs nothing.

In a shift register of the invention with the aforementioned configuration, a capacitor is connected between the gate and the other of the source and drain of the second transistor.

In a shift register of the invention with the aforementioned configuration, an output signal of a preceding stage is inputted to the gate of the first transistor, one of the source and the drain of the first transistor is connected to the power source line at H-level, and the other of the source and the drain of the first transistor is connected to the gate of the second transistor.

In a shift register of the invention with the aforementioned configuration, an output signal of a preceding stage is inputted to the gate of the first transistor, one of the source and drain of the first transistor is connected to a power supply line at H-level, and the other of the source and the drain of the first transistor is connected to the gate of the second transistor.

In a shift register of the invention with the aforementioned configuration, an output signal of a preceding stage is inputted to the gate and one of the source and the drain of the first transistor, and the other of the source and the drain of the first transistor is connected to the gate of the second transistor.

In a shift register of the invention with the aforementioned configuration, a control signal transmitted through the first signal line to be inputted to an N-th stage (N is a natural number), a control signal transmitted through the first signal line to be inputted to an (N+1)th stage, and a control signal transmitted through the first signal line to be inputted to an (N+2)th stage have a phase difference of 120°.

In a shift register of the invention with the aforementioned configuration, a control signal transmitted through the second signal line to be inputted to the N-th stage (N is a natural number), a control signal transmitted through the second signal line to be inputted to the (N+1)th stage, and a control signal transmitted through the second signal line to be inputted to the (N+2)th stage have a phase difference of 120°.

In a shift register of the invention with the aforementioned configuration, a control signal transmitted through the third signal line to be inputted to the N-the stage (N is a natural number), a control signal transmitted through the third signal line to be inputted to the (N+1)th stage, and a control signal transmitted through the third signal line to be inputted to the (N+2)th stage have a phase difference of 120°.

In a shift register of the invention with the aforementioned configuration, each of the first to twenty-first transistors is formed of an amorphous semiconductor.

In a shift register of the invention with the aforementioned configuration, at least one power source line is provided between the first, second, and third signal lines, and the first to twenty-first transistors.

In a shift register of the invention with the aforementioned configuration, a channel region of the second transistor has a U-shape.

In a shift register of the invention with the aforementioned configuration, an output signal of the shift register is outputted through a level shifter circuit.

In a shift register of the invention with the aforementioned configuration, a control signal inputted to the shift register is inputted through a level shifter circuit.

In a shift register of the invention with the aforementioned configuration, a plurality of switching elements are sequentially turned on by an output signal of the shift register.

In a display device of the invention with the aforementioned configuration, a pixel, a gate driver constituted by using a shift register, a gate signal line which transmits an output signal of the gate driver to the pixel, and a source signal line which transmits a video signal to the pixel are provided. An output signal of the gate driver selects the pixel, thereby the video signal is written to the selected pixel.

Further, the pixel includes at least a liquid crystal element of which transmittance changes depending on an applied voltage and a twenty-second transistor which operates as a switching element which is controlled to be turned on or off by a gate signal line. A video signal is written to the liquid crystal element through the twenty-second transistor which is turned on.

In a display device of the invention, a gate driver is constituted by a transistor formed of an amorphous semiconductor. The gate drivers are arranged to be opposed to each other and select the same gate signal line at the same timing.

In the invention, in a non-selection period, by sequentially turning on a plurality of transistors which output a power source voltage, there is no transistor which is always on. Therefore, characteristics deterioration of the transistor can be suppressed. Further, a noise can be reduced when a fixed voltage is outputted at all times or for a certain period in a non-selection period.

BRIEF DESCRIPTION OF DRAWINGS

FIGS. 10A and 10B are diagrams showing Embodiment Mode 3.
FIG. 26 is a diagram showing Embodiment 7.
FIGS. 29A and 29B are views showing Embodiment 2.
FIGS. 30A and 30B are views showing Embodiment 2.
FIGS. 32A to 32D are diagrams showing Embodiment 3.
FIGS. 33A to 33C are diagrams showing Embodiment 3.
FIGS. 34A to 34D are diagrams showing Embodiment 3.
FIGS. 35A to 35D are diagrams showing Embodiment 3.
FIGS. 36A to 36D are diagrams showing Embodiment 3.

FIG. 45 is a diagram showing Embodiment Mode 7.
FIG. 47 is a diagram showing Embodiment Mode 6.

DETAILED DESCRIPTION OF THE INVENTION

Although the present invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Embodiment Mode 1

In this embodiment mode, description is made with reference to FIGS. 1 to 4 of a configuration and an operation of a shift register circuit in which a noise is reduced by outputting VSS at regular intervals for reducing a noise of an output voltage in a non-selection period.

Figure 1:
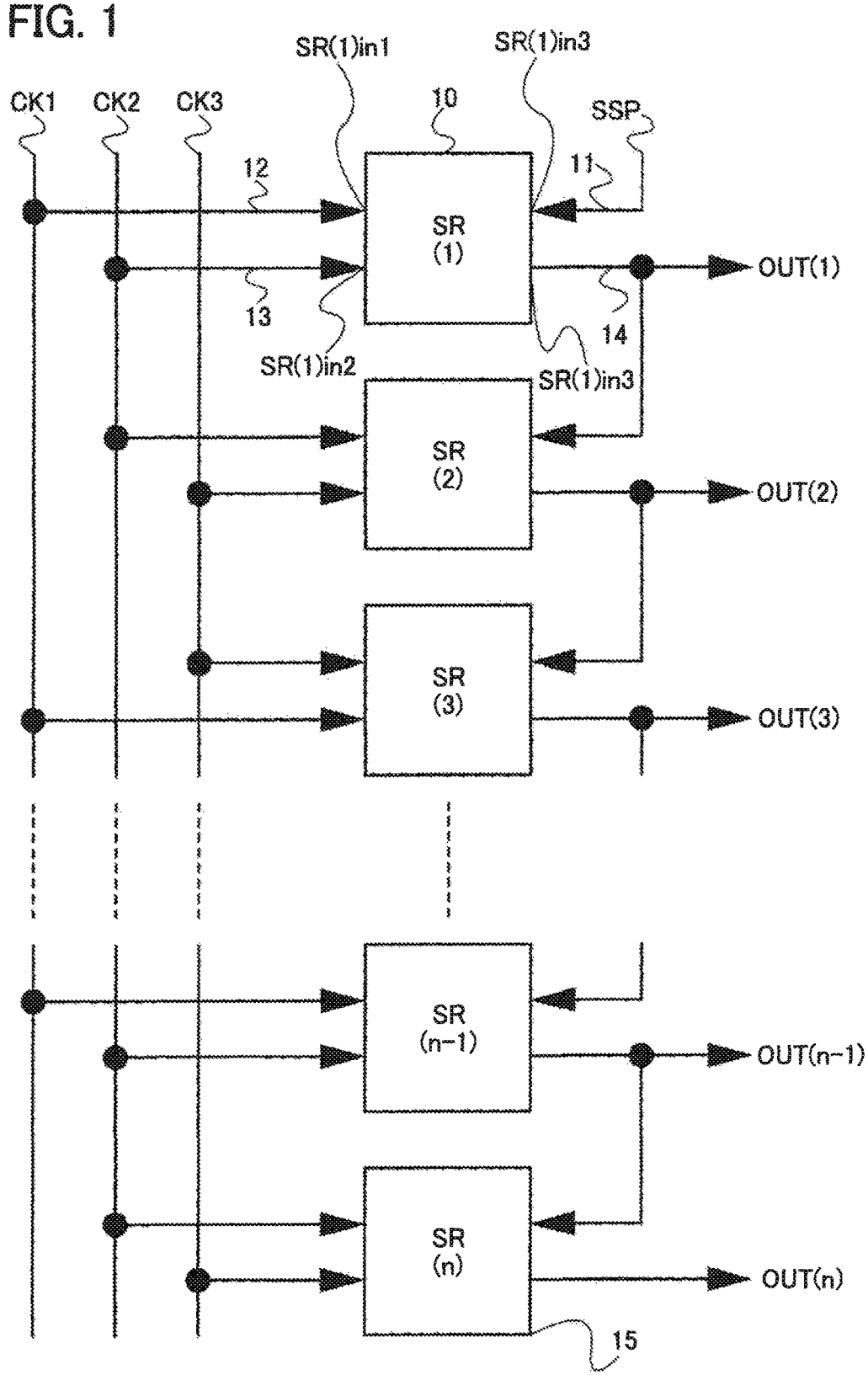
FIG. 1 is a diagram showing Embodiment Mode 1.

As shown in FIG. 1, a circuit 10 constitutes a shift register circuit with n (n is a natural number of 2 or larger) circuits SR(1) to SR(n) connected in series.

An input terminal 11 is an input terminal for inputting a start pulse in SR(1) as the circuit 10 of a first stage and for inputting an output from an output terminal 14 of a preceding stage in the circuits 10 of second to n-th stages. An input terminal 12 is an input terminal for sequentially inputting CK1, CK2, and CK3 in such a manner that CK1 is inputted as a clock signal to SR(1) as the circuit 10 of the first stage, CK2 is inputted as a clock signal to SR(2) as the circuit 10 of the second stage, CK3 is inputted as a clock signal to SR(3) as the circuit 10 of the third stage, and CK1 is inputted to SR(4) as the circuit 10 of the fourth stage.

An input terminal 13 is an input terminal for sequentially inputting CK1, CK2, and CK3 in such a manner that CK2 is inputted to SR(1) as the circuit 10 of the first stage, CK3 is inputted to SR(2) as the circuit 10 of the second stage, CK1 is inputted to SR(3) as the circuit 10 of the third stage, and CK2 is inputted to SR(4) as the circuit 10 of the fourth stage. The output terminal 14 is an output terminal of the circuit 10, which outputs OUT(1) from SR(1) as the circuit 10 of the first stage and outputs OUT(1) to the input terminal 11 of SR(2) as the circuit 10 of the second stage, outputs OUT(2) from SR(2) as the circuit 10 of the second stage and outputs OUT(2) to the input terminal 11 of SR(3) as the circuit 10 of the third stage. It is to be noted that the input terminals 11 to 14 are connected to wires respectively.

Here, SSP, CK1, CK2, and CK3 are 1-bit signals each having a binary value of High and Low. Moreover, OUT(1), OUT(2), OUT(3), OUT(n−1), and OUT(n) are 1-bit signals each having a binary value of High and Low. High is the same potential as VDD which is a positive power source whereas Low is the same potential as VSS which is a negative power source.

An operation of the shift register circuit shown in FIG. 1 is described with reference to a timing chart of this embodiment mode shown in FIG. 2.

Figure 2:
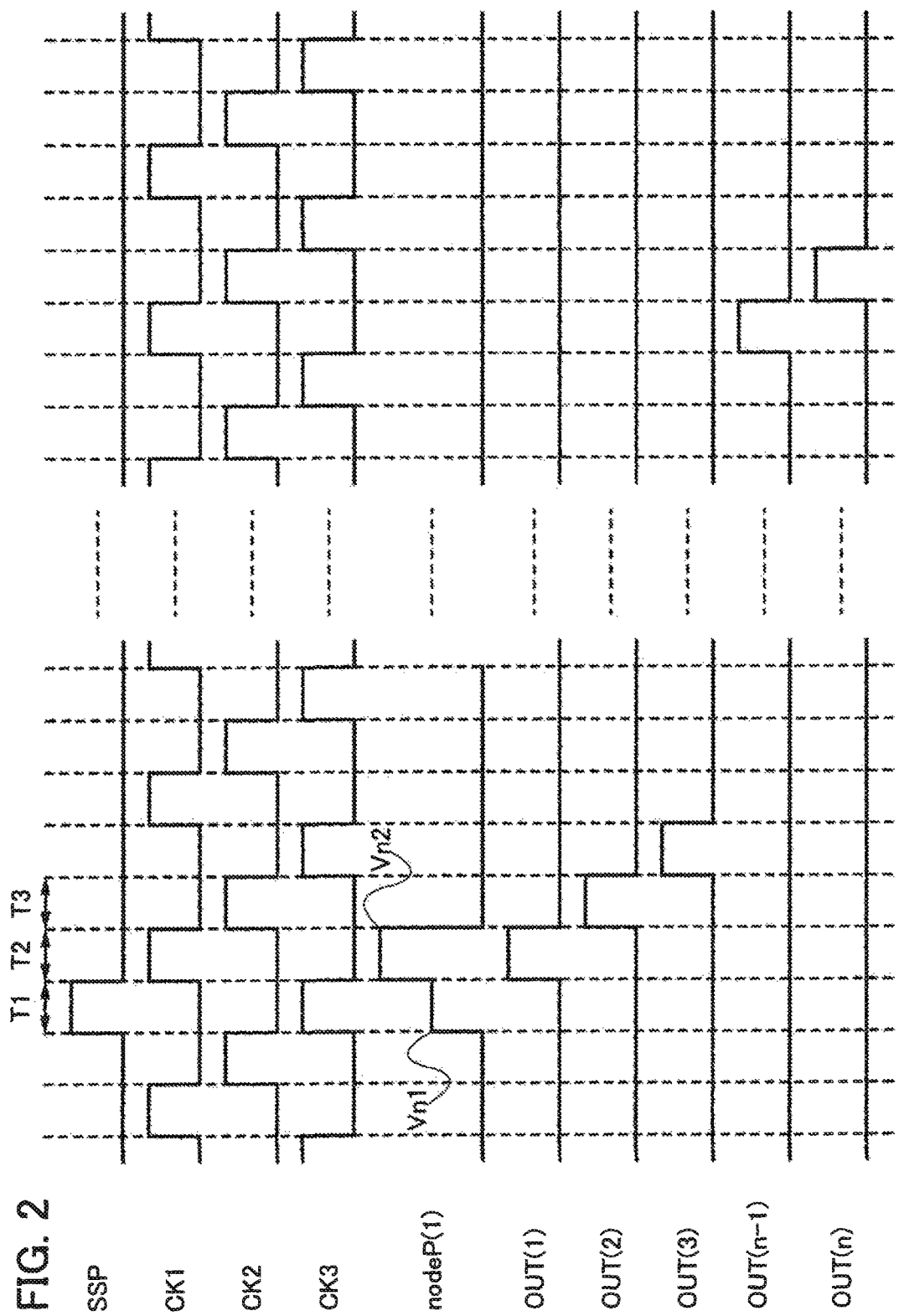
FIG. 2 is a diagram showing Embodiment Mode 1.

In FIG. 2, SSP is a start pulse which becomes High of which pulse width becomes one-third the cycle of CK1, CK2, and CK3. CK1, CK2, and CK3 are three-phase clock signals. In FIG. 1, it is preferable that SSP become High when CK3 becomes High. A node P(1) has a potential of a node P shown in FIG. 3 which is described later. OUT(1) is an output of SR(1) as the circuit 10 of the first stage, OUT(2) is an output of SR(2) as the circuit 10 of the second stage, and OUT(3) is an output of SR(3) as the circuit 10 of the third stage, OUT(n−1) is an output of SR(n−1) as the circuit 10 of the (n−1)th stage, and OUT(n) is an output of SR(n) as the circuit 10 of the n-th stage.

As shown in the timing chart of FIG. 2, when SSP becomes High in a period T1, OUT(1) becomes High in the period T2, and then OUT(2) becomes High in the period T3. In this manner, a shift register circuit is realized by shifting an output of SSP.

Next, a configuration of the circuit 10 of the first stage is described with reference to FIG. 3.

Figure 3:
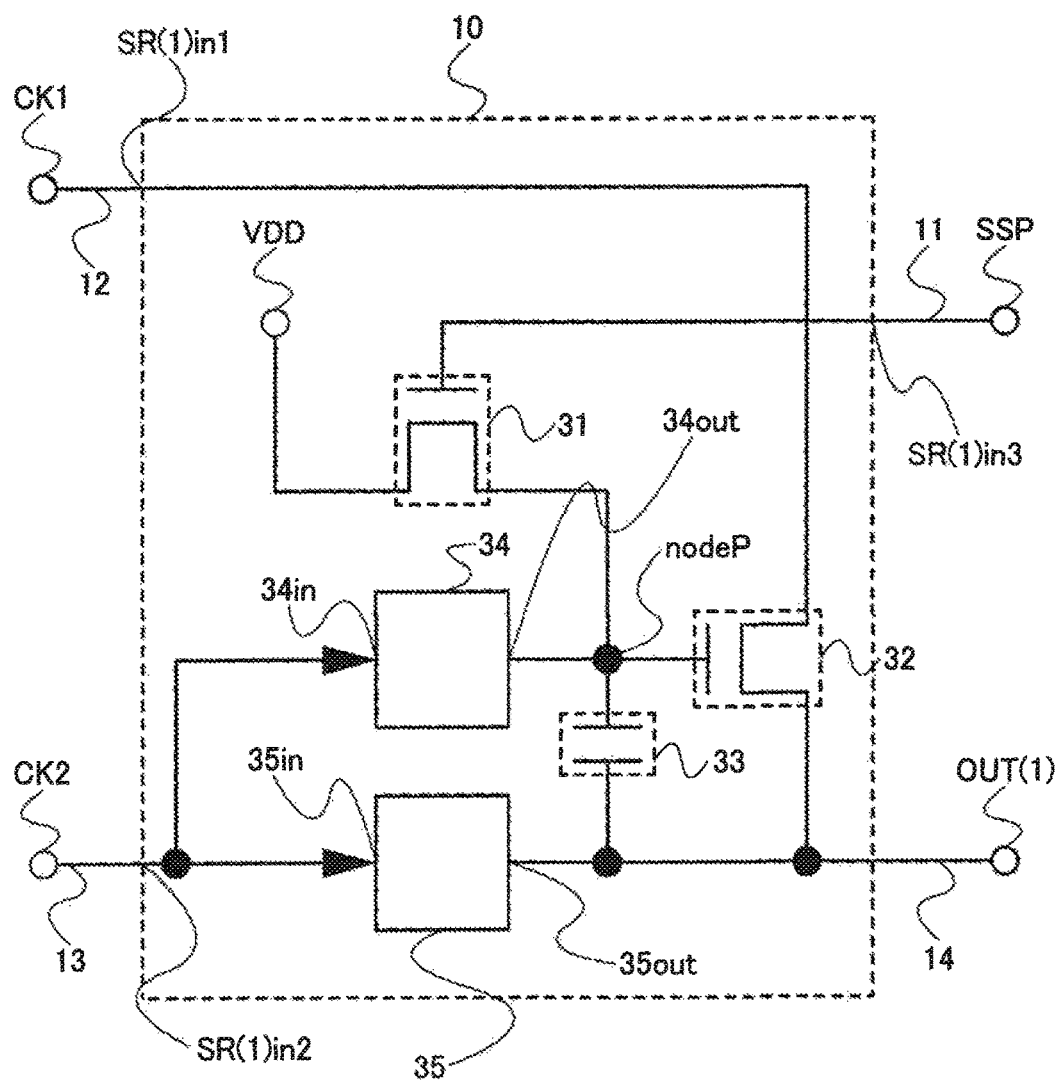
FIG. 3 is a diagram showing Embodiment Mode 1.

The circuit 10 shown in FIG. 3 is configured with the input terminal 11, the input terminal 12, the input terminal 13, the output terminal 14, a transistor 31, a transistor 32, a capacitor 33, a circuit 34, and a circuit 35. It is to be noted that the input terminals 11 to 13 are connected to wires. The input terminals 11 to 13 and the output terminal 14 are similar to those described in FIG. 1. The transistors 31 and 32 are n-channel transistors formed of an amorphous semiconductor, a polycrystal semiconductor, or a single crystal semiconductor. The capacitor 33 is a capacitor having two electrodes. The circuit 34 is a circuit which outputs Low to the node P when the CK2 is High and of which output becomes a floating state when CK2 is Low. The circuit 35 is a circuit which outputs Low to the output terminal 14 when CK2 is High and of which output becomes a floating state when CK2 is Low.

Connections in the circuit shown in FIG. 3 are described. A gate of the transistor 31 is connected to the input terminal 11, one of a source and a drain thereof is connected to VDD, and the other of the source and the drain is connected to one electrode of the capacitor 33, a gate of the transistor 32 and an output terminal of the circuit 34, that is the node P. Further, one of the source and the drain of the transistor 32 is connected to the input terminal 12 and the other of the source and the drain thereof is connected to an output terminal of the circuit 35, the other terminal of the capacitor 33, and the output terminal 14. The input terminal 13 is connected to an input terminal of the circuit 34 and an input terminal of the circuit 35.

Description is made of an operation of the circuit shown in FIG. 3 in the period T1, the period T2, and the period T3 separately with reference to the timing chart of this embodiment mode shown in FIG. 2. Moreover, potentials of the node P and OUT(1) are VSS in an initial state.

In the period T1, SSP becomes High, CK1 becomes Low, CK2 becomes Low, and CK3 becomes High. A gate potential of the transistor 31 at this time is VDD, a potential of one of the source and the drain thereof is VDD, and that of the other of the source and the drain thereof is VSS. Therefore, the transistor 31 is turned on and the potential of the node P starts rising. The rise of the potential of the node P stops when it becomes a potential lower than VDD by a threshold voltage of the transistor 31, thereby the transistor 31 is turned off. A potential of the node P at this time is Vn1. Further, as CK2 is Low, the outputs of the circuits 34 and 35 are in floating states. Therefore, as a charge is not supplied to the node P, the node P becomes a floating state. A gate potential of the transistor 32 at this time is Vn1, a potential of one of the source and the drain thereof is VSS, and the other of the source and the drain thereof is VSS, thus the transistor 32 is on. However, as the potential of one of the source and the drain and the potential of the other thereof are the same, there is no move in charge, thereby no current flows and no potential changes. The capacitor 33 holds a potential difference between VSS as the potential of the output terminal 14 and Vn1 as the potential of the node P.

In the period T2, SSP becomes Low, CK1 becomes High, CK2 becomes Low, and CK3 becomes Low. The gate potential of the transistor 31 at this time is VSS, that of one of the source and the drain thereof is VDD, and that of the other of the source and the drain thereof is Vn1, thereby the transistor 31 is turned off. As CK2 is Low, the outputs of the circuits 34 and 35 become floating states. The gate potential of the transistor 32 at this time is Vn1, that of one of the source and the drain thereof is VDD, and that of the other of the source and the drain thereof, that is a potential of the output terminal 14 becomes VSS, thereby the transistor 32 is turned on and the potential of the output terminal 14 starts rising. Then, the capacitor 33 which is connected between the gate and the other of the source and the drain of the transistor 32 holds the potential difference held in the period T1 as it is; therefore, when a potential of the other of the source and the drain rises, a gate voltage rises at the same time. A potential of the node P is Vn2 at this time. When the potential of the node P rises as high as the sum of VDD and a threshold voltage of the transistor 32, the rise of the potential of the output terminal 14 stops at VDD which is the same as CK1. In other words, by the boot strap operation, the potential of the output terminal 14 can be raised as high as VDD which is a High potential of CK1.

In the period T3, SSP is Low, CK1 is Low, CK2 is High, and CK3 is Low. At this time, the potential of the node P becomes VSS as CK2 is High and VSS is outputted from the circuit 34, and the potential of OUT(1) becomes VSS as VSS is outputted from the circuit 35. The gate potential of the transistor 31 at this time becomes VSS, that of one of the source and the drain becomes VDD, and that of the other of the source and the drain thereof becomes VSS, thereby the transistor 31 is turned off. The gate potential of the transistor 32 becomes VSS, that of one of the source and the drain thereof becomes VSS, and that of the other of the source and the drain becomes VSS, thereby the transistor 32 is turned off.

By the operations in the periods T1, T2, and T3 described above, OUT(1) is outputted in the period T2 when SSP is inputted in the period T1. That is, the shift register is configured by connecting n stages of the circuits 10 each of which outputs SSP with a shift of one-third of the cycle of the clock signal.

Figure 51:
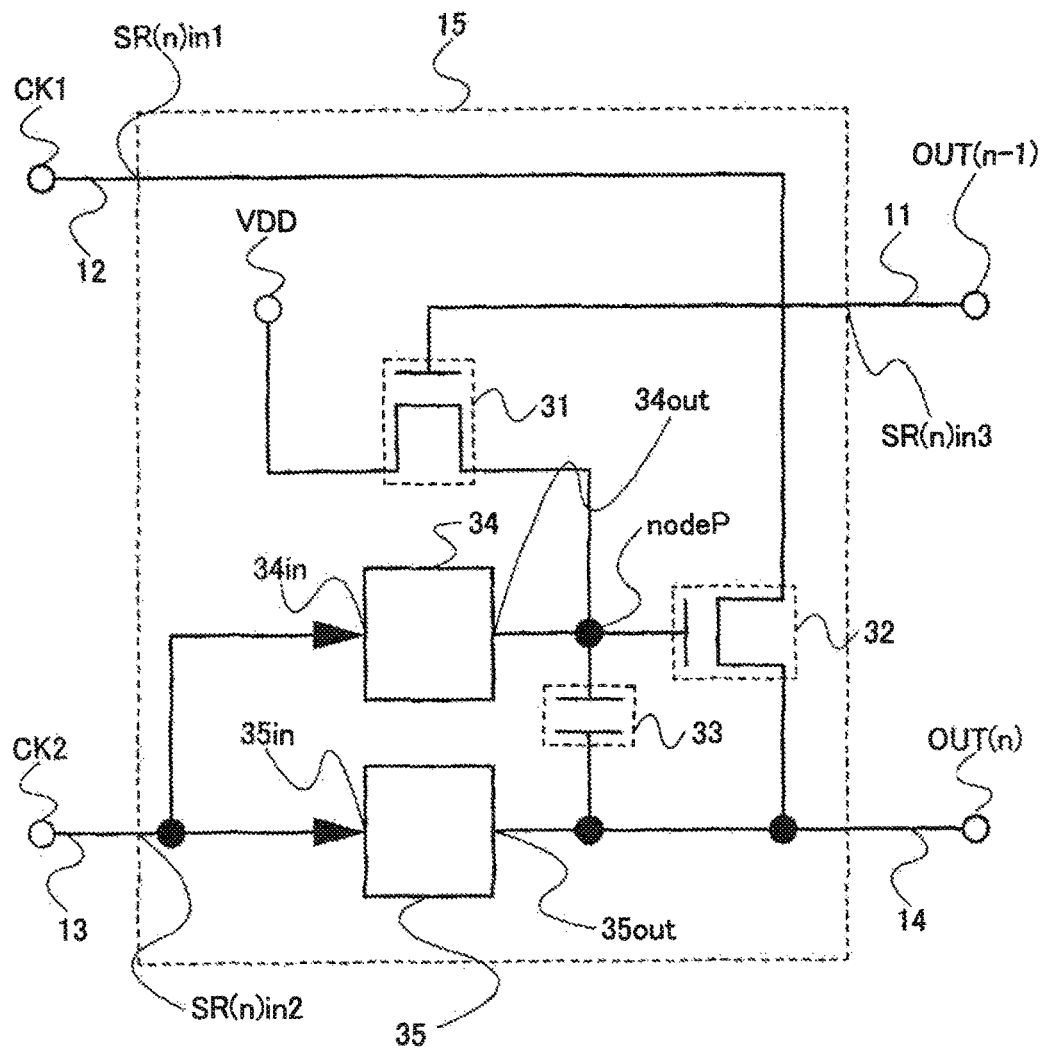
FIG. 51 is a diagram showing Embodiment Mode 1.

In FIG. 3, SR(1) as the circuit 10 of the first stage is shown. SR(n) as the circuit 10 of the n-th stage is described with reference to FIG. 51. In FIG. 51, the transistor 31, the transistor 32, the capacitor 33, the circuit 34, the circuit 35, the input terminal 11, the input terminal 12, the input terminal 13, and the output terminal 14 are similar to those shown in FIG. 3. An input signal inputted from the input terminal 11 is connected to the output terminal 14 of the circuit 10 of the preceding stage.

It is to be noted that the gate of the transistor 31 and the other of the source and the drain of the transistor 32 may be connected to a wire (hereinafter referred to as a "power source line") which functions as a power source line, for example, to a power source line such as the positive power source VDD and the negative power source VSS, another power source line, or a wire which functions as another signal line (hereinafter referred to as a "signal line"). Moreover, the other of the source and the drain of the transistor 31 may be connected to another signal line, for example, to a signal line such as CK1, CK2, CK3, and SSP, another signal line, or another power source line.

The transistors used in the shift register circuit shown in FIG. 3 are all n-channel transistors, thus forming a unipolar circuit, however, only p-channel transistors may be used as well. It is needless to say that a p-channel transistor and an n-channel transistor may be used in combination. A shift register circuit where all the transistors are p-channel transistors is described with reference to FIG. 55.

Figure 55:
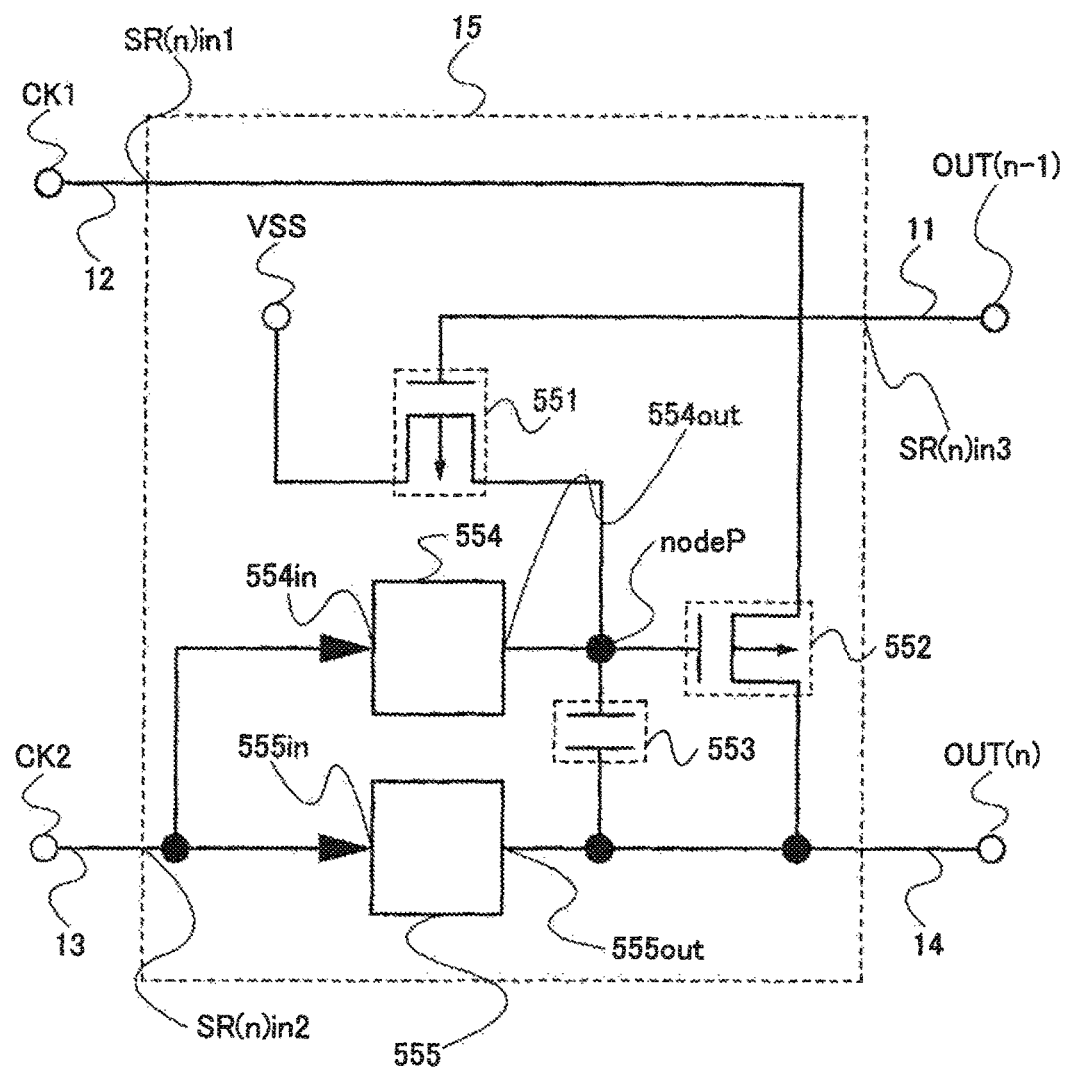
FIG. 55 is a diagram showing Embodiment Mode 1.

In a circuit configuration shown in FIG. 55, the positive power source VDD, the negative power source VSS, the input terminal 11, the input terminal 12, the input terminal 13, and the output terminal 14 can be similar to those in FIG. 3. Transistors 551 and 552 are p-channel transistors formed of an amorphous semiconductor, a polycrystal semiconductor, or a single crystal semiconductor. A capacitor 553 has two electrodes. A circuit 554 outputs High to the node P when CK2 is Low and of which output becomes a floating state when CK2 is High. A circuit 555 outputs High to the output terminal 14 when CK2 is Low and of which output becomes a floating state when CK2 is High.

Connections in the circuit shown in FIG. 55 are described. A gate of the transistor 551 is connected to the input terminal 11, one of a source and a drain thereof is connected to the positive power source VSS, the other of the source and the drain thereof is connected to one electrode of the capacitor 553, a gate of the transistor 552 and an output terminal of the circuit 554, that is the node P. One of a source and a drain of the transistor 552 is connected to the input terminal 12, the other of the source and the drain thereof is connected to an output terminal of the circuit 555, the other electrode of the capacitor 553, and the output terminal 14. The input terminal 13 is connected to an input terminal of the circuit 554 and an input terminal of the circuit 555.

The gate of the transistor 551 and the other of the source and the drain of the transistor 552 may be connected to the power source line, for example, to a power source line such as the positive power source VDD and the negative power source VSS, another power source line, or another signal line. Further, the other of the source and the drain of the transistor 551 may be connected to a signal line, for example, to a signal line such as CK1, CK2, CK3, and SSP, another signal line, or another power source line.

A configuration example of the circuit 554 shown in FIG. 55 is described with reference to FIG. 59A. As shown in the circuit 554 of FIG. 59A, the input terminal 13 and the node P are similar to those in FIG. 55. The transistor 591 is a p-channel transistor formed of an amorphous semiconductor, a polycrystal semiconductor, or a single crystal semiconductor.

Figure 59A:
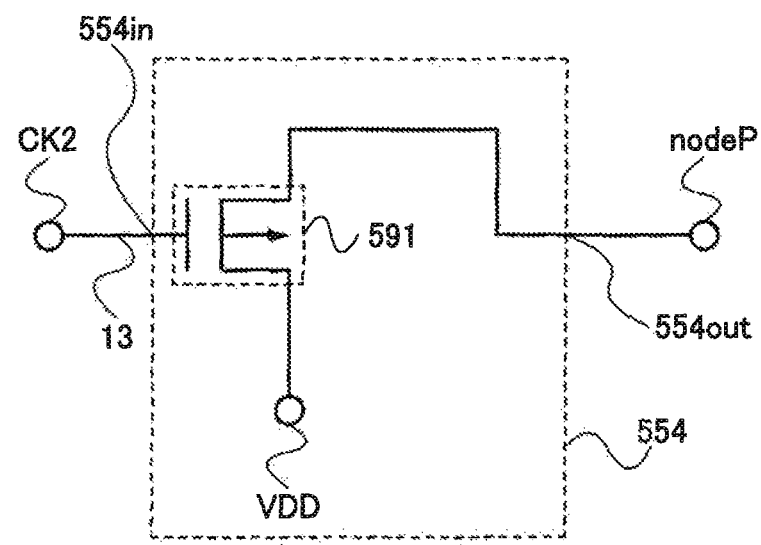
FIGS. 59A and 59B are diagrams showing Embodiment Mode 1.

Connections in the circuit shown in FIG. 59A are described. A gate of a transistor 591 is connected to the input terminal 13, one of a source and a drain thereof is connected to VDD, and the other of the source and the drain thereof is connected to the node P.

An operation of FIG. 59A is described. The transistor 591 is turned on when CK2 inputted from the input terminal 13 is Low, thereby VDD is outputted to the node P, whereas the transistor 591 is turned off when CK2 is High, thereby nothing is outputted to the node P. In this manner, the circuit 554 has a function to output High when CK2 is Low and of which output becomes a floating state when CK2 is High. Further, another circuit configuration having the same function may be employed instead of the aforementioned circuit configuration.

It is to be noted that one of the source and the drain of the transistor 591 may be connected to a signal line, for example, to a signal line such as CK1, CK2, CK3, and SSP, another signal line, or another power source line. Further, a gate of the transistor 591 may be connected to a power source line, for example, to a power source line such as the positive power source VDD and the negative power source VSS, another power source line, or another signal line.

A configuration example of the circuit 555 shown in FIG. 55 is described with reference to FIG. 59B. As shown in the circuit 555 of FIG. 59B, the input terminal 13 and the output terminal 14 are similar to those in FIG. 55. A transistor 592 is a p-channel transistor formed of an amorphous semiconductor, a polycrystal semiconductor, or a single crystal semiconductor.

Figure 59B:
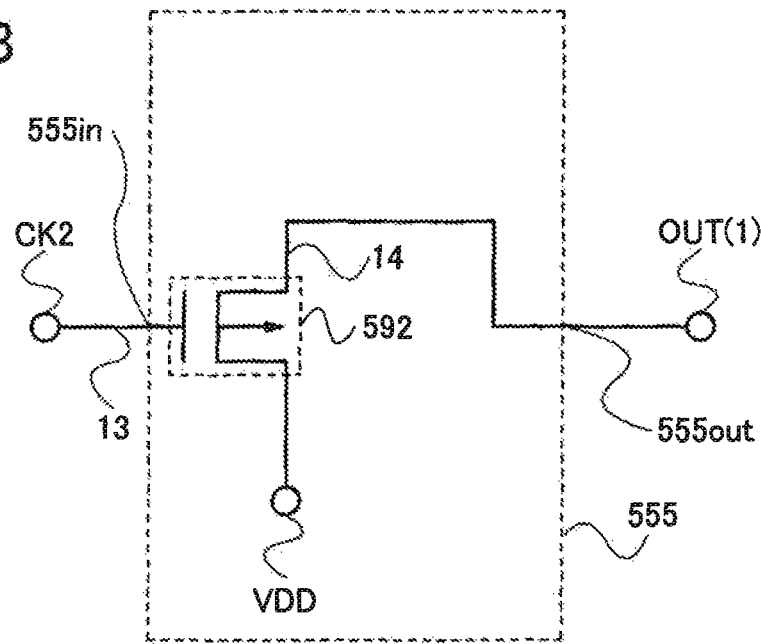

An operation of the circuit shown in FIG. 59B is described. The transistor 592 is turned on when CK2 inputted from the input terminal 13 is Low, thereby VDD is outputted to the output terminal 14, whereas the transistor 592 is turned off when CK2 is High, thereby nothing is outputted to the output terminal 14. In this manner, the circuit 555 has a function to output High when CK2 is Low and of which output becomes a floating state when CK2 is High. Further, another circuit configuration having the same function may be employed instead of the aforementioned circuit configuration.

It is to be noted that one of the source and the drain of the transistor 592 may be connected to a signal line, for example, to a signal line such as CK1, CK2, CK3, and SSP, another signal line, or another power source line. Further, a gate of the transistor 592 may be connected to a power source line, for example, to a power source line such as the positive power source VDD and the negative power source VSS, another power source line, or another signal line.

Next, a configuration example of the circuit 34 shown in FIG. 3 is described with reference to FIG. 4A.

Figure 4A:
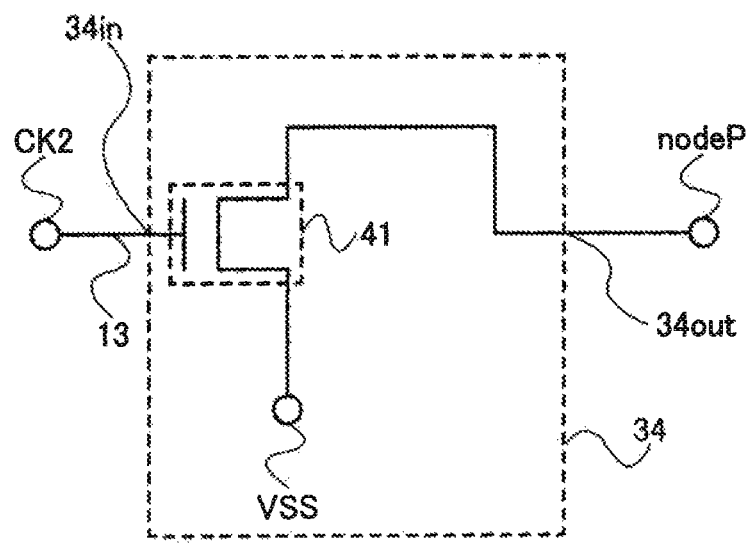
FIGS. 4A and 4B are diagrams showing Embodiment Mode 1.

In the circuit 34 shown in FIG. 4A, the input terminal 13 and the node P are similar to those in FIG. 3. A transistor 41 is an n-channel transistor formed of an amorphous semiconductor, a polycrystal semiconductor, or a single crystal semiconductor.

Connections of the circuit shown in FIG. 4A are described. A gate of the transistor 41 is connected to the input terminal 13, one of a source and a drain thereof is connected to VSS, and the other of the source and the drain thereof is connected to the node P.

An operation of the circuit shown in FIG. 4A is described. The transistor 41 is turned on when CK2 inputted from the input terminal 13 is High, thereby VSS is outputted to the node P, whereas the transistor 41 is turned off when CK2 is Low, thereby nothing is outputted to the node P. In this manner, the circuit 34 has a function to output Low when CK2 is High and of which output becomes a floating state when CK2 is Low. Further, another circuit configuration having the same function may be employed instead of the aforementioned circuit configuration.

It is to be noted that one of the source and the drain of the transistor 41 may be connected to a signal line, for example, to a signal line such as CK1, CK2, CK3, and SSP, another signal line, or another power source line. Further, a gate of the transistor 41 may be connected to a power source line, for example, to a power source line such as the positive power source VDD and the negative power source VSS, another power source line, or another signal line.

A configuration example of the circuit 35 shown in FIG. 3 is described with reference to FIG. 4B.

Figure 4B:
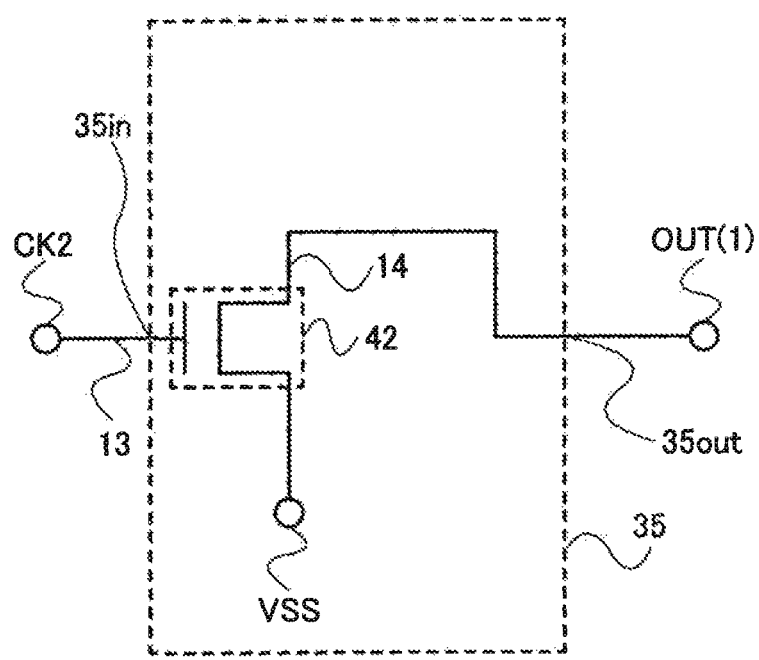

In the circuit 35 shown in FIG. 4B, the input terminal 13 and the output terminal 14 are similar to those in FIG. 3. A transistor 42 is an n-channel transistor formed of an amorphous semiconductor, a polycrystal semiconductor, or a single crystal semiconductor.

An operation of the circuit shown in FIG. 4B is described. The transistor 42 is turned on when CK2 inputted from the input terminal 13 is High, thereby VSS is outputted to the output terminal 14, whereas the transistor 42 is turned off when CK2 is Low, thereby nothing is outputted to the output terminal 14. In this manner, the circuit 35 has a function to output Low when CK2 is High and of which output becomes a floating state when CK2 is Low. Further, another circuit configuration having the same function may be employed instead of the aforementioned circuit configuration.

It is to be noted that one of the source and the drain of the transistor 42 may be connected to a signal line, for example, to a signal line such as CK1, CK2, CK3, and SSP, another signal line, or another power source line. It is needless to say that one of the source and the drain of the transistor 42 may be connected to a wire having VSS, to which one of the source and the drain of the transistor 41 is connected. Further, the gate of the transistor 42 may be connected to a power source line, for example, to a power source line such as the positive power source VDD and the negative power source VSS, another power source line, or another signal line.

That is, in the configurations shown in FIGS. 3 and 4, a first transistor (the transistor 31), a second transistor (the transistor 32), a third transistor (the transistor 41), and a fourth transistor (the transistor 42) are provided. One of a source and a drain of the first transistor is connected to a first wire (VDD), the other of the source and the drain is connected to a gate electrode of the second transistor and the other of a source and a drain of the third transistor, a gate electrode of the first transistor is connected to a fifth wire (the input terminal 11), one of a source and a drain of the second transistor is connected to a third wire (the input terminal 12), the other of the source and the drain is connected to a sixth wire (the output terminal 14), one of the source and the drain of the third transistor is connected to a second wire (VSS), the other of the source and the drain thereof is connected to a gate electrode of the second transistor, a gate electrode of the third transistor is connected to a fourth wire (the input terminal 13), one of a source and a drain of the fourth transistor is connected to the second wire (VSS), the other of the source and the drain of the fourth transistor is connected to a sixth wire (the output terminal 14), and a gate electrode thereof is connected to the fourth wire (the input terminal 13). Further, one of the source and the drain of the first transistor may be connected to a fifth wire (the input terminal 11).

In the shift register circuit as described above, VSS can be supplied to the node P and the output terminal 14 as CK2 becomes High. That is, by inputting VSS at regular intervals in a non-selection period, a noise can be reduced. Moreover, as there is no transistor which is stationary on, characteristics deterioration of the transistor can be suppressed. In addition, as at least four transistors can be used for operation, the number of elements in a whole shift register circuit can be reduced, which enables to form an internal circuit in a small area over an insulating substrate.

Hereinafter described are some configuration examples and operation examples of this embodiment mode, which are variable. The configuration examples and the operation examples described below can be applied to "SUMMARY OF THE INVENTION", embodiment modes, and embodiments.

As shown in FIG. 1, the clock signals of CK1, CK2, and CK3 are inputted when the circuit 10 is in a non-selection period, however, a switching element or the like may be provided so that the clock signals are not inputted to the circuit 10 in a non-selection period. As a result, a load on a clock signal line can be reduced and power consumption can be reduced.

Further, in FIG. 1, the shift register circuit described above may be scanned reversely. For example, an output of the circuit 10 of the n-th stage may be inputted to the circuit 10 of the (n−1)th stage. By repeating this in all the stages, the reverse scanning can be realized.

As shown in FIG. 2, a pulse width of SSP, CK1, CK2, and CK3 is a one-third cycle, the pulse width may be a little shorter than the one-third cycle. As a result, a current which flows instantaneously, such as a through current can be suppressed and an operation with a high operation margin and low power consumption can be performed. In a circuit configuration which performs a boot strap operation, there is a node in a floating state, which is advantageous in performing a normal boot strap operation.

In FIG. 2, in a period when SSP is High, CK3 is High with the same pulse width. However, the invention is not limited to this. For example, when a signal is transmitted from an external circuit to an internal circuit, delay time may vary between control signals depending on a buffer circuit, a level shifter circuit which changes signal amplitude, or the like.

In FIG. 3, the capacitor 33 is connected for a boot strap operation. However, if there is gate-source capacitance between the gate and the other of the source and the drain of the transistor 32, or the like, which is large enough for the boot strap operation, the capacitor 33 is not always required to be provided. Moreover, the capacitor 33 may be formed by any method. For example, the capacitor may be formed between a semiconductor layer and a gate wiring layer or between an amorphous semiconductor layer and a wire. It is advantageous to form a capacitor between a semiconductor layer and a gate wiring layer since the capacitor can be formed with a thin GI film (gate insulating film) interposed therebetween regardless of a bottom gate transistor or a top gate transistor, which enables to obtain more capacitance with a smaller area.

In FIG. 3, SSP is inputted to the gate of the transistor 31, however, the gate and one of the source and the drain thereof may be connected to each other, to which SSP may be inputted. As a result, one power source line can be reduced as the positive power source VDD is not required. Therefore, an area for forming the shift register circuit can be smaller. Consequently, a display device with higher resolution and a narrower frame can be provided.

The circuits 34 and 35 shown in FIG. 3 may be any circuits in which VSS is outputted when CK2 is High and of which output becomes a floating state when CK2 is Low as described above. Moreover, an output of the circuit 10 of a next stage may be inputted to the input terminal of the circuit 34, an output of the circuit 10 of a following stage may be inputted to the input terminal of the circuit 35 similarly, or an output of the circuit 10 of a following stage may be inputted to the input terminals of the circuits 34 and 35. By using the output of the circuit 10 of a following stage, the circuits 34 and 35 can be synchronized not only with a control signal but with an actual output of the shift register circuit as well; therefore, there is an advantage in that a potential can be changed appropriately in accordance with an operation of the shift register circuit.

As shown in FIG. 3, a capacitor may be connected between the node P, and VSS or VDD. By connecting the capacitor, a potential of the node P can be stabilized.

It is to be noted in FIG. 3 that the circuit 34 is not always required. That is, as VSS is outputted at regular intervals by the circuit 35, the transistor 32 is to be turned off even when the node P has a noise. As a result, the number of elements can be reduced. At that time, a capacitor may be connected between the node P, and VSS or VDD.

Embodiment Mode 2

In this embodiment mode, description is made with reference to FIGS. 2 and 5 to 7 of a configuration and an operation of a shift register circuit in which a noise in an output voltage in a non-selection period is reduced by outputting VSS at regular intervals.

Figure 5:
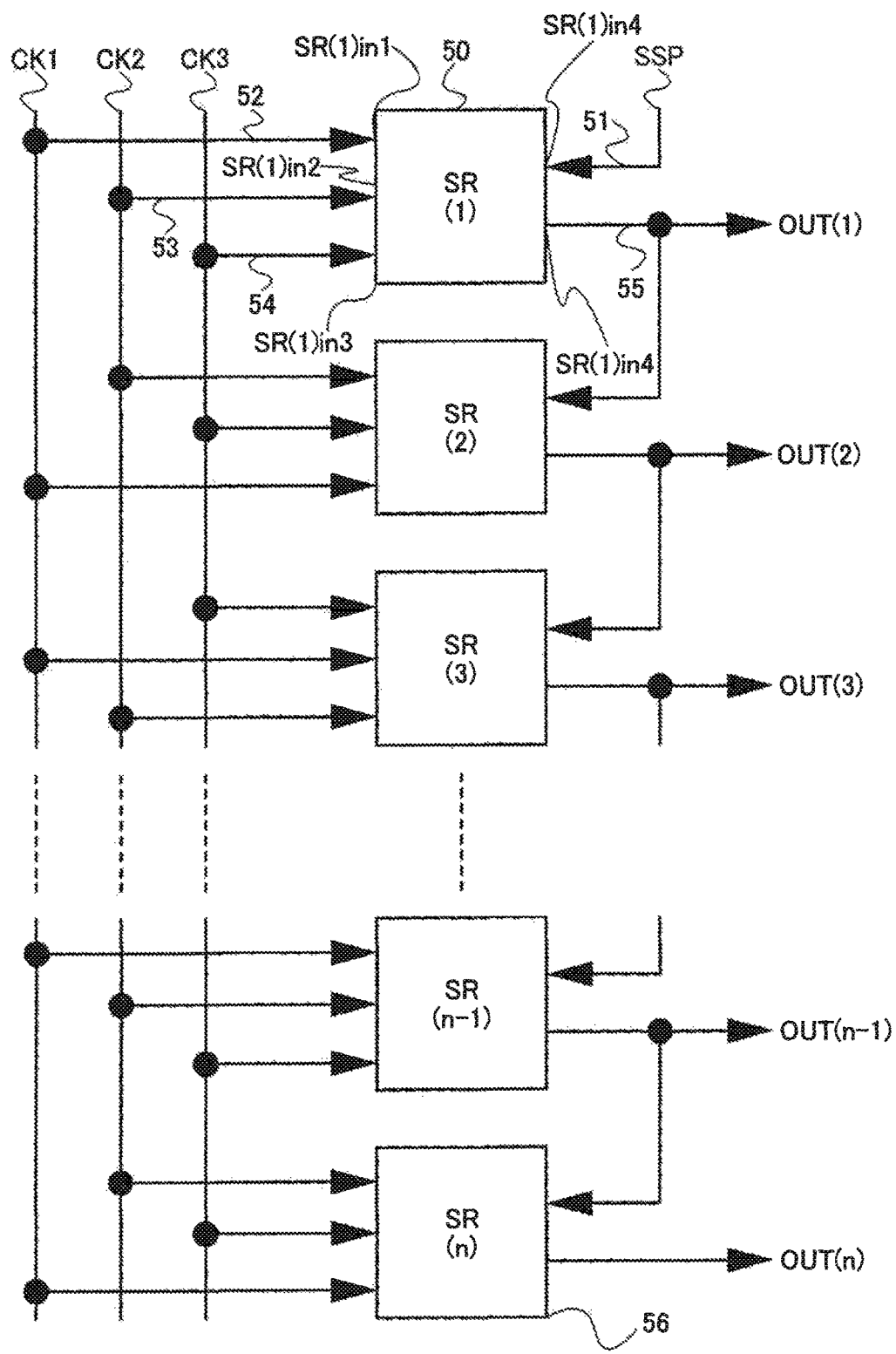
FIG. 5 is a diagram showing Embodiment Modes 2 to 4.

As shown in FIG. 5, a circuit 50 forms a shift register circuit by n (n is a natural number of two or larger) circuits SR(1) to SR(n) connected in series.

An input terminal 51 is an input terminal for inputting a start pulse in SR(1) as the circuit 50 of a first stage and for inputting an output from an output terminal 55 of a preceding stage in SR(2) as the circuits 50 of second to n-th stages. An input terminal 52 is an input terminal for sequentially inputting CK1, CK2, and CK3 in such a manner that CK1 is inputted as a clock signal to SR(1) as the circuit 50 of the first stage, CK2 is inputted as a clock signal to SR(2) as the circuit 50 of the second stage, CK3 is inputted as a clock signal to SR(3) as the circuit 50 of the third stage, and CK1 is inputted to SR(4) as the circuit 50 of the fourth stage. An input terminal 53 is an input terminal for sequentially inputting clock signals in such a manner that CK2 is inputted to SR(1) as the circuit 50 of the first stage, CK3 is inputted to SR(2) as the circuit 50 of the second stage, CK1 is inputted to SR(3) as the circuit 50 of the third stage, and CK2 is inputted to SR(4) as the circuit 50 of the fourth stage. An input terminal 54 is an input terminal for sequentially inputting clock signals in such a manner that CK3 is inputted to SR(1) as the circuit 50 of the first stage, CK1 is inputted to SR(2) as the circuit 50 of the second stage, CK2 is inputted to SR(3) as the circuit 50 of the third stage, and CK3 is inputted to SR(4) as the circuit 50 of the fourth stage. The output terminal 55 is an output terminal of the circuit 50, which outputs OUT(1) from SR(1) as the circuit 50 of the first stage and outputs OUT(1) to the input terminal 51 of SR(2) as the circuit 50 of the second stage, outputs OUT(2) from SR(2) as the circuit 50 of the second stage and outputs OUT(2) to the input terminal 51 of SR(3) as the circuit 50 of the third stage.

Here, SSP, CK1, CK2, and CK3 are 1-bit signals each having a binary value of High and Low. High is the same potential as VDD which is a positive power source whereas Low is the same potential as VSS which is a negative power source. Here, SSP, CK1, CK2, and CK3 are 1-bit signals each having a binary value of High and Low. Moreover, OUT(1), OUT(2), OUT(3), OUT(n−1), and OUT(n) are 1-bit signals each having a binary value. High is the same potential as VDD which is a positive power source whereas Low is the same potential as VSS which is a negative power source.

An operation of the shift register circuit shown in FIG. 5 is described with reference to the timing chart of this embodiment mode shown in FIG. 2.

SSP, CK1, CK2, and CK3 can be similar to those in Embodiment Mode 1. It is to be noted that a node P(1) is the same potential as a node P in FIG. 6 described later. OUT(1) is an output of SR(1) as the circuit 50 of the first stage, OUT(2) is an output of SR(2) as the circuit 50 of the second stage, OUT(3) is an output of SR(3) as the circuit 50 of the third stage, OUT(n−1) is an output of SR(n−1) as the circuit 50 of the (n−1)th stage, and OUT(n) is an output of SR(n) as the circuit 50 of the n-th stage.

In the timing chart of FIG. 2, when SSP becomes High as shown in the period T1, OUT(1) becomes High as shown in the period T2 and OUT(2) becomes High as shown in the period T3. In this manner, a shift register circuit is realized by shifting an output of SSP.

Next, a configuration of the circuit 50 of the first stage is described with reference to FIG. 6.

Figure 6:
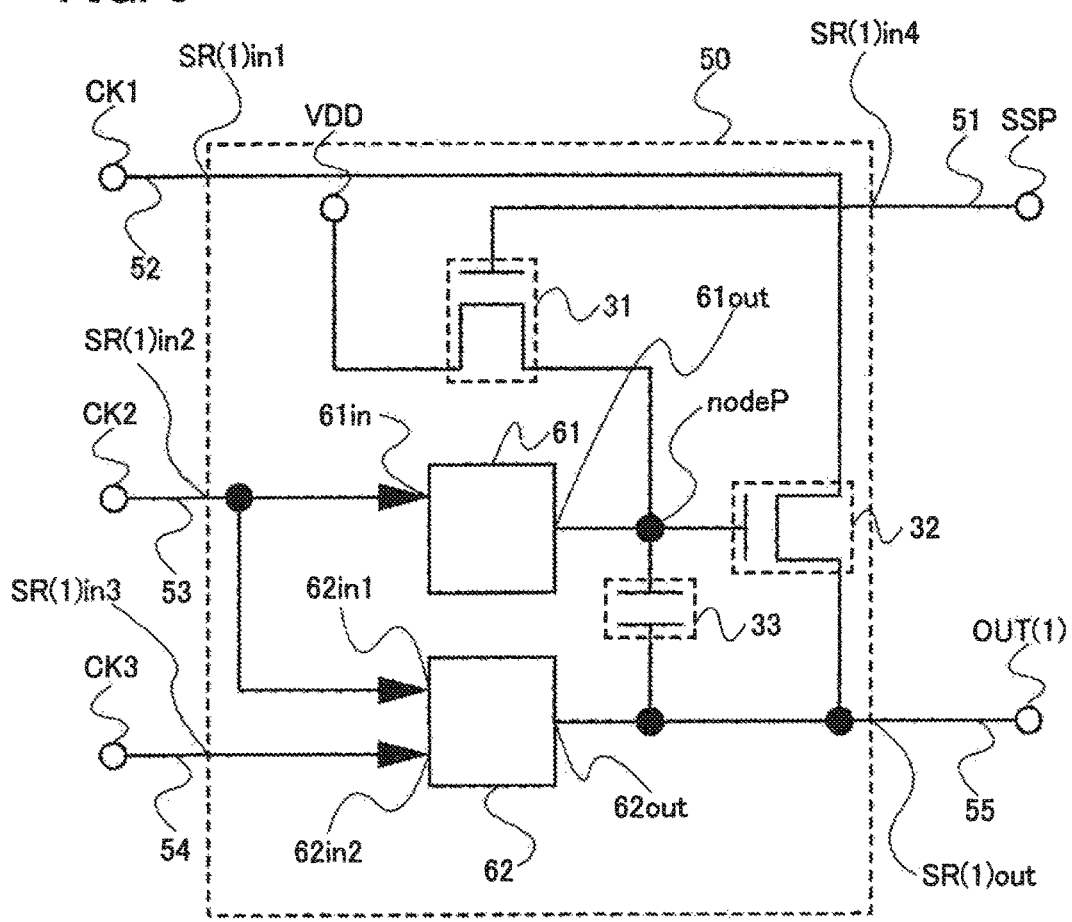
FIG. 6 is a diagram showing Embodiment Mode 2.

The circuit 50 shown in FIG. 6 is configured with the input terminal 51, the input terminal 52, the input terminal 53, the input terminal 54, the output terminal 55, the transistor 31, the transistor 32, the capacitor 33, the circuit 34, and the circuit 35. The input terminal 51, the input terminal 52, the input terminal 53, the input terminal 54, and the output terminal 55 are similar to those described in FIG. 5. The transistor 31 and the transistor 32 are similar to those shown in FIG. 3. A circuit 61 has a function to output Low to the node P when CK2 is High and of which output becomes a floating state when CK2 is Low. The circuit 62 has a function to output Low to the output terminal 55 when either of CK2 or CK3 is High and of which output becomes a floating state when CK2 and CK3 are Low.

Connections of the circuit shown in FIG. 6 are described. The gate of the transistor 31 is connected to the input terminal 51, one of the source and the drain thereof is connected to VDD, and the other of the source and the drain thereof is connected to one electrode of the capacitor 33, the gate of the transistor 32, and an output terminal of the circuit 61, that is to the node P. One of the source and the drain of the transistor 32 is connected to the input terminal 52 and the other of the source and the drain thereof is connected to an output terminal of the circuit 62, the other electrode of the capacitor 33, and the output terminal 55. The input terminal 53 is connected to an input terminal of the circuit 61 and an input terminal of the circuit 62. The input terminal 54 is connected to the input terminal of the circuit 62.

Description is made of an operation of the circuit shown in FIG. 6 in the period T1, the period T2, and the period T3 separately with reference to the timing chart of this embodiment mode shown in FIG. 2. Moreover, potentials of the node P and OUT(1) are VSS in an initial state.

In the period T1, SSP becomes High, CK1 becomes Low, CK2 becomes Low, and CK3 becomes High. A gate potential of the transistor 31 at this time is VDD, that of one of the source and the drain thereof is VDD, and that of the other of the source and the drain thereof is VSS. Therefore, the transistor 31 is turned on and the potential of the node P starts rising from VSS. The rise of the potential of the node P stops when it becomes a potential lower than VDD by a threshold voltage of the transistor 31, thereby the transistor 31 is turned off. A potential of the node P at this time is Vn1. Further, as CK2 is Low, the output of the circuit 61 is in a floating state. Therefore, as a charge is not supplied to the node P, the node P becomes a floating state. As CK2 is Low and CK3 is High, the circuit 62 outputs Low. A gate potential of the transistor 32 at this time is Vn1, a potential of one of the source and the drain thereof is VSS, and the other of the source and the drain thereof is VSS, thus the transistor 32 is on. However, as the potential of one of the source and the drain and the potential of the other thereof are the same, there is no move in charge, thereby no current flows and no potential changes. The capacitor 33 holds a potential difference between VSS as the potential of the output terminal 55 and Vn1 as the potential of the node P.

In the period T2, SSP becomes Low, CK1 becomes High, CK2 becomes Low, and CK3 becomes Low. The gate potential of the transistor 31 at this time is VSS, that of one of the source and the drain thereof is VDD, and that of the other of the source and the drain thereof is Vn1, thereby the transistor 31 is turned off. As CK2 is Low, the output of the circuit 61 becomes a floating state. As CK2 is Low and CK3 is Low, the output of the circuit 62 becomes a floating state. The gate potential of the transistor 32 at this time is Vn1, that of one of the source and the drain thereof is VDD, and that of the other of the source and the drain thereof, that is a potential of the output terminal 55 becomes VSS, thereby the transistor 32 is turned on and the potential of the output terminal 55 starts rising. Then, the capacitor 33 which is connected between the gate and the other of the source and the drain of the transistor 32 holds the potential difference held in the period T1 as it is; therefore, when a potential of the other of the source and the drain rises, a gate voltage rises at the same time. A potential of the node P is Vn2 at this time. When the potential of the node P rises as high as the sum of VDD and a threshold voltage of the transistor 32, the rise of the potential of the output terminal 14 stops at VDD which is the same as CK1. In other words, by the boot strap operation, the potential of the output terminal 55 can be raised as high as VDD which is a High potential of CK1.

In the period T3, SSP is Low, CK1 is Low, CK2 is High, and CK3 is Low. At this time, the potential of the node P becomes VSS as CK2 is High and VSS is outputted from the circuit 61, and the potential of OUT(1) becomes VSS as VSS is outputted from the circuit 62. The gate potential of the transistor 31 at this time becomes VSS, that of one of the source and the drain becomes VDD, and that of the other of the source and the drain thereof becomes VSS, thereby the transistor 31 is turned off. The gate potential of the transistor 32 becomes VSS, that of one of the source and the drain thereof becomes VSS, and that of the other of the source and the drain becomes VSS, thereby the transistor 32 is turned off.

By the operations in the periods T1, T2, and T3 described above, OUT(1) is outputted in the period T2 when SSP is inputted in the period T1. That is, the shift register circuit is configured by connecting n stages of the circuits 50 each of which outputs SSP with a shift of one-third of the cycle of the clock signal.

Figure 52:
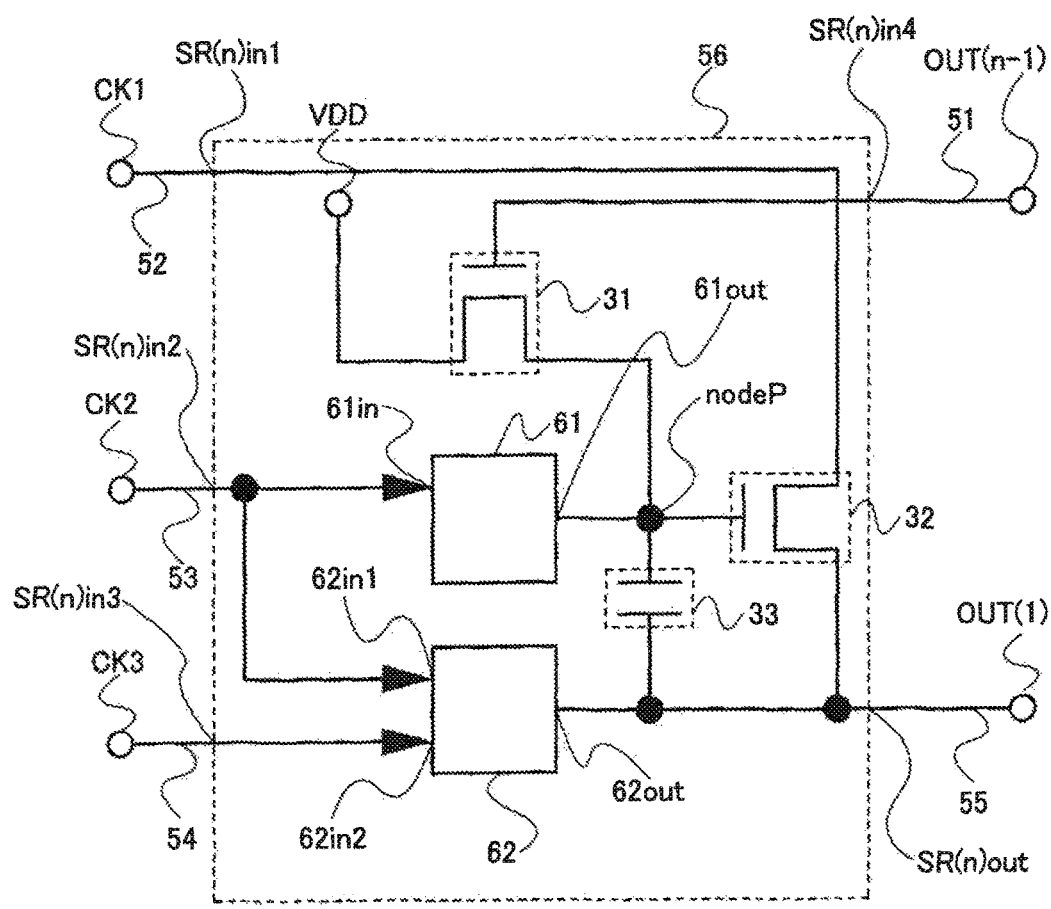
FIG. 52 is a diagram showing Embodiment Mode 2.

The description has been made of the circuit 50 of the first stage shown in FIG. 6, but now the circuit 50 of the n-th stage is described with reference to FIG. 52. In FIG. 52, the transistor 31, the transistor 32, the capacitor 33, the circuit 61, the circuit 62, the input terminal 51, the input terminal 52, the input terminal 53, the input terminal 54, and the output terminal 55 are similar to those described in FIG. 6. A feature of the circuit is that an input signal inputted from the input terminal 51 is connected to the output terminal 55 of a circuit of a preceding stage.

It is to be noted that the gate of the transistor 31 and the other of the source and the drain of the transistor 32 may be connected to a power source line, for example, to a power source line such as a positive power source VDD and a negative power source VSS, another power source line, or another signal line. Further, the other of the source and the drain of the transistor 31 may be connected to a signal line, for example, to a signal line such as CK1, CK2, CK3, and SSP, another signal line, or another power source line.

The transistors used in the shift register circuit shown in FIG. 6 are all n-channel transistors, thus forming a unipolar circuit, however, only p-channel transistors may be used as well. It is needless to say that a p-channel transistor and an n-channel transistor may be used in combination. A shift register circuit where all the transistors are p-channel transistors is described with reference to FIG. 56.

Figure 56:
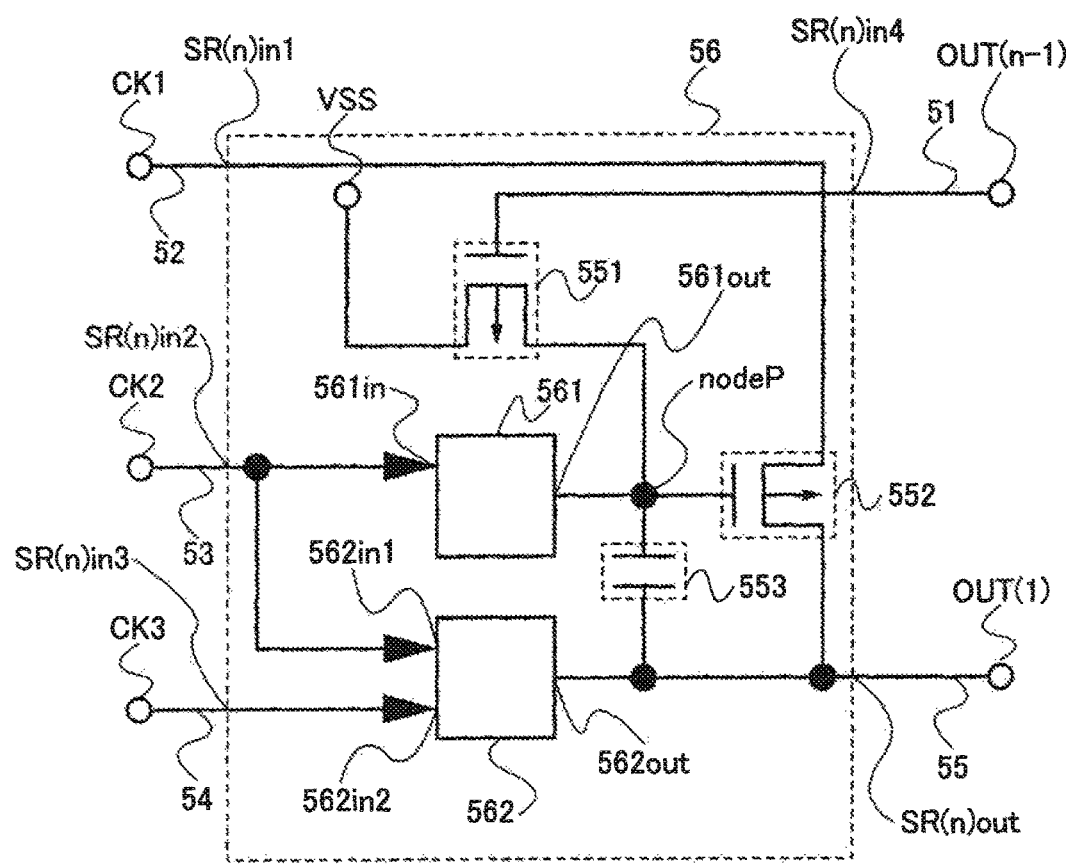
FIG. 56 is a diagram showing Embodiment Mode 2.

In a circuit configuration shown in FIG. 56, the positive power source VDD, the negative power source VSS, the input terminal 51, the input terminal 52, the input terminal 53, the input terminal 54, the transistor 551, the transistor 552, and the capacitor 553 can be similar to those in FIG. 55. A circuit 561 has a function to output High to the node P when CK2 is Low and of which output becomes a floating state when CK2 is High. A circuit 562 has a function to output High to the node P when either of CK2 or CK3 is Low and of which output becomes a floating state when CK2 and CK3 are High.

Connections in the circuit shown in FIG. 56 are described. The gate of the transistor 551 is connected to the input terminal 51, one of the source and the drain thereof is connected to the positive power source VSS, and the other of the source and the drain thereof is connected to one electrode of the capacitor 553, the gate of the transistor 552, and an output terminal of the circuit 561, that is to the node P. One of the source and the drain of the transistor 552 is connected to the input terminal 52 and the other of the source and the drain thereof is connected to an output terminal of the circuit 562, the other electrode of the capacitor 553, and the output terminal 55. The input terminal 53 is connected to an input terminal of the circuit 561 and a first input terminal of the circuit 562. The input terminal 54 is connected to a second input terminal of a first transistor in the circuit 562.

It is to be noted that the gate of the transistor 551 and the other of the source and the drain of the transistor 552 may be connected to a power source line, for example, to a power source line such as the positive power source VDD and the negative power source VSS, another power source line, or another signal line. Further, the other of the source and the drain of the transistor 551 may be connected to a signal line, for example, to a signal line such as CK1, CK2, CK3, and SSP, another signal line, or another power source line.

Next, a configuration example of the circuit 561 shown in FIG. 56 is described with reference to FIG. 60A.

Figure 60A:
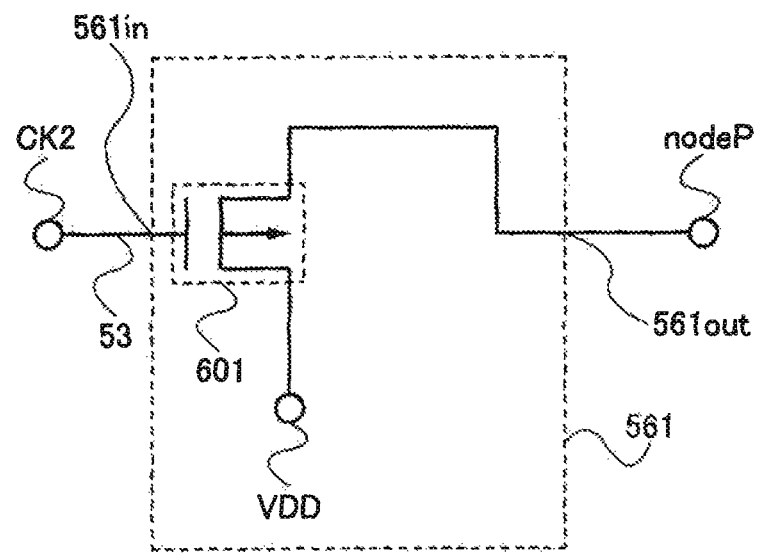
FIGS. 60A and 60B are diagrams showing Embodiment Mode 2.

The input terminal 53 and the node P in the circuit 561 shown in FIG. 60A are similar to those in FIG. 55. The transistor 601 is a p-channel transistor formed of an amorphous semiconductor, a polycrystal semiconductor, or a single crystal semiconductor.

Connections in the circuit shown in FIG. 60A are described. A gate of the transistor 601 is connected to the input terminal 53, one of a source and a drain thereof is connected to VDD, and the other of the source and the drain thereof is connected to a node P.

An operation of the circuit shown in n FIG. 60A is described. The transistor 601 is turned on when CK2 inputted from the input terminal 53 is Low, thereby VDD is outputted to the node P, whereas the transistor 601 is turned off when CK2 is High, thereby nothing is outputted to the node P. In this manner, the circuit 561 has a function to output High when CK2 is Low and of which output becomes a floating state when CK2 is High. Further, another circuit configuration having the same function may be employed instead of the aforementioned circuit configuration.

It is to be noted that one of the source and the drain of the transistor 601 may be connected to a signal line, for example, to a signal line such as CK1, CK2, CK3, and SSP, another signal line, or another power source line. Further, a gate of the transistor 601 may be connected to a power source line, for example, to a power source line such as the positive power source VDD and the negative power source VSS, another power source line, or another signal line.

A configuration example of the circuit 562 shown in FIG. 56 is described with reference to FIG. 60B.

Figure 60B:
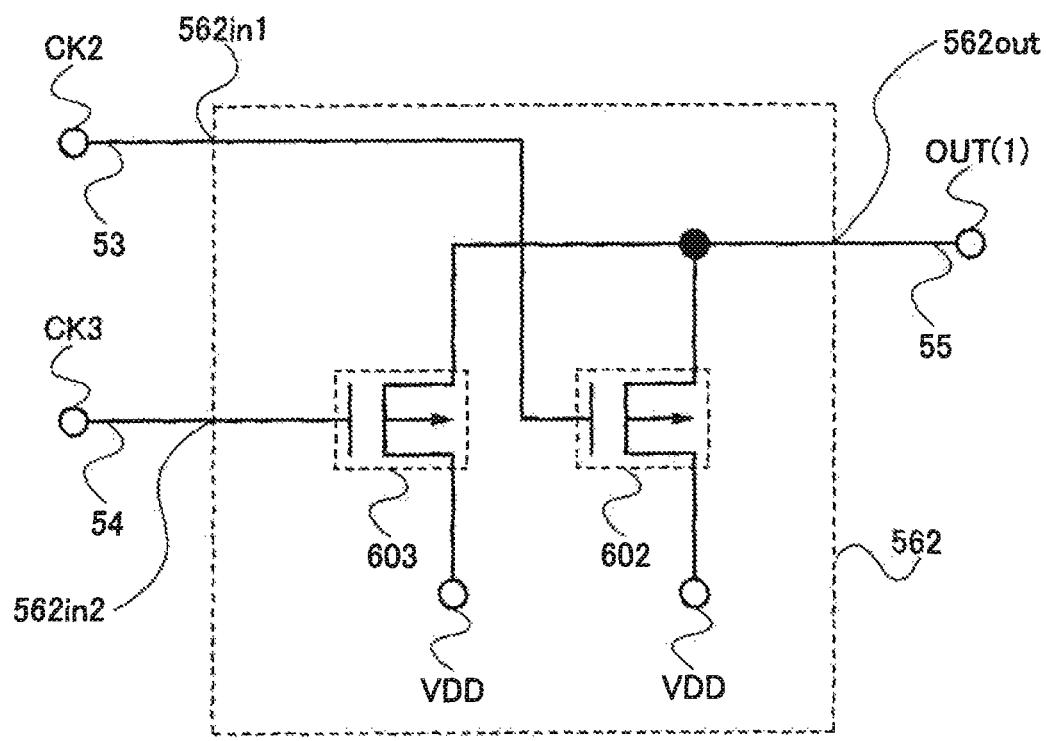

In the circuit 562 shown in FIG. 60B, the input terminals 53 and 54 and the output terminal 55 are similar to those in FIG. 55. Transistors 602 and 603 are p-channel transistors formed of an amorphous semiconductor, a polycrystal semiconductor, or a single crystal semiconductor.

An operation of the circuit shown in FIG. 60B is described. The transistor 602 is turned on when CK2 inputted from the input terminal 53 is Low, thereby VDD is outputted to the output terminal 55, whereas the transistor 602 is turned off when CK2 is High, thereby nothing is outputted to the output terminal 55. The transistor 603 is turned on when CK3 inputted from the input terminal 54 is Low, thereby VDD is outputted to the output terminal 55, whereas nothing is outputted to the output terminal 55 when CK3 is High. In this manner, the circuit 562 has a function to output High when CK2 and CK3 are Low, and of which output becomes a floating state when CK2 and CK3 are High. Further, another circuit configuration having the same function may be employed instead of the aforementioned circuit configuration.

It is to be noted that one of the source and the drain of the transistor 592 may be connected to a signal line, for example, to a signal line such as CK1, CK2, CK3, and SSP, another signal line, or another power source line. Further, a gate of the transistor 592 may be connected to a power source line, for example, to a power source line such as the positive power source VDD and the negative power source VSS, another power source line, or another signal line.

Next, a configuration example of the circuit 61 shown in FIG. 6 is described with reference to FIG. 7A.

Figure 7A:
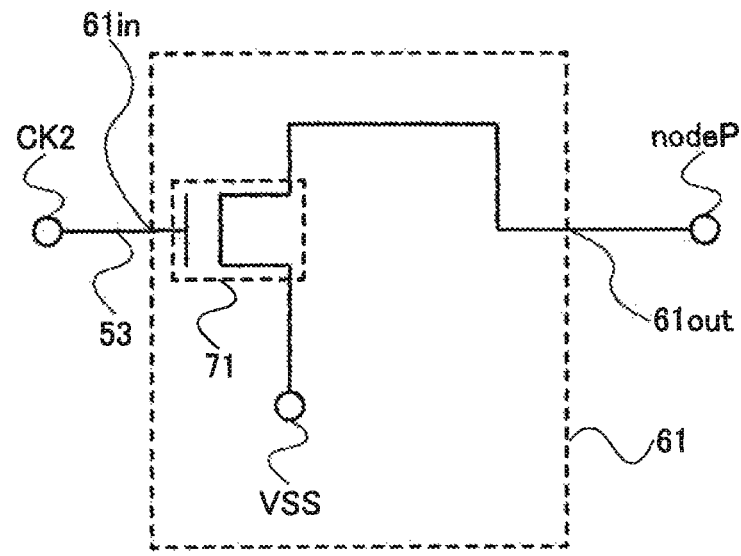
FIGS. 7A and 7B are diagrams showing Embodiment Mode 2.

As shown in the circuit 61 shown in FIG. 7A, the input terminal 53 and the node P are similar to those in FIG. 6. A transistor 71 is an n-channel transistor formed of an amorphous semiconductor, a polycrystal semiconductor, or a single crystal semiconductor.

Connections of the circuit shown in FIG. 7A are described. A gate of the transistor 71 is connected to the input terminal 53, one of a source and a drain thereof is connected to VSS, and the other of the source and the drain is connected to a node P.

An operation of the circuit shown in FIG. 7A is described. The transistor 71 is turned on when CK2 inputted from the input terminal 53 is High, thereby VSS is outputted to the node P, whereas the transistor 71 is turned off when CK2 is Low, thereby nothing is outputted to the node P. In this manner, the circuit 71 has a function to output Low when CK2 is High and of which output becomes a floating state when CK2 is Low. Further, another circuit configuration having the same function may be employed instead of the aforementioned circuit configuration.

One of the source and the drain of the transistor 71 may be connected to a signal line, for example, to a signal line such as CK1, CK2, CK3, and SSP, another signal line, or another power source line. The gate of the transistor 71 may be connected to a power source line, for example, a power source line such as the positive power source VDD and the negative power source VSS, another power source line, or another signal line.

A configuration example of the circuit 62 shown in FIG. 6 is described with reference to FIG. 7B.

Figure 7B:
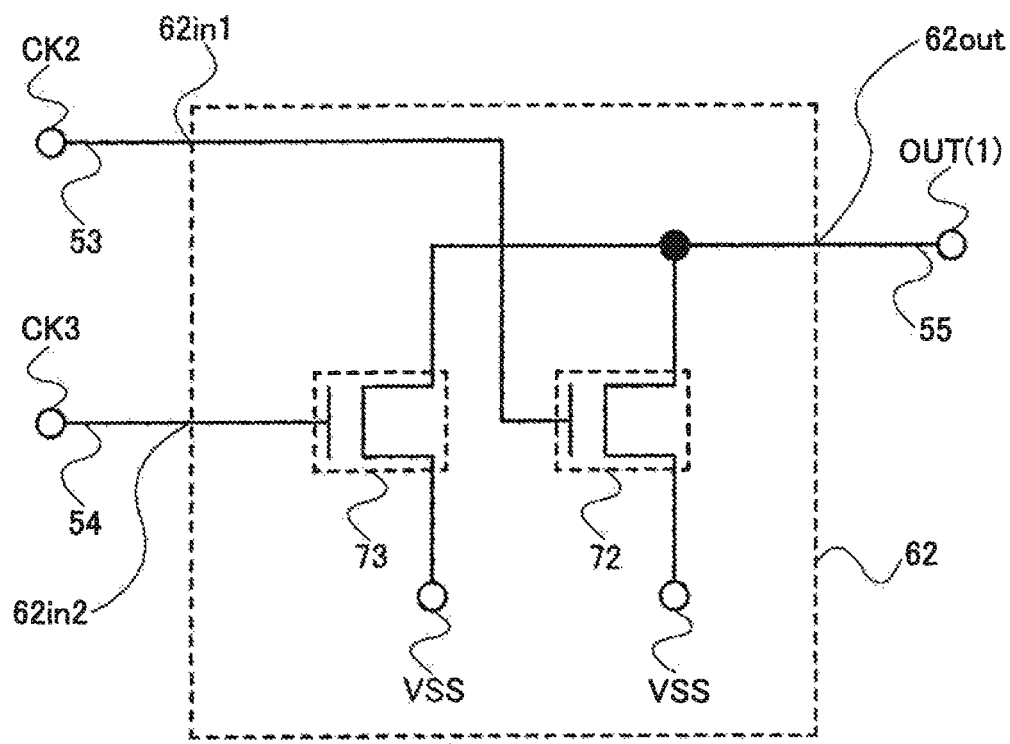

As shown in the circuit 62 shown in FIG. 7B, the input terminal 53, the input terminal 54, and OUT(1) are similar to those in FIG. 6. Transistors 72 and 73 are n-channel transistors formed of an amorphous semiconductor, a polycrystal semiconductor, or a single crystal semiconductor.

Connections of the circuit shown in FIG. 7B are described. A gate of the transistor 72 is connected to the input terminal 53, one of a source and a drain thereof is connected to VSS, and the other of the source and the drain thereof is connected to the output terminal 55. A gate of the transistor 73 is connected to the input terminal 54, one of a source and a drain thereof is connected to VSS, and the other of the source and the drain is connected to the output terminal 55. It is needless to say that one of the source and the drain of the transistors 72 and 73 may be connected to a wire having VSS, to which one of the source and the drain of the transistor 71 is connected.

An operation of the circuit shown in FIG. 7B is described. The transistor 72 is turned on when CK2 inputted from the input terminal 53 is High, thereby VSS is outputted to OUT(1), whereas the transistor 72 is turned off when CK2 is Low, thereby nothing is outputted to OUT(1). The transistor 73 is turned on when CK3 inputted from the input terminal 54 is High, thereby VSS is outputted to OUT(1), whereas the transistor 73 is turned off when CK3 is Low, thereby nothing is outputted to OUT(1). In this manner, the circuit 62 has a function to output Low to OUT(1) when either of CK2 or CK3 is High and of which output becomes a floating state when CK2 and CK3 are Low. Further, another circuit configuration having the same function may be employed instead of the aforementioned circuit configuration.

It is to be noted that one of the source and the drain of each of the transistor 72 and the transistor 73 may be connected to a signal line, for example, to a signal line such as CK1, CK2, CK3, and SSP, another signal line, or another power source line. Further, a gate of the transistor 72 may be connected to a power source line, for example, to a power source line such as the positive power source VDD and the negative power source VSS, another power source line, or another signal line. A gate of the transistor 73 may be connected to a power source line, for example, to a power source line such as the positive power source VDD and the negative power source VSS, another power source line, or another signal line.

That is, in the configurations shown in FIGS. 6 and 7, a first transistor (the transistor 31), a second transistor (the transistor 32), a third transistor (the transistor 71), a fourth transistor (the transistor 72), and a fifth transistor (the transistor 73) are provided. One of a source and a drain of the first transistor is connected to a first wire (VDD), the other of the source and the drain is connected to the gate electrode of the second transistor and the other of a source and a drain of the third transistor, a gate electrode of the first transistor is connected to a fifth wire (the input terminal 51), one of a source and a drain of the second transistor is connected to a third wire (the input terminal 52), the other of the source and the drain is connected to a sixth wire (the output terminal 55), one of the source and the drain of the third transistor is connected to a second wire (VSS), the other of the source and the drain thereof is connected to a gate electrode of the second transistor, a gate electrode of the third transistor is connected to a fourth wire (the input terminal 53), one of a source and a drain of the fourth transistor is connected to the second wire (VSS), the other of the source and the drain of the fourth transistor is connected to a sixth wire (the output terminal 55), and a gate electrode thereof is connected to the fourth wire (the input terminal 53), one of a source and a drain of the fifth transistor is connected to the second wire (VSS), the other of the source and the drain thereof is connected to the sixth wire (the output terminal 55), and a gate electrode thereof is connected to a seventh wire (the input terminal 54). Further, one of the source and the drain of the first transistor may be connected to a fifth wire (the input terminal 51).

In the shift register circuit as described above, VSS can be supplied to the output terminal 55 as either of CK2 or CK3 becomes High. That is, by inputting VSS at regular intervals in a non-selection period, a noise can be reduced. Moreover, as there is no transistor which is stationary on, characteristics deterioration of the transistor can be suppressed. In addition, as compared to Embodiment Mode 1, VSS can be supplied to the output terminal 55 for a period twice as long, as shown in the non-selection period. Therefore, a noise can be further suppressed.

Hereinafter described are some configuration examples and operation examples of this embodiment mode, which are variable. The configuration examples and the operation examples described below can be applied to "SUMMARY OF THE INVENTION", embodiment modes, and embodiments. The configuration example and the operation example described in Embodiment Mode 1 can be applied to this embodiment mode.

As shown in FIG. 6, a capacitor may be provided between the node P, and VSS or VDD. By connecting the capacitor, a potential of the node P can be stabilized.

In FIG. 6, the capacitor 33 is connected for a boot strap operation. However, if there is capacitance between the gate and the other of the source and the drain of the transistor 32, or the like, which is large enough for the boot strap operation, the capacitor 33 is not always required to be provided. Moreover, the capacitor 33 may be formed anywhere. For example, the capacitor may be formed between an amorphous semiconductor layer and a gate wiring layer or between a semiconductor layer and a wire. It is advantageous to form a capacitor between a semiconductor layer and a gate wiring layer since the capacitor can be formed with a thin GI film (gate insulating film) interposed therebetween regardless of a bottom gate transistor or a top gate transistor, which enables to obtain more capacitance with a smaller area.

It is to be noted in FIG. 6 that the circuit 61 is not always required. That is, as VSS is outputted at regular intervals by the circuit 62, the transistor 32 is to be turned off even when the node P has a noise. As a result, the number of elements can be reduced. At that time, a capacitor may be connected between the node P, and VSS or VDD.

An output of the circuit 50 of a stage may be inputted to the input terminal of the circuit 62, an output of the circuit 50 of a following stage may be inputted to the input terminal of the circuit 35 similarly, or an output of the circuit 50 of a following stage may be inputted to the input terminals of the circuits 61 and 62. By using the output of the circuit 50 of a following stage, the signal can be synchronized not only with a control signal but with an actual output of the shift register as well; therefore, there is an advantage in that a potential can be changed in accordance with an operation of the shift register circuit.

As shown in FIG. 6, a capacitor may be connected between the node P, and VSS or VDD. By connecting the capacitor, a potential of the node P can be stabilized.

Embodiment Mode 3

In this embodiment mode, description is made with reference to FIGS. 2, 5, and 8 to 10 of a configuration and an operation of a shift register circuit in which a noise in an output voltage in a non-selection period is reduced by outputting VSS in the non-selection period.

The configuration of the shift register circuit shown in FIG. 5 and an operation thereof can be similar to those described in Embodiment Mode 2.

Figure 8:
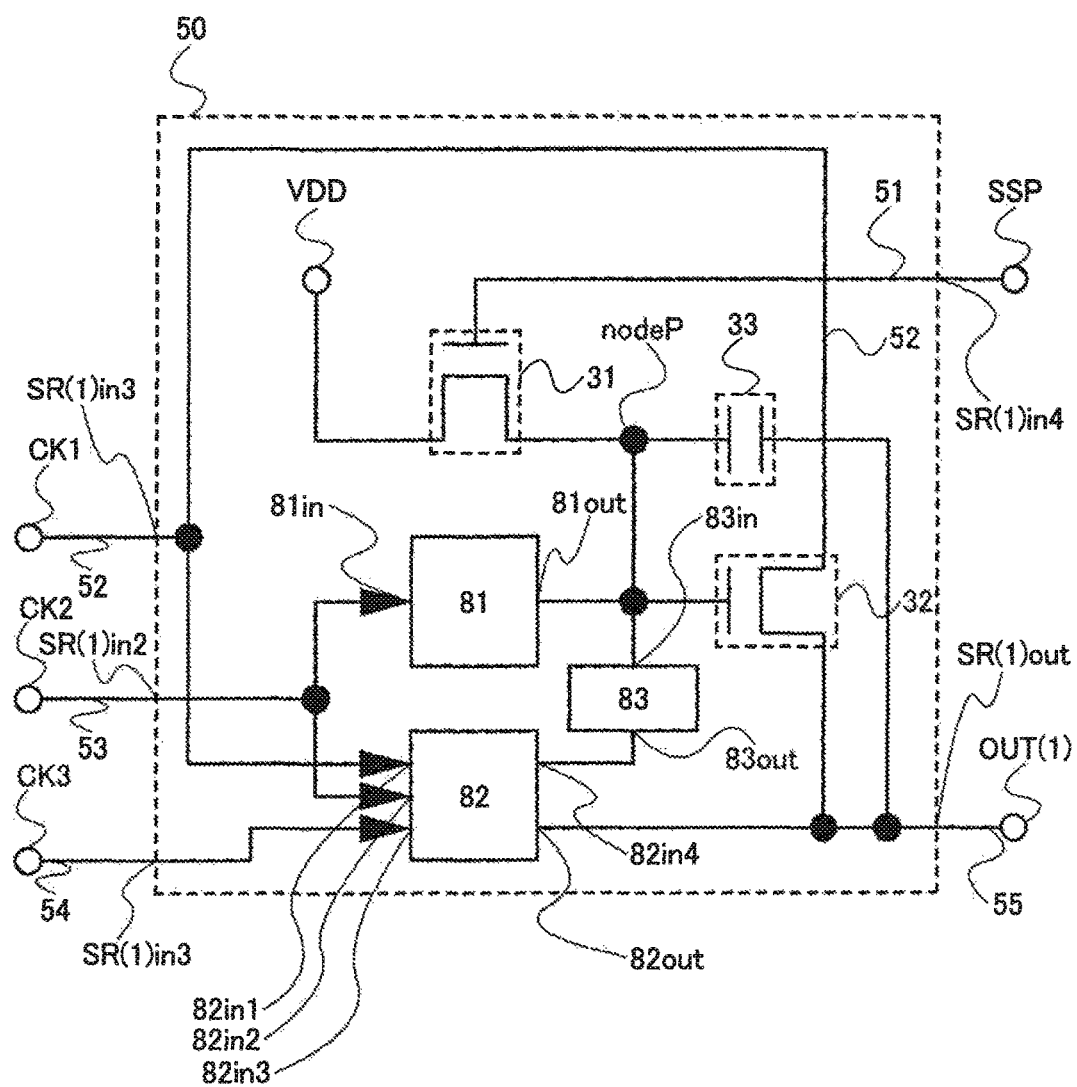
FIG. 8 is a diagram showing Embodiment Mode 3.

Description is made of a configuration of SR(1) as the circuit 50 of a first stage with reference to FIG. 8. The circuit 50 shown in FIG. 8 is configured with the input terminal 51, the input terminal 52, the input terminal 53, the input terminal 54, the output terminal 55, the transistor 31, the transistor 32, the capacitor 33, a circuit 81, a circuit 82, and a circuit 83.

The input terminal 51, the input terminal 52, the input terminal 53, the input terminal 54, the output terminal 55, the transistor 31, the transistor 32, and the capacitor 33 are similar to those shown in FIG. 5.

The circuit 81 has a function to output Low to a node P when CK2 is High and of which output becomes a floating state when CK2 is Low. The circuit 82 has a function to output Low to the output terminal 55 when an output of the circuit 83 is High and any one of CK1, CK2, and CK3 is High, and of which output becomes a floating state when CK1, CK2, and CK3 are Low. The circuit 83 has a function to output Low to the circuit 82 when a potential of the node P is around VDD or equal to or higher than VDD and output High to the circuit 82 when the potential of the node P is VSS.

Connections of a circuit shown in FIG. 8 are described. The gate of the transistor 31 is connected to the input terminal 51, one of the source and the drain thereof is connected to VDD, and the other of the source and the drain thereof is connected to one electrode of the capacitor 33, the gate of the transistor 32, an input terminal of the circuit 83, and an output terminal of the circuit 81, that is to the node P. One of the source and the drain of the transistor 32 is connected to the input terminal 52, the other of the source and the drain is connected to an output terminal of the circuit 82, the other terminal of the capacitor 33, and the output terminal 55. The input terminal 52 is connected to an input terminal of the circuit 82, the input terminal 53 is connected to an input terminal of the circuit 81 and the input terminal of the circuit 82. The input terminal 54 is connected to the input terminal of the circuit 82. An output terminal of the circuit 83 is connected to the input terminal of the circuit 82.

Description is made of an operation of the circuit shown in FIG. 8 in the periods T1, the period T2, and the period T3 separately with reference to the timing chart of this embodiment mode shown in FIG. 2. Moreover, potentials of the node P and OUT(1) are VSS in an initial state.

In the period T1, SSP becomes High, CK1 becomes Low, CK2 becomes Low, and CK3 becomes High. A gate potential of the transistor 31 at this time is VDD, that of one of the source and the drain thereof is VDD, and that of the other of the source and the drain thereof is VSS. Therefore, the transistor 31 is turned on and the potential of the node P starts rising from VSS. The rise of the potential of the node P stops when it becomes a potential lower than VDD by a threshold voltage of the transistor 31, thereby the transistor 31 is turned off. A potential of the node P at this time is Vn1. Further, as CK2 is Low, the output of the circuit 81 is in a floating state. Therefore, as a charge is not supplied to the node P, the node P becomes a floating state. As the circuit 83 outputs Low, CK1 is Low, CK2 is Low, and CK3 is High, the circuit 82 outputs Low. A gate potential of the transistor 32 at this time is Vn1, a potential of one of the source and the drain thereof is VSS, and the other of the source and the drain thereof is VSS, thus the transistor 32 is on. However, as the potential of one of the source and the drain and the potential of the other thereof are the same, there is no move in charge, thereby no current flows and no potential changes. The capacitor 33 holds a potential difference between VSS as the potential of the output terminal 55 and Vn1 as the potential of the node P.

In the period T2, SSP becomes Low, CK1 becomes High, CK2 becomes Low, and CK3 becomes Low. The gate potential of the transistor 31 at this time is VSS, that of one of the source and the drain thereof is VDD, and that of the other of the source and the drain thereof is Vn1, thereby the transistor 31 is turned off. As CK2 is Low, the output of the circuit 61 becomes a floating state. As a potential of the node P is Vn1, the circuit 83 outputs Low to the input terminal of the circuit 82. As the output of the circuit 83 is Low, CK1 is High, CK2 is Low, and CK3 is Low, the output of the circuit 82 becomes a floating state. The gate potential of the transistor 32 at this time is Vn1, that of one of the source and the drain thereof is VDD, and that of the other of the source and the drain thereof, that is a potential of the output terminal 55 becomes VSS, thereby the transistor 32 is turned on and the potential of the output terminal 55 starts rising. Then, the capacitor 33 which is connected between the gate and the other of the source and the drain of the transistor 32 holds the potential difference held in the period T1 as it is; therefore, when a potential of the other of the source and the drain rises, a gate voltage rises at the same time. A potential of the node P is Vn2 at this time. When the potential of the node P rises as high as the sum of VDD and a threshold voltage of the transistor 32, the rise of the potential of the output terminal 55 stops at VDD which is the same as CK1. In other words, by the boot strap operation, the potential of the output terminal 55 can be raised as high as VDD which is a High potential of CK1.

In the period T3, SSP is Low, CK1 is Low, CK2 is High, and CK3 is Low. At this time, the potential of the node P becomes VSS as CK2 is High and VSS is outputted from the circuit 81, thereby the circuit 83 outputs High to the input terminal of the circuit 82. The potential of OUT(1) becomes VSS as VSS is outputted from the circuit 82. The gate potential of the transistor 31 at this time becomes VSS, that of one of the source and the drain becomes VDD, and that of the other of the source and the drain thereof becomes VSS, thereby the transistor 31 is turned off. The gate potential of the transistor 32 becomes VSS, that of one of the source and the drain thereof becomes VSS, and that of the other of the source and the drain becomes VSS, thereby the transistor 32 is turned off.

By the operations in the periods T1, T2, and T3 described above, OUT(1) is outputted in the period T2 when SSP is inputted in the period T1. That is, the shift register is configured by connecting n stages of the circuits 50 each of which outputs SSP with a shift of one-third of the cycle of the clock signal.

Figure 53:
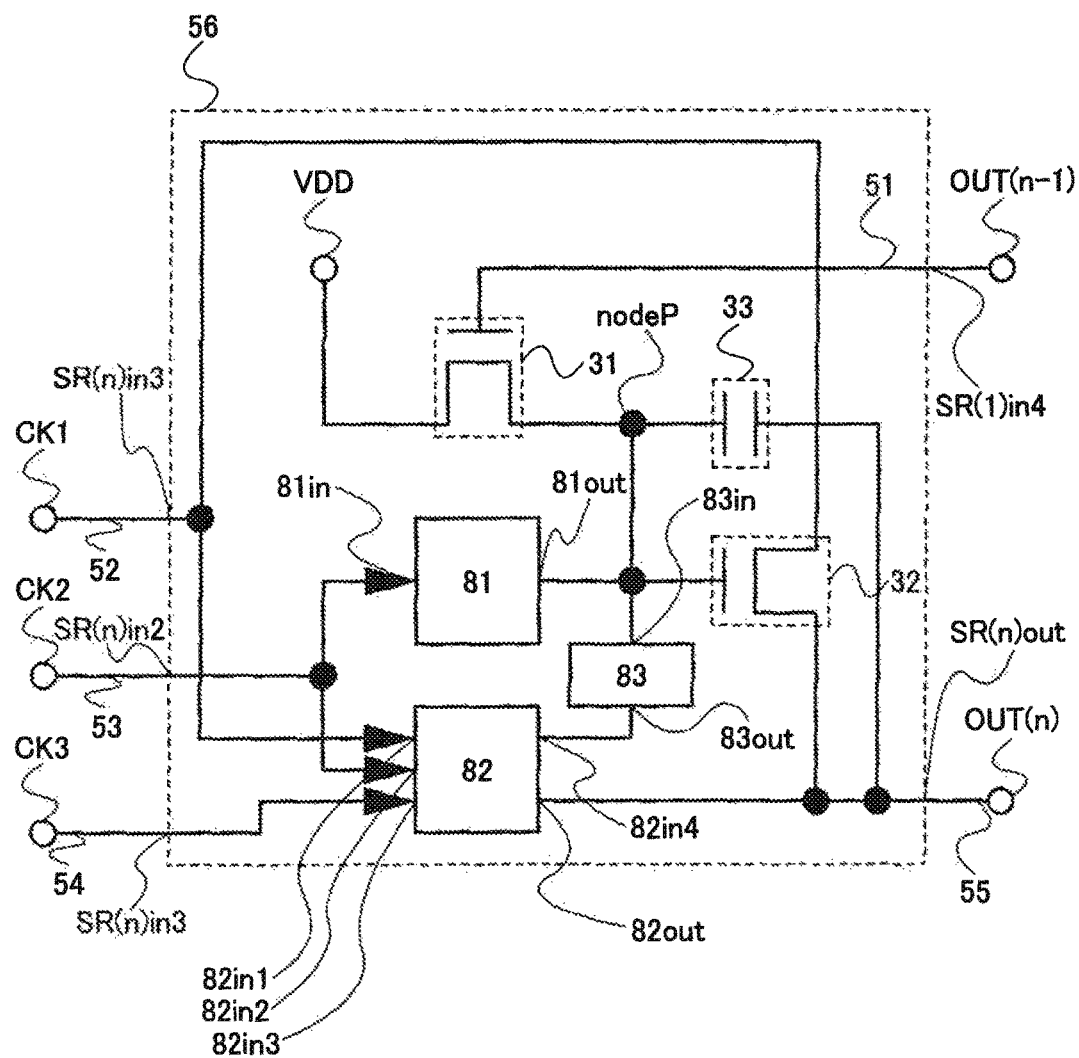
FIG. 53 is a diagram showing Embodiment Mode 3.

The description has been made of the circuit 50 of the first stage shown in FIG. 8, but now description is made of the circuit of the n-th stage with reference to FIG. 53.

In FIG. 53, the transistors 31 and 32, the capacitor 33, the circuits 81, 82, and 83, the input terminals 51, 52, 53, and 54, and the output terminal 55 are similar to those shown in FIG. 8. A feature of the circuit is that an input signal inputted from the input terminal 51 is connected to the output terminal 55 of a circuit of a preceding stage.

The transistors used in the shift register circuit shown in FIG. 8 are all n-channel transistors, thus forming a unipolar circuit, however, only p-channel transistors may be used as well. It is needless to say that a p-channel transistor and an n-channel transistor may be used in combination. A shift register circuit where all the transistors are p-channel transistors is described with reference to FIG. 57.

Figure 57:
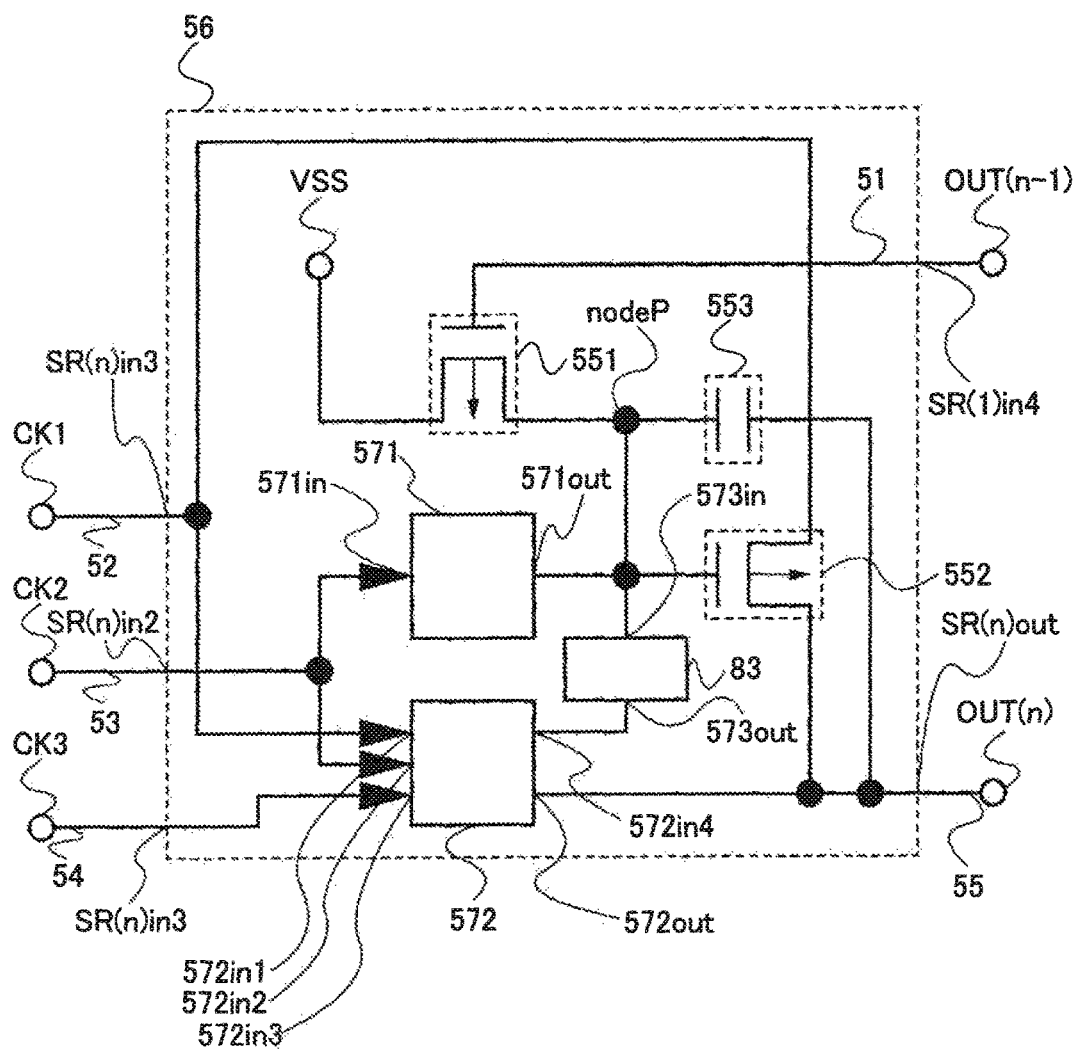
FIG. 57 is a diagram showing Embodiment Mode 3.

In a circuit configuration shown in FIG. 57, the positive power source VDD, the negative power source VSS, the input terminals 51, the input terminal 52, the input terminal 53, the input terminal 54, the transistor 551, the transistor 552, and the capacitor 553 can be similar to those in FIG. 55. A circuit 571 has a function to output High to the node P when CK2 is Low and of which output becomes a floating state when CK2 is High. A circuit 572 outputs High to the output terminal 55 when any one of CK1, CK2, and CK3 is Low.

Connections of a circuit shown in FIG. 57 are described. The gate of the transistor 551 is connected to the input terminal 51, one of the source and the drain thereof is connected to the positive power source VSS, the other of the source and the drain thereof is connected to one electrode of the capacitor 553, the gate of the transistor 552, and the output terminal of the circuit 571, that is to the node P. One of the source and the drain of the transistor 552 is connected to the input terminal 52, the other of the source and the drain thereof is connected to an output terminal of the circuit 572, the other electrode of the capacitor 553, and the output terminal 55. The input terminal 52 is connected to an input terminal of the circuit 572. The input terminal 53 is connected to an input terminal of the circuit 571 and a first input terminal of the circuit 572. The input terminal 54 is connected to a second input terminal of a first transistor in the circuit 572.

It is to be noted that the gate of the transistor 551 and the other of the source and the drain of the transistor 552 may be connected to a power source line, for example, to a power source line such as a positive power source VDD and a negative power source VSS, another power source line, or another signal line. Further, the other of the source and the drain of the transistor 551 may be connected to a signal line, for example, to a signal line such as CK1, CK2, CK3, and SSP, another signal line, or another power source line.

Next, a configuration example of the circuit 81 shown in FIG. 8 is described with reference to FIG. 9A.

Figure 9A:
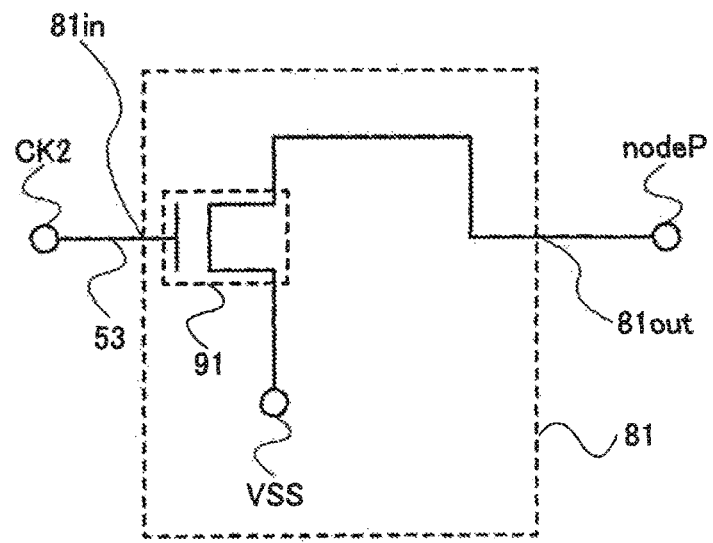
FIGS. 9A and 9B are diagrams showing Embodiment Mode 3.

In the circuit 81 shown in FIG. 9A, the input terminal 53 and the node P are similar to those in FIG. 8. A transistor 91 is an n-channel transistor formed of an amorphous semiconductor, a polycrystal semiconductor, or a single crystal semiconductor.

Connections of the circuit shown in FIG. 9A are described. A gate of the transistor 91 is connected to the input terminal 53, one of a source and a drain thereof is connected to VSS, and the other of the source and the drain thereof is connected to a node P.

Figure 61A:
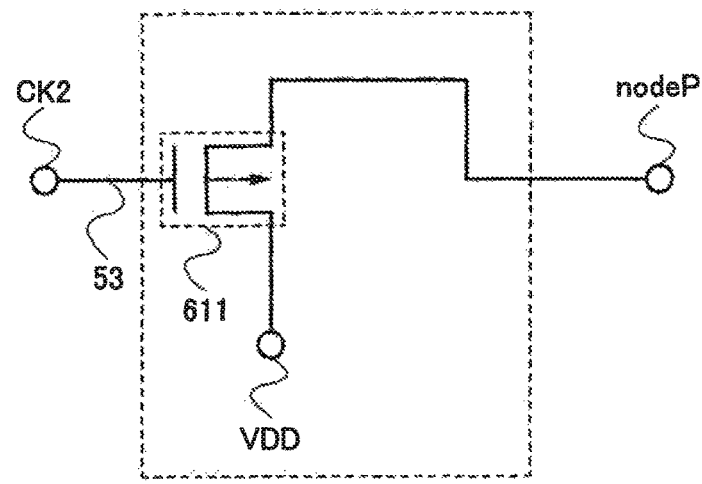
FIGS. 61A and 61B are diagrams showing Embodiment Mode 3.
Figure 61B:
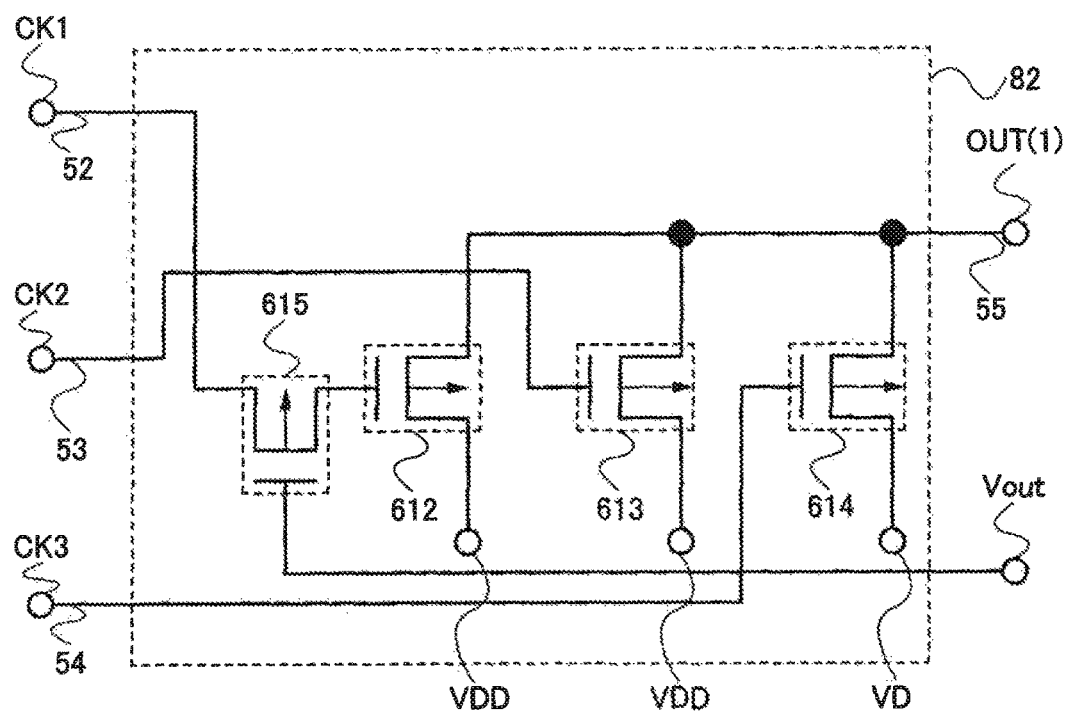

An operation of the circuit shown in FIG. 9A is described. The transistor 91 is turned on when CK2 inputted from the input terminal 53 is High, thereby VSS is outputted to the node P, whereas the transistor 91 is turned off when CK2 is Low, thereby nothing is outputted to the node P. In this manner, the circuit 91 has a function to output Low when CK2 is High and of which output becomes a floating state when CK2 is Low. Further, another circuit configuration having the same function may be employed instead of the aforementioned circuit configuration. FIG. 61 shows a configuration example of the case where a p-channel transistor is used. Such a change can be easily accomplished by those skilled in the art.

It is to be noted that one of the source and the drain of the transistor 91 may be connected to a signal line, for example, to a signal line such as CK1, CK2, CK3, and SSP, another signal line, or another power source line. Further, a gate of the transistor 91 may be connected to a power source line, for example, to a power source line such as a positive power source VDD and a negative power source VSS, another power source line, or another signal line.

Next, a configuration example of the circuit 82 shown in FIG. 8 is described with reference to FIG. 9B.

Figure 9B:
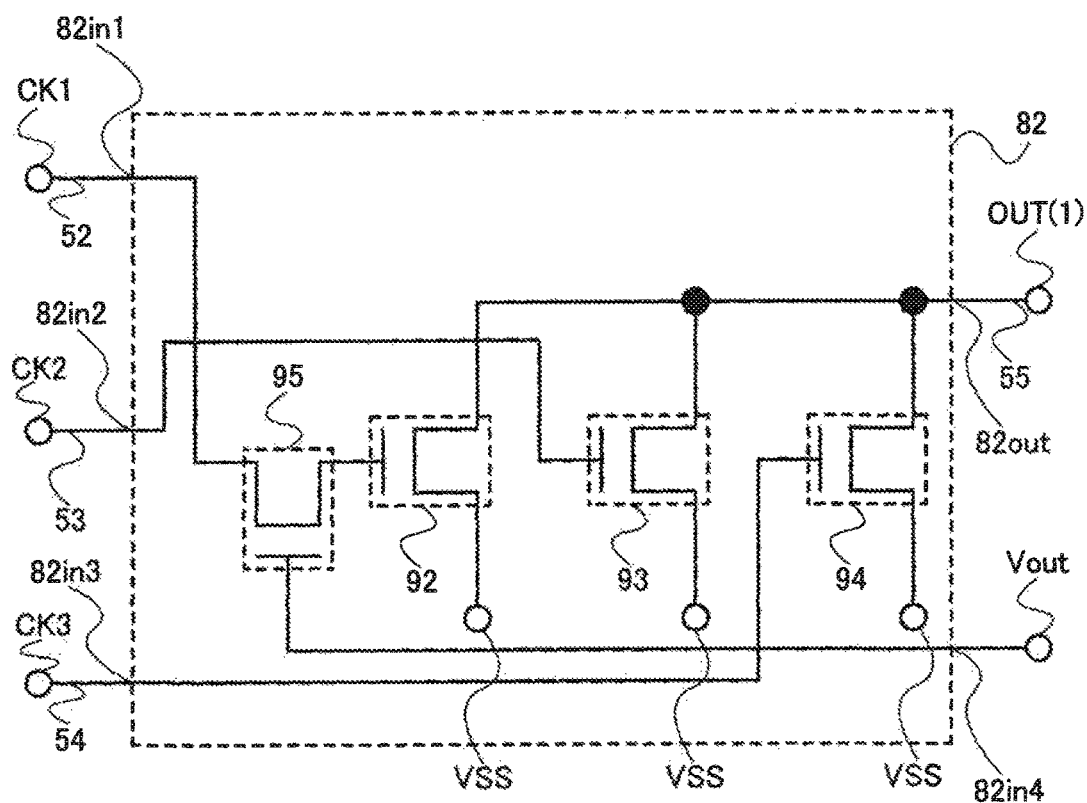

In the circuit 82 shown in FIG. 9B, the input terminals 52, 53, and 54, and OUT(1) are similar to those in FIG. 8. Transistors 92, 93, 94, and 95 are n-channel transistors formed of an amorphous semiconductor, a polycrystal semiconductor, or a single crystal semiconductor. Vout is an output of the circuit 82.

Connections of the circuit shown in FIG. 9B are described. A gate of the transistor 95 is connected to Vout, one of a source and a drain thereof is connected to the input terminal 52, and the other of the source and the drain thereof is connected to the gate of a transistor 92. One of a source and a drain of the transistor 92 is connected to VSS and the other of the source and the drain thereof is connected to the output terminal 55. A gate of the transistor 93 is connected to the input terminal 53, one of a source and a drain thereof is connected to VSS, and the other of the source and the drain thereof is connected to the output terminal 55. A gate of the transistor 94 is connected to the input terminal 54, one of a source and a drain thereof is connected to VSS, and the other of the source and the drain thereof is connected to the output terminal 55.

An operation of the circuit shown in FIG. 9B is described. The transistor 95 is turned on when Vout is inputted from the output of the circuit 82 is High, thereby CK1 is transmitted to the gate of the transistor 92, whereas the transistor 95 is turned off when Vout is Low, thereby CK1 is not transmitted to the gate of the transistor 92, which remains in the former state. Here, when the transistor 95 is turned on and CK1 inputted from the input terminal 52 is High, the transistor 92 is turned on and outputs VSS to OUT(1), whereas the transistor 92 is turned off when CK1 is Low, thereby nothing is outputted to OUT(1). The transistor 93 is turned on when CK2 inputted from the input terminal 53 is High, thereby VSS is outputted to OUT(1), whereas the transistor 93 is turned off when CK2 is Low, thereby nothing is outputted to OUT(1). The transistor 94 is turned on when CK3 inputted from the input terminal 54 is High, thereby VSS is outputted to OUT(1), whereas the transistor 94 is turned off when CK3 is Low, thereby nothing is outputted to OUT(1). In this manner, the circuit 82 has a function to output Low to the output terminal 55 when the circuit 82 outputs High and CK1 is High, or either CK2 or CK3 is High, and of which output becomes a floating state when CK1, CK2, and CK3 are Low, and a function to output Low to the output terminal 55 when the circuit 83 outputs Low and either of CK2 or CK3 is High and of which output becomes a floating state when CK2 and CK3 are Low. Further, another circuit configuration having the same function may be employed instead of the aforementioned circuit configuration.

It is to be noted that one of the source and the drain of the transistor 92, one of the source and the drain of the transistor 93, and one of the source and the drain of the transistor 94 may be connected to a signal line, for example, to a signal line such as CK1, CK2, CK3, and SSP, another signal line, or another power source line. Further, one of the source and the drain of the transistor 95, the gate of the transistor 92, the gate of the transistor 93, and the gate of the transistor 94 may be connected to a power source line, for example, a power source line such as the positive power source VDD and the negative power source VSS, another power source line, or another signal line.

Next, a configuration example of the circuit 83 shown in FIG. 8 is described with reference to FIG. 10A.

Figures 10A, 10B:
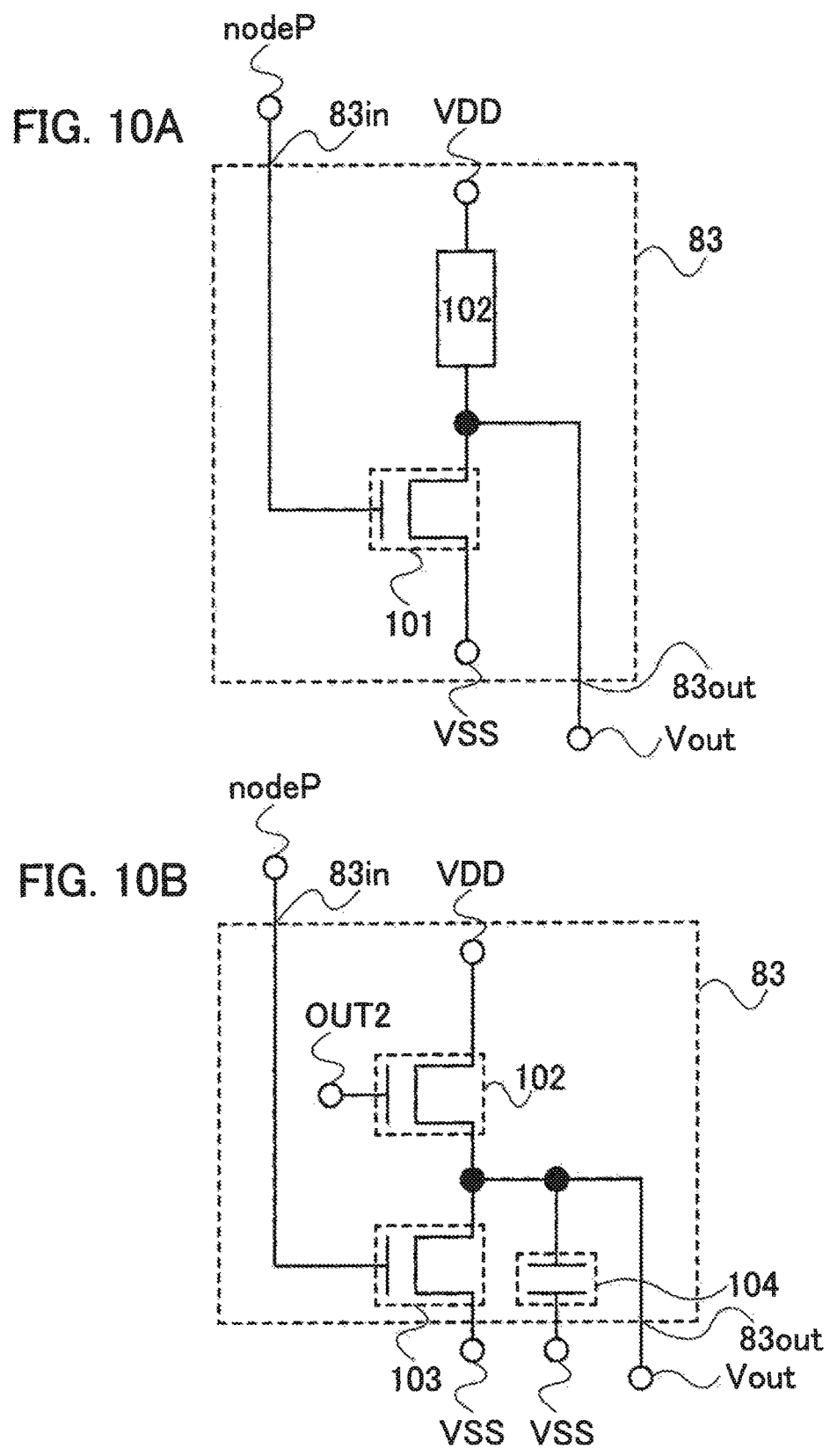

In the circuit 83 shown in FIG. 10A, a node P and Vout are similar to those in FIG. 8. A transistor 101 is an n-channel transistor formed of an amorphous semiconductor, a polycrystal semiconductor, or a single crystal semiconductor. A resistor 102 has a resistive component. Any linear element or non-linear element may be used as long as it has a resistive component. For example, a diode-connected transistor may be used.

Figure 48:
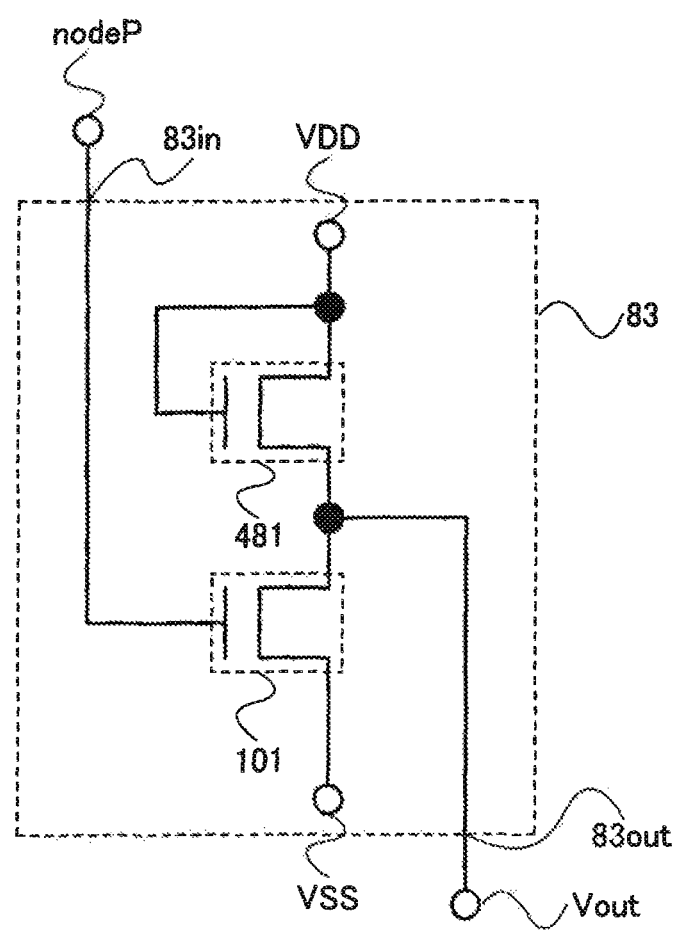
FIG. 48 is a diagram showing Embodiment Mode 3.

A configuration example in which a transistor is used as the resistor 102 is described with reference to FIG. 48. A node P, Vout, the transistor 101, the positive power source VDD, and the negative power source VSS are similar to those in FIG. 10. A transistor 481 is an n-channel transistor formed of an amorphous semiconductor, a polycrystal semiconductor, or a single crystal semiconductor. One of a source and a drain of the transistor 481 is connected to the positive power source VDD, the other of the source and the drain thereof is connected to Vout, and a gate thereof is connected to one of the source and the drain, thereby the transistor 481 is diode-connected. Vout is a potential obtained by subtracting a threshold voltage of the transistor 481 from VDD, unless a charge is supplied from VSS through the transistor 101 which is turned on. In this manner, when the node P becomes Low, the transistor 101 is turned off and the potential of Vout becomes a potential obtained by subtracting the threshold voltage of the transistor 481 from VDD, whereas the potential of Vout becomes as high as VSS when the node P becomes High and the transistor 101 is turned on.

Connections of the circuit shown in FIG. 10A are described. A gate of the transistor 101 is connected to the node P, one of a source and a drain of the transistor 101 is connected to one terminal of the resistor 102 and Vout, and the other of the source and the drain thereof is connected to VSS. The other terminal of the resistor 102 is connected to VDD.

Figure 62A:
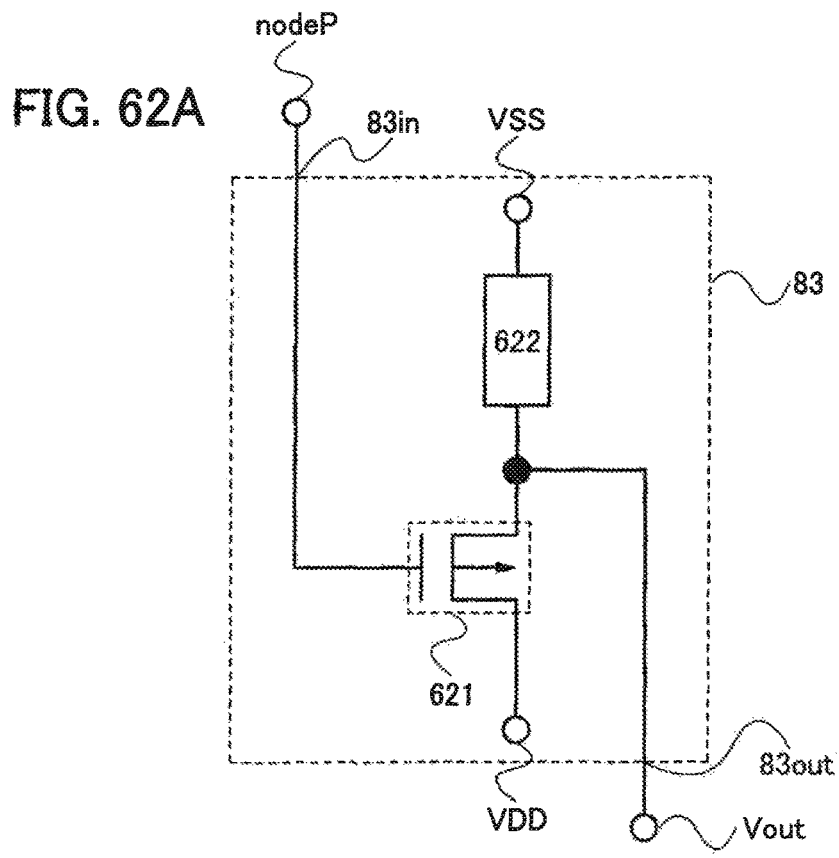
FIGS. 62A and 62B are diagrams showing Embodiment Modes 3 and 4.
Figure 62B:
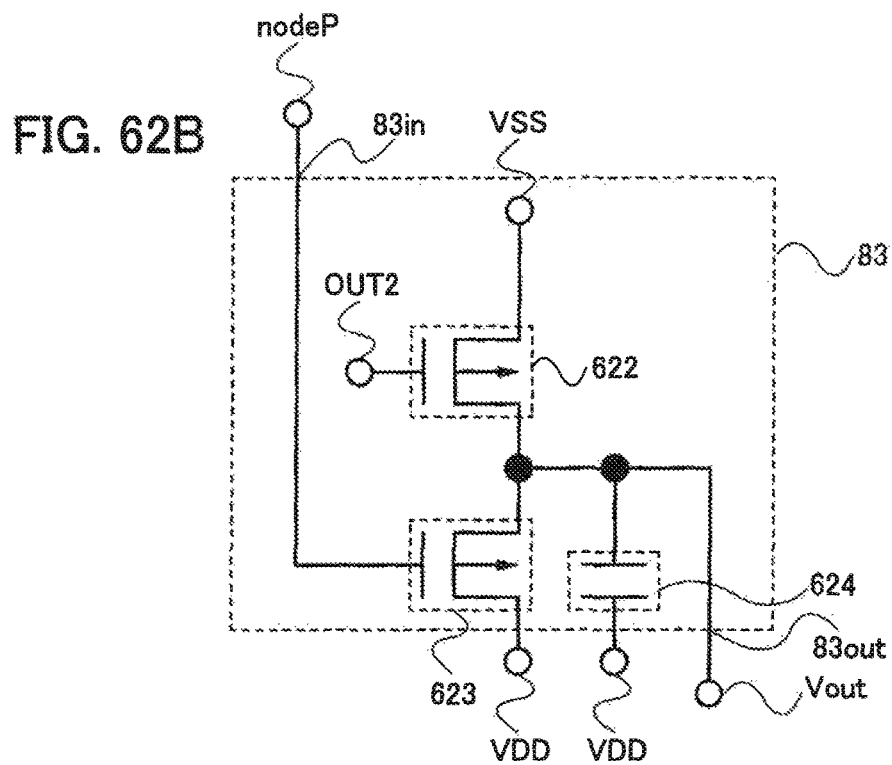

An operation of the circuit shown in FIG. 10A is described. The transistor 101 is turned on when the potential of the node P is equal to or higher than the sum of VSS and a threshold voltage of the transistor 101, thereby VSS is outputted to Vout. The transistor 101 is turned off when the potential of the node P is lower than the sum of VSS and the threshold voltage of the transistor 101, thereby VDD is outputted to Vout through the resistor 102. In this manner, the circuit 83 has a function to output Low to the input terminal of the circuit 82 when the potential of the node P is equal to or higher than the sum of VSS and the threshold voltage of the transistor 101 and output High to the input terminal of the circuit 82 when the potential of the node P is lower than the sum of VSS and the threshold voltage of the transistor 101. Further, another circuit configuration having the same function may be employed instead of the aforementioned circuit configuration. FIG. 62 shows a configuration example which corresponds to the configuration example shown in FIG. 10 using a p-channel transistor.

It is to be noted that the other of the source and the drain of the transistor 101 may be connected to a signal line, for example, to a signal line such as CK1, CK2, CK3, and SSP, another signal line, or another power source line. Further, the gate of the transistor 101 may be connected to a power source line, for example, to a power source line such as a positive power source VDD and a negative power source VSS, another power source line, or another signal line.

Another configuration example of the circuit 83 shown in FIG. 8 is described with reference to FIG. 10B.

As shown in the circuit 83 shown in FIG. 10B, the node P and Vout are similar those in FIG. 8. OUT(2) is an output of the circuit 50 of the next second stage. For example, if the circuit 83 is the circuit 50 of the n-th stage, OUT(2) thereof corresponds to an output of the circuit 50 of a (n+1)th stage. The transistors 102 and 103 are n-channel transistors formed of an amorphous semiconductor, a polycrystal semiconductor, or a single crystal semiconductor. A capacitor 104 has two electrodes.

Connections of the circuit shown in FIG. 10B are described. A gate of the transistor 102 is connected to OUT(2), one of a source and a drain thereof is connected to VDD, and the other of the source and the drain thereof is connected to one of a source and a drain of the transistor 103, one electrode of the capacitor 104, and Vout. A gate of the transistor 103 is connected to the node P and the other of the source and the drain thereof is connected to VSS. The other electrode of the capacitor 104 is connected to VSS.

An operation of the circuit shown in FIG. 10B is described. The transistor 103 is turned on when the potential of the node P is equal to or higher than the sum of VSS and the threshold voltage of the transistor 103, thereby VSS is outputted to Vout. The transistor 103 is turned off when the potential of the node P is lower than the sum of VSS and the threshold voltage of the transistor 103, thereby the output of the circuit 83 becomes a floating state. The transistor 102 is turned on when OUT(2) is High, thereby a voltage corresponding to a difference between VDD and a threshold voltage of the transistor 102 is outputted to Vout. The transistor 102 is turned off when OUT(2) is Low, thereby the output of the circuit 83 becomes a floating state. That is, Vout outputs Low when the potential of the node P is around, equal to, or higher than VDD, whereas Vout outputs High when the potential of the node P is VSS. Further, another circuit configuration having the same function may be employed instead of the aforementioned circuit configuration.

The gate of the transistor 102 and the gate of the transistor 103 may be connected to a power source line, for example, to a power source line such as the positive power source VDD and the negative power source VSS, another power source line, or another signal line. Further, the other of the source and the drain of the transistor 103 may be connected to a signal line, for example, a signal line such as CK1, CK2, CK3, and SSP, another signal line, or another power source line.

In the shift register as described above, VSS can be supplied to the output terminal 55 when any one of CK1, CK2, and CK3 is High as in a non-operation period. That is, as VSS is supplied to the output terminal 55 in the non-selection period, a potential can be stabilized, a noise can be reduced, and there is no transistor which is stationary on; therefore, characteristics deterioration can be suppressed. Further, by supplying VSS to the node P at regular intervals, the transistor 32 can be surely turned off.

Hereinafter described are some configuration examples and operation examples of this embodiment mode, which are variable. The configuration examples and the operation examples described below can be applied to "SUMMARY OF THE INVENTION", embodiment modes, and embodiments. The configuration examples and the operation examples described in Embodiment Mode 1 can be applied to this embodiment mode.

As shown in FIGS. 9A and 9B, the gate of the transistor 92 is in a floating state when the transistor 95 is off. Therefore, when the gate capacitance of the transistor 92 holding a potential is not large enough, a capacitor may be additionally connected. In that case, the capacitor is preferably connected between the gate of the transistor 92, and VDD or VSS.

As shown in FIG. 10B, the capacitor 104 is connected to Vout, however, the capacitor 104 may be omitted when an element connected to Vout has enough capacitance. By omitting the capacitor 104 connected to Vout, a faster operation can be realized.

As shown in FIG. 10B, the node P is connected to the gate of the transistor 103, however, the input terminal 51 may be connected thereto. By connecting the input terminal 51, there is no period when the transistors 102 and 103 are simultaneously turned on, and thus a through current which flows through the transistors 102 and 103 is not generated. As a result, a malfunction does not easily occur and power consumption can be reduced.

Embodiment Mode 4

In this embodiment mode, description is made with reference to FIGS. 2, 5, 11, and 12 of a configuration and an operation of a shift register circuit in which a noise of an output voltage in a non-selection period is reduced by outputting VSS at regular intervals.

A configuration and an operation of a shift register circuit shown in FIG. 5 can be similar to those described in Embodiment Mode 2.

Figure 11:
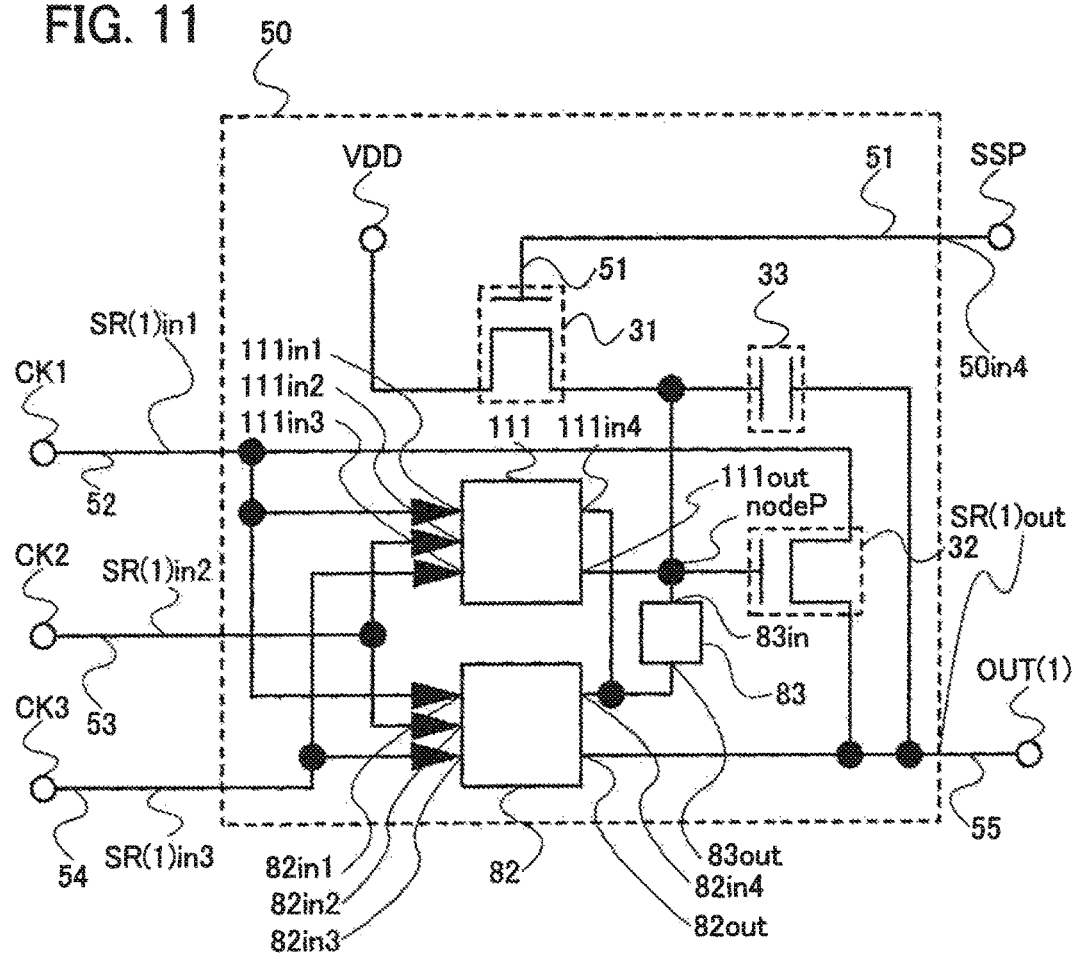
FIG. 11 is a diagram showing Embodiment Mode 4.

Description is made of a configuration of SR(1) as the circuit 50 of a first stage with reference to FIG. 11. The circuit 50 shown in FIG. 11 is configured with the input terminal 51, the input terminal 52, the input terminal 53, the input terminal 54, the output terminal 55, the transistor 31, the transistor 32, the capacitor 33, a circuit 111, the circuit 82, and the circuit 83. The input terminals 51, 52, 53, and 54, the output terminal 55, the circuits 82 and 83, the transistors 31 and 32, the capacitor 33, and the node P are similar to those shown in FIG. 8.

The circuit 111 outputs Low to the node P when the circuit 83 outputs High and any one of CK1, CK2, and CK3 is High, whereas an output thereof becomes a floating state when CK1, CK2, and CK3 are Low. The circuit 111 has a function to output Low to the node P when the circuit 83 outputs Low and CK2 is High and of which output becomes a floating state when CK2 is Low.

Connections of the circuit shown in FIG. 11 are described. The gate of the transistor 31 is connected to the input terminal 51, one of the source and the drain thereof is connected to VDD, the other of the source and the drain thereof is connected to one electrode of the capacitor 33, the gate of the transistor 32, the input terminal of the circuit 83, and the output terminal of the circuit 111, that is the node P. One of the source and the drain of the transistor 32 is connected to the input terminal 52, the other of the source and the drain thereof is connected to the output terminal of the circuit 82, the other electrode of the capacitor 33, and the output terminal 55. The input terminal 52 is connected to the input terminal of the circuit 82 and the input terminal of the circuit 111, the input terminal 53 is connected to the input terminal of the circuit 82 and the input terminal of the circuit 111, and the input terminal 54 is connected to the input terminal of the circuit 82 and the input terminal of the circuit 111. The output terminal of the circuit 83 is connected to the input terminal of the circuit 82 and the input terminal of the circuit 111.

Description is made of an operation of the circuit shown in FIG. 11 in the period T1, the period T2, and the period T3 separately with reference to the timing chart of this embodiment mode shown in FIG. 2. Moreover, potentials of the node P and OUT(1) are VSS in an initial state.

In the period T1, SSP becomes High, CK1 becomes Low, CK2 becomes Low, and CK3 becomes High. A gate potential of the transistor 31 at this time is VDD, that of one of the source and the drain thereof is VDD, and that of the other of the source and the drain thereof is VSS. Therefore, the transistor 31 is turned on and the potential of the node P starts rising from VSS. The rise of the potential of the node P stops when it becomes a potential lower than VDD by a threshold voltage of the transistor 31, thereby the transistor 31 is turned off. A potential of the node P at this time is Vn1. As the potential of the node P is Vn1, the circuit 83 outputs Low to the input terminals of the circuits 82 and 83. The output of the circuit 111 becomes a floating state as the circuit 83 outputs Low, CK1 is Low, CK2 is Low, and CK3 is High. The circuit 82 outputs Low to the output terminal 55 as the circuit 83 outputs Low, CK1 is Low, CK2 is Low, and CK3 is High. The capacitor 33 holds a potential difference between VSS as the potential of the output terminal 55 and Vn1 as the potential of the node P.

In the period T2, SSP becomes Low, CK1 becomes High, CK2 becomes Low, and CK3 becomes Low. The gate potential of the transistor 31 at this time is VSS, that of one of the source and the drain thereof is VDD, and that of the other of the source and the drain thereof is Vn1, thereby the transistor 31 is turned off. As a potential of the node P is Vn1, the circuit 83 outputs Low to the input terminal of the circuit 82 and the input terminal of the circuit 111. As the output of the circuit 83 is Low, CK1 is High, CK2 is Low, and CK3 is Low, the output of the circuit 111 becomes a floating state. As the output of the circuit 83 is Low, CK1 is High, CK2 is Low, and CK3 is Low, an output of the circuit 82 becomes a floating state. The gate potential of the transistor 32 at this time is Vn1, that of one of the source and the drain thereof is VDD, and that of the other of the source and the drain thereof, that is a potential of the output terminal 55 becomes VSS, thereby the transistor 32 is turned on and the potential of the output terminal 55 starts rising. Then, the capacitor 33 which is connected between the gate and the other of the source and the drain of the transistor 32 holds the potential difference held in the period T1 as it is; therefore, when a potential of the other of the source and the drain rises, a gate potential rises at the same time. A potential of the node P is Vn2 at this time. When the potential of the node P rises as high as the sum of VDD and a threshold voltage of the transistor 32, the rise of the potential of the output terminal 55 stops at VDD which is the same as CK1. In other words, by the boot strap operation, the potential of the output terminal 55 can be raised as high as VDD which is a High potential of CK1.

In the period T3, SSP is Low, CK1 is Low, CK2 is High, and CK3 is Low. At this time, the potential of the node P becomes VSS as CK2 is High and VSS is outputted from the circuit 111, thereby the circuit 83 outputs High to the input terminal of the circuit 82. The potential of OUT(1) becomes VSS as VSS is outputted from the circuit 82. The gate potential of the transistor 31 at this time becomes VSS, that of one of the source and the drain becomes VDD, and that of the other of the source and the drain thereof becomes VSS, thereby the transistor 31 is turned off. The gate potential of the transistor 32 becomes VSS, that of one of the source and the drain thereof becomes VSS, and that of the other of the source and the drain becomes VSS, thereby the transistor 32 is turned off.

By the operations in the periods T1, T2, and T3 described above, OUT(1) is outputted in the period T2 when SSP is inputted in the period T1. That is, the shift register circuit is configured by connecting n stages of the circuits 50 which outputs SSP with a shift of one-third of the cycle of the clock signal.

The transistors used in the shift register circuit shown in FIG. 11 are all n-channel transistors, thus forming a unipolar circuit, however, only p-channel transistors may be used as well. It is needless to say that a p-channel transistor and an n-channel transistor may be used in combination. A shift register circuit where all the transistors are p-channel transistors is described with reference to FIG. 58.

Figure 58:
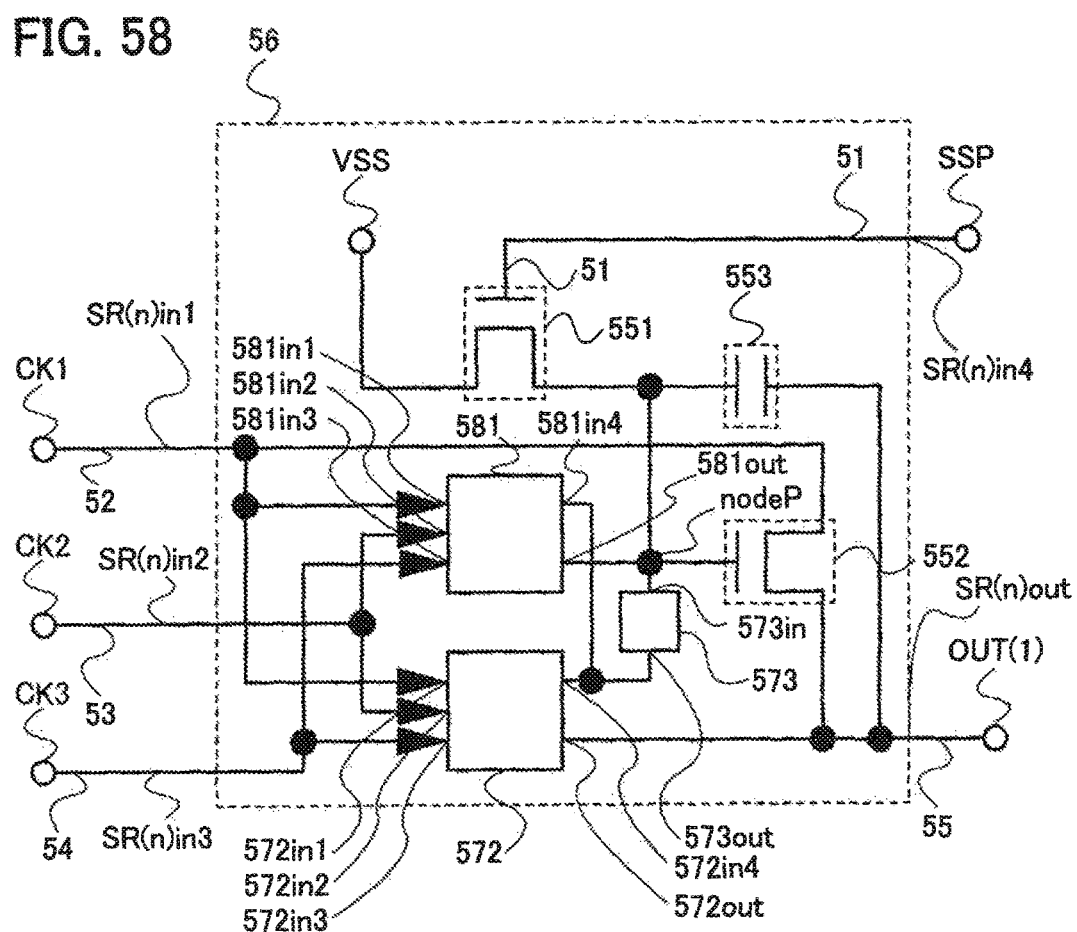
FIG. 58 is a diagram showing Embodiment Mode 4.

In a circuit configuration shown in FIG. 58, the positive power source VDD, the negative power source VSS, the input terminal 51, the input terminal 52, the input terminal 53, the input terminal 54, the transistor 551, the transistor 552, and the capacitor 553 can be similar to those in FIG. 55. The circuits 572 and 573 can be similar to those in FIG. 57. A circuit 581 outputs High to the output terminal 55 when any one of CK1, CK2, and CK3 is Low.

Connections of the circuit shown in FIG. 58 are described. The gate of the transistor 551 is connected to the input terminal 51, one of the source and the drain thereof is connected to the positive power source VSS, the other of the source and the drain thereof is connected to one electrode of the capacitor 553, the gate of the transistor 552, and the output terminal of the circuit 581, that is the node P. One of the source and the drain of the transistor 552 is connected to the input terminal 52, the other of the source and the drain thereof is connected to the output terminal of the circuit 572, the other electrode of the capacitor 553, and the output terminal 55. The input terminal 52 is connected to the input terminal of the circuit 572. The input terminal 53 is connected to the input terminal of the circuit 581 and a first input terminal of the circuit 572. The input terminal 54 is connected to a second input terminal of a first transistor of the circuit 562.

It is to be noted that the gate of the transistor 551 and the other of the source and the drain of the transistor 552 may be connected to a power source line, for example, to a power source line such as a positive power source VDD and a negative power source VSS, another power source line, or another signal line. Further, the other of the source and the drain of the transistor 551 may be connected to a signal line, for example, to a signal line such as CK1, CK2, CK3, and SSP, another signal line, or another power source line.

Figure 54:
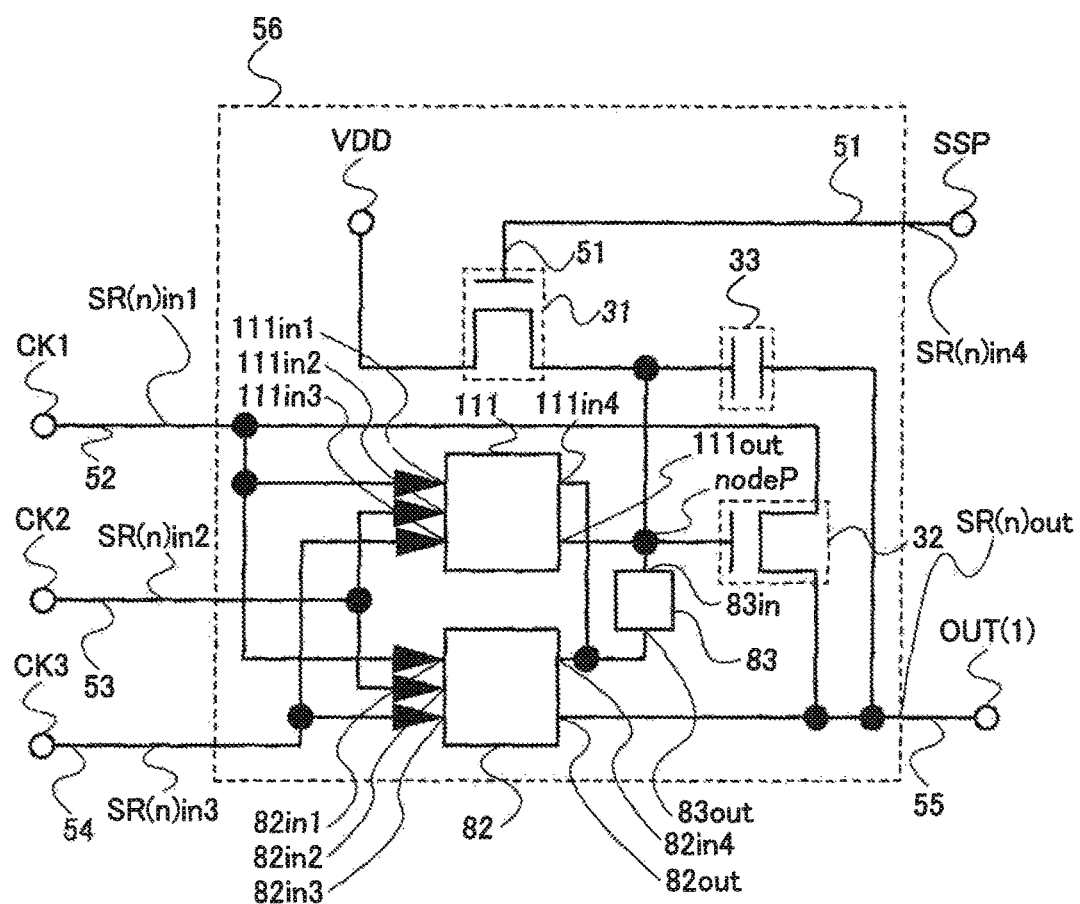
FIG. 54 is a diagram showing Embodiment Mode 4.

The description has been made of the circuit 50 of the first stage shown in FIG. 11, but now the circuit 56 of the n-th stage is described with reference to FIG. 54. In FIG. 54, the transistor 31, the transistor 32, the capacitor 33, the circuit 111, the circuit 82, the circuit 83, the input terminal 51, the input terminal 52, the input terminal 53, the input terminal 54, and the output terminal 55 are similar to those described in FIG. 11. A feature of the circuit 50 is that an input signal inputted from the input terminal 51 is connected to the output terminal 55 of a circuit of a preceding stage.

Next, a configuration example of the circuit 111 shown in FIG. 11 is described with reference to FIG. 12.

Figure 12:
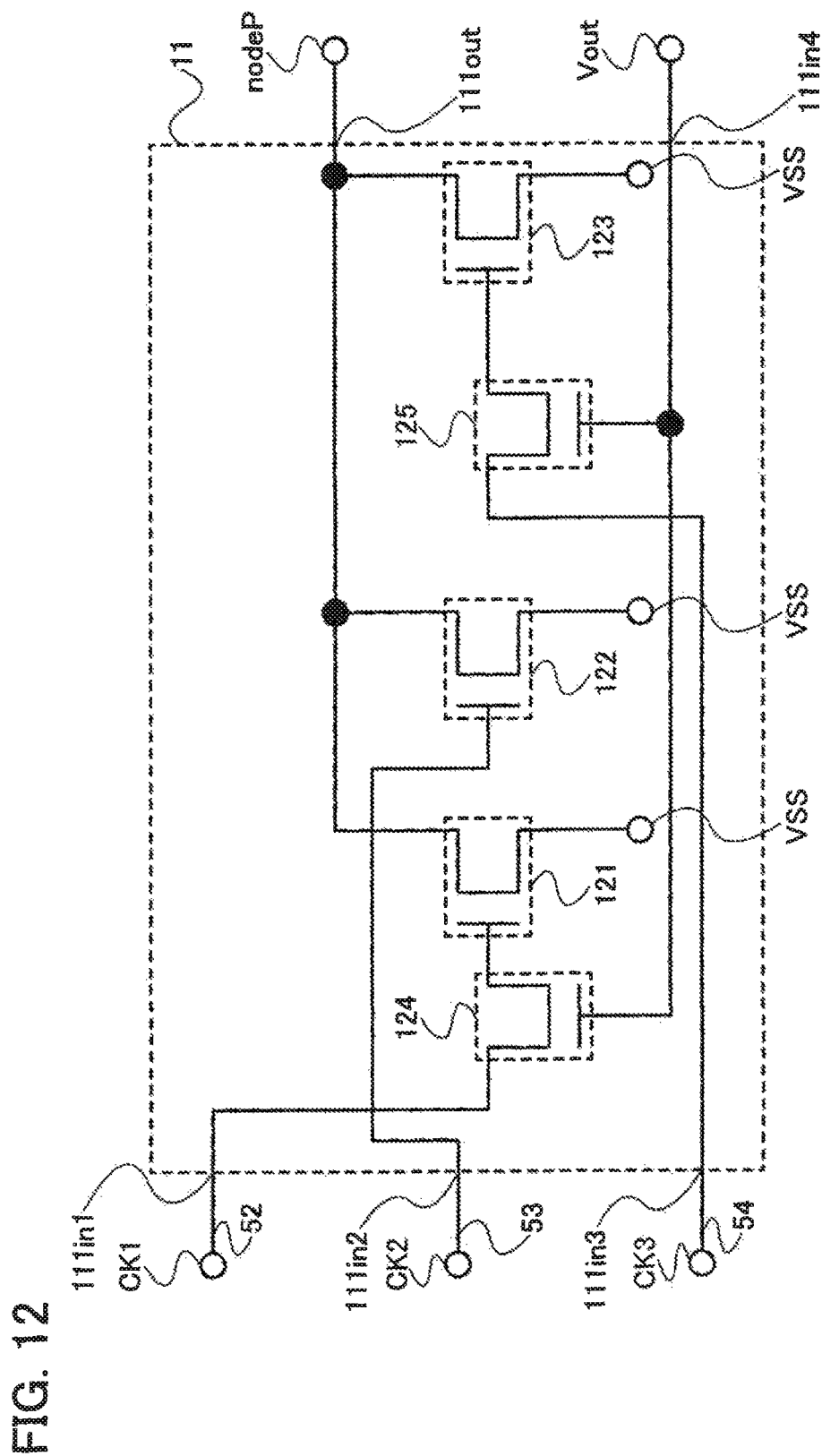
FIG. 12 is a diagram showing Embodiment Mode 4.

In the circuit 111 shown in FIG. 12, the input terminal 52, the input terminal 53, the input terminal 54, and OUT(1) are similar to those in FIGS. 5 and 11. A transistor 121, a transistor 122, a transistor 123, a transistor 124, and a transistor 125 are n-channel transistors formed of an amorphous semiconductor, a polycrystal semiconductor, or a single crystal semiconductor. Vout is an output of the circuit 111.

Connections of a circuit shown in FIG. 12 are described. A gate of the transistor 124 is connected to Vout, one of a source and a drain thereof is connected to the input terminal 52, and the other of the source and the drain thereof is connected to a gate of the transistor 121. One of a source and a drain of the transistor 121 is connected to VSS and the other of the source and the drain thereof is connected to the node P. A gate of the transistor 122 is connected to the input terminal 53, one of a source and a drain thereof is connected to VSS, and the other of the source and the drain thereof is connected to the node P. A gate of the transistor 125 is connected to Vout, one of a source and a drain thereof is connected to the input terminal 54, and the other of the source and the drain thereof is connected to a gate of the transistor 123. One of a source and a drain of the transistor 123 is connected to VSS and the other of the source and the drain thereof is connected to the node P.

Figure 63:
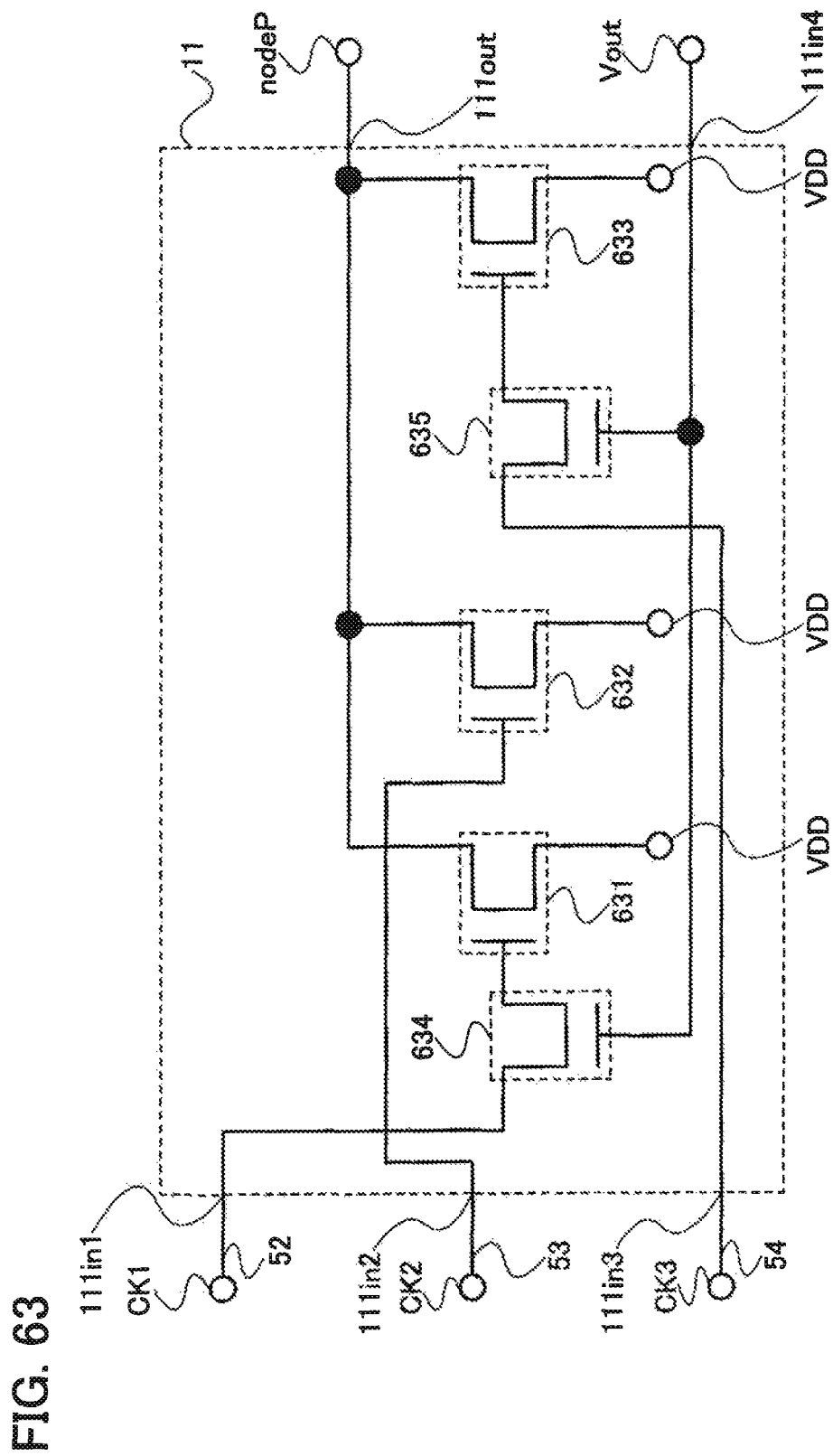
FIG. 63 is a diagram showing Embodiment Mode 4.

An operation of the circuit shown in FIG. 12 is described. The transistors 124 and 125 are turned on when Vout inputted from an output of the circuit 83 is High, thereby CK1 is transmitted to the gate of the transistor 121 and CK3 is transmitted to the gate of the transistor 123. The transistors 124 and 125 are turned off when Vout is Low, thereby CK1 is not transmitted to the gate of the transistor 121, which remains in the former state. As CK3 is not transmitted to the gate of the transistor 123, the transistor 123 remains in the former state. Here, the transistor 121 is turned on when the transistor 124 is turned on and CK1 inputted from the input terminal 52 is High, thereby VSS is outputted to the node P, whereas the transistor 121 is turned off when CK1 is Low, thereby nothing is outputted to the node P. The transistor 122 is turned on when CK2 inputted from the input terminal 53 is High, thereby VSS is outputted to the node P, whereas the transistor 122 is turned off when CK2 is Low, thereby nothing is outputted to the node P. The transistor 123 is turned on when the transistor 125 is turned on and CK3 inputted from the input terminal 54 is High, thereby VSS is outputted to the node P, whereas the transistor 123 is turned off when CK3 is Low, thereby nothing is outputted to the node P. In this manner, the circuit 111 outputs Low to the output terminal 55 when the circuit 83 outputs High and any one of CK1, CK2, and CK3 is High, and of which output becomes a floating state when CK1, CK2, and CK3 are Low. Thus, the circuit 111 has a function to output Low to the output terminal 55 when the circuit 83 outputs Low and CK2 is High and of which output becomes a floating state when CK2 is Low. Further, another circuit configuration having the same function may be employed instead of the aforementioned circuit configuration. FIG. 63 shows a configuration example where a p-channel transistor is used.

It is to be noted that the other of the source and the drain of the transistor 124, the gate of the transistor 121, the gate of the transistor 122, one of a source and a drain of the transistor 125, and the gate of the transistor 123 may be connected to a signal line, for example, to a signal line such as CK1, CK2, CK3, and SSP, another signal line, or another power source line. Further, the other of the source and the drain of the transistor 121, the other of the source and the drain of the transistor 122, and the other of the source and the drain of the transistor 123 may be connected to a signal line, for example, to a signal line such as CK1, CK2, CK3, and SSP, another signal line, or another power source line.

In the shift register circuit as described above, VSS can be supplied to the output terminal 55 and the node P when any one of CK1, CK2, and CK3 is High as in a non-operation period. That is, as VSS is always supplied to the output terminal 55 and the node P in the non-selection period, a potential can be stabilized, a noise can be reduced, and there is no transistor which is stationary on; therefore, characteristics deterioration can be suppressed.

Hereinafter described are some configuration examples and operation examples of this embodiment mode, which are variable. The configuration examples and the operation examples described below can be applied to "SUMMARY OF THE INVENTION", embodiment modes, and embodiments. The configuration examples and the operation examples described in Embodiment Mode 1 can be applied to this embodiment mode.

As shown in FIG. 12, a signal inputted to the gate of the transistor 121 may be the same as a signal inputted to the gate of the transistor 92 in the circuit 82. As a result, the number of transistors can be reduced.

As shown in FIG. 12, the gate of the transistor 121 is in a floating state when the transistor 124 is off. Therefore, when the gate capacitance of the transistor 121 holding a potential is not large enough, a capacitor may be additionally connected. In that case, the capacitor is preferably connected between the gate of the transistor 121, and VDD or VSS.

As shown in FIG. 12, the gate of the transistor 123 is in a floating state when the transistor 125 is off. Therefore, when the gate capacitance of the transistor 123 holding a potential is not large enough, a capacitor may be additionally connected. In that case, the capacitor is preferably connected between the gate of the transistor 123, and VDD or VSS.

Embodiment Mode 5

In this embodiment mode, some configuration examples of a circuit using the shift register circuit described in Embodiment Modes 1 to 4 are described.

A configuration example of a gate driver which scans pixels by the shift register circuit described in Embodiment Modes 1 to 4 is described with reference to FIG. 13. A timing chart thereof is shown in FIG. 14.

Figure 13:
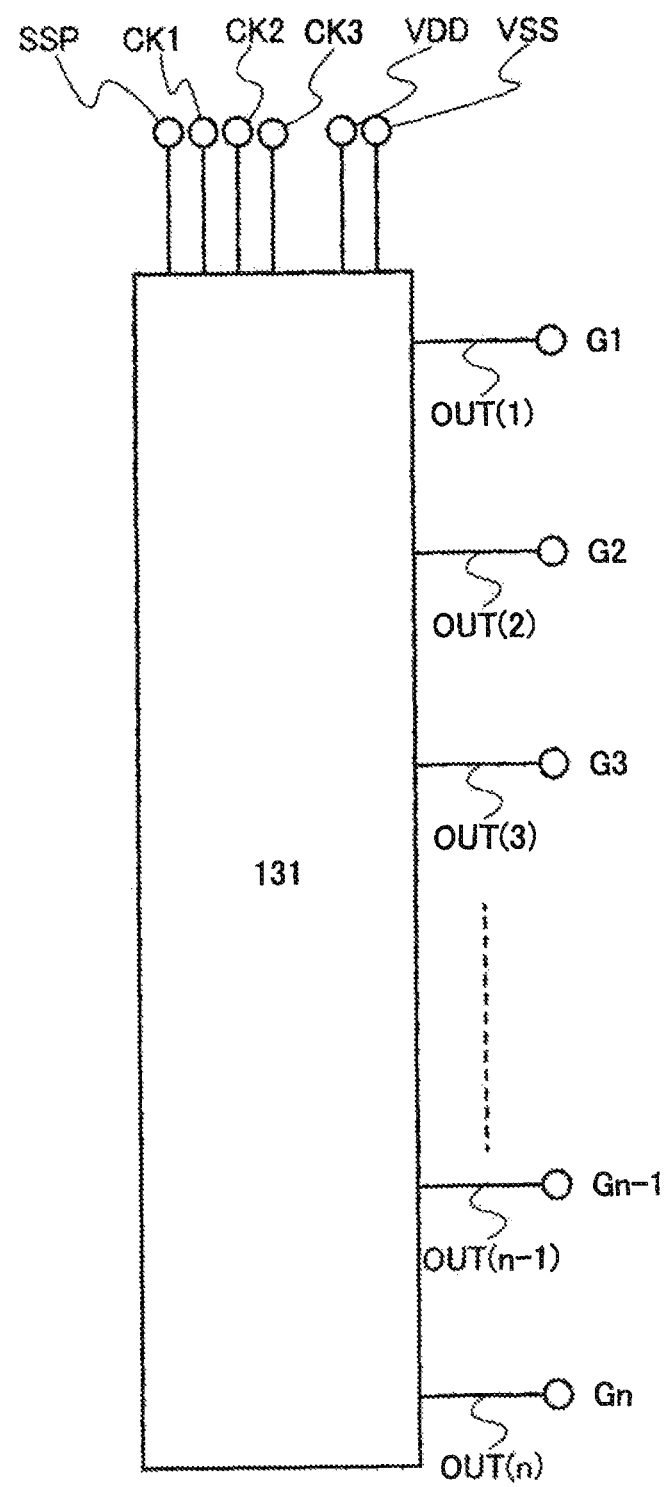
FIG. 13 is a diagram showing Embodiment Mode 5.

A gate driver circuit shown in FIG. 13 is formed of a shift register circuit 131 described in Embodiment Modes 1 to 4. Then, OUT1 to OUTn which are output signals outputted from the shift register circuit 131 are transmitted as gate signals to pixels.

Figure 14:
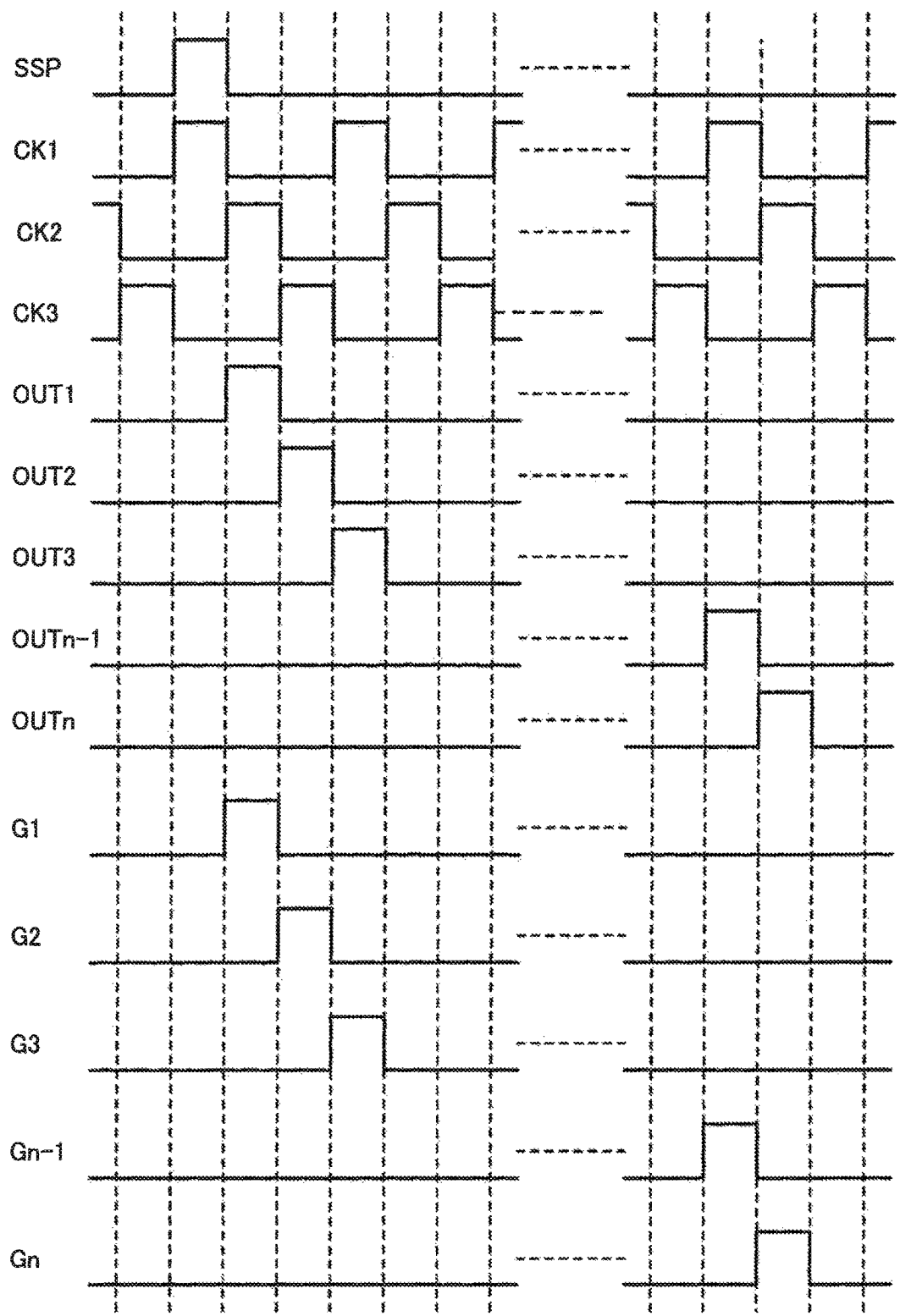
FIG. 14 is a diagram showing Embodiment Mode 5.

SSP, CK1, CK2, and CK3 as control signals are inputted to the shift register circuit 131, at a timing similar to those described in Embodiment Modes 1 to 4 as shown in FIG. 14. As a power source, a positive power source VDD and a negative power source VSS are inputted. An amplitude voltage of the control signal corresponds to the positive power source VDD and the negative power source VSS. When SSP is inputted as shown in FIG. 14, gate signal lines are selected from OUT(1) sequentially (this operation is hereinafter also referred to as scanning). In this manner, an output of the shift register 131 is outputted as a gate signal to gate signal lines G1 to Gn without change.

Here, it is preferable that a potential of the positive power source VDD is higher than a maximum value of a video signal of a pixel which is described later, and a potential of the negative power source VSS is lower than a minimum value of a video signal. In this manner, a video signal can be surely written to a pixel; therefore, a display device with higher image quality can be provided.

The gate driver described in FIG. 13 outputs an output of the shift register circuit 131 as a gate signal without change. This is advantageous in that an area of a gate driver portion is reduced. Further, as the number of elements in the gate driver portion is reduced as well, it is advantageous in that the yield can be enhanced.

Figure 15:
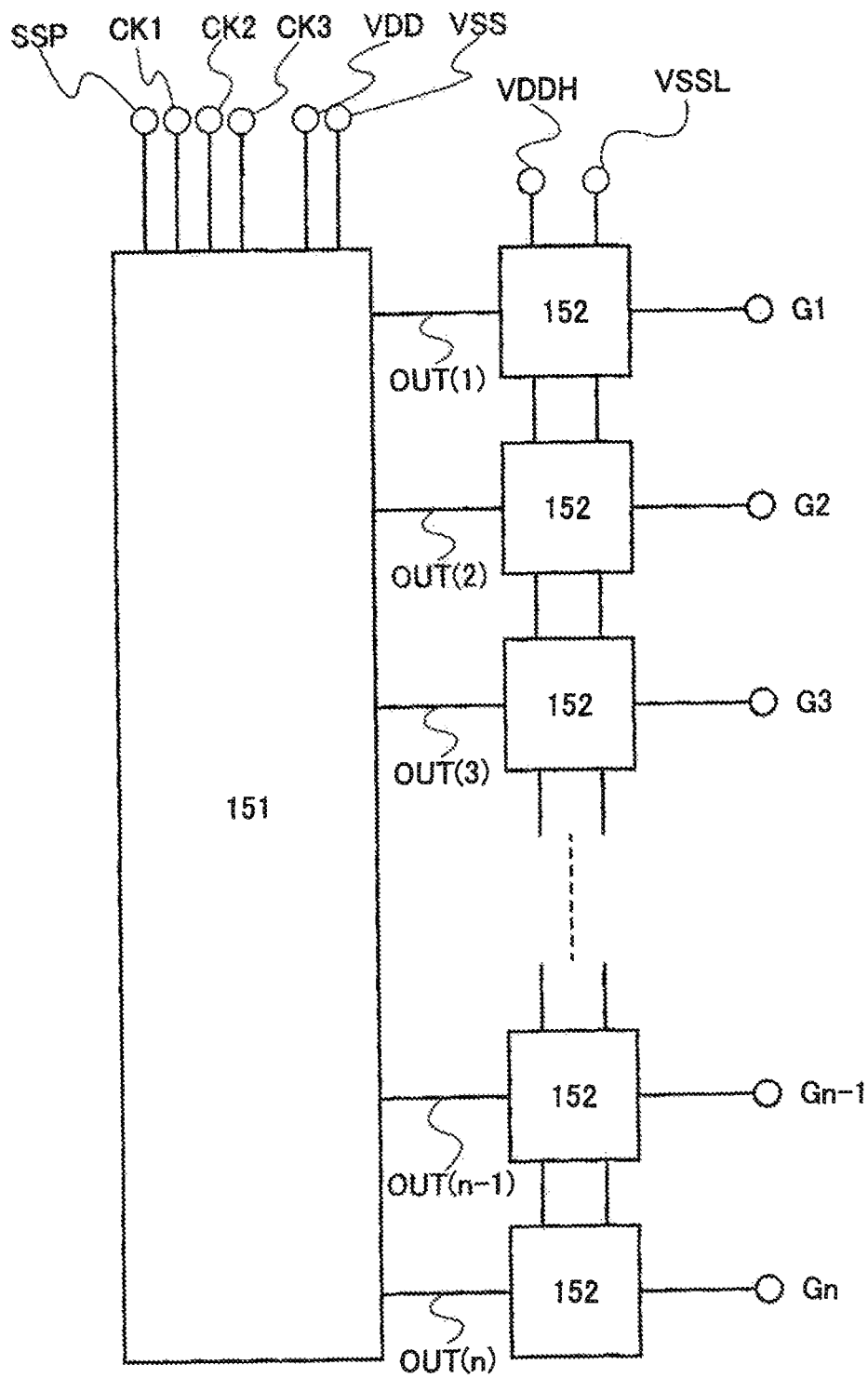
FIG. 15 is a diagram showing Embodiment Modes 5 and 6.
Figure 16:
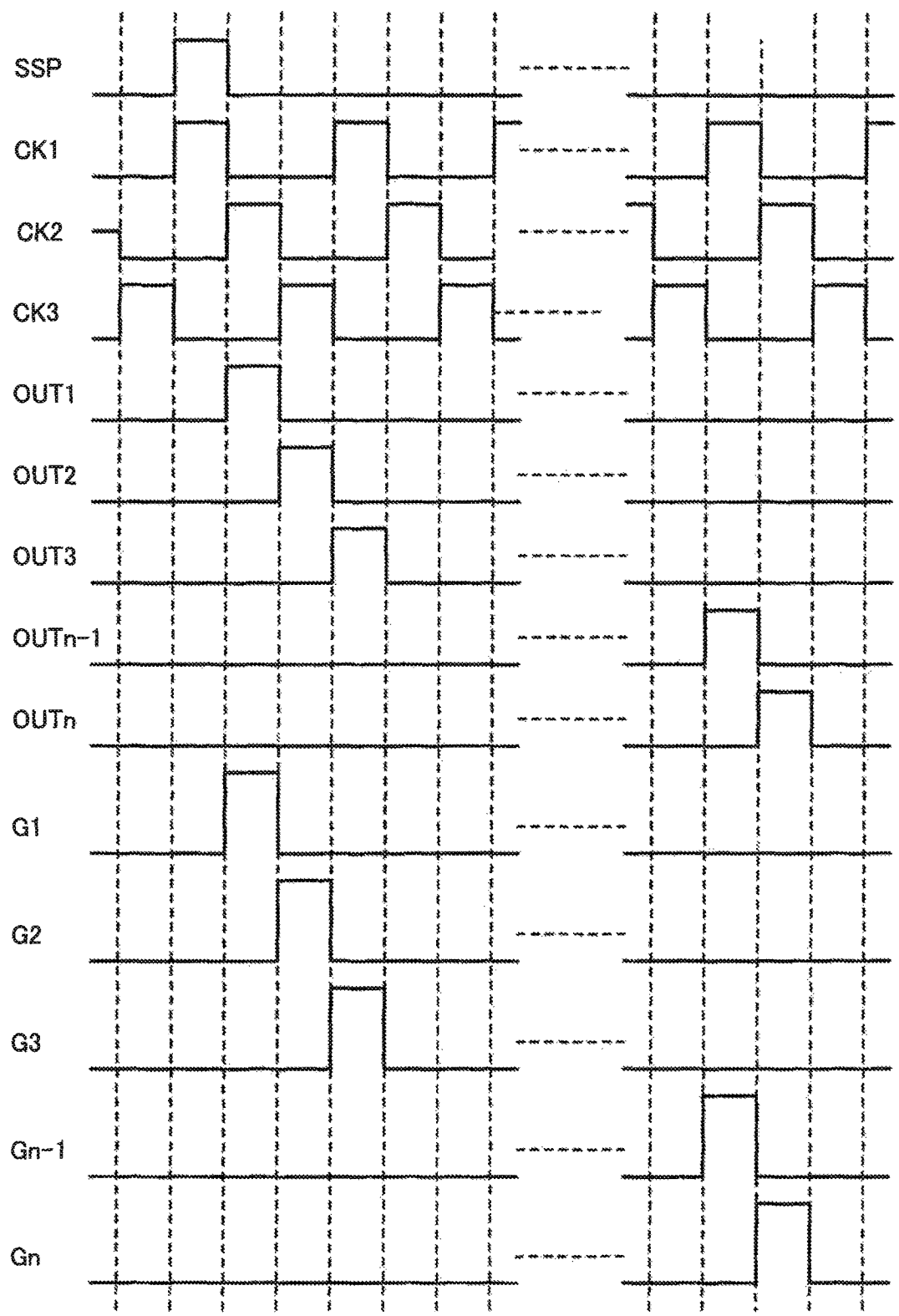
FIG. 16 is a diagram showing Embodiment Modes 5 and 6.

Description is made with reference to FIG. 15 of a gate driver which scans pixels by changing an amplitude voltage of an output signal of the shift register circuit described in Embodiment Modes 1 to 4. A timing chart thereof is shown in FIG. 16.

The gate driver circuit shown in FIG. 15 is configured with a shift register circuit 151 described in Embodiment Modes 1 to 4 and a level shifter circuit 152. Then, OUT(1) to OUT(n) which are output signals outputted from the shift register circuit 151 through the gate signal lines G1 to Gn are transmitted as gate signals through the level shifter circuit 152.

The level shifter circuit 152 shown in FIG. 15 is described with reference to FIGS. 50A and 50B. The level shifter circuit shown in FIG. 50 can be applied not only to the level shifter circuit 152 shown in FIG. 15, but also to the other drawings, embodiment modes, and embodiments.

Figure 50A:
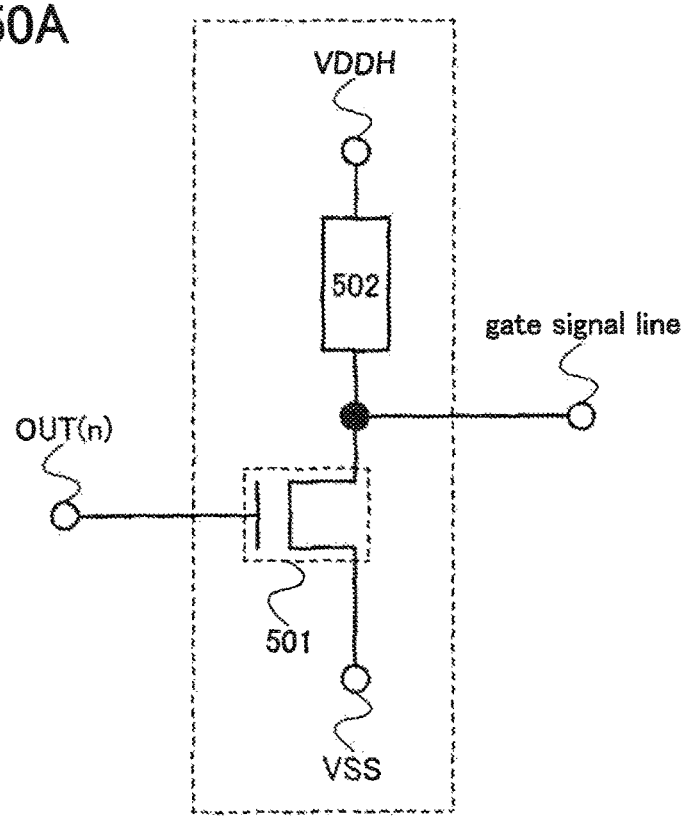
FIGS. 50A and 50B are diagrams showing Embodiment Mode 3.

In a level shifter circuit shown in FIG. 50A, OUT(n) as an output of the shift register circuit 151 of an n-th row, a power source VDDH of which potential is higher than a maximum value of an amplitude voltage of OUT(n), a negative power source VSS, a resistor 502 with a resistive component, and a transistor 501 are at least provided. OUT(n) is inputted to the gate of the transistor 501, one of one of a source and a drain thereof is connected to the negative power source VSS, the other of the source and the drain thereof is connected to one terminal of the resistor 502 and a gate signal line, and the other terminal of the resistor 502 is connected to the power source VDDH.

Figure 50B:
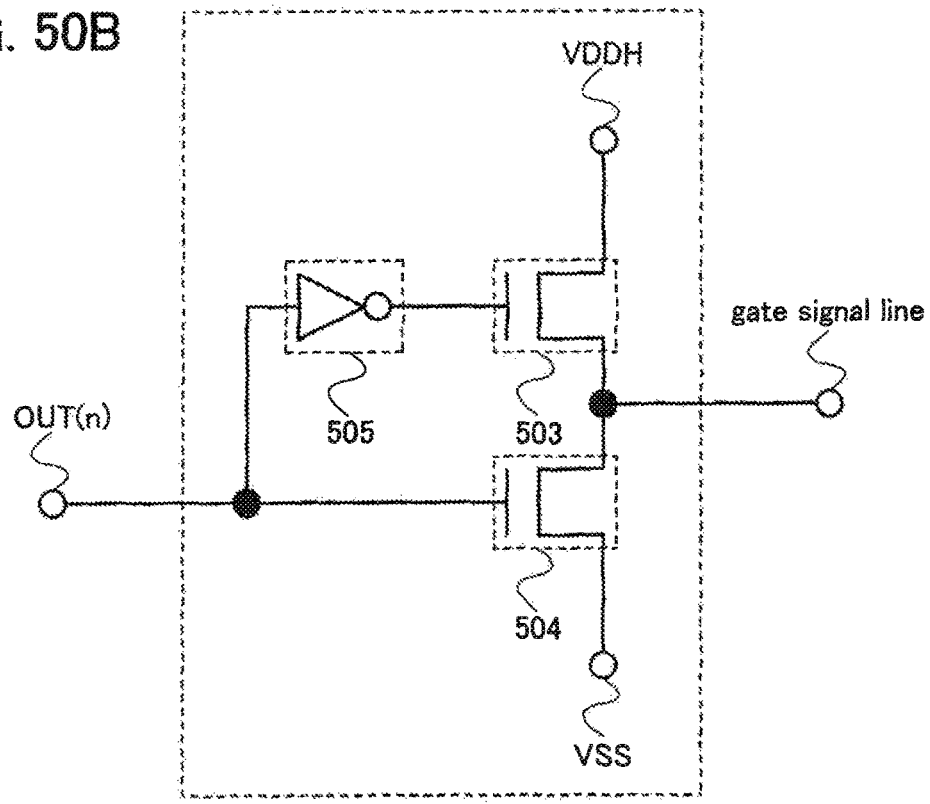

In a level shifter circuit shown in FIG. 50B, OUT(n) as an output of the shift register circuit 151 of the n-th row, a power source VDDH of which potential is higher than a maximum value of an amplitude voltage of OUT(n), a negative power source VSS, the transistor 503, the transistor 504, and an inverter circuit 505 are at least provided.

OUT(n) is inputted to a gate of the transistor 504 and OUT(n) which is inverted through the inverter circuit 505 is inputted to the gate of the transistor 503. One of the source and the drain of the transistor 504 is connected to the negative power source VSS and one of the source and the drain of the transistor 503 is connected to the power source VDD. The other of the source and the drain of the transistor 504 and the other of the source and the drain of the transistor 505 are connected to a gate signal line.

SSP, CK1, CK2, and CK3 as control signals are inputted to the shift register circuit 151 at a timing similar to those in Embodiment Modes 1 to 4, as shown in FIG. 16. As a power source, the positive power source VDD and the negative power source VSS are inputted. An amplitude voltage of a control signal is set corresponding to the positive power source VDD and the negative power source VSS. When SSP is inputted as shown in FIG. 16, the gate signal lines are sequentially selected from OUT(1) (this operation is hereinafter also referred to as scanning). In this manner, an output of the shift register circuit 151 can be inputted to the level shifter circuit 152. Amplitude of an output signal of the shift register circuit 151 at this time has a High potential being the positive power source VDD and a Low potential being the negative power source VSS.

The level shifter circuit 152 has a function to change an amplitude voltage of the output signal of the shift register circuit 151 inputted thereto. For example, when High is inputted, the level shifter circuit 152 changes a potential from a potential of the positive power source VDD to that of the positive power source VDDH, whereas when Low is inputted, the level shifter circuit 152 changes a potential from the potential of the negative power source VSS to that of the negative power source VSSL to be outputted to the gate signal line. The potential of the positive power source VDDH is higher than that of the positive power source VDD and the potential of the negative power source VSSL is lower than that of the negative power source VSS. Only an amplitude voltage of the High signal may be changed or only that of the Low signal may be changed as well.

Here, it is preferable that the potential of the positive power source VDDH is higher than a maximum value of a video signal inputted to a pixel which is described later and the potential of the negative power source VSS is lower than a minimum value of the video signal. In this manner, a video signal can be surely written to a pixel; therefore, a display device with higher image quality can be provided.

The gate driver shown in FIG. 15 outputs an output signal of the shift register circuit 151 to the gate signal line by changing an amplitude voltage thereof through the level shifter circuit 152. In this manner, the shift register circuit 151 can be driven by a control signal with a smaller amplitude voltage and a power source. Therefore, it is advantageous in reducing power consumption.

Figure 17:
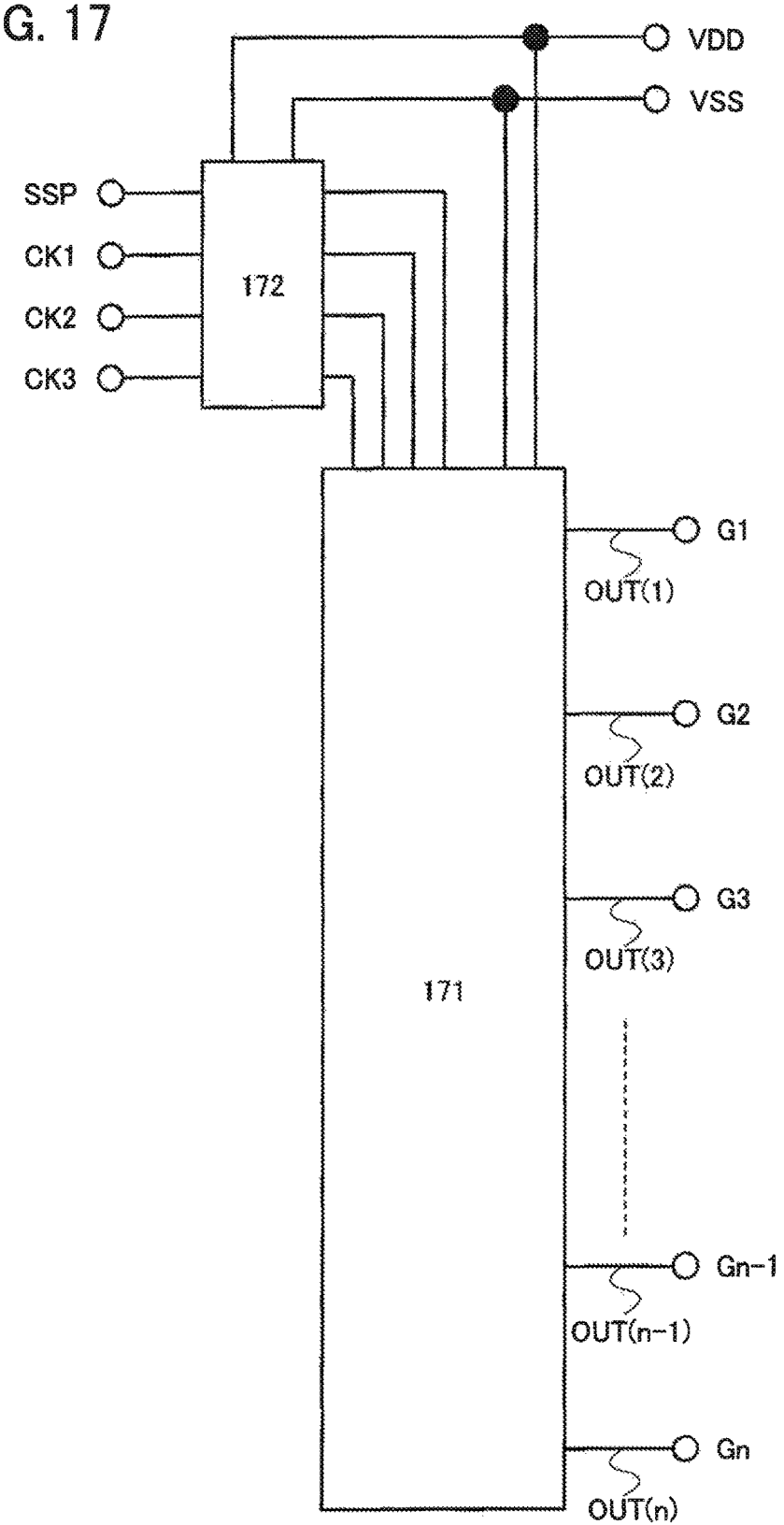
FIG. 17 is a diagram showing Embodiment Mode 5.

Description is made with reference to FIG. 17 of a gate driver circuit which inputs a control signal through a level shifter circuit to the shift register circuit described in Embodiment Modes 1 to 4. A timing chart thereof is shown in FIG. 18.

The gate driver circuit shown in FIG. 17 is configured with shift register circuits 171 and 172 described in Embodiment Modes 1 to 4, and transmits output signals OUT1 to OUTn to the pixels, which are outputted from the shift register circuit 151 through the gate signal lines G1 to Gn.

The level shifter circuit 172 is a circuit for changing an amplitude voltage of an inputted signal. For example, the level shifter circuit 172 can change a High potential of the inputted signal to a potential of the positive power source VDD as a power source of the shift register circuit 171 and change a Low potential thereof to a potential of the negative power source VSS. In the case of FIG. 17, the amplitude voltages of the controls signals SSP, CK1, CK2, and CK3 inputted to the level shifter circuit 172 can be changed to the amplitude voltages corresponding to the positive power source VDD and the negative power source VSS. That is, a control signal which is inputted with small amplitude, for example, with amplitude of a known external circuit, can be inputted to the shift register circuit 171 by changing an amplitude voltage of the control signal through the level shifter circuit 172 to an amplitude voltage corresponding to the positive power source VDD and the negative power source VSS. As a result, the gate driver circuit shown in FIG. 17 can be driven regardless of a use of an amplitude voltage of an external circuit and there is no need to additionally develop an external circuit. Therefore, it is advantageous in reducing the cost as a display device.

Figure 18:
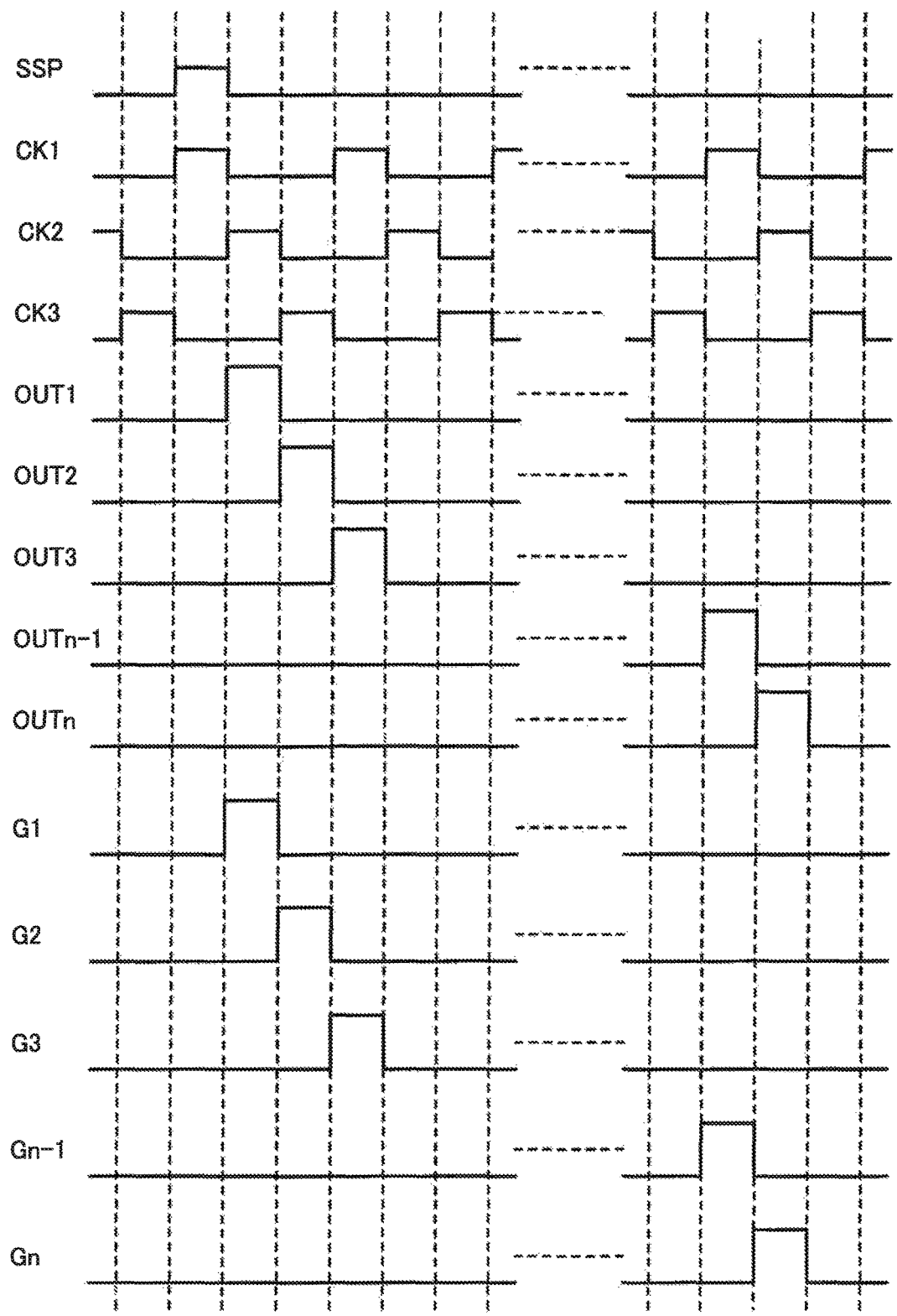
FIG. 18 is a diagram showing Embodiment Mode 5.

SSP, CK1, CK2, and CK3 which are changed to have amplitude voltages corresponding to the positive power source VDD and the negative power source VSS are inputted to the shift register circuit 171 at a similar timing to that shown in FIG. 18 as described in Embodiment Modes 1 to 4. As a power source, the positive power source VDD and the negative power source VSS are inputted to the shift register circuit 171. As shown in FIG. 18, when SSP is inputted, the gate signal lines are sequentially selected from OUT(1). In this manner, an output of the shift register circuit 171 is outputted to the gate signal lines G1 to Gn as they are as gate signals. That is, the gate signal lines are sequentially scanned.

Here, it is preferable that the potential of the positive power source VDD is higher than a maximum value of a video signal inputted to a pixel which is described later and the potential of the negative power source VSS is lower than a minimum value of the video signal. In this manner, a video signal can be surely written to a pixel; therefore, a display device with higher image quality can be provided.

Figure 19:
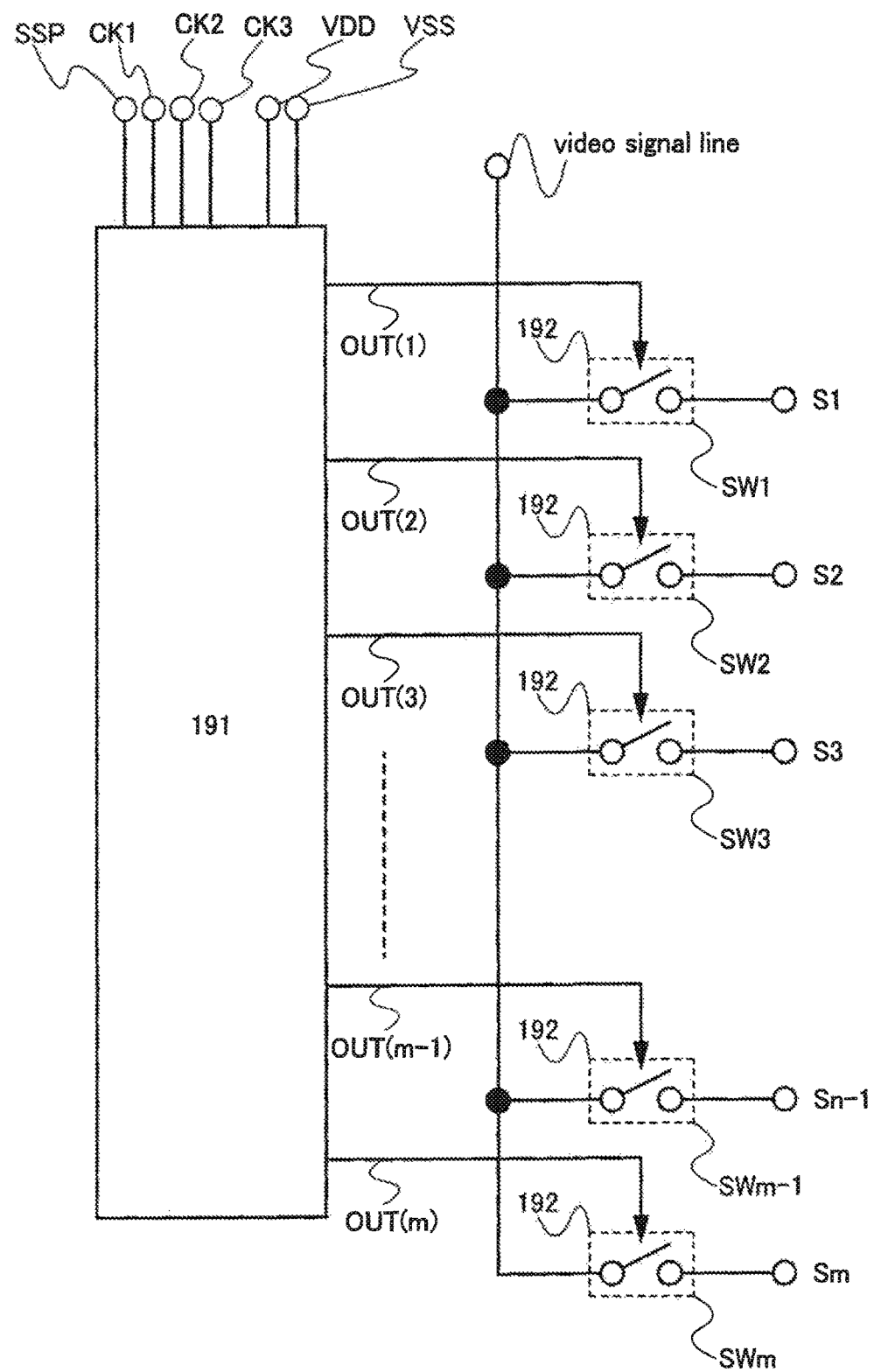
FIG. 19 is a diagram showing Embodiment Mode 5.
Figure 20:
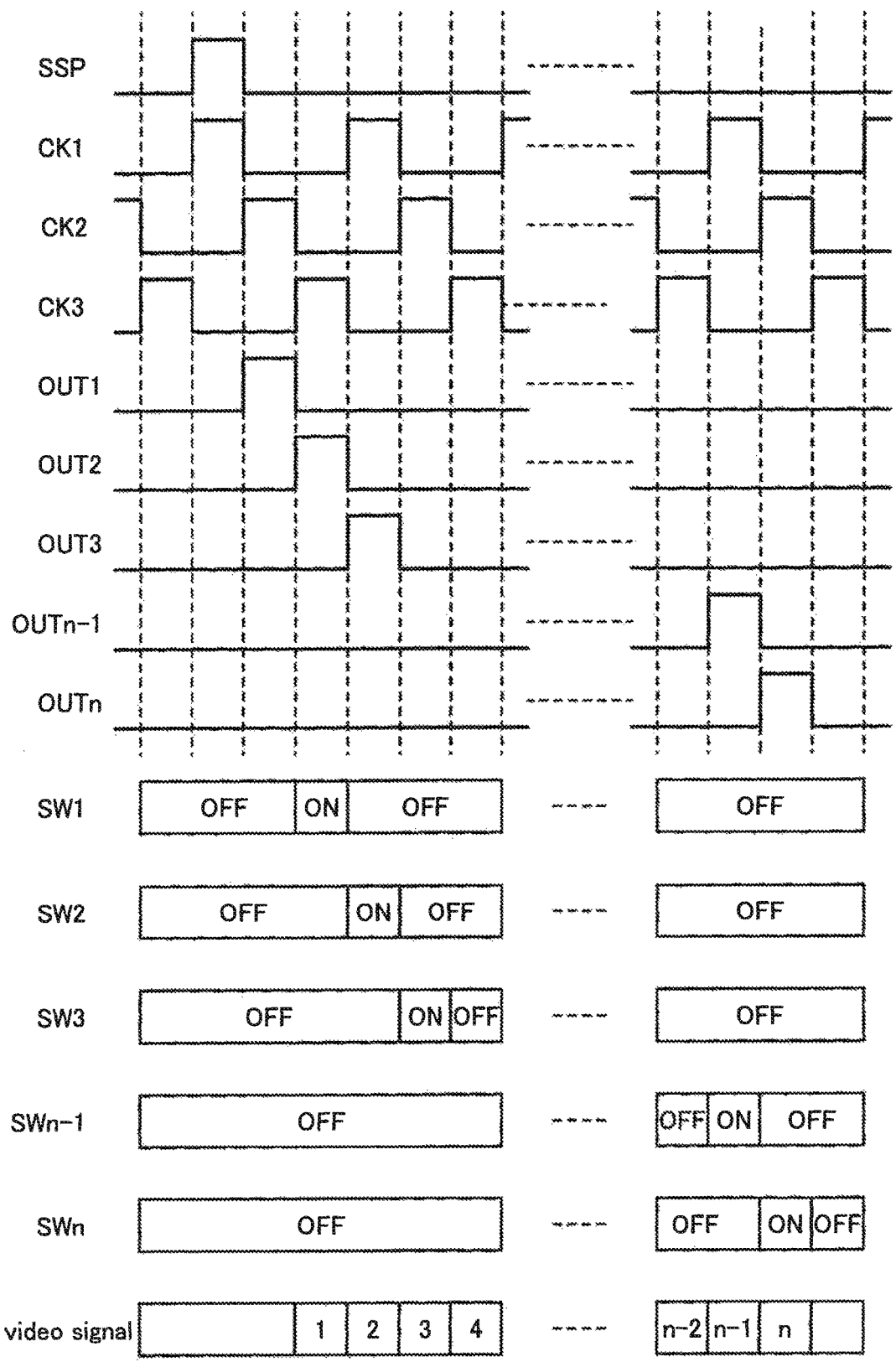
FIG. 20 is a diagram showing Embodiment Mode 5.

Description is made with reference to FIG. 19 of a source driver circuit using the shift register circuit described in Embodiment Modes 1 to 4. A timing chart thereof is shown in FIG. 20.

The source driver circuit shown in FIG. 19 is configured with a shift register circuit 191 and switching elements 192 described in Embodiment Modes 1 to 4. By an output signal of the shift register circuit 191, the switching elements 192 are sequentially turned on from SW1 as a first column to SWm. One terminal of the switching element 192 is connected to a video signal line which transmits a video signal and the other terminal of the switching element 192 is connected to a source signal line; therefore, a video signal can be outputted to the source signal line when the switching element 192 is turned on. As shown in FIG. 20, the video signal changes in accordance with a source signal line of a column which is turned on. Thus, in all columns, an arbitrary video signal can be outputted to the source signal line. As the source signal lines are connected to pixels, video signals can be transmitted to the pixels.

Here, an output signal of the shift register circuit 192 is a 1-bit signal of High and Low as described in Embodiment Modes 1 to 4. A High potential is a potential of the positive power source VDD while a Low potential is a potential of the negative power source VSS. The switching elements 192 are controlled by outputs of the shift register circuit 191. Therefore, the potentials of the positive power source VDD and the negative power source VSS are required to be potentials which can surely turn on or off the switching elements 192 regardless of the video signals. That is, the potential of the positive power source VDD is preferably higher than a maximum value of a potential of the video signal, and the potential of the negative power source VSS is preferably lower than a minimum value of a potential of the video signal. Similarly, a control signal inputted to the shift register circuit 191 is required to have an amplitude voltage corresponding to the potentials of the positive power source VDD and the negative power source VSS.

It is preferable that the switching elements 192 is formed of n-channel transistors. A gate of the n-channel transistor is connected to an output of the shift register circuit 191, one of a source and a drain thereof is connected to a video signal line, and the other of the source and the drain thereof is connected to a source signal line. In this manner, the n-channel transistor is turned on when an output of the shift register circuit 191 is High, and an n-channel transistor can be turned off when an output of the shift register circuit 191 is Low. By using n-channel transistors as the switching elements 192, amorphous silicon can be used to form a transistor. That is, there is an advantage in that the switching elements 192, a pixel portion, and a shift register circuit constituted only by n-channel transistors can be formed over the same substrate.

A type of a transistor applicable as a switching element to the invention is not limited. A transistor used for the invention may be a transistor using a non-single crystal semiconductor film represented by amorphous silicon or polycrystal silicon, a MOS transistor formed by using a semiconductor substrate or an SOI substrate, a junction transistor, a bipolar transistor, a transistor using an organic semiconductor or a carbon nanotube, or the like. Furthermore, a substrate over which a transistor is mounted is not exclusively limited to a certain type. It may be a single crystal substrate, an SOI substrate, a quartz substrate, a glass substrate, a resin substrate, or the like.

As a transistor is operated simply as a switching element, polarity (conductivity type) thereof is not particularly limited, and either of an n-channel transistor or a p-channel transistor can be used. However, when an off-current is preferably smaller, a transistor with a less off-current is preferably used. As a transistor with a less off-current, there is a transistor having a region (referred to as an LDD region) between a channel forming region, and a source region or a drain region, to which an impurity element imparting a conductivity type is added at a low concentration.

It is preferable to use an n-channel transistor when the transistor operates with a source potential closer to a low potential side power source. On the contrary, it is preferable to use a p-channel transistor when the transistor operates with a source potential closer to a high potential side power source. With such a configuration, an absolute value of a gate-source voltage of a transistor can be set large; therefore, the transistor can be easily operated as a switch. It is to be noted that a CMOS switching element may be formed by using both an n-channel transistor and a p-channel transistor.

FIG. 19 shows one video signal line, however, a plurality of video signal lines may be provided as well. For example, when two video signal lines are provided, two switching elements 192 are controlled by an output signal of the shift register circuit 191, and another video signal line is connected to each of the switching elements 192. As a result, the two switching elements 192 are simultaneously turned on and another video signal can be outputted to another source signal line. That is, with source signal lines of the same number of columns, the number of stages of the shift register circuit 191 can be reduced to half. Therefore, it is advantageous in that an area for forming the shift register circuit 191 can be reduced to half. Moreover, an yield can be expected to be improved since the number of elements is reduced as a whole.

As shown in FIG. 19, a level shifter circuit may be additionally provided between the output of the shift register circuit 191 and the switching element 192. As a result, the shift register circuit 191 can be operated with a small amplitude voltage, and an output signal of the shift register circuit 191 can be increased by the level shifter circuit to be inputted to the switching element 192. That is, power consumption can be reduced by operating the shift register circuit 191 with a small amplitude voltage. By inputting an output signal of the shift register circuit 191 to the switching element 192 through a level shifter circuit, an amplitude voltage can be higher than the video signal.

As shown in FIG. 19, a control signal may be inputted to the shift register circuit 191 through a level shifter circuit. As a result, a display device of the invention can be driven by using a known external circuit. Moreover, a level shifter circuit may be connected to the output of the shift register circuit 191.

Embodiment Mode 6

In this embodiment mode, description is made of some configuration examples of a display device using a gate driver and a source driver which have the shift register circuits described in Embodiment Modes 1 to 4.

Figure 21:
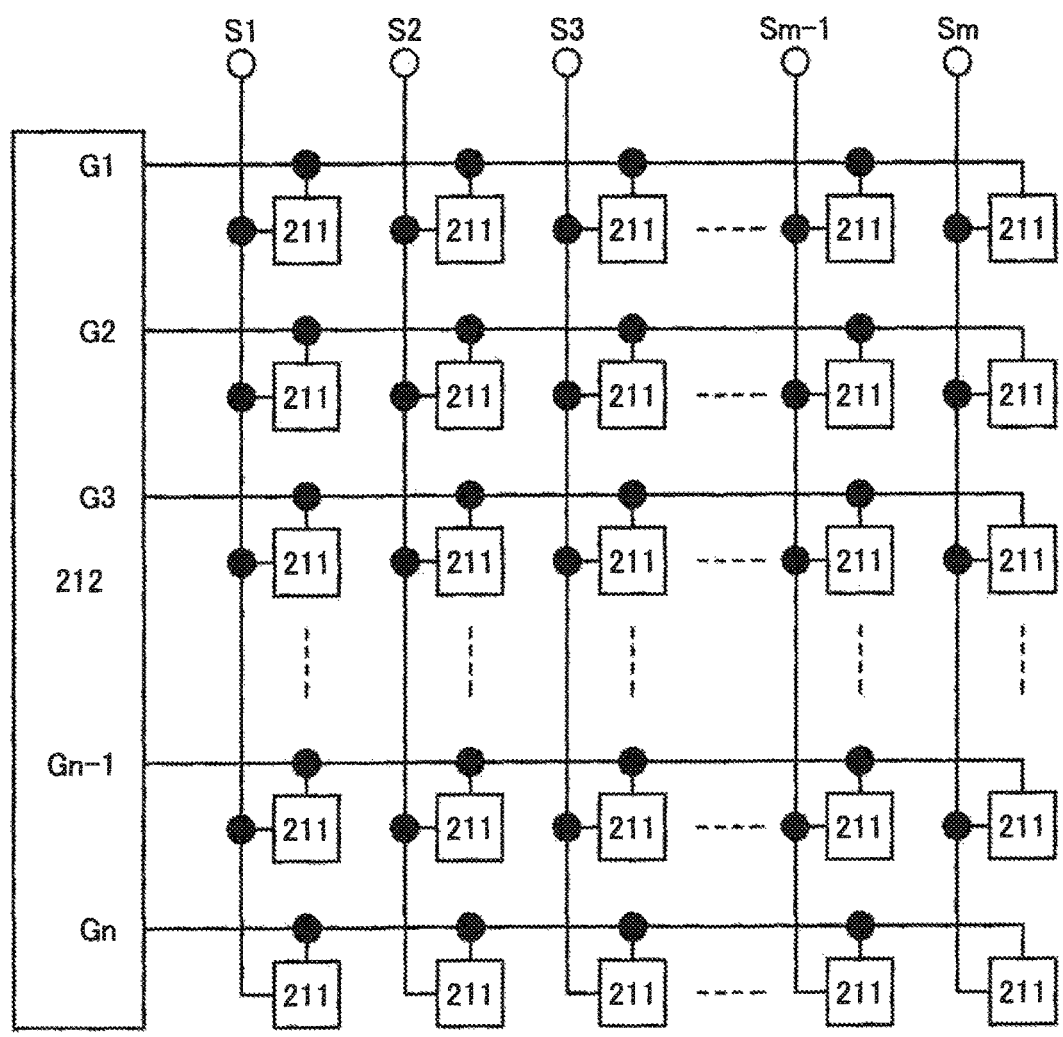
FIG. 21 is a diagram showing Embodiment Mode 6.

Description is made with reference to FIG. 21 of a configuration example of a display device in the case where the shift register circuit described in Embodiment Modes 1 to 4 is used as a gate driver. Further, a control signal line, a power source line, a counter electrode, and the like are not shown for convenience, however, they can be additionally provided as required. A gate driver can be additionally provided as required as well. Further, the gate driver described in Embodiment Mode 5 is preferably used as a gate driver shown in FIG. 21.

The display device shown in FIG. 21 includes a gate driver 212, pixels 211, gate signal lines G1 to Gn, and source signal lines S1 to Sm. The gate signal lines for transmitting gate signals outputted from the gate driver 212 and the source signal lines for transmitting video signals transmitted from an external circuit control the pixels 211.

Each of the pixels 211 includes a display element such as a liquid crystal element and a light emitting element such as an FED element and an EL element, and may include a switching element or a transistor for controlling the display element, a capacitor for holding a video signal or a threshold voltage of the transistor, and the like.

The gate driver 212 is a gate driver circuit which outputs a gate signal for selecting the pixel 211 to which a video signal is written. When the pixel is selected, the gate signal lines are sequentially selected from G1 to Gn. Further, it is preferable that an amplitude voltage transmitted from the gate signal line to the pixel is higher than a maximum value and a minimum value of a potential of a video signal. Further, when a video signal is a current, it is preferable that the video signal has a higher amplitude voltage than a maximum value and a minimum value of a potential of the source signal line, which is determined by a flowing current. To select the gate signal line means to output a High signal from the gate driver 212. In a period when the gate signal line is not selected, the gate driver 212 outputs a Low signal.

The source signal lines S1 to Sm are source signal lines for transmitting video signals inputted from an external circuit to the pixels. The video signal may be inputted as an analog signal, a digital signal, a current, or a voltage. A source driver which outputs video signals may be formed as an internal circuit and an output of the source driver may be outputted to the source signal line. Further, a video signal inputted to the source signal line may be inputted all columns at the same time by a line sequential drive or divided video signals may be inputted per one column or a plurality of columns by a dot sequential drive.

Figure 22:
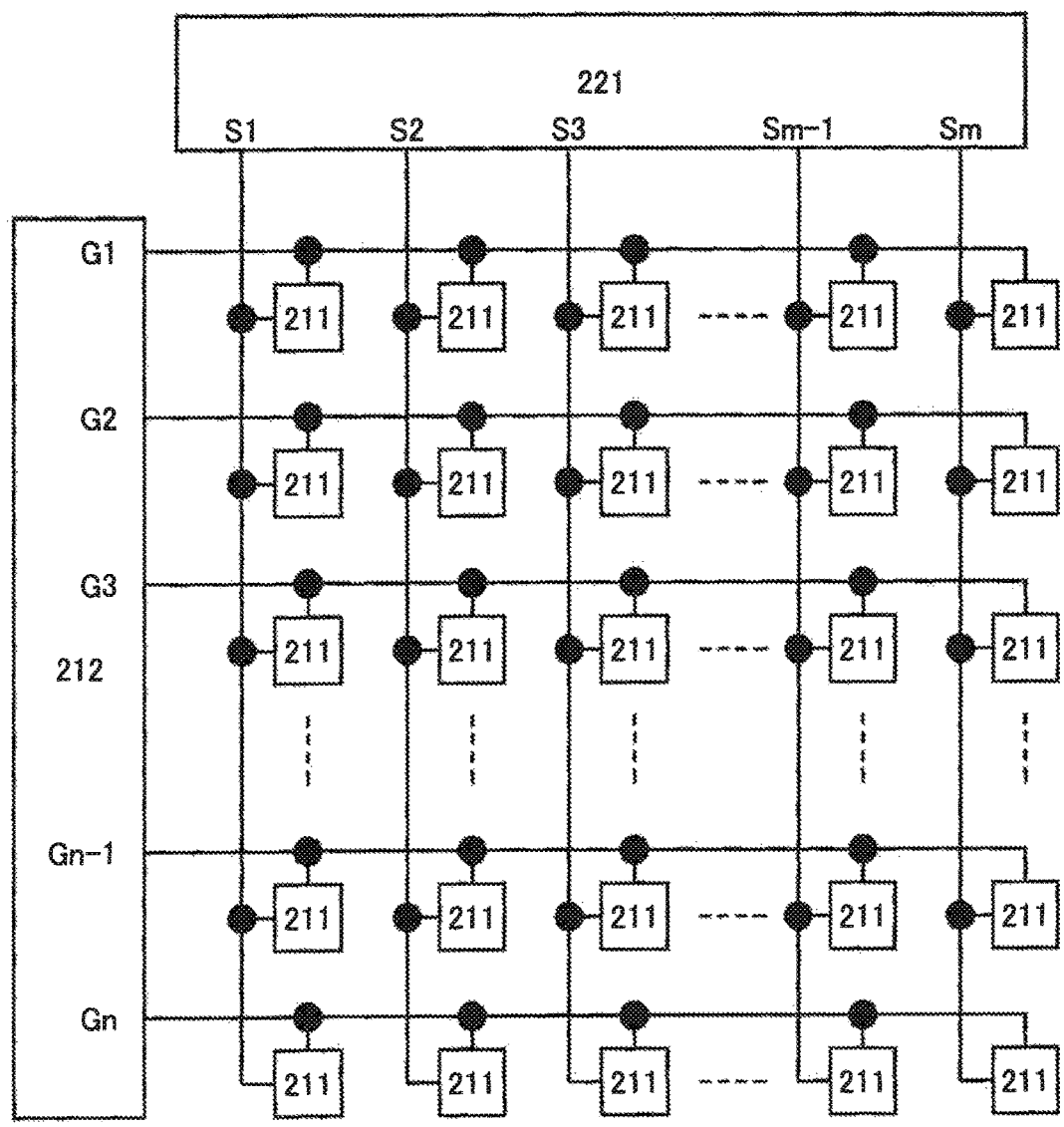
FIG. 22 is a diagram showing Embodiment Mode 6.

FIG. 22 shows a configuration example of the case where a source driver is formed as an internal circuit. As shown in FIG. 22, the pixels 211, the gate driver 212, the gate signal lines, and the source signal lines can be similar to those in FIG. 21. The source driver 221 is a source driver for outputting video signals by a dot sequential drive or a line sequential drive. A configuration of the source driver 221 may employ the configuration of the source driver described in Embodiment Mode 5.

As shown in the configuration example of the display device in FIG. 21, m video signals are required to be inputted to m columns of source signal lines. When a display device has a higher resolution and a larger size, the number of video signals, that is the number of terminals to which the video signals are inputted through an external circuit, an FPC, or the like is expected to be drastically increased accordingly. In view of this, a period when a certain gate signal line is selected by a gate driver (High is outputted) is divided into a plurality of periods, thereby a video signal is outputted to another source signal line in the divided periods. Description is made with reference to FIG. 46 of a configuration example of a video signal input portion where the number of terminals to which video signals are inputted is reduced. FIG. 47 shows a timing chart of FIG. 46.

Figure 46:
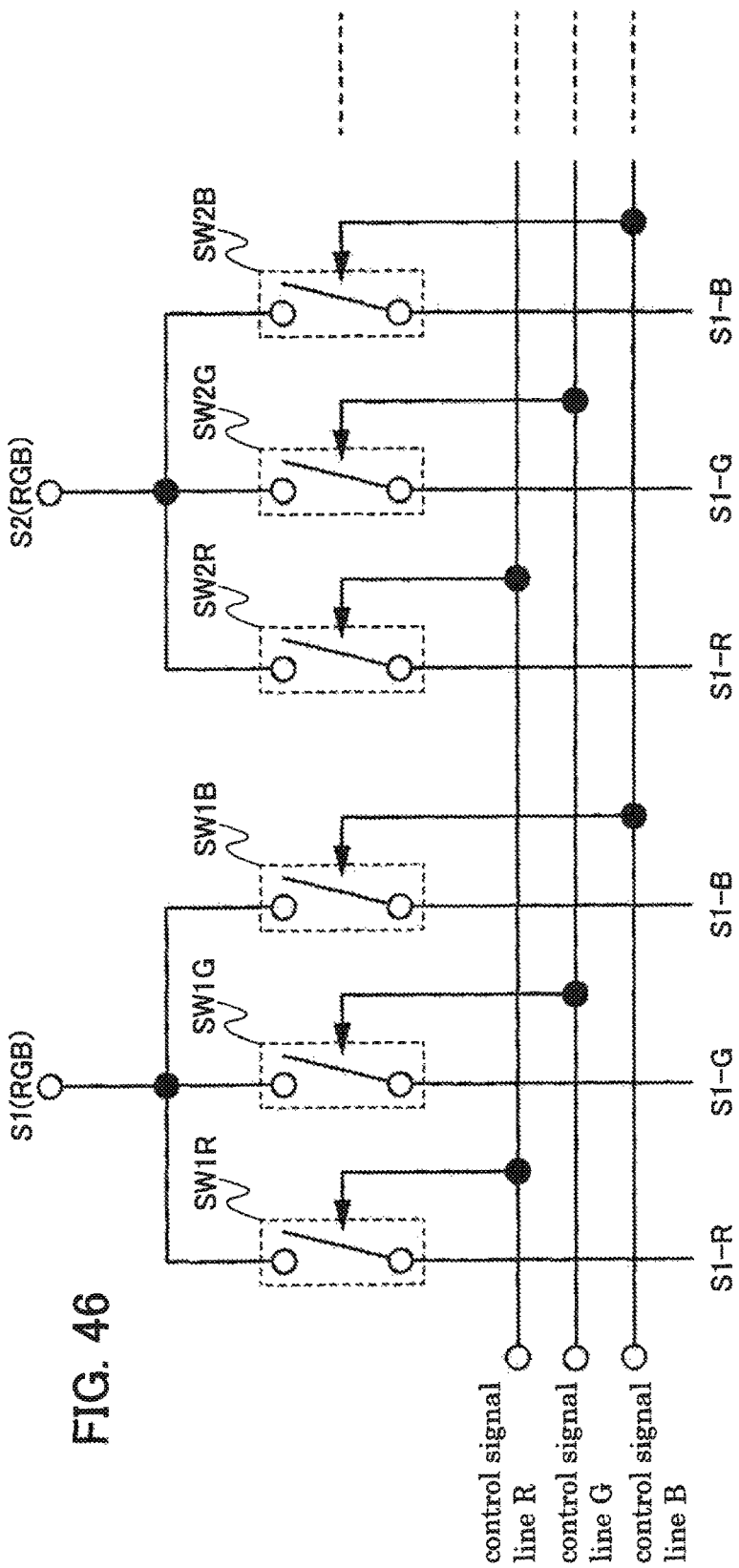
FIG. 46 is a diagram showing Embodiment Mode 6.

FIG. 46 shows an example of a video signal input portion of the display device shown in FIG. 21. Other portions which are not shown, for example, the pixels 211, the gate driver 212, and the like can be similar to those in FIG. 21. Description is made with reference to FIG. 46 of a configuration example of the case where the source signal lines are divided into R, G, and B. In addition, two input terminals for video signals and six source signal lines are provided for convenience, however, the invention is not limited to this and the number of the terminals and signal lines can be changed as required.

As shown in FIG. 46, a control signal line R, a control signal line G, a control signal line B, a video signal input terminal S1 (RGB), and a video signal input terminal S2 (RGB) are input terminals to which controls signals are externally inputted. A switching element SW1R and a switching element SW2R are controlled to be turned on or off by a control signal line R. A switching element SW1G and a switching element SW2G are controlled to be turned on or off by a control signal line G. A switching element SW1B and a switching element SW2B are controlled to be turned on or off by a control signal line B. A source signal line S1-R, a source signal line S1-C a source signal line S1-B, a source signal line S2-R, a source signal line S2-G, and a source signal line S2-B are source signal lines for transmitting video signals to the pixels.

Connections of the circuit shown in FIG. 46 are described. The video signal input terminal S1 (RGB) is connected to one terminal of the switching element SW1R, one terminal of the switching element SW1G, and one terminal of the switching element SW1B. The other terminal of the switching element SW1R is connected to the source signal line S1-R, the other terminal of the switching element SW1G is connected to the source signal line S1-G, and the other terminal of the switching element SW1B is connected to the source signal line S1-B. The video signal input terminal S2 (RGB), the switching elements SW2R, SW2G and SW2B, and the source signal lines S1-R, S1-G, and S1-B are similarly connected.

The switching elements SW1R, SW1G, SW1B, SW2R, SW2G, and SW2B can be formed of, for example, n-channel transistors. One of a source and a drain of the n-channel transistor is connected to a video input terminal S1 (RGB), the other of the source and the drain thereof is connected to a video input terminal S1 (RGB), and a gate thereof is connected to a control signal line R, thereby a function as a switching element can be realized. By using an n-channel transistor as the switching element, an amorphous semiconductor can be easily used, which is advantageous in cost reduction and enlargement of the size. In addition to the aforementioned switches, a general analog switch configured with an n-channel transistor and a p-channel transistor connected in parallel or any element or circuit which can control on and off may be used.

FIG. 47 shows a timing chart in the case of writing a video signal to the pixels 211 of the n-th row and the (n+1)th row. As described above, a period when a video signal is written to the n-th row (hereinafter also referred to as one gate selection period) is divided into three periods. Video signals S1-Rn, S1-Gn, and S1-Bn are sequentially inputted from an external circuit to the video signal input terminal S1 (RGB). By controlling on/off of the switching element in accordance with the changes of the video signals, video signals can be outputted to the aforementioned three source signal lines by one video signal input terminal. As a result, the number of video signal input terminals can be reduced.

The driving method shown in FIG. 46 is an effective method for a display device in which a gate driver configured with transistors and pixels which are formed of an amorphous semiconductor are formed over the same substrate. In the case of a display device in which only a pixel of an m-th row and an n-th column, source signal lines, and gate signal lines are formed, it requires at least m×n terminals to be connected to an external circuit. In the case of forming a gate driver and pixels over the same substrate, a terminal for inputting a control signal, a terminal for a power source for driving the gate driver, and n input terminals for n rows are required as input terminals. That is, approximately n input terminals are required. Here, as shown in FIG. 46, the scale of an external circuit can be reduced when the n terminals can be reduced to (⅓) n terminals.

An operation of the circuit shown in FIG. 21 is described. As described above, a video signal can be written to the pixel 211 of a row selected by the gate driver 212. The written video signal determines how much light the pixel 211 emits or transmits. After the selection by the gate driver 212 is terminated, luminance or transmittance is held by holding the video signal by using a capacitor or capacitance of a display element until next selection is carried out. In this manner, active matrix drive can be realized.

Figure 49:
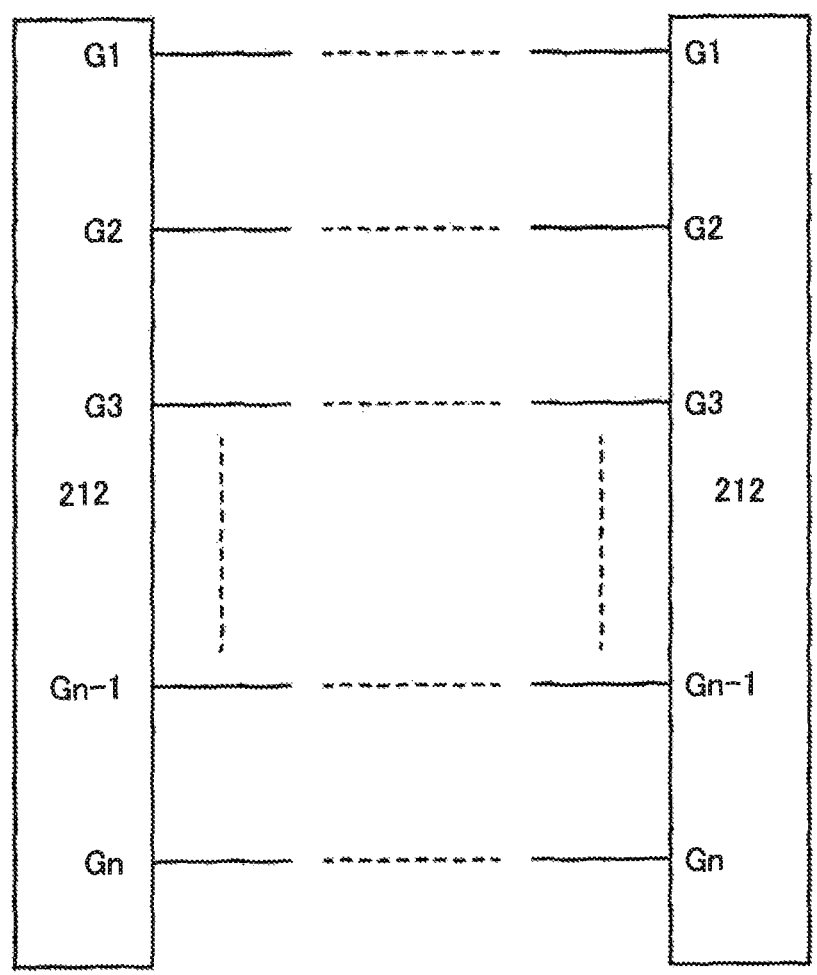
FIG. 49 is a diagram showing Embodiment Mode 6.

Description is made with reference to FIG. 49 of a configuration example of a display device in which gate drivers are provided to be opposed to each other as shown in the configuration examples of the display device shown in FIGS. 21, 22, and 46. Although not shown in FIG. 49, a source signal line and the pixel 211 are provided.

As shown in FIG. 49, the gate drivers 212 are gate drivers which output gate signals at the same timing, and outputs of each other are connected in the same row. These gate drivers 212 can be similar to the gate driver 212 shown in FIGS. 21 and 22.

As shown in FIG. 49, a driving method to drive one gate signal line by the gate drivers 212 provided to oppose to each other is advantageous in the case of forming the gate driver 212 using a transistor formed of an amorphous semiconductor regardless of the configuration of the gate driver 212. A transistor which is formed of an amorphous semiconductor and has low mobility of charge is quite inferior in capability to a polycrystal semiconductor and a single crystal semiconductor. However, such a transistor can be manufactured by an easy manufacturing process and is suitable for enlargement in the size. Therefore, a display device in which a portion of an internal circuit, for example, a gate driver is provided over the same substrate as the substrate where pixels are provided has been developed. However, in the case of forming a gate driver using a transistor formed of an amorphous semiconductor, a transistor with a wide channel width is required because of the low capability of the transistor. Therefore, an area for the gate driver is increased, which leads to a difficulty in realizing a narrower frame and higher resolution. In view of this, by driving one gate signal line by two gate drivers provided to oppose to each other, the gate signal line can be normally scanned even with low current capability.

As shown in FIG. 49, the aforementioned gate driver is not required to use the shift register circuit described in Embodiment Modes 1 to 4. In particular, the aforementioned gate driver is advantageous for a display device in which a gate driver is integrated, which is formed by using a transistor formed of an amorphous semiconductor with a low capability.

Hereinafter described are some configuration examples of the pixels 211 shown in FIGS. 21, 22, and 46.

Figure 23:
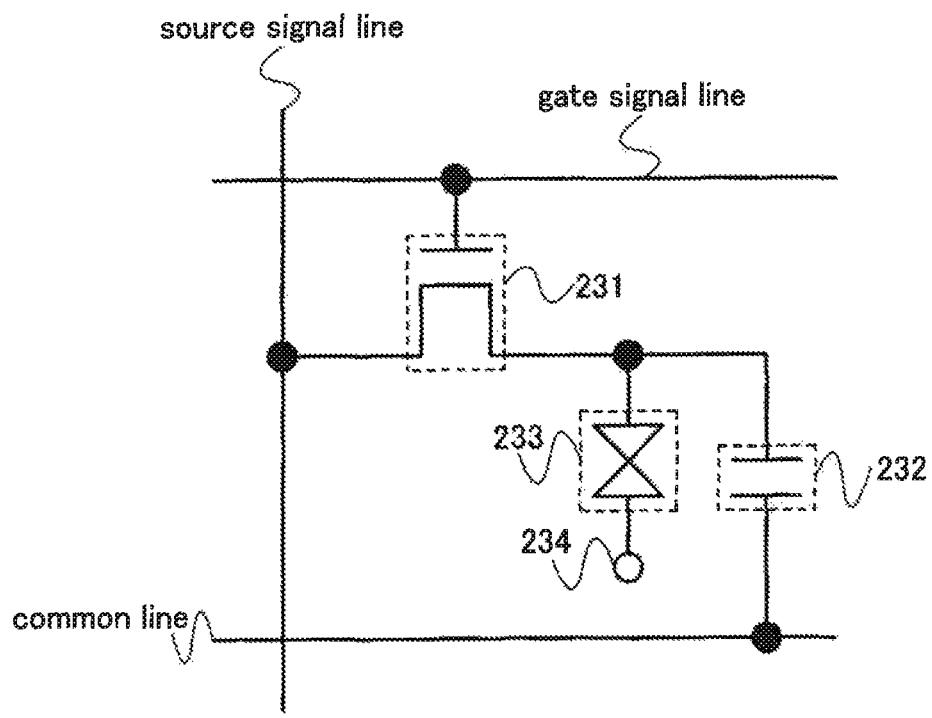
FIG. 23 is a diagram showing Embodiment Mode 6.

Description is made with reference to FIG. 23 of a configuration example of the pixel 211 using liquid crystal elements.

The pixel 211 of FIG. 23 is configured with a transistor 231, a capacitor 232 having two electrodes, a liquid crystal element 233 having two electrodes, a counter electrode 234 as the other electrode of the liquid crystal element 233, a source signal line, a gate signal line, and a common line as the other electrode of the capacitor 232. The source signal line and the gate signal line are similar to those shown in FIGS. 21, 22, and 46. The source signal line transmits an analog signal voltage as a video signal.

The transistor 231 is an n-channel transistor which operates as a switch. The transistor 231 is turned on when a potential of the gate signal line is High, and turned off when the potential of the gate signal line is Low. When the transistor 231 is turned on, the source signal line and one electrode of the liquid crystal element 233, and one electrode of the capacitor 232 are electrically connected, thereby a video signal transmitted from the source signal line is transmitted to one electrode of the liquid crystal element 233 and one electrode of the capacitor 232 as it is. When the transistor 231 is turned off, the source signal line and one electrode of the liquid crystal element 233, and one electrode of the capacitor 232 are electrically disconnected, thereby no charge is supplied or moved to one electrode of the capacitor 232 and one electrode of the liquid crystal element 233.

The capacitor 232 is a capacitor for holding a video signal transmitted from the source signal line through the transistor 231 which is turned on. The other electrode of the capacitor 232 is connected to the common line which has a constant potential, a potential applied to one electrode of the capacitor 232 can be held for a certain period. Further, the other electrode of the capacitor 232 may be connected anywhere as long as it has a constant potential in operation. For example, the other electrode of the capacitor 232 is preferably connected to a gate signal line of a preceding row. The gate signal line of the preceding row has just been scanned; therefore, the gate signal lines of almost all rows are Low and have a constant potential in the scan period. Thus, the gate signal line of the preceding row can be used instead of the common line.

The other electrode of the liquid crystal element 233 is connected to the counter electrode 234 having a constant potential. The liquid crystal element 233 is a liquid crystal element of which light transmittance changes depending on a potential difference between one electrode and the counter electrode 234. A potential of one electrode of the liquid crystal element 233 is determined by a video signal transmitted through the source signal line and the transistor 231; therefore, the transmittance of the liquid crystal element 233 is determined by the potential of the video signal. In the case of a display device using the liquid crystal element 233, a backlight can be used, a reflective electrode can be used, or a backlight and a reflective electrode can both be used. The liquid crystal element 233 has a capacitive component. Therefore, when the liquid crystal element 233 has a sufficient capacitive component for holding a video signal, the capacitor 232 and the common line are not required to be provided.

Figure 38:
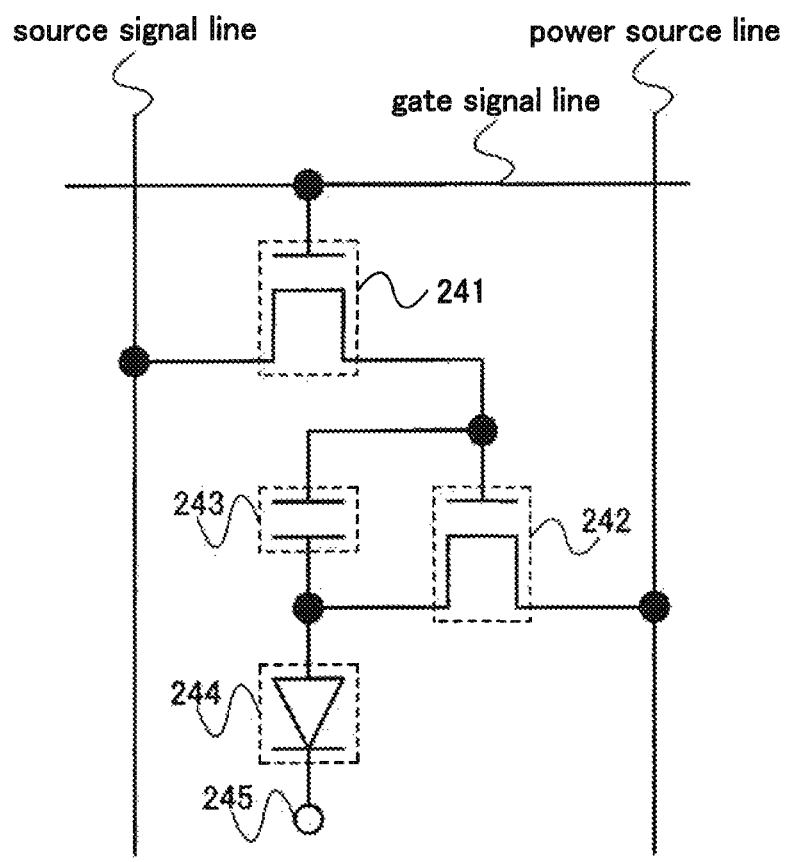
FIG. 38 is a diagram showing Embodiment Mode 6.

Description is made with reference to FIG. 38 of a configuration example of the pixel 211 using a light emitting element.

The pixel 211 shown in FIG. 38 is configured with a transistor 241, a transistor 242, a capacitor 243 having two electrodes, a light emitting element 244 having two electrodes, a counter electrode 245 as the other electrode of the light emitting element 244, a power source line, a source signal line, and a gate signal line. The source signal line and the gate signal line are similar to those shown in FIGS. 21, 22, and 46. The source signal line transmits an analog signal voltage or a 1-bit digital signal voltage as a video signal.

The transistor 241 is an n-channel transistor which operates as a switch. The transistor 241 is turned on when a potential of the gate signal line is High, and turned off when the potential of the gate signal line is Low. When the transistor 241 is turned on, the source signal line, a gate of the transistor 242, and one electrode of the capacitor 243 are electrically connected, thereby a video signal transmitted from the source signal line is transmitted to the gate of the transistor 242 and one electrode of the capacitor 243 as it is. When the transistor 241 is turned off, the source signal line, the gate of the transistor 242, and one electrode of the capacitor 243 are electrically disconnected, thereby no charge is supplied or moved to the gate of the transistor 242 and one electrode of the capacitor 243.

The transistor 242 is an n-channel driving transistor which operates in a saturation region and a linear region. When the transistor 242 operates in a saturation region, a current flowing therethrough is determined by a potential applied to a gate thereof, whereas when the transistor 242 operates in a linear region, the transistor 242 is turned on or off by a potential applied to the gate thereof. The power source line has a constant potential which is higher than that of the counter electrode 245. Therefore, a source of the transistor 242 is connected to the other electrode of the capacitor 243 and a drain thereof is connected to the power source line.

The capacitor 243 is a capacitor for holding a video signal transmitted from the source signal line through the transistor 241 which is turned on. One electrode of the capacitor 243 is connected to the gate of the transistor 242 and the other electrode thereof is connected to the source of the transistor 242. That is, the capacitor 243 holds a potential difference between the gate and the source of the transistor 242. Therefore, when a source potential of the transistor 242 changes, a gate potential of the transistor 242 changes as well by capacitive coupling. The other electrode of the capacitor 243 is connected to the source of the transistor 242 because the source potential thereof changes depending on a current supplied to the light emitting element 244 which is described later. That is, if a video signal writing period (a period when the transistor 241 is on) is terminated with a potential of one electrode of the light emitting element 244 in a transient state, the source potential of the transistor 242 changes and a gate-source potential changes, which results in changing a current value. If a potential of one electrode of the light emitting element 244 can be set in a steady state in the video signal writing period, the other electrode of the capacitor 243 may be connected to the power source line, a gate signal line of a preceding row, or anywhere having a constant potential.

The luminance of the light emitting element 244 changes in proportion to a current supplied thereto. That is, the luminance is determined in proportion to a current value determined by the transistor 242. The other electrode of the light emitting element 244 is connected to the counter electrode 245. It is preferable that the counter electrode 245 have a constant potential; however, the potential may be changed for compensating the change in characteristics of the transistor 242.

Figure 39:
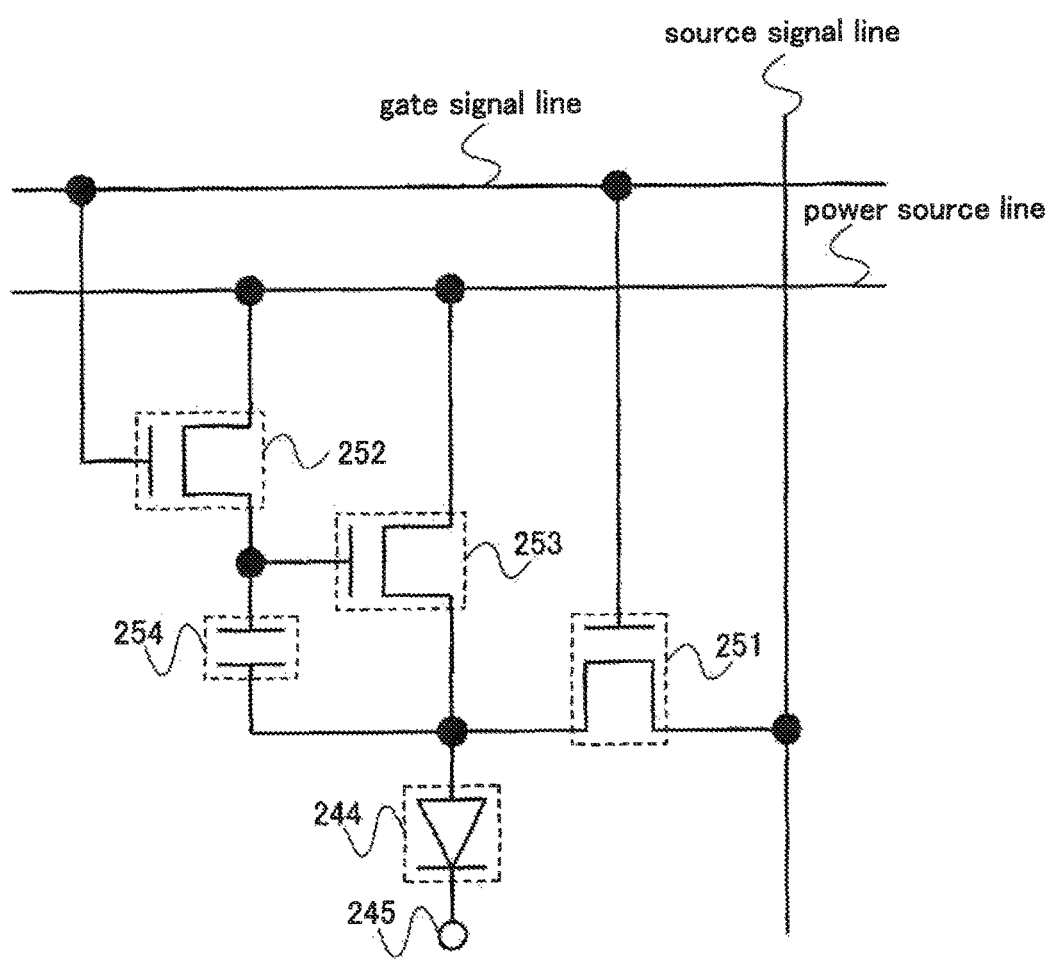
FIG. 39 is a diagram showing Embodiment Mode 6.

Description is made with reference to FIG. 39 of a configuration example of the pixel 211 using a light emitting element and a pixel circuit for compensating the change in characteristics of a driving transistor.

The pixel 211 shown in FIG. 39 is configured with a transistor 251, a transistor 252, a transistor 253, a capacitor 254 having two electrodes, a light emitting element 244 having two electrodes, a counter electrode 245 as the other electrode of the light emitting element 244, a power source line, a source signal line, and a gate signal line. The source signal line and the gate signal line are similar to those shown in FIGS. 21, 22, and 46. The light emitting element 244 and the counter electrode 245 are similar to those in FIG. 38. The source signal line transmits an analog signal current as a video signal.

The transistor 251 is an n-channel transistor which operates as a switch. The transistor 251 is turned on when a potential of the gate signal line is High and off when the potential of the gate signal line is Low. When the transistor 251 is turned on, the source signal line, a source of the transistor 252, one electrode of the capacitor 254, and one electrode of the light emitting element 244 are electrically connected, thereby a video signal is transmitted from the source signal line. When the transistor 251 is turned off, the source signal line, the source of the transistor 252, one electrode of the capacitor 254, and one electrode of the light emitting element 244 are electrically disconnected, thereby a video signal is not transmitted.

The transistor 252 is an n-channel transistor which operates as a switch. The transistor 252 is turned on when a potential of the gate signal line is High and off when the potential of the gate signal line is Low. When the transistor 252 is turned on, the power source line and a gate of a transistor 253 are electrically connected, thereby the transistor 253 is diode-connected. When the transistor 252 is turned off, the power source line and the gate of the transistor 253 are disconnected, thereby no charge is supplied or moved to the gate of the transistor 252.

The transistor 253 is an n-channel transistor which operates in a saturation region. The transistor 253 is a driving transistor of which gate voltage is determined by a current flowing therethrough. In a writing period when a current as a video signal is inputted from the source signal line through the transistors 251 and 252 which are turned on by the gate signal line having a High potential, the transistor 253 is diode-connected. A source of the transistor 253 is connected to one electrode of the light emitting element and a drain thereof is connected to the power source line so that a current as a video signal flows from the power source line side. Here, as in the video signal writing period, it is preferable that a potential of the power source line be a potential which makes a source potential of the transistor 253 be equal to or lower than the sum of a potential of a counter electrode 256 and a threshold voltage of the light emitting element 244. If the source potential of the transistor 253 is higher than the sum of the potential of the counter electrode 256 and the threshold voltage of the light emitting element 244, a current large enough for the light emitting element 244 to emit light is supplied and the light emitting element 244 emits light. Moreover, a video signal cannot be written accurately, which degrades display quality. In this manner, when a video signal is written, the video signal is held in the capacitor 254 which is connected between the gate and the source of the transistor 253 in accordance with the video signal. As the transistor 253 operates in a saturation region, a constant current flows therethrough if a potential difference between the source and drain potentials is held. In this manner, a video signal is written and the transistors 251 and 252 are turned off, thereby the gate of the transistor 253 becomes a floating state. When a potential of the power source line is raised in this state, a current corresponding to the video signal starts flowing from the power source line through the transistor 253 to the light emitting element 244. When the current starts flowing, a potential corresponding to the flowing current is supplied to one electrode of the light emitting element 244, thereby a potential thereof gradually rises. As a result, a source potential of the transistor 253 changes and a gate potential of the transistor 253 rises at the same time since the capacitor 254 holds a potential difference between the gate and the source of the transistor 253. That is, the potential difference between the gate and the source of the transistor 253 does not change even when the potential of the power source line becomes high and a current starts flowing to the light emitting element 244. Therefore, a current value corresponding to the video signal can be supplied to the light emitting element 244.

The capacitor 254 is a capacitor for holding a potential difference between the gate and the source of the transistor 253. As described above, one electrode of the capacitor 254 is connected to the source of the transistor 253 and one electrode of the light emitting element 244, while the other electrode thereof is connected to the gate of the transistor 253.

As described above, the power source line has a low potential in a video signal writing period and a high potential when the writing period is terminated. That is, the power source line has a potential of a binary value. The shift register circuit described in Embodiment Modes 1 to 4 may be used to drive this power source line. This shift register circuit has a configuration to sequentially output a High signal. However, by using an inverter circuit which inverts between High and Low, a function as the power source line can be achieved.

Figure 40:
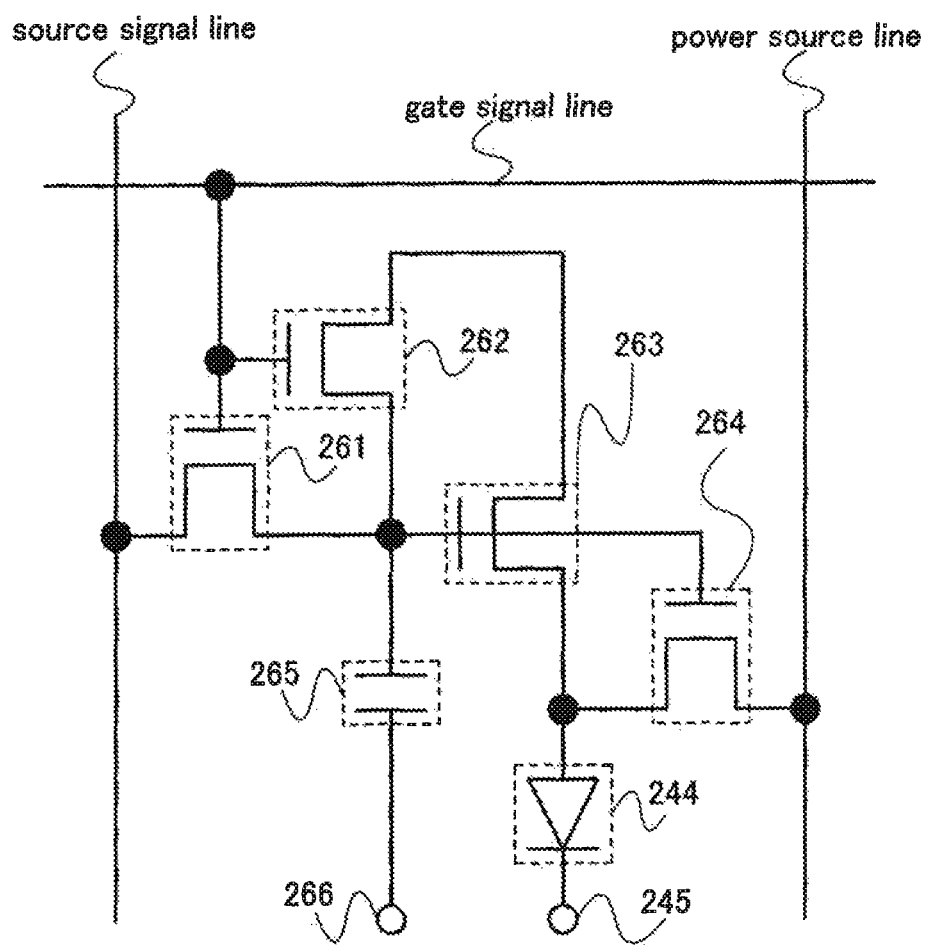
FIG. 40 is a diagram showing Embodiment Mode 6.

Description is made with reference to FIG. 40 of a configuration example of the pixel 211 using a light emitting element and a pixel circuit for compensating the change in characteristics of a driving transistor.

The pixel 211 shown in FIG. 40 is configured with a transistor 261, a transistor 262, a transistor 263, a transistor 264, a capacitor 265 having two electrodes, a constant potential line 266 as the other electrode of the capacitor 265, the light emitting element 244 having two electrodes, the counter electrode 245 as the other electrode of the light emitting element 244, the power source line, the source signal line, and the gate signal line. The source signal line and the gate signal line are similar to those described in FIGS. 21, 22, and 46. The light emitting element 244 and the counter electrode 245 are similar to those shown in FIG. 38. The source signal line transmits an analog signal current as a video signal.

The transistors 261 and 262 are n-channel transistors which operates as switches. The transistors 261 and 262 are turned on when a potential of the gate signal line is High and off when the potential of the gate signal line is Low. When the transistors 261 and 262 are turned on, the source signal line and a gate of the transistor 263, a gate of the transistor 264, and one electrode of the capacitor 265 are electrically connected, thereby the transistor 263 is diode-connected. A video signal is a current which flows from the source signal line. Sources of the transistors 263 and 264 are connected to one electrode of the light emitting element so that the power source line has a higher potential than one electrode of the light emitting element. A drain of the transistors 263 is connected to the transistor 262 and a drain of the transistor 264 is connected to the power source line.

The transistor 263 is an n-channel transistor which operates in a saturation region. The transistor 263 is a driving transistor of which gate voltage is determined by a current flowing therethrough. When the gate signal line has a High potential and the transistors 261 and 262 are turned on, the transistor 263 is diode-connected and a video signal is inputted from the source signal line. A gate potential of the transistor 263 at that time corresponds to the video signal and the transistors 263 and 264 have gates and sources in common; therefore, a gate potential of the transistor 264 also corresponds to the video signal. A potential of the gates of the transistors 263 and 264 at that time is held at one electrode of the capacitor 265. In this manner, the gate signal line has a Low potential, thereby the transistors 261 and 262 are turned off. Then, the gate potential of the transistors 263 and 264 is held in the capacitor 265. The drain of the transistor 263 becomes a floating state; therefore, a current does not flow through the transistor 263 to the light emitting element 244.

The constant potential line 266 as the other electrode of the capacitor 265 may be the power source line or a gate signal line of a preceding row. Alternatively, one electrode of the light emitting element 244 may be used. In this manner, a current corresponding to a video signal can be supplied to the light emitting element without changing a potential difference between the gate and the source of the transistor 264 even when a potential of one electrode of the light emitting element 244 changes.

Embodiment Mode 7

In this embodiment mode, description is made of a layout example of the shift register circuit described in Embodiment Modes 1 to 4.

Figure 44:
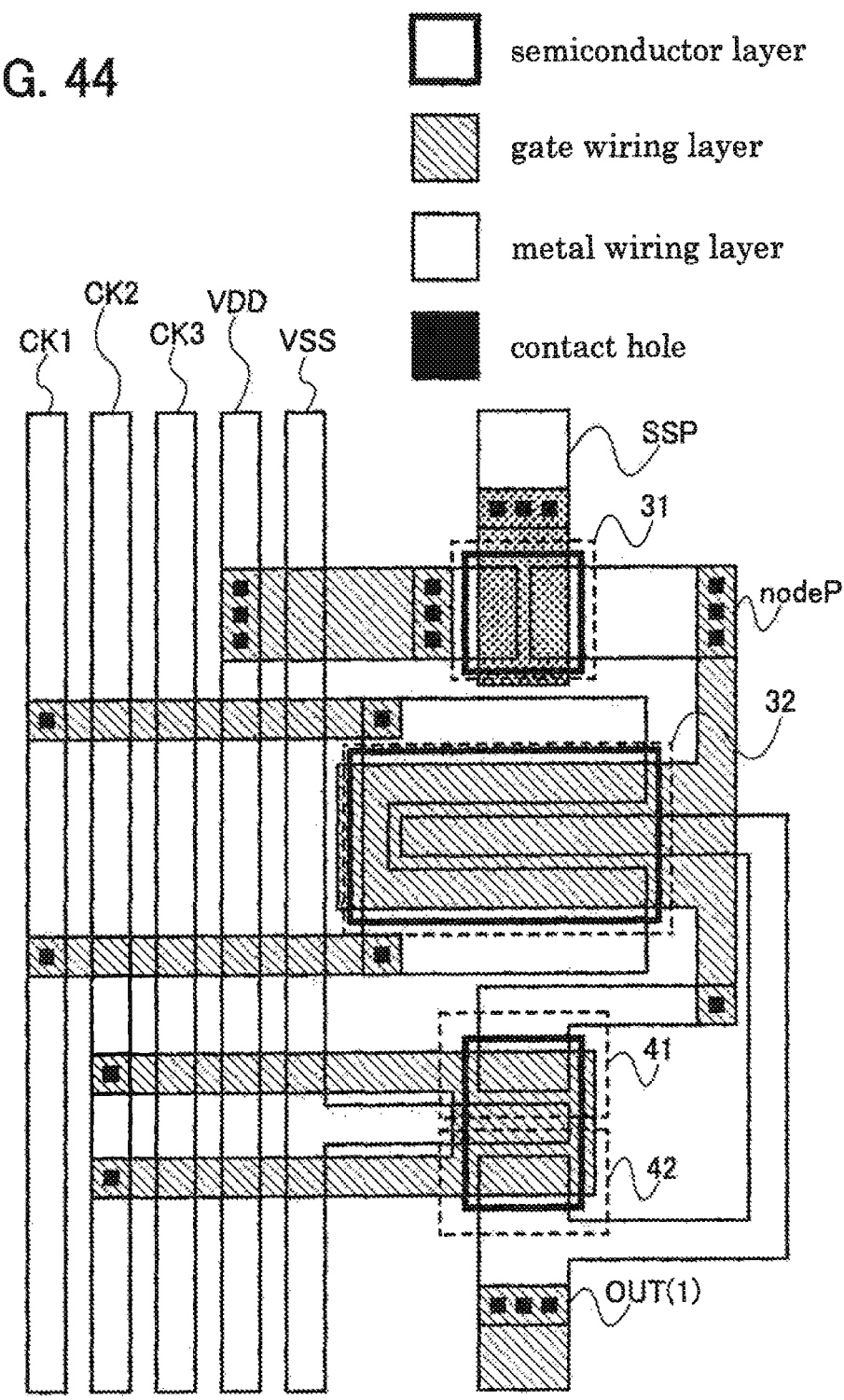
FIG. 44 is a diagram showing Embodiment Mode 7.

Description is made with reference to FIG. 44 of a configuration example of the case where the shift register circuit described in Embodiment Mode 1 is formed of a bottom gate type transistor. FIG. 44 shows a configuration example of the shift register circuit described in Embodiment Mode 1; however, the invention is not limited to this and this embodiment mode can be applied to the shift register circuit described in Embodiment Modes 2 to 4 as well. In addition, this embodiment mode can be applied to a shift register circuit other than those described in Embodiment Modes 1 to 4.

FIG. 44 includes a transistor 31, a transistor 32, a transistor 41, a transistor 42, three control signal lines for transmitting control signals of CK1, CK2, and CK3, a power source line having a potential of the positive power source VDD, and two power source lines each having a potential of the negative power source VSS. The control signal line for transmitting CK1 is referred to as a control signal line CK1, the control signal line for transmitting CK2 is referred to as a control signal line CK2, the control signal line for transmitting CK3 is referred to as a control signal line CK3, the power source line having a potential of the positive power source VDD is referred to as a power source line VDD, and the power source line having a potential of the negative power source VSS is referred to as a power source line VSS.

Description is made of some features of the configuration example of the shift register circuit shown in FIG. 44.

A feature of the shift register circuit is that the power source line VDD and the power source line VSS are provided between OUT(1) as an output of the shift register circuit, and the control signal lines CK1, CK2, and CK3. The control signal lines CK1, CK2, and CK3 which are control signal lines for transmitting clock signals have constantly changing potentials. Therefore, when parasitic capacitance is generated between the control signal lines, a noise may occur due to a change in potential of the control signal line. As OUT(1) corresponds to an input of a shift register circuit of a following stage, the shift register circuit easily malfunctions if a noise occurs in OUT(1). Therefore, by providing the power source lines having constant potentials between the control signal lines and OUT(1), an effect of the noise generated by the control signal lines on the shift register circuit can be reduced.

A feature of the shift register circuit is that the power source line VDD, the power source line VSS, and a transistor are provided between a metal wiring layer for connecting the output of the transistor 32 and OUT(1) and the control signal lines CK1, CK2, and CK3. As described above, if a noise occurs in the metal wiring layer for connecting the output of the transistor 32 and OUT(1), a malfunction of the shift register circuit may occur. Moreover, depending on the arrangement of the transistors, a long wire is required to be prepared. Therefore, by providing a power source line and a transistor between the control signal lines, a noise can be prevented.

A feature of the shift register circuit is that the transistor 32 which performs a boot strap operation is formed of a U-shaped transistor. The transistor 32 is a transistor for supplying the positive power source VDD of the output; therefore, a high current capability is required. By using a U-shaped transistor, a channel width can be set wide.

One of the source or the drain of the transistors 41 and 42 is used in common. As a result, as an area for the shift register circuit can be smaller, it is advantageous in that a display device with higher resolution and a narrower frame can be provided.

A feature of the shift register circuit is that the power source line and the control signal line have the same widths. Normally, a large instantaneous current flows through the power source line; therefore, a width thereof is formed wide to reduce wiring resistance. In this manner, a malfunction caused by a voltage drop due to the instantaneous current is prevented. However, the control signal line is used for outputting the potential of the positive power source VDD in the invention; therefore, a large instantaneous current also flows through the control signal line. In view of this, it is preferable that the width of the control signal line is wide. If the width of the control signal line is as narrow as before, the control signal line cannot hold the potential due to a voltage drop caused by a large instantaneous current, which leads to a malfunction of the shift register circuit. In view of this, it is preferable that the control signal line and the power source line have the same widths. Further, as a small current flows through the power source line in the shift register circuit of the invention, the control signal line may have a wider width than the power source line.

Description is made with reference to FIG. 45 of another configuration example of the case where the shift register circuit described in Embodiment Mode 1 is formed of a bottom gate type transistor FIG. 45 shows a configuration example of the shift register circuit described in Embodiment Mode 1; however, the invention is not limited to this and this embodiment mode can be applied to the shift register circuits described in Embodiment Modes 2 to 4 as well. Further, this embodiment mode can be applied to a shift register circuit except for those described in Embodiment Modes 1 to 4.

The circuit shown in FIG. 45 is configured with the transistor 31, the transistor 32, the transistor 41, the transistor 42, three control signal lines for transmitting controls signals of CK1, CK2, and CK3, and two power source lines which are a power source line having a potential of the positive power source VDD and a power source line having a potential of the negative power source VSS. The control signal line for transmitting CK1 is referred to as a control signal line CK1, the control signal line for transmitting CK2 is referred to as a control signal line CK2, the control signal line for transmitting CK3 is referred to as a control signal line CK3, the power source line having a potential of the positive power source VDD is referred to as a power source line VDD, and the power source line having a potential of the negative power source VSS is referred to as a power source line VSS.

Description is made of some features of the configuration example of the shift register circuit shown in FIG. 45.

A feature of the shift register circuit is that a transistor constituting the shift register circuit is provided so as to be sandwiched by the power source lines having constant potentials. When a boot strap operation is employed, a noise is required to be reduced since a node in a floating state exists. That is, by sandwiching the transistor with the power source lines having constant potentials, a noise caused by the control signal line or other circuits can be reduced.

Embodiment 1

Figure 24A:
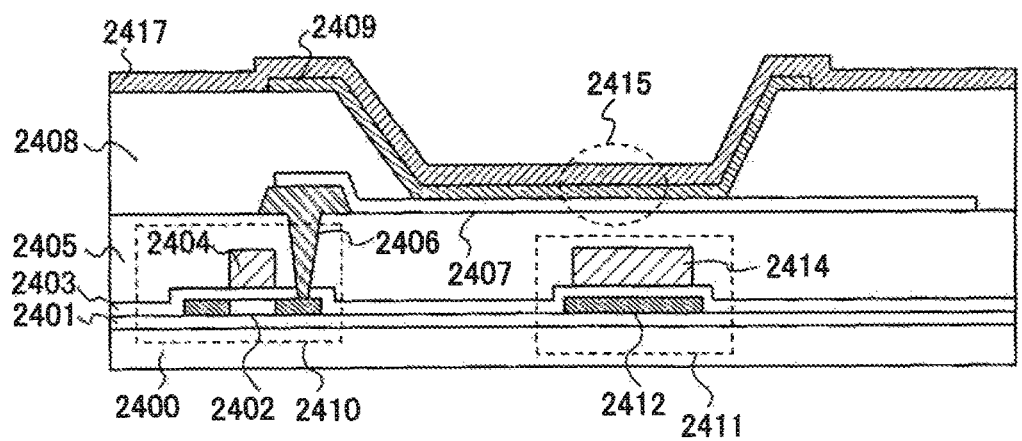
FIGS. 24A and 24B are diagrams showing Embodiment 1.
Figure 24B:
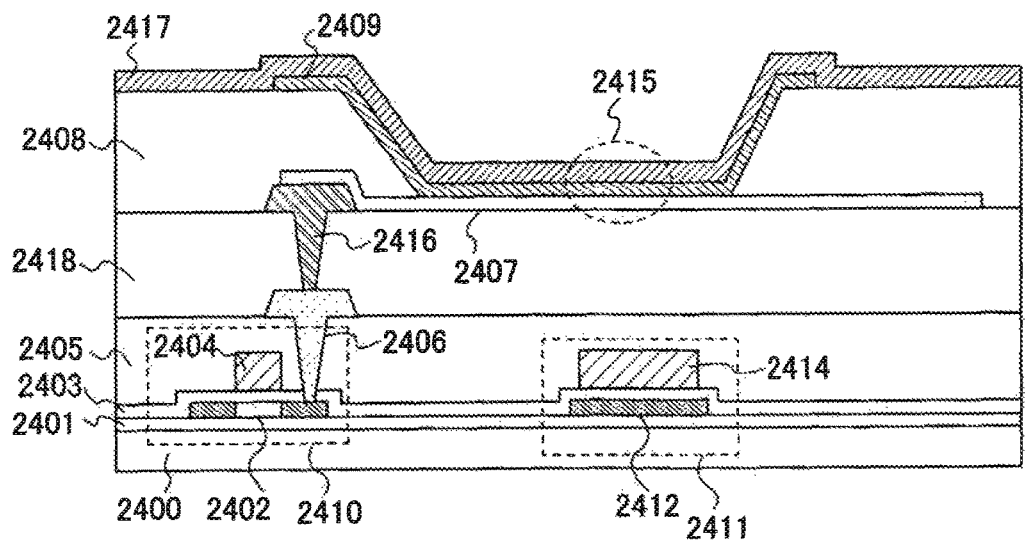

In this embodiment, a structure example of a pixel is described. FIGS. 24A and 24B are cross sectional views each showing a pixel in the panel of the invention. They show an example in which a transistor is used as a switching element arranged in the pixel, and a light emitting element is used as a display medium arranged in the pixel.

In FIGS. 24A and 24B, a reference numeral 2400 denotes a substrate, 2401 denotes a base film, each of 2402 and 2412 denotes a semiconductor layer, 2403 denotes a first insulating film, 2404 denotes a gate electrode, 2414 denotes an electrode, 2405 denotes a second insulating film, 2406 denotes an electrode which can function as a source electrode or a drain electrode, 2407 denotes a first electrode, 2408 denotes a third insulating film, 2409 denotes a light emitting layer, 2417 denotes a second electrode, 2410 denotes a transistor, 2415 denotes a light emitting element, and 2411 denotes a capacitor. In FIGS. 24A and 24B, the transistor 2410 and the capacitor 2411 are shown as representatives of elements forming a pixel. A structure of FIG. 24A is described.

The substrate 2400 can be a glass substrate such as a barium borosilicate glass substrate or an alumino borosilicate glass substrate, a quartz substrate, a ceramic substrate, or the like. Alternatively, the substrate 2400 may be a metal substrate including stainless steel or a semiconductor substrate each having a surface over which an insulating film is formed. Alternatively, the substrate 2400 may be formed of a flexible synthetic resin such as plastic. The surface of the substrate 2400 may be planarized in advance by polishing such as CMP.

The base film 2401 can be an insulating film such as silicon oxide, silicon nitride, or silicon nitride oxide. The base film 2401 can prevent an alkaline earth metal or an alkali metal such as Na included in the substrate 2400 from diffusing into a semiconductor layer 2402 and from causing an adverse effect on the characteristic of the transistor 2410. Although in FIGS. 24A and 24B, the base film 2401 is formed of a single layer, it may be formed of two or more layers. Note that in the case where diffusion of impurities is not a big problem like in the case of using a quartz substrate, the base film 2401 is not always required to be provided.

As the semiconductor layers 2402 and 2412, a patterned crystalline semiconductor film and amorphous semiconductor film can be used. A crystalline semiconductor film can be obtained by crystallizing an amorphous semiconductor film. As a crystallization method, laser crystallization, thermal crystallization using RTA or an annealing furnace, thermal crystallization using a metal element for promoting crystallization, or the like can be used. The semiconductor layer 2402 includes a channel forming region and a pair of impurity regions to which an impurity element imparting a conductivity type is added. Note that another impurity region to which an impurity element is added at a low concentration may be provided between the channel forming region and the pair of impurity regions. Accordingly, the semiconductor layer 2412 can have a structure where an impurity element imparting a conductivity type is added to the whole semiconductor layer 2412.

The first insulating film 2403 can be formed of a single layer or stacked layers of a plurality of films by using silicon oxide, silicon nitride, silicon nitride oxide, or the like. It is to be noted that a layer containing hydrogen is used as the first insulating film 2403, and the semiconductor layer 2402 may be hydrogenated.

The gate electrode 2404 and the electrode 2414 are formed of a single layer or stacked layers of elements selected from Ta, W, Ti, Mo, Al, Cu, Cr, and Nd or an alloy or a compound containing such elements.

The transistor 2410 includes the semiconductor layer 2402, the gate electrode 2404, and the first insulating film 2403 between the semiconductor layer 2402 and the gate electrode 2404. Although in FIGS. 24A and 24B, only the transistor 2410 connected to the first electrode 2407 of the light emitting element 2415 is shown as a transistor constituting a pixel, a pixel may include a plurality of transistors. Further, although in this embodiment, the transistor 2410 is shown as a top gate transistor, it may also be a bottom gate transistor having a gate electrode below the semiconductor layer, or a dual gate transistor having gate electrodes above and below the semiconductor layer.

The capacitor 2411 includes the first insulating film 2403 as a dielectric, and the semiconductor layer 2412 and the electrode 2414 as a pair of electrodes that faces each other with the first insulating film 2403 interposed therebetween. FIGS. 24A and 24B show an example in which one of the pair of electrodes of the capacitor included in a pixel is the semiconductor layer 2412 formed at the same time as the semiconductor layer 2402 of the transistor 2410, and the other electrode is the electrode 2414 formed at the same time as the gate electrode 2404 of the transistor 2410. However, the invention is not limited to this.

The second insulating film 2405 can be formed of a single layer or stacked layers of an inorganic insulating film or an organic insulating film. As an inorganic insulating film, a silicon oxide film formed by CVD, a silicon oxide film applied by SOG (Spin On Glass), or the like can be used. As an organic insulating film, a film of polyimide, polyamide, BCB (benzocyclobutene), acrylic, a positive photosensitive organic resin, a negative photosensitive organic resin, or the like can be used.

Further, as the second insulating film 2405, a material having a skeleton of a bond of silicon (Si) and oxygen (O) can be used. As a substituent of this material, an organic group containing at least hydrogen (for example, alkyl group or aromatic hydrocarbon) is used. Alternatively, a fluoro group, or both an organic group containing at least hydrogen and a fluoro group may be used as a substituent.

A surface of the second insulating film 2405 may be processed with high density plasma to be nitrided. The high density plasma is generated by using a microwave with a high frequency, for example, 2.45 GHz. It is to be noted that high density plasma with an electron density of $1 \times 10^{11}$ to $1 \times 10^{13}$ cm$^{-3}$ and an electron temperature of 0.2 to 2.0 eV (more preferably, 0.5 to 1.5 eV) is used. Since the high density plasma with a feature of the low electron temperature has low kinetic energy of active species as mentioned above, a film having less defects can be formed with less plasma damage as compared to the conventional plasma treatment. In high density plasma treatment, a temperature of the substrate 2400 is set to be 350 to 450° C. Further, in an apparatus for generating high density plasma, a distance between an antenna for generating a microwave and the substrate 2400 is set to be 20 to 80 mm (preferably, 20 to 60 mm).

In an atmosphere of nitrogen ($N_2$) and a rare gas (containing at least one of He, Ne, Ar, Kr, and Xe), or an atmosphere of nitrogen, hydrogen ($H_2$), and a rare gas, or an atmosphere of ammonia ($NH_3$) and a rare gas, the aforementioned high density plasma treatment is performed to nitride the surface of the second insulating film 2405. The surface of the second insulating film 2405 formed by the nitridation treatment with the high density plasma is mixed with H or an element such as He, Ne, Ar, Kr, or Xe. For example, a silicon oxide film or a silicon oxynitride film is used as the second insulating film 2405 and is subjected to the high density plasma treatment to form a silicon nitride film. By utilizing hydrogen contained in the thus formed silicon nitride film, the semiconductor layer 2402 of the transistor 2410 may be hydrogenated. Note that the hydrogenation treatment may be combined with the aforementioned hydrogenation treatment using hydrogen contained in the first insulating film 2403. Note that an insulating film may be formed over a nitride film formed by the aforementioned high density plasma treatment so as to be used as the second insulating film 2405.

The electrode 2406 is formed of a single layer or stacked layers of an element selected from Al, Ni, C, W, Mo, Ti, Pt, Cu, Ta, Au, and Mn, or an alloy containing such elements.

One or both of the first electrode 2407 and the second electrode 2417 can be a light-transmissive electrode. As a light-transmissive electrode, indium oxide containing tungsten oxide (IWO), indium zinc oxide containing tungsten oxide (IWZO), indium oxide containing titanium oxide (ITiO), indium tin oxide containing titanium oxide (ITTiO), or the like may be used. Alternatively, it is needless to say that indium tin oxide (ITO), indium zinc oxide (IZO), indium tin oxide to which silicon oxide is added (ITSO), or the like may be used.

The light emitting layer 2409 is preferably formed of a plurality of layers which has a different function, such as a hole injecting/transporting layer, a light emitting layer, and an electron injecting/transporting layer.

A hole injecting/transporting layer is preferably formed of a compound material including an organic compound material with a hole transporting property and an inorganic compound material with an electron accepting property with respect to the organic compound material. This structure generates a lot of hole carriers in an organic compound which originally has almost no inherent carriers so that an extremely excellent hole injecting/transporting property can be obtained. Accordingly, a driving voltage can be set lower than a conventional driving voltage. Further, since the hole injecting/transporting layer can be made thick without raising a driving voltage, a short circuit of the light emitting element due to dust or the like can be suppressed.

As an organic compound material with a hole transporting property, 4,4',4"-tris[N-(3-methylphenyl)-N-phenylamino]-triphenylamine (abbreviated to MTDATA), 1,3,5-tris[N,N-di(m-tolyl)amino]benzene (abbreviated to m-MTDAB), N,N'-diphenyl-N,N'-bis(3-methylphenyl)-1,1'-biphenyl-4,4'-diamine (abbreviated to TPD), 4,4'-bis[N-(1-naphthyl)-N-phenylamino]biphenyl (abbreviated to NPB) or the like is given as an example. However, the organic compound material with a hole transporting property is not limited to the example.

As an inorganic compound material with an electron accepting property, titanium oxide, zirconium oxide, vanadium oxide, molybdenum oxide, tungsten oxide, rhenium oxide, ruthenium oxide, and zinc oxide, or the like is given as an example. In particular, vanadium oxide, molybdenum oxide, tungsten oxide, and rhenium oxide are preferred since these oxides can be used easily for vacuum deposition.

An electron injecting/transporting layer is formed using an organic compound material with an electron transporting property. Specifically, tris(8-quinolinolato)aluminum (abbreviated to Alq$_3$), tris(4-methyl-8-quinolinolato)aluminum (abbreviated to Almq$_3$), or the like is given as an example. However, the organic compound material with an electron transporting property is not limited to the example.

As a light emitting layer, the following compound can be given as an example: 9,10-di(2-naphthyl)anthracene (abbreviated to DNA), 9,10-di(2-naphthyl)-2-tert-butylanthracene (abbreviated to t-BuDNA), 4,4'-bis(2,2-diphenylvinyl)biphenyl (abbreviated to DPVBi), coumarin 30, coumarin 6, coumarin 545, coumarin 545T, perylene, rubrene, periflanthene, 2,5,8,11-tetra(tert-butyl)perylene (abbreviated to TBP), 9,10-diphenylanthracene (abbreviated to DPA), 5,12- diphenyltetracene, 4-(dicyanomethylene)-2-methyl-[p-(dimethylamino)styryl]-4H-pyran (abbreviated to DCM1), 4-(dicyanomethylene)-2-methyl-6-[2-(julolidine-9-yl)ethenyl]-4H-pyran (abbreviated to DCM2), and 4-(dicyanomethylene)-2,6-bis[p-(dimethylamino)styryl]-4H-pyran (abbreviated to BisDCM), or the like. Alternatively, a compound capable of emitting phosphorescence such as bis[2-(4',6'-difluorophenyl)pyridinato-N,$C^{2'}$]iridium(picolinate) (abbreviated to FIrpic), bis{2-[3',5'-bis(trifluoromethyl)phenyl]pyridinato-N,$C^{2'}$}iridium(picolinate) (abbreviated to Ir(CF$_3$ppy)$_2$(pic)), tris(2-phenylpyridinato-N,$C^{2'}$) iridium (abbreviated to Ir(ppy)$_3$), bis(2-phenylpyridinato-N,$C^{2'}$)iridium(acetylacetonate) (abbreviated to Ir(ppy)$_2$(acac)), bis[2-(2'-thienyl)pyridinato-N,$C^{3'}$]iridium(acetylacetonate) (abbreviated to Ir(thp)$_2$(acac)), bis(2-phenylquinolinato-N,$C^{2'}$)iridium(acetylacetonate) (abbreviated to Ir(pq)$_2$(acac)), or bis[2-(2'-benzothienyl)pyridinato-N,$C^{3'}$]iridium(acetylacetonate) (abbreviated to Ir(btp)$_2$(acac)) can be used.

Besides, as a high molecular electroluminescent material that can be used to form the light emitting layer, a polyparaphenylene vinylene based material, a polyparaphenylene based material, a polythiophene based material, or a polyfluorene based material can be given as an example.

In any case, the structure of the light emitting layer can vary. Therefore, instead of providing a specific hole or electron injecting/transporting layer or light emitting layer, modifications of the structure such as providing an electrode layer in order to be used for the hole or electron injecting/transporting layer or the light emitting layer, or providing a dispersed light emitting material can be allowed as far as an object as the light emitting element can be achieved.

The other of the first electrode 2407 and the second electrode 2417 may be formed of a non-light transmissive material. For example, an alkaline metal such as Li or Cs, an alkali earth metal such as Mg, Ca, or Sr, an alloy containing such metals (Mg:Ag, Al:Li, Mg:In, or the like), a compound of such metals (CaF$_2$ or CaN), or a rare earth metal such as Yb or Er can be used.

The third insulating film 2408 can be formed using the same material as the second insulating film 2405. The third insulating film 2408 is formed on the periphery of the first electrode 2407 so as to cover an end portion of the first electrode 2407, and has a function of separating the light emitting layer 2409 between adjacent pixels.

The light emitting layer 2409 is formed of a single layer or a plurality of layers. In the case where it is formed of a plurality of layers, these layers can be categorized into a hole injecting layer, a hole transporting layer, a light emitting layer, an electron transporting layer, an electron injecting layer, and the like in terms of a carrier transporting property. Note that a boundary between layers is not always required to be clear, and there is a case where materials constituting adjacent layers are mixed with each other so that an interface is unclear. An organic material or an inorganic material can be used for each layer. As an organic material, any of a high molecular organic material, a medium molecular organic material, and a low molecular organic material can be used.

The light emitting element 2415 is formed of the light emitting layer 2409, and the first electrode 2407 and the second electrode 2417 which interpose the light emitting layer 2409 therebetween. One of the first electrode 2407 and the second electrode 2417 corresponds to an anode, and the other corresponds to a cathode. When a forward bias voltage higher than a threshold voltage is applied between the anode and the cathode, a current flows from the anode to the cathode so that the light emitting element 2415 emits light.

Description is made of a structure of FIG. 24B. Note that the same reference numeral is used for a common portion in FIGS. 24A and 24B, and the description is omitted. FIG. 24B shows a structure in which an insulating film 2418 is sandwiched between the second insulating film 2405 and the third insulating film 2408 in FIG. 24A. The second electrode 2416 and the first electrode 2406 are connected in a contact hole formed in the insulating film 2418.

The insulating film 2418 can have the same structure as the second insulating film 2405. The second electrode 2416 can have the same structure as the first electrode 2406.

Embodiment 2

Figure 28A:
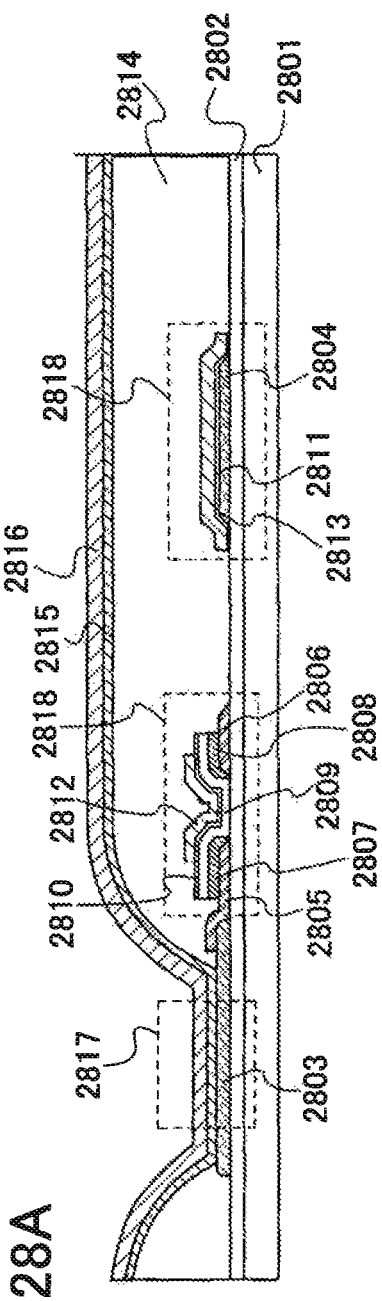
FIGS. 28A and 28B are views showing Embodiment 2.
Figure 28B:
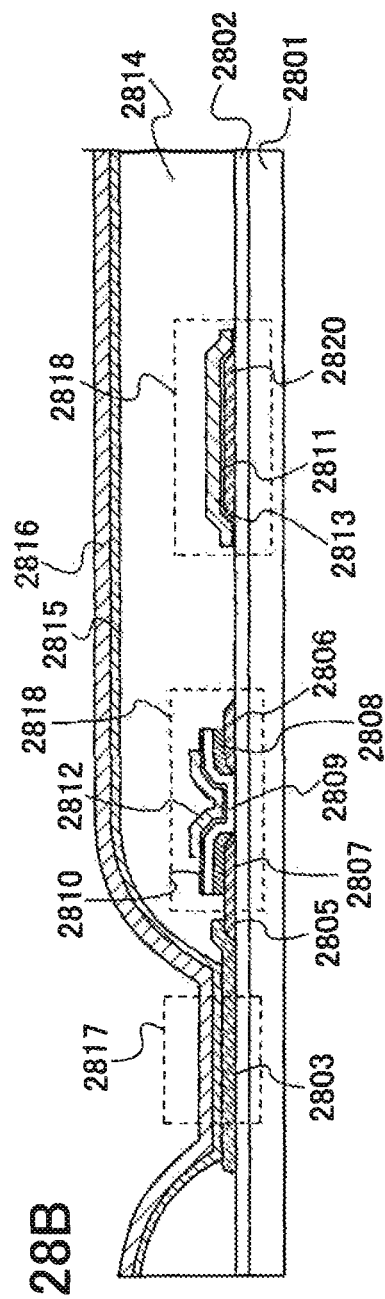

In this embodiment, description is made of the case of using an amorphous silicon (a-Si:H) film as a semiconductor layer of a transistor. FIGS. 28A and 28B each show a case of a top gate transistor, and FIGS. 29A to 30B each show a case of a bottom gate transistor.

FIG. 28A shows a cross sectional view of a top gate transistor which uses amorphous silicon for the semiconductor layer. A base film 2802 is formed over a substrate 2801. Further, a pixel electrode 2803 is formed over the base film 2802. In addition, a first electrode 2804 is formed in the same layer with the same material as the pixel electrode 2803.

As the substrate, a glass substrate, a quartz substrate, a ceramic substrate, or the like can be used. The base film 2802 can be formed using a single layer of aluminum nitride, silicon oxide, silicon oxynitride, or the like or stacked layers thereof.

Wires 2805 and 2806 are formed over the base film 2802, and an end portion of the pixel electrode 2803 is covered with the wire 2805. N-type semiconductor layers 2807 and 2808 each having N-type conductivity are formed over the wires 2805 and 2806 respectively. In addition, a semiconductor layer 2809 is formed between the wires 2805 and 2806 and over the base film 2802, which is partially extended so as to cover the N-type semiconductor layers 2807 and 2808. Note that this semiconductor layer is formed of an amorphous semiconductor film such as an amorphous silicon (a-Si:H) film or a microcrystalline semiconductor (μ-Si:H) film. Then, a gate insulating film 2810 is formed over the semiconductor layer 2809, and an insulating film 2811 is formed in the same layer with the same material as the gate insulating film 2810, and also over the first electrode 2804. Note that as the gate insulating film 2810, a silicon oxide film, a silicon nitride film, or the like is used.

A gate electrode 2812 is formed over the gate insulating film 2810. In addition, a second electrode 2813 is formed in the same layer with the same material as the gate electrode, and over the first electrode 2804 with the insulating film 2811 interposed therebetween. A capacitor 2819 corresponds to a region where the insulating film 2811 is interposed between the first electrode 2804 and the second electrode 2813. An interlayer insulating film 2814 is formed so as to cover end portions of the pixel electrode 2803, the driving transistor 2818, and the capacitor 2819.

A layer 2815 including an organic compound and a counter electrode 2816 are formed over the interlayer insulating film 2814 and the pixel electrode 2803 located in an opening portion of the interlayer insulating film 2814. Thus, a light emitting element 2817 corresponds to a region where the layer 2815 including an organic compound is interposed between the pixel electrode 2803 and the counter electrode 2816.

The first electrode 2804 shown in FIG. 28A may be formed of a first electrode 2820 as shown in FIG. 28B. The first electrode 2820 is formed in the same layer with the same material as the wires 2805 and 2806.

FIGS. 29A and 29B are partial cross sectional views of a display panel having a bottom gate transistor which uses amorphous silicon as its semiconductor layer. A gate electrode 2903 is formed over a substrate 2901. Further, a first electrode 2904 is formed in the same layer with the same material as the gate electrode 2903. A high melting point metal such as Ti, Cr, Mo, W, or Ta can be used for the gate electrode 2903.

A gate insulating film 2905 is formed so as to cover the gate electrode 2903 and the first electrode 2904. As the gate insulating film 2905, a silicon oxide film, a silicon nitride film, or the like is used.

A semiconductor layer 2906 is formed over the gate insulating film 2905. In addition, a semiconductor layer 2907 is formed in the same layer with the same material as the semiconductor layer 2906. As the substrate, a glass substrate, a quartz substrate, a ceramic substrate, or the like can be used.

N-type semiconductor layers 2908 and 2909 having N-type conductivity are formed over the semiconductor layer 2906, and an N-type semiconductor layer 2910 is formed over the semiconductor layer 2907. Wires 2911 and 2912 are formed over the N-type semiconductor layers 2908 and 2909 respectively, and a conductive layer 2913 is formed in the same layer with the same material as the wires 2911 and 2912, over the N-type semiconductor layer 2910.

A second electrode is formed of the semiconductor layer 2907, the N-type semiconductor layer 2910, and the conductive layer 2913. Note that a capacitor 2920 having a structure where the gate insulating film 2905 is interposed between the second electrode and the first electrode 2904 is formed.

One end portion of the wire 2911 is extended, and a pixel electrode 2914 is formed so as to be in contact with an upper portion of the extended wire 2911.

Then, an insulating layer 2915 is formed so as to cover an end portion of the pixel electrode 2914, a driving transistor 2919, and a capacitor 2920. A layer 2916 including an organic compound and a counter electrode 2917 are formed over the pixel electrode 2914 and the insulating layer 2915. A light emitting element 2918 corresponds to a region where the layer 2916 including an organic compound is interposed between the pixel electrode 2914 and the counter electrode 2917.

The semiconductor layer 2907 and the N-type semiconductor layer 2910 to be a part of the second electrode of the capacitor are not necessarily required. That is, the second electrode may be the conductive layer 2913, so that the capacitor may have such a structure that the gate insulating film is interposed between the first electrode 2904 and the conductive layer 2913.

Note that the pixel electrode 2914 is formed before forming the wire 2911 in FIG. 29A, thereby a capacitor 2920 shown in FIG. 29B can be obtained, which has a structure where the gate insulating film 2905 is interposed between the first electrode 2904 and a second electrode 2921 formed of the pixel electrode 2914.

Although FIGS. 29A and 29B show inverted staggered channel-etched transistors, a channel-protective transistor may be used. Description of channel-protective transistors is made with reference to FIGS. 30A and 30B.

A channel-protective transistor shown in FIG. 30A is different from the channel-etched driving transistor 2919 shown in FIG. 29A in that an insulating layer 3001 functioning as an etching mask is provided over the channel forming region in the semiconductor layer 2906. Other common portions are denoted by the same reference numerals.

Similarly, a channel-protective transistor shown in FIG. 30B is different from the channel-etched driving transistor 2919 shown in FIG. 29B in that the insulating layer 3001 functioning as an etching mask is provided over the channel forming region in the semiconductor layer 2906. Other common portions are denoted by the same reference numerals.

By using an amorphous semiconductor film as a semiconductor layer (channel forming region, source region, drain region, or the like) of a transistor included in the pixel of this embodiment, the manufacturing cost can be reduced. For example, an amorphous semiconductor film can be applied by using the pixel structure shown in FIGS. 6 and 7.

Structures of the transistors and capacitors to which the pixel structure of this embodiment can be applied are not limited to those described above, and various structures of transistors and capacitors can be used.

This embodiment can be implemented in free combination with Embodiment 1.

Embodiment 3

In this embodiment, description is made of a manufacturing method of a semiconductor device using plasma treatment, as a method of manufacturing a semiconductor device including transistors, for example.

Figure 31A:
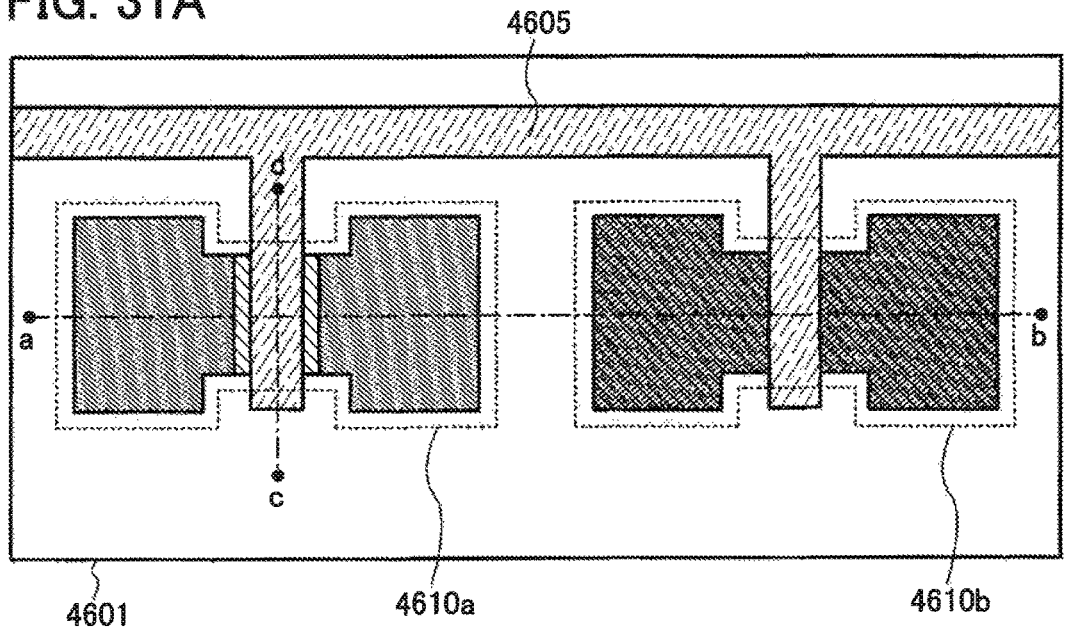
FIGS. 31A to 31C are diagrams showing Embodiment 3.
Figure 31B:
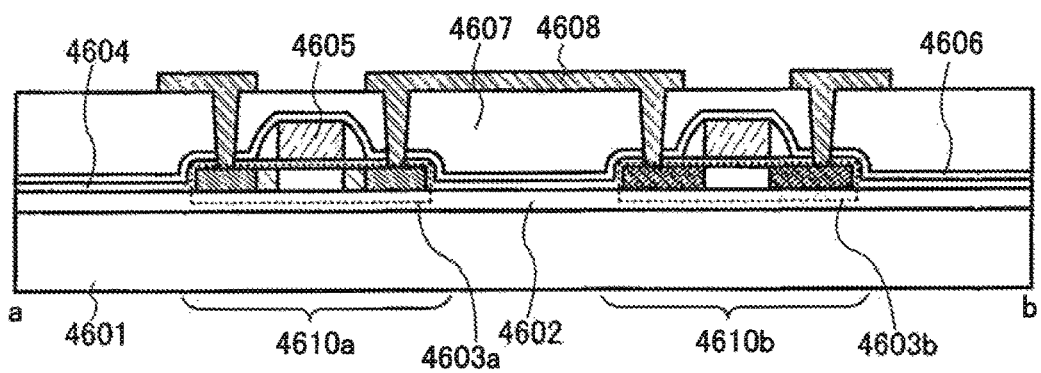
Figure 31C:
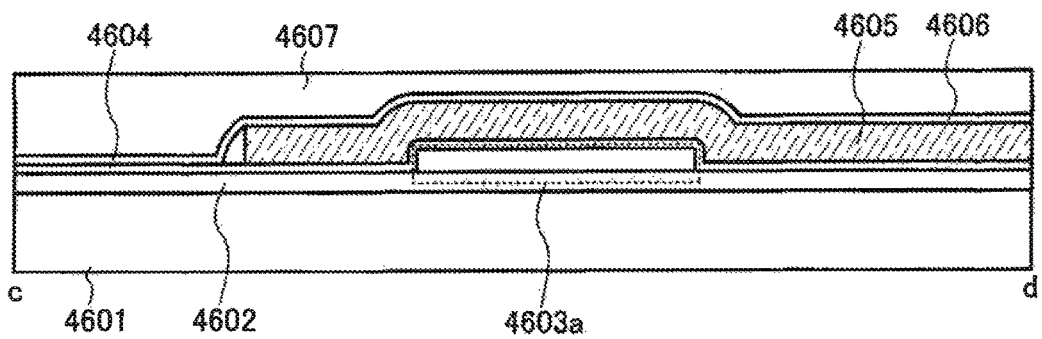

FIGS. 31A to 31C show structure examples of a semiconductor device including transistors. Note that FIG. 31B corresponds to a cross sectional view taken along a line a-b in FIG. 31A, whereas FIG. 31C corresponds to a cross sectional view taken along a line c-d in FIG. 31A.

The semiconductor device shown in FIGS. 31A to 31C includes semiconductor films 4603a and 4603b provided over a substrate 4601 with an insulating film 4602 interposed therebetween, gate electrodes 4605 provided over the semiconductor films 4603a and 4603b with a gate insulating layer 4604 interposed therebetween, insulating films 4606 and 4607 provided so as to cover the gate electrodes 4605, and a conductive film 4608 provided over the insulating film 4607 and electrically connected to a source region or a drain region of the semiconductor films 4603a and 4603b. Although FIGS. 31A to 31C show a case of providing an n-channel transistor 4610a which uses a part of the semiconductor film 4603a as a channel region, and a p-channel transistor 4610b which uses a part of the semiconductor film 4603b as a channel region, the invention is not limited to such a structure. For example, although the n-channel transistor 4610a is provided with LDD regions, whereas the p-channel transistor 4610b is not provided with LDD regions in FIGS. 31A to 31C, such structures may be provided that both of the transistors are provided with LDD regions or neither of the transistors is provided with LDD regions.

In this embodiment, the semiconductor device shown in FIGS. 31A to 31C is manufactured by oxidizing or nitriding a semiconductor film or an insulating film, that is, by performing plasma oxidation or nitridation treatment to at least one layer among the substrate 4601, the insulating film 4602, the semiconductor films 4603a and 4603b, the gate insulating film 4604, the insulating film 4606, and the insulating film 4607. In this manner, by oxidizing or nitriding a semiconductor film or an insulating film by plasma treatment, the surface of the semiconductor film or the insulating film can be modified, thereby a denser insulating film can be formed, as compared to an insulating film formed by CVD or sputtering. Therefore, defects such as pin holes can be suppressed, and thus the characteristics and the like of the semiconductor device can be improved.

In this embodiment, description is made of a manufacturing method of a semiconductor device by oxidizing or nitriding the semiconductor films 4603a and 4603b or the gate insulating film 4604 shown in FIGS. 31A to 31C by plasma treatment, with reference to the drawings.

Description is made of a case where island-shaped semiconductor films are each formed so as to have an edge portion with an almost right angle.

First, the semiconductor films 4603a and 4603b with island shapes are formed over the substrate 4601 (FIG. 32A). The semiconductor films 4603a and 4603b with island shapes can be provided by forming an amorphous semiconductor film by sputtering, LPCVD, plasma CVD, or the like using a material containing silicon (Si) as a main component (for example, SixGe1-x) over the insulating film 4602 which is formed in advance over the substrate 4601, and then crystallizing the amorphous semiconductor film, and further etching the semiconductor film selectively. Note that the crystallization of the amorphous semiconductor film can be performed by a crystallization method such as laser crystallization, thermal crystallization using RTA or an annealing furnace, thermal crystallization using metal elements which promote crystallization, or a combination of them. Note that in FIG. 32A, the semiconductor films 4603a and 4603b with island shapes are each formed so as to have an edge portion with an almost right angle (θ=85 to 100°).

Subsequently, the semiconductor films 4603a and 4603b are oxidized or nitrided by plasma treatment to form oxide or nitride films 4621a and 4621b (hereinafter also referred to as insulating films 4621a and 4621b) on the surfaces of the semiconductor films 4603a and 4603b respectively (FIG. 32B). For example, when Si is used for the semiconductor films 4603a and 4603b, silicon oxide ($SiO_x$) or silicon nitride ($SiN_x$) is formed as the insulating films 4621a and 4621b. Further, after being oxidized by plasma treatment, the semiconductor films 4603a and 4603b may be subjected to plasma treatment again to be nitrided. In this case, silicon oxide is formed over the semiconductor films 4603a and 4603b first, and then silicon nitride oxide ($SiN_xO_y$) (x>y) is formed over the surface of the silicon oxide. Note that in the case of oxidizing the semiconductor film by plasma treatment, the plasma treatment is performed in an oxygen atmosphere (for example, an atmosphere containing oxygen ($O_2$) and a rare gas (containing at least one of He, Ne, Ar, Kr, and Xe), an atmosphere containing oxygen, hydrogen ($H_2$), and a rare gas, or an atmosphere containing dinitrogen monoxide and a rare gas). Meanwhile, in the case of nitriding the semiconductor film by plasma treatment, the plasma treatment is performed in a nitrogen atmosphere (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a mixed gas of Ar and Kr may be used. Therefore, the insulating films 4621a and 4621b contain the rare gas (containing at least one of He, Ne, Ar, Kr, and Xe) used in the plasma treatment, and in the case where Ar is used, the insulating films 4621a and 4621b contain Ar.

Since the plasma treatment is performed in the atmosphere containing the aforementioned gas, with the conditions of a plasma electron density of $1\times10^{11}$ to $1\times10^{13}$ cm$^{-3}$, and a plasma electron temperature of 0.5 to 1.5 eV. Since the plasma electron density is high and the electron temperature on the periphery of a treatment subject (here, the semiconductor films 4603a and 4603b) formed over the substrate 4601 is low, plasma damage to the treatment subject can be prevented. In addition, since the plasma electron density is as high as $1\times10^{11}$ cm$^{-3}$ or higher, an oxide or nitride film formed by oxidizing or nitriding the treatment subject by plasma treatment is advantageous in evenness of thickness or the like and dense as compared to a film formed by CVD, sputtering, or the like. Further, since the plasma electron temperature is as low as 1 eV or less, oxidation or nitridation treatment can be performed at a lower temperature, as compared to the conventional plasma treatment or thermal oxidation. For example, oxidation or nitridation treatment can be performed sufficiently even when plasma treatment is performed at a temperature lower than the strain point of a glass substrate by 100 degrees or more. Note that as a frequency for generating plasma, high frequencies such as microwaves (2.45 GHz) can be used. Note that the plasma treatment is to be performed under the aforementioned conditions unless specified below.

Subsequently, the gate insulating film 4604 is formed so as to cover the insulating films 4621a and 4621b (FIG. 32C). The gate insulating film 4604 can be formed by sputtering, LPCVD, or plasma CVD to have either a single-layer structure or a stacked-layer structure of an insulating film containing oxygen or nitrogen, such as silicon oxide, silicon nitride, silicon oxynitride ($SiO_xN_y$) (x>y), or silicon nitride oxide ($SiN_xO_y$) (x>y). For example, when Si is used for the semiconductor films 4603a and 4603b, and Si is oxidized by plasma treatment to form silicon oxide as the insulating films 4621a and 4621b on the surfaces of the semiconductor films 4603a and 4603b, silicon oxide is formed as a gate insulating film over the insulating films 4621a and 4621b. In addition, in FIG. 32B, when the insulating films 4621a and 4621b formed by oxidizing or nitriding the semiconductor films 4603a and 4603b by plasma treatment are sufficiently thick, the insulating films 4621a and 4621b can be used as the gate insulating films.

Subsequently, by forming the gate electrodes 4605 or the like over the gate insulating film 4604, a semiconductor device having the n-channel transistor 4610a and the p-channel transistor 4610b which respectively have the semiconductor films 4603a and 4603b with island shapes as channel regions can be manufactured (FIG. 32D).

In this manner, by oxidizing or nitriding the surfaces of the semiconductor films 4603a and 4603b by plasma treatment before providing the gate insulating film 4604 over the semiconductor films 4603a and 4603b, short circuits or the like between the gate electrodes and the semiconductor films can be prevented, which would be caused by coverage defects of the gate insulating film 4604 at edge portions 4651a and 4651b of the channel regions. That is, if the edge portions of the island-shaped semiconductor films have an almost right angle (θ=85 to 100 degrees), there is a concern that when a gate insulating film is formed so as to cover the semiconductor films by CVD, sputtering, or the like, a coverage defect might be caused, resulting from breaking of the gate insulating film at the edge portions of the semiconductor films, or the like. However, such a coverage defect or the like can be prevented by oxidizing or nitriding the surfaces of the semiconductor films by plasma treatment in advance.

Alternatively, in FIG. 32C, the gate insulating film 4604 may be oxidized or nitrided by performing plasma treatment after forming the gate insulating film 4604. In this case, an oxide or nitride film (hereinafter also referred to as an insulating film 4623) is formed over the surface of the gate insulating film 4604 (FIG. 33A) by oxidizing or nitriding the gate insulating film 4604 by performing plasma treatment to the gate insulating film 4604 which is formed so as to cover the semiconductor films 4603a and 4603b (FIG. 33B). The plasma treatment can be performed with similar conditions to those in FIG. 32B. In addition, the insulating film 4623 contains a rare gas which is used in the plasma treatment, and for example contains Ar when Ar is used for the plasma treatment.

Alternatively, referring to FIG. 33B, after oxidizing the gate insulating film 4604 by performing plasma treatment in an oxygen atmosphere, the gate insulating film 4604 may be subjected to plasma treatment again in a nitrogen atmosphere, so as to be nitrided. In this case, silicon oxide or silicon oxynitride ($SiO_xN_y$) (x>y) is formed so as to have shapes of the semiconductor films 4603a and 4603b first, and then silicon nitride oxide ($SiN_xO_y$) (x>y) is formed so as to be in contact with the gate electrodes 4605. After that, by forming the gate electrodes 4605 or the like over the insulating film 4623, a semiconductor device having the n-channel transistor 4610a and the p-channel transistor 4610b which respectively have the semiconductor films 4603a and 4603b with island shapes as channel regions can be manufactured (FIG. 33C). In this manner, by oxidizing or nitriding the surface of the gate insulating film by plasma treatment, the surface of the gate insulating film can be modified to form a dense film. The insulating film obtained by plasma treatment is dense and has few defects such as pin holes, as compared to an insulating film formed by CVD or sputtering. Therefore, the characteristics of the transistors can be improved.

Although FIGS. 33A to 33C show the case where the surfaces of the semiconductor films 4603a and 4603b are oxidized or nitrided by performing plasma treatment to the semiconductor films 4603a and 4603b in advance, such a method may be employed that plasma treatment is not performed to the semiconductor films 4603a and 4603b, but performed after forming the gate insulating film 4604. In this manner, by performing plasma treatment before forming a gate electrode, a semiconductor film can be oxidized or nitrided even if the semiconductor film is exposed due to a coverage defect such as breaking of a gate insulating film at edge portions of the semiconductor film; therefore, short circuits or the like between the gate electrode and the semiconductor film can be prevented, which would be caused by a coverage defect of the gate insulating film at the edge portions of the semiconductor film.

In this manner, by oxidizing or nitriding the semiconductor films or the gate insulating film by plasma treatment, short circuits or the like between the gate electrodes and the semiconductor films can be prevented, which would be caused by a coverage defect of the gate insulating film at the edge portions of the semiconductor films, even if the island-shaped semiconductor films are formed so as to have edge portions with an almost right angle.

Subsequently, a case is shown where the island-shaped semiconductor films formed over the substrate are provided with tapered edge portions (θ=30 to 85°).

First, the semiconductor films 4603a and 4603b with island shapes are formed over the substrate 4601 (FIG. 34A). The semiconductor films 4603a and 4603b with island shapes can be provided by forming an amorphous semiconductor film over the insulating film 4602 which is formed over the substrate 4601 in advance, by sputtering, LPCVD, plasma CVD, or the like using a material containing silicon (Si) as a main component (for example, $Si_xGe_{1-x}$) or the like, and then crystallizing the amorphous semiconductor film by laser crystallization, thermal crystallization using RTA or an annealing furnace, or thermal crystallization using metal elements which promote crystallization, and further selectively etching the semiconductor film to be removed. Note that in FIG. 34A, the island-shaped semiconductor films are formed so as to have tapered edge portions (θ=30 to 85°).

Subsequently, the gate insulating film 4604 is formed so as to cover the semiconductor films 4603a and 4603b (FIG. 34B). The gate insulating film 4604 can be provided so as to have either a single-layer structure or a stacked-layer structure of an insulating film containing oxygen or nitrogen, such as silicon oxide, silicon nitride, silicon oxynitride ($SiO_xN_y$) (x>y), or silicon nitride oxide ($SiN_xO_y$) (x>y) by sputtering, LPCVD, plasma CVD, or the like.

Subsequently, an oxide or nitride film (hereinafter also referred to as an insulating film 4624) is formed on the surface of the gate insulating film 4604 by oxidizing or nitriding the gate insulating film 4604 by plasma treatment (FIG. 34C). The plasma treatment can be performed under the aforementioned conditions. For example, in the case where silicon oxide or silicon oxynitride ($SiO_xN_y$) (x>y) is used as the gate insulating film 4604, the gate insulating film 4604 is oxidized by performing plasma treatment in an oxygen atmosphere, thereby a dense film with few defects such as pin holes can be formed on the surface of the gate insulating film, as compared to a gate insulating film formed by CVD, sputtering, or the like. On the other hand, when the gate insulating film 4604 is nitrided by plasma treatment in a nitrogen atmosphere, a silicon nitride oxide film ($SiN_xO_y$) (x>y) can be provided as the insulating film 4624 on the surface of the gate insulating film 4604. Alternatively, after oxidizing the gate insulating film 4604 by performing plasma treatment in an oxygen atmosphere, the gate insulating film 4604 may be subjected to plasma treatment again in a nitrogen atmosphere, so as to be nitrided. In addition, the insulating film 4624 contains a rare gas which is used in the plasma treatment, and contains Ar when Ar is used in the plasma treatment, for example.

Subsequently, by forming the gate electrodes 4605 or the like over the gate insulating film 4604, a semiconductor device having the n-channel transistor 4610a and the p-channel transistor 4610b which respectively have the semiconductor films 4603a and 4603b with island shapes as channel regions can be manufactured (FIG. 34D).

In this manner, by performing plasma treatment to the gate insulating film, an insulating film made of an oxide or nitride film can be provided on the surface of the gate insulating film, and thus the surface of the gate insulating film can be modified. Since the insulating film obtained by oxidation or nitridation with plasma treatment is dense and has few defects such as pin holes, as compared to a gate insulating film formed by CVD or sputtering, the characteristics of the transistors can be improved. In addition, short circuits or the like between the gate electrodes and the semiconductor films can be prevented by forming the semiconductor films so as to have tapered edge portions, which would be caused by a coverage defect of the gate insulating film at the edge portions of the semiconductor films. Furthermore, short circuits or the like between the gate electrodes and the semiconductor films can be prevented even more effectively by performing plasma treatment after forming the gate insulating film.

Subsequently, description is made of a manufacturing method of a semiconductor device which differs from that in FIGS. 34A to 34D, with reference to the drawings. Specifically, a case is shown where plasma treatment is selectively performed to tapered edge portions of semiconductor films.

First, the semiconductor films 4603a and 4603b with island shapes are formed over the substrate 4601 (FIG. 35A). The semiconductor films 4603a and 4603b with island shapes can be provided by forming an amorphous semiconductor film over the insulating film 4602 which is formed over the substrate 4601 in advance, by sputtering, LPCVD, plasma CVD, or the like using a material containing silicon (Si) as a main component (for example, SixGe1-x) or the like, crystallizing the amorphous semiconductor film, and further etching the semiconductor film selectively by using resists 4625a and 4625b as masks. Note that the crystallization of the amorphous semiconductor film can be performed by a crystallization method such as laser crystallization, thermal crystallization using RTA or an annealing furnace, thermal crystallization using metal elements which promote crystallization, or a combination of them.

Subsequently, the edge portions of the semiconductor films 4603a and 4603b with island shapes are selectively oxidized or nitrided by plasma treatment before removing the resists 4625a and 4625b which are used for etching the semiconductor films, thereby an oxide or nitride film (hereinafter also referred to as an insulating film 4626) is formed on edge portions of the semiconductor films 4603a and 4603b (FIG. 35B). The plasma treatment is performed under the aforementioned conditions. In addition, the insulating film 4626 contains a rare gas which is used in the plasma treatment.

Subsequently, the gate insulating film 4604 is formed so as to cover the semiconductor films 4603a and 4603b (FIG. 35C). The gate insulating film 4604 can be formed in a similar manner to the aforementioned.

Subsequently, by forming the gate electrodes 4605 or the like over the gate insulating film 4604, a semiconductor device having the n-channel transistor 4610a and the p-channel transistor 4610b which respectively have the semiconductor films 4603a and 4603b with island shapes as channel regions can be manufactured (FIG. 35D).

When the semiconductor films 4603a and 4603b are provided with tapered edge portions, edge portions 4652a and 4652b of the channel regions which are formed in parts of the semiconductor films 4603a and 4603b are also tapered, thereby the thickness of the semiconductor films and the gate insulating film in that portion differs from that in the central portion, which may adversely affect the characteristics of the transistors. Thus, such effects on the transistors due to the edge portions of the channel regions can be reduced by forming insulating films over the semiconductor films, namely, the edge portions of the channel regions, by selectively oxidizing or nitriding the edge portions of the channel regions by plasma treatment here.

Figure 37A:
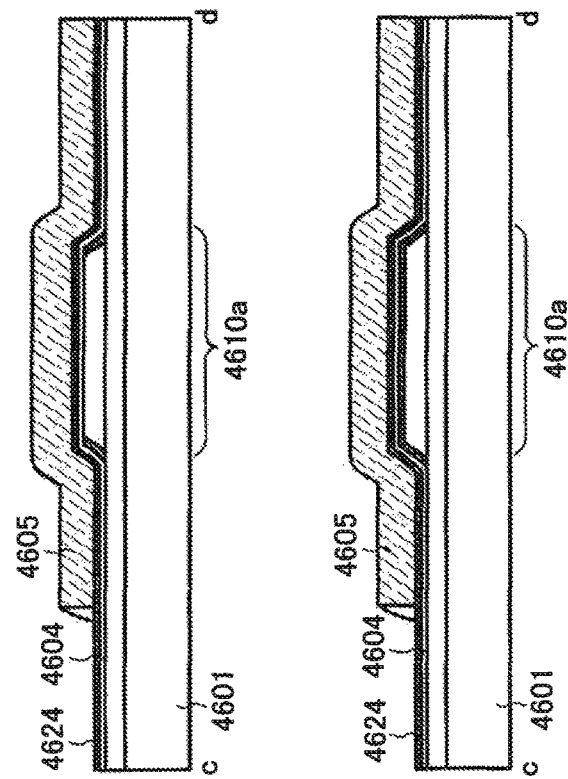
FIGS. 37A and 37B are diagrams showing Embodiment 3.

Although FIGS. 35A to 35D show an example where only the edge portions of the semiconductor films 4603a and 4603b are oxidized or nitrided by plasma treatment, the gate insulating film 4604 can also be oxidized or nitrided by plasma treatment as shown in FIG. 34C (FIG. 37A).

Next, description is made of a manufacturing method of a semiconductor device which differs from the aforementioned, with reference to the drawings. Specifically, a case is shown where plasma treatment is performed to semiconductor films with tapered shapes.

First, the semiconductor films 4603a and 4603b with island shapes are formed over the substrate 4601 similarly to the aforementioned (FIG. 36A).

Next, the semiconductor films 4603a and 4603b are oxidized or nitrided by plasma treatment, thereby forming oxide or nitride films (hereinafter also referred to as insulating films 4627a and 4627b) on the surfaces of the semiconductor films 4603a and 4603b (FIG. 36B). The plasma treatment can be performed under the aforementioned conditions. For example, when Si is used for the semiconductor films 4603a and 4603b, silicon oxide or silicon nitride is formed as the insulating films 4627a and 4627b. In addition, after being oxidized by plasma treatment, the semiconductor films 4603a and 4603b may be subjected to plasma treatment again to be nitrided. In this case, silicon oxide or silicon oxynitride ($SiO_xN_y$) (x>y) is formed on the semiconductor films 4603a and 4603b first, and then silicon nitride oxide ($SiN_xO_y$) (x>y) is formed on the silicon oxide. Therefore, the insulating films 4627a and 4627b contain a rare gas which is used in the plasma treatment. Note that the edge portions of the semiconductor films 4603a and 4603b are simultaneously oxidized or nitrided by performing plasma treatment.

Next, the gate insulating film 4604 is formed so as to cover the insulating films 4627a and 4627b (FIG. 36C). The gate insulating film 4604 can be formed so as to have either a single-layer structure or a stacked-layer structure of an insulating film containing oxygen or nitrogen, such as silicon oxide, silicon nitride, silicon oxynitride ($SiO_xN_y$) (x>y), or silicon nitride oxide ($SiN_xO_y$) (x>y) by sputtering, LPCVD, plasma CVD, or the like. For example, when Si is used for the semiconductor films 4603a and 4603b, and the surfaces of the semiconductor films 4603a and 4603b are oxidized by plasma treatment to form silicon oxide as the insulating films 4627a and 4627b, silicon oxide is formed as a gate insulating film over the insulating films 4627a and 4627b.

Next, by forming the gate electrodes 4605 or the like over the gate insulating film 4604, a semiconductor device having the n-channel transistor 4610a and the p-channel transistor 4610b which respectively have the semiconductor films 4603a and 4603b with island shapes as channel regions can be manufactured (FIG. 36D).

When the semiconductor films are provided with tapered edge portions, edge portions of the channel regions which are formed in parts of the semiconductor films are also tapered, which may adversely affect the characteristics of the semiconductor elements. Such effects on the semiconductor elements can be reduced by oxidizing or nitriding the semiconductor films by plasma treatment, since the edge portions of the channel regions can also be oxidized or nitrided accordingly.

Figure 37B:
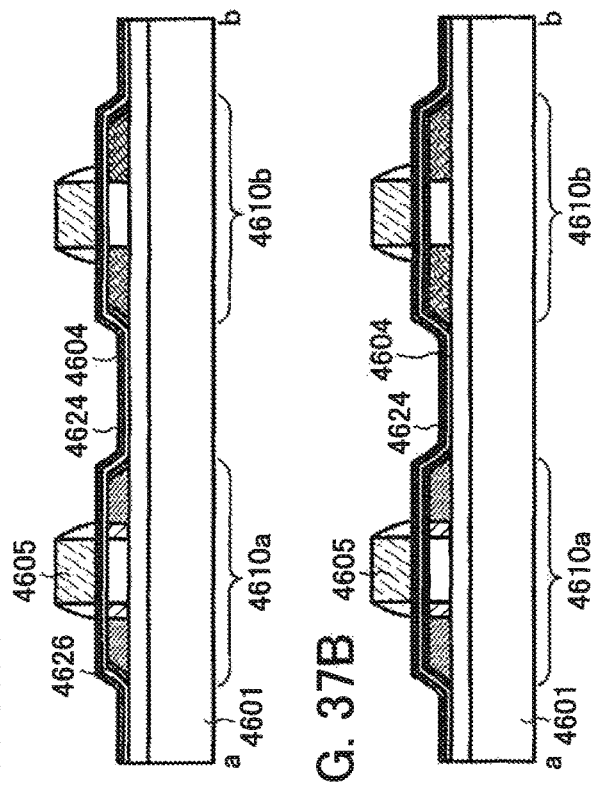

Although FIGS. 36A to 36D show examples where only the semiconductor films 4603a and 4603b are oxidized or nitrided by plasma treatment, it is needless to say that the gate insulating film 4604 may also be oxidized or nitrided by plasma treatment as shown in FIG. 34B (FIG. 37B). In this case, after being oxidized by plasma treatment in an oxygen atmosphere, the gate insulating film 4604 may be subjected to plasma treatment again to be nitrided. In this case, silicon oxide ($SiO_x$) or silicon oxynitride ($SiO_xN_y$) (x>y) is formed so as to have forms of the semiconductor films 4603a and 4603b first, and then silicon nitride oxide ($SiN_xO_y$) (x>y) is formed so as to be in contact with the gate electrodes 4605.

At this time, dust 4673 is in a state of being easily removed from the surface of the insulating film 4674 by simple washing such as brushing. In this manner, by performing plasma treatment, even fine dust which has adhered to the insulating film or the semiconductor film can be easily removed. Note that this effect is obtained by performing plasma treatment; therefore, the similar thing can be applied to not only this embodiment, but other embodiments.

In this manner, by modifying the surface of a semiconductor film or a gate insulating film by oxidization or nitridation using plasma treatment, a dense and high-quality insulating film can be formed. In addition, dust or the like which has adhered to the surface of the insulating film can be easily removed by washing. Accordingly, defects such as pin holes can be prevented even when the insulating film is formed thin, thereby microfabrication and high performance of semiconductor elements such as transistors can be realized.

Although this embodiment shows an example where plasma treatment is performed to the semiconductor films 4603a and 4603b or the gate insulating film 4604 to oxidize or nitride the semiconductor films 4603a and 4603b or the gate insulating film 4604, a layer to be subjected to the plasma treatment is not limited to these. For example, plasma treatment may be performed to the substrate 4601 or the insulating film 4602, or to the insulating film 4606 or 4607.

This embodiment may be implemented in free combination with Embodiment 1 or 2.

Embodiment 4

In this embodiment, description is made of an example of a mask pattern for manufacturing a semiconductor device including transistors, for example, with reference to FIGS. 41A to 43B.

Figure 41A:
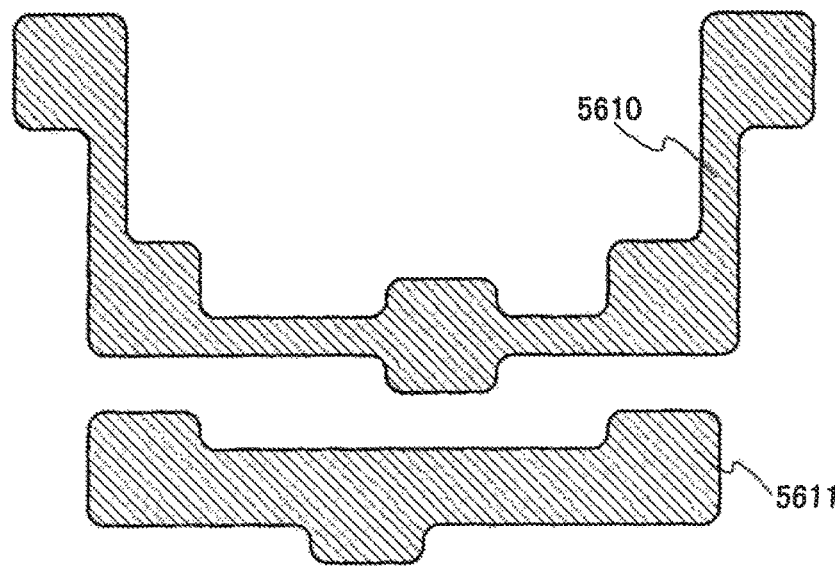
FIGS. 41A and 41B are diagrams showing Embodiment 5.

Semiconductor layers 5610 and 5611 shown in FIG. 41A are preferably formed of silicon or a crystalline semiconductor containing silicon. For example, single crystal silicon, polycrystal silicon obtained by crystallizing a silicon film by laser annealing, or the like can be employed. Alternatively, a metal oxide semiconductor, amorphous silicon, or an organic semiconductor can be employed as long as it exhibits semiconductor characteristics.

In any case, a semiconductor to be formed first is provided over an entire or a part of surface of a substrate having an insulating surface (region having a larger area than the area which is defined as a semiconductor region of a transistor). Then, a mask pattern is formed over the semiconductor layer by photolithography. By etching the semiconductor layer using the mask pattern, the semiconductor layers 5610 and 5611 each having a specific island shape are formed, which include source and drain regions and a channel forming region of a transistor. The semiconductor layers 5610 and 5611 are determined in accordance with the adequacy of the layout.

Figure 41B:
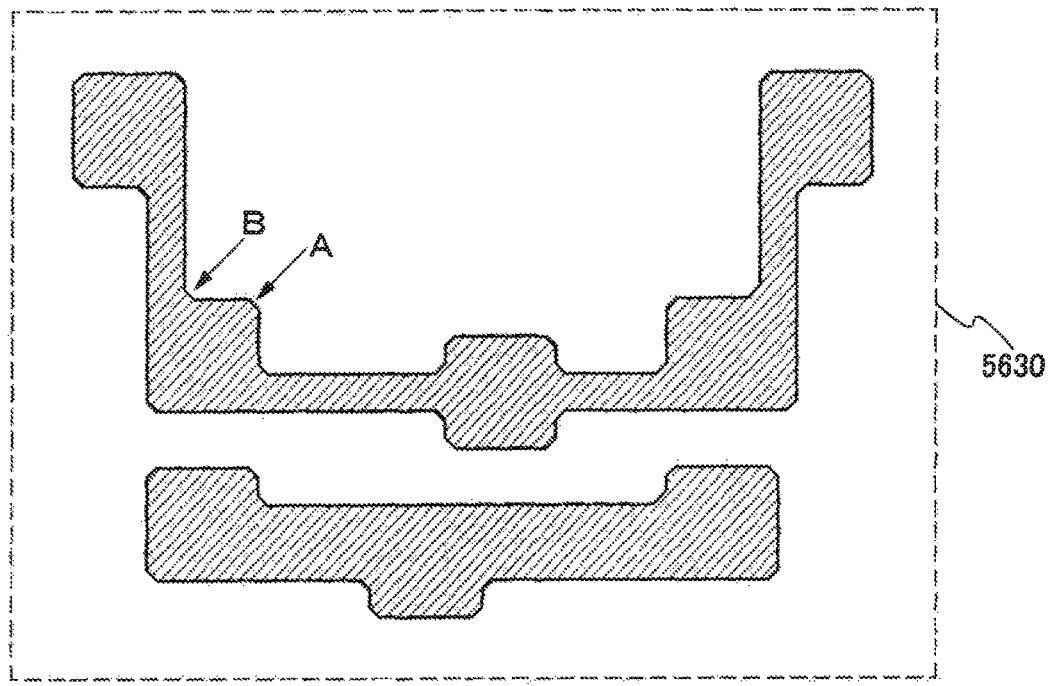

The photomask for forming the semiconductor layers 5610 and 5611 shown in FIG. 41A is provided with a mask pattern 5630 shown in FIG. 41B. The shape of this mask pattern 5630 differs depending on whether the resist used for the photolithography process is a positive type or a negative type. In the case of using a positive resist, the mask pattern 5630 shown in FIG. 41B is formed as a light shielding portion. The mask pattern 5630 has such a shape that a vertex A of a polygon is removed. In addition, a corner B has such a shape that a plurality of corners are provided so as not to form a right-angled corner. In the pattern of this photomask, corners are removed so that one side of each removed corner (right-angled triangle) has a length of 10 μm or less, for example.

The semiconductor layers 5610 and 5611 shown in FIG. 41A reflect the mask pattern 5630 shown in FIG. 41B. In this case, the mask pattern 5630 may be transferred in such a manner that a pattern similar to the original one is formed or corners of the mask pattern 5630 are more rounded. That is, roundish corner portions with a smoother shape may be provided, as compared to those of the mask pattern 5630.

Figure 42A:
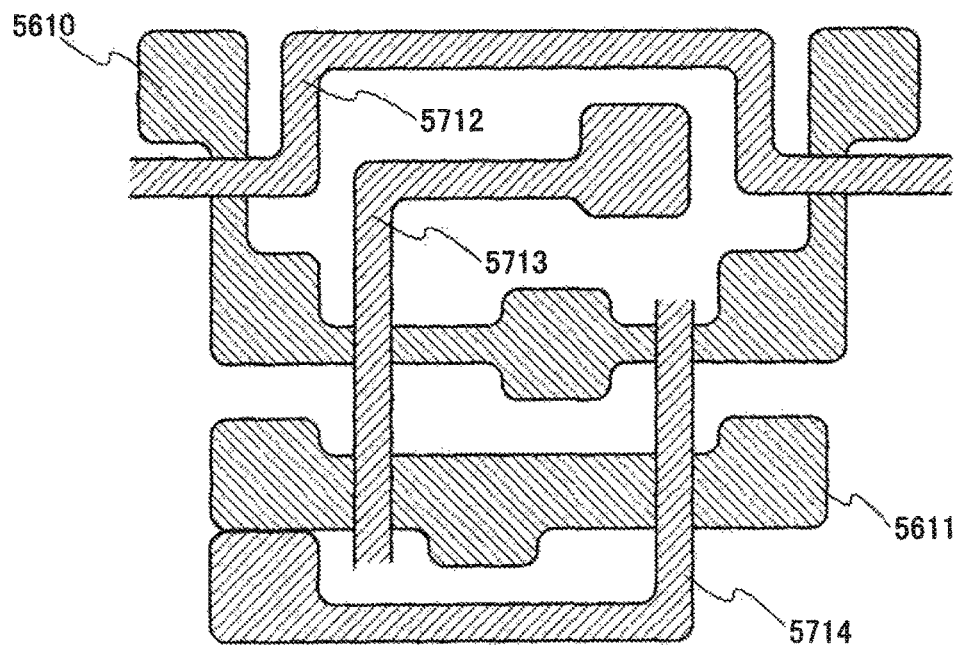
FIGS. 42A and 42B are diagrams showing Embodiment 5.

An insulating layer which at least partially contains silicon oxide or silicon nitride is formed over the semiconductor layers 5610 and 5611. One purpose of forming this insulating layer is to form a gate insulating layer. Then, gate wires 5712, 5713, and 5714 are formed so as to partially overlap the semiconductor layers as shown in FIG. 42A. The gate wire 5712 is formed corresponding to the semiconductor layer 5610. The gate wire 5713 is formed corresponding to the semiconductor layers 5610 and 5611. The gate wire 5714 is formed corresponding to the semiconductor layers 5610 and 5611. The gate wires are formed by depositing a metal layer or a highly conductive semiconductor layer over the insulating layer and then printing a pattern onto the layer by photolithography.

Figure 42B:
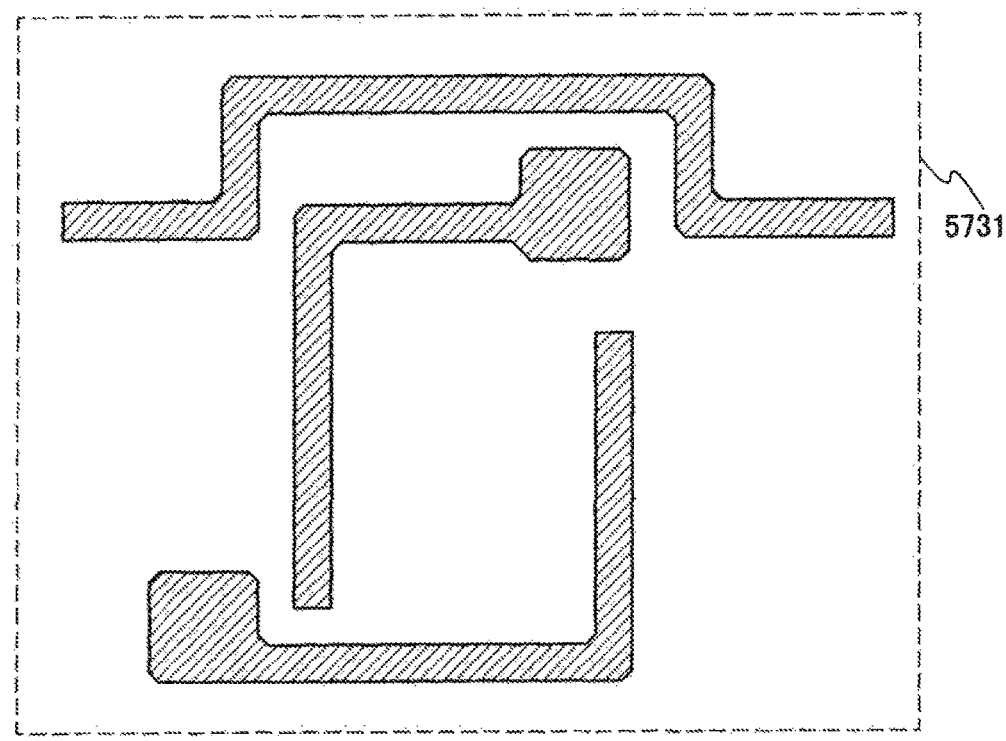

The photomask for forming the gate wires is provided with a mask pattern 5731 shown in FIG. 42B. In this mask pattern 5731, its corners are removed in such a manner that each removed corner (right-angled triangle) has one side of 10 μm or less, or has one side of ⅕ to ½ of the wire width. The gate wires 5712, 5713, and 5714 shown in FIG. 42A reflect the shape of the mask pattern 5731 shown in FIG. 42B. In this case, although the mask pattern 5731 may be transferred in such a manner that a pattern similar to the mask pattern 5731 is formed or corners of the mask pattern 5731 are further rounded. That is, roundish corner portions with a smoother shape may be provided, as compared to those of the mask pattern 5731. Specifically, each corner of the gate wires 5712, 5713, and 5714 is formed so as to be roundish by removing an edge portion so that the removed corner has a length of ⅕ to ½ of the wire width. Forming a projecting portion of a corner so as to be roundish helps to suppress generation of fine powder due to abnormal discharge in dry etching with plasma. In addition, by forming a depressed portion of a corner to be roundish, such an effect can be obtained that, even when fine powder are generated in washing, they can be washed away without gathering in the corner. As a result, yields can be expected to be significantly improved.

An interlayer insulating layer is a layer to be formed after the gate wires 5712, 5713, and 5714 are formed. The interlayer insulating layer is formed using an inorganic insulating material such as silicon oxide or an organic insulating material such as polyimide or an acrylic resin. Another insulating layer such as silicon nitride or silicon nitride oxide may be provided between the interlayer insulating layer and the gate wires 5712, 5713, and 5714. Further, an insulating layer such as silicon nitride or silicon nitride oxide may be provided over the interlayer insulating layer as well. Such an insulating layer can prevent contamination of the semiconductor layer and the gate insulating layer with impurities which would adversely affect the transistor, such as extrinsic metal ions or moisture.

Figure 43A:
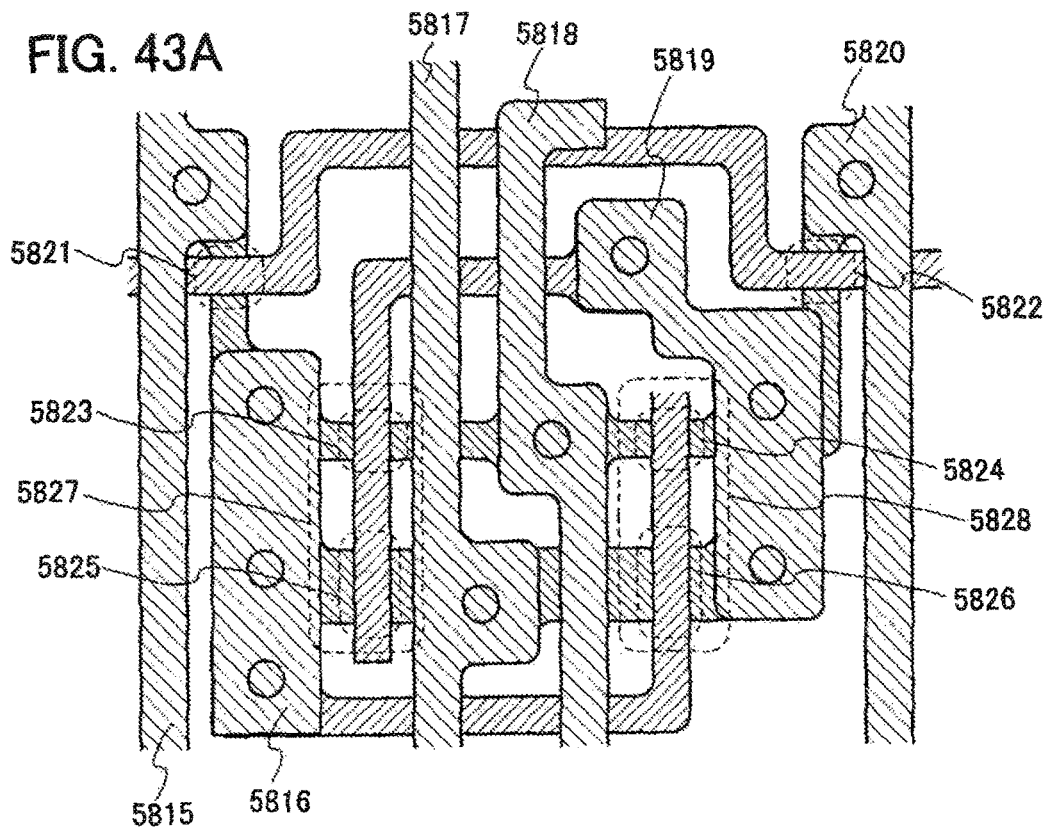
FIGS. 43A and 43B are diagrams showing Embodiment 5.

Openings are formed in predetermined positions of the interlayer insulating layer. For example, the openings are provided in corresponding positions to the gate wires and the semiconductor layers located below the interlayer insulating layer. A wiring layer which has a single layer or a plurality of layers of metals or metal compounds is formed by photolithography with the use of a mask pattern, and then etched into a predetermined pattern. Then, as shown in FIG. 43A, the wires 5815 to 5820 are formed so as to partially overlap the semiconductor layers. A wire connects between specific elements, which means that a wire connects specific elements not linearly but includes corners due to the restriction of a layout. In addition, the width of the wire varies in a contact portion and other portions. In the case where the width of a contact hole is equal to or wider than the wire width, the wire in the contact portion is formed wider than the width of the other portions.

Figure 43B:
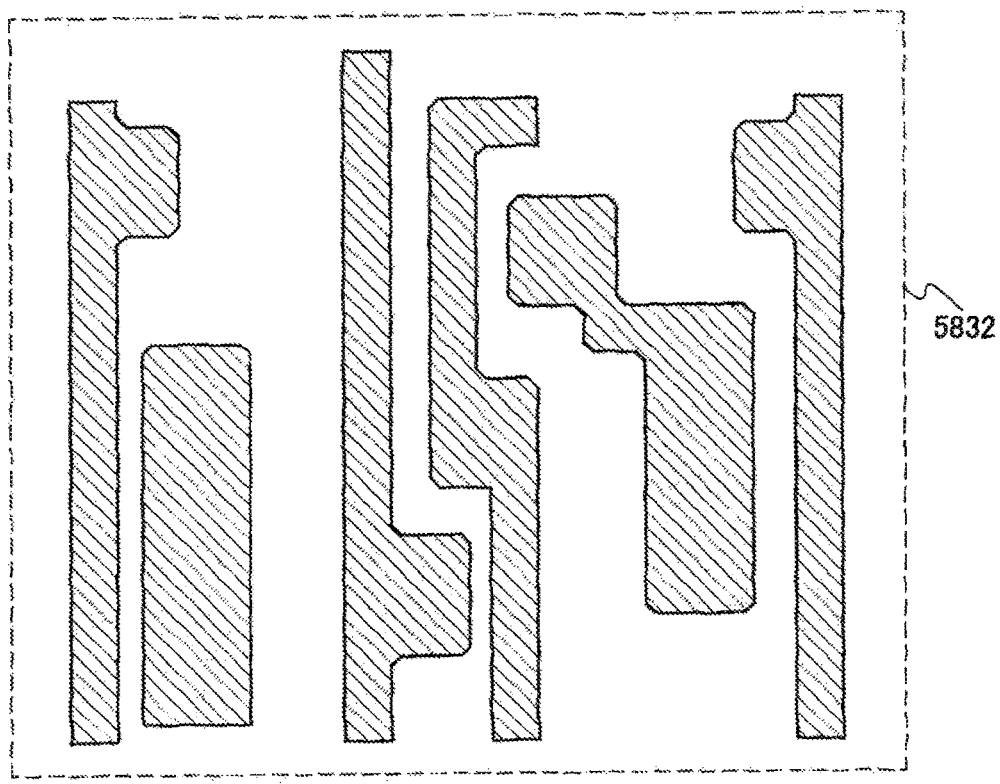

A photomask for forming the wires 5815 to 5820 has a mask pattern 5832 shown in FIG. 43B. In this case also, each wire is formed so as to have such a pattern that a right-angled corner (right-angled triangle) is removed with the condition that one side of the removed triangle is 10 µm or less, or has a length of ⅕ to ½ of the wire width, so that the corner is rounded. Forming a projecting portion of a corner to be roundish helps to suppress generation of fine powder due to abnormal discharge can be suppressed in dry etching with plasma. In addition, by forming a depressed portion of a corner to be roundish, such an effect can be obtained that, even when fine powder are generated in washing, they can be washed away without gathering in the corner. Thus, yields can be significantly improved. When corners of wires are formed to be roundish, electrical conduction can be expected. Further, when a plurality of wires are formed in parallel, dust can be easily washed away.

In FIG. 43A, n-channel transistors 5821 to 5824 and p-channel transistors 5825 and 5826 are formed. The n-channel transistor 5823 and the p-channel transistor 5825, and the n-channel transistor 5824 and the p-channel transistor 5826 constitute inverters 5827 and 5828 respectively. Note that a circuit including the six transistors constitutes an SRAM. An insulating layer such as silicon nitride or silicon oxide may be formed over these transistors.

Note that this embodiment can be implemented in free combination with any of Embodiments 1 to 3.

Embodiment 5

Figure 25A:
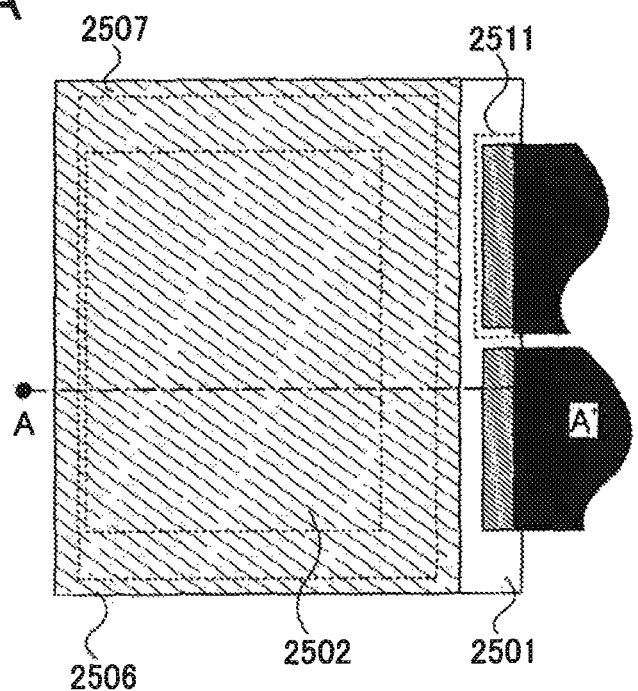
FIGS. 25A to 25C are diagrams showing Embodiment 6.
Figure 25B:
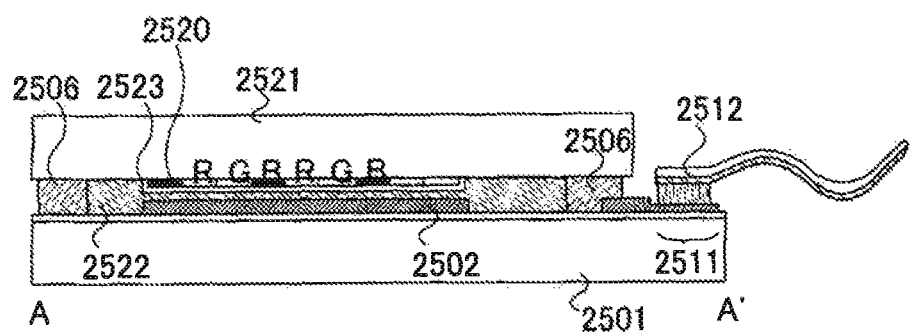
Figure 25C:
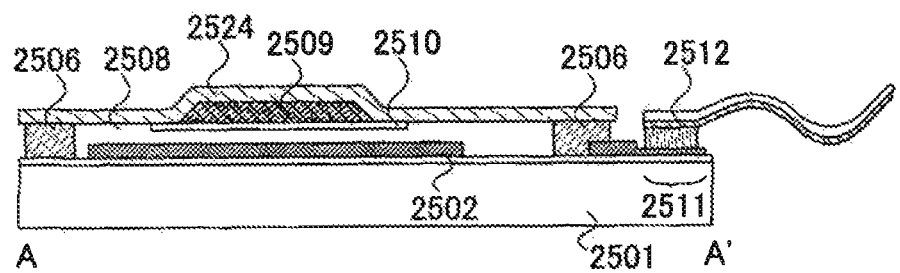

In this embodiment, description is made of a structure where a substrate on which pixels are formed is sealed, with reference to FIGS. 25A to 25C. FIG. 25A is a top plan view of a panel where a substrate on which pixels are formed is sealed, and FIGS. 25B and 25C are cross sectional views taken along a line A-A' of FIG. 25A. FIGS. 25B and 25C show examples where sealing is performed by different methods.

In FIGS. 25A to 25C, a pixel portion 2502 having a plurality of pixels is provided over a substrate 2501, and a sealant 2506 is provided so as to surround the pixel portion 2502, while a sealing material 2507 is attached thereto. For the structure of pixels, those described in embodiment modes or Embodiment 1 can be employed.

In the display panel in FIG. 25B, the sealing material 2507 in FIG. 25A corresponds to a counter substrate 2521. The counter substrate 2521 which transmits light is attached to the substrate 2501 using the sealant 2506 as an adhesive layer, and accordingly, a sealed space 2522 is formed by the substrate 2501, the counter substrate 2521, and the sealant 2506. The counter substrate 2521 is provided with a color filter 2520 and a protective film 2523 for protecting the color filter. Light emitted from light emitting elements which are disposed in the pixel portion 2502 is emitted outside through the color filter 2520. The sealed space 2522 is filled with an inert resin, liquid, or the like. Note that the resin for filling the sealed space 2522 may be a light-transmissive resin in which a moisture absorbent is dispersed. In addition, the same materials may be used for the sealant 2506 and a material filled in the sealed space 2522, so that the adhesion of the counter substrate 2521 and the sealing of the pixel portion 2502 may be performed simultaneously.

In the display panel shown in FIG. 25C, the sealing material 2507 in FIG. 25A corresponds to a sealing material 2524. The sealing material 2524 is attached to the substrate 2501 using the sealant 2506 as an adhesive layer, and a sealed space 2508 is formed by the substrate 2501, the sealant 2506, and the sealing material 2524. The sealing material 2524 is provided with a moisture absorbent 2509 in advance in its depressed portion, and the moisture absorbent 2509 functions to keep a clean atmosphere in the sealed space 2508 by adsorbing moisture, oxygen, and the like, and to suppress degradation of the light emitting elements. The depressed portion is covered with a fine-meshed cover material 2510. The cover material 2510 transmits air and moisture, whereas the moisture absorbent 2509 does not transmit them. Note that the sealed space 2508 may be filled with a rare gas such as nitrogen or argon, as well as an inert resin or liquid.

An input terminal portion 2511 for transmitting signals to the pixel portion 2502 and the like are provided over the substrate 2501. Signals such as video signals are transmitted to the input terminal portion 2511 through an FPC (Flexible Printed Circuit) 2512. At the input terminal portion 2511, wires formed over the substrate 2501 are electrically connected to wires provided in the FPC 2512 with the use of a resin in which conductors are dispersed (anisotropic conductive resin: ACF).

The pixel portion 2502 and a driver circuit for inputting signals to the pixel portion 2502 may be integrally formed over the substrate 2501. Alternatively, the driver circuit for inputting signals to the pixel portion 2502 may be formed into an IC chip so as to be connected onto the substrate 2501 by COG (Chip On Glass), or the IC chip may be disposed over the substrate 2501 by using TAB (Tape Automated Bonding) or a printed board.

This embodiment can be implemented in free combination with any of Embodiments 1 to 4.

Embodiment 6

The invention can be applied to a display module where a circuit for inputting signals to a panel is mounted on the panel.

FIG. 26 shows a display module where a panel 2600 is combined with a circuit board 2604. Although FIG. 26 shows an example where a controller 2605, a signal dividing circuit 2606, and the like are formed over the circuit board 2604, circuits formed over the circuit board 2604 are not limited to these. Any circuit which can generate signals for controlling the panel may be formed.

Signals outputted from the circuits formed over the circuit board 2604 are inputted to the panel 2600 through a connecting wire 2607.

The panel 2600 includes a pixel portion 2601, a source driver 2602, and gate drivers 2603. The structure of the panel 2600 may be similar to those described in Embodiments 1, 2, and the like. Although FIG. 26 shows an example where the source driver 2602 and the gate drivers 2603 are formed over the same substrate as the pixel portion 2601, the display module of the invention is not limited to this. Only the gate drivers 2603 may be formed over the same substrate as the pixel portion 2601, while the source driver 2602 is formed over a circuit board. Alternatively, both of the source driver and the gate drivers may be formed over a circuit board.

Display portions of various electronic appliances can be formed by incorporating such a display module.

This embodiment can be implemented in free combination with any of Embodiments 1 to 5.

Embodiment 7

In this embodiment, description is made of electronic appliances according to the invention. The electronic appliances include a camera (a video camera, a digital camera, and the like), a projector, a head-mounted display (goggle-type display), a navigation system, a car stereo, a personal computer, a game machine, a portable information terminal (a mobile computer, a portable phone, an electronic book, and the like), an image reproducing device provided with a recording medium (specifically, a device for reproducing a recording medium such as a digital versatile disc (DVD), and having a display that can display the reproduced image), and the like. Examples of the electronic appliances are shown in FIGS. 27A to 27D.

Figure 27A:
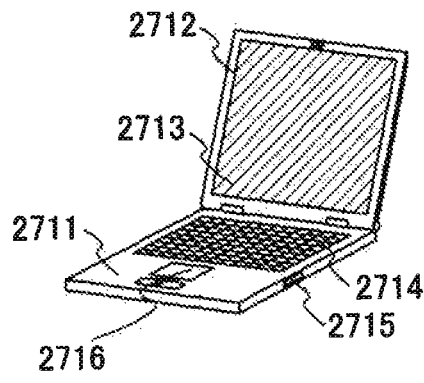
FIGS. 27A to 27D are diagrams showing Embodiment 8.

FIG. 27A shows a personal computer which includes a main body 2711, a housing 2712, a display portion 2713, a keyboard 2714, an external connecting port 2715, a pointing mouse 2716, and the like. The invention is applied to the display portion 2713. With the invention, power consumption of the display portion can be reduced.

Figure 27B:
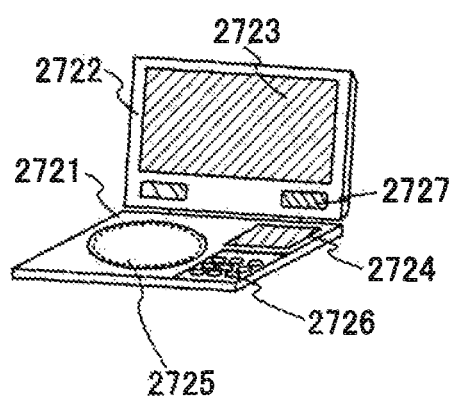

FIG. 27B shows an image reproducing device provided with a recording medium (specifically, a DVD reproducing device), which includes a main body 2721, a housing 2722, a first display portion 2723, a second display portion 2724, a recording medium (DVD or the like) reading portion 2725, an operating key 2726, a speaker portion 2727, and the like. The first display portion 2723 mainly displays image data, while the second display portion 2724 mainly displays text data. The invention is applied to the first display portion 2723 and the second display portion 2724. With the invention, power consumption of the display portion can be reduced.

Figure 27C:
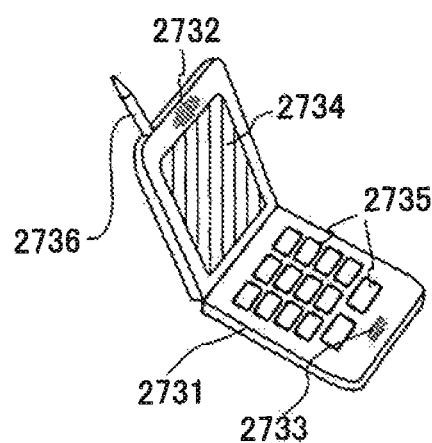

FIG. 27C shows a portable phone which includes a main body 2731, an audio output portion 2732, an audio input portion 2733, a display portion 2734, operating switches 2735, an antenna 2736, and the like. The invention is applied to the display portion 2734. With the invention, power consumption of the display portion can be reduced.

Figure 27D:
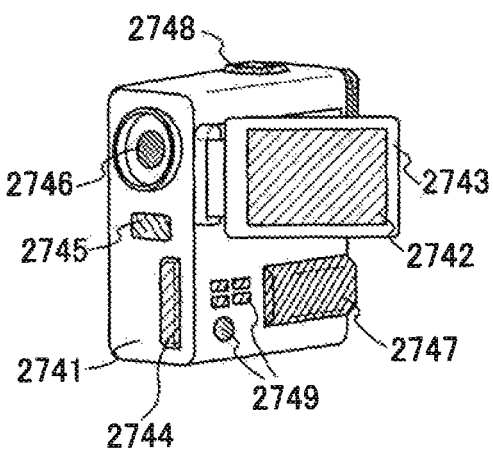

FIG. 27D shows a camera which includes a main body 2741, a display portion 2742, a housing 2743, an external connecting port 2744, a remote control receiving portion 2745, an image receiving portion 2746, a battery 2747, an audio input portion 2748, operating keys 2749, and the like. The invention is applied to the display portion 2742. With the invention, power consumption of the display portion can be reduced.

This embodiment can be implemented in free combination with any of Embodiments 1 to 6.

This application is based on Japanese Patent Application serial no. 2005-303771 filed in Japan Patent Office on 18 Oct. 2005, the entire contents of which are hereby incorporated by reference.

What is claimed is:

1. A semiconductor device comprising:
a first transistor;
a second transistor;
a third transistor;
a fourth transistor;
a fifth transistor;
a sixth transistor; and
a capacitor,
wherein one of a source and a drain of the first transistor, one of a source and a drain of the second transistor, one of a source and a drain of the third transistor, and a first electrode of the capacitor are electrically connected to a first node,
wherein a gate of the first transistor, one of a source and a drain of the fourth transistor, one of a source and a drain of the fifth transistor, one of a source and a drain of the sixth transistor, and a second electrode of the capacitor are electrically connected to a second node,
wherein a gate of the third transistor and a gate of the fourth transistor are electrically connected to a third node,
wherein the other of the source and the drain of the second transistor is electrically connected to a power source line of VSS,
wherein the other of the source and the drain of the third transistor is electrically connected to the power source line of VSS,
wherein the other of the source and the drain of the fourth transistor is electrically connected to the power source line of VSS,
wherein the other of the source and the drain of the sixth transistor are electrically connected to the power source line of VSS,
wherein the other of the source and the drain of the fifth transistor is electrically connected to a power source line of VDD,
wherein the other of the source and the drain of the first transistor is electrically connected to a first clock signal line, and
wherein a gate of the second transistor is electrically connected a second clock signal line.

2. The semiconductor device according to claim 1, wherein the gate of the third transistor and the gate of the fourth transistor are able to be in a floating state.

3. The semiconductor device according to claim 1,
wherein the one of the source and the drain of the first transistor, one of the source and the drain of the second transistor, the one of the source and the drain of the third transistor, and the first electrode of the capacitor are directly connected to the first node,
wherein the gate of the first transistor, the one of the source and the drain of the fourth transistor, the one of the source and the drain of the fifth transistor, the one of the source and the drain of the sixth transistor, and the second electrode of the capacitor are directly connected to the second node, and
wherein the gate of the third transistor and the gate of the fourth transistor are directly connected to the third node.

4. The semiconductor device according to claim 1, wherein each of the first transistor, the second transistor, the third transistor, the fourth transistor, the fifth transistor, and the sixth transistor comprises a channel formation region comprising an amorphous silicon.

5. The semiconductor device according to claim 1,
wherein the gate of the third transistor is electrically connected to one of a source and a drain of a seventh transistor, and
wherein the gate of the fourth transistor is electrically connected to one of a source and a drain of an eighth transistor.

6. A portable information terminal comprising:
a display portion comprising the semiconductor device according to claim 1.

7. A semiconductor device comprising:
a first transistor;
a second transistor;

a third transistor;
a fourth transistor;
a fifth transistor;
a sixth transistor; and
a capacitor,
wherein one of a source and a drain of the first transistor, one of a source and a drain of the second transistor, one of a source and a drain of the third transistor, and a first electrode of the capacitor are electrically connected to a first node,
wherein a gate of the first transistor, one of a source and a drain of the fourth transistor, one of a source and a drain of the fifth transistor, one of a source and a drain of the sixth transistor, and a second electrode of the capacitor are electrically connected to a second node,
wherein a gate of the third transistor and a gate of the fourth transistor are electrically connected to a third node,
wherein the other of the source and the drain of the second transistor is electrically connected to a power source line of VSS,
wherein the other of the source and the drain of the third transistor is electrically connected to the power source line of VSS,
wherein the other of the source and the drain of the fourth transistor is electrically connected to the power source line of VSS,
wherein the other of the source and the drain of the sixth transistor are electrically connected to the power source line of VSS,
wherein the other of the source and the drain of the fifth transistor is electrically connected to a power source line of VDD,
wherein the other of the source and the drain of the first transistor is able to be input a first clock signal,
wherein the gate of the third transistor and the gate of the fourth transistor are able to be controlled by the first clock signal, and
wherein a gate of the second transistor is able to be controlled by a second clock signal.

8. The semiconductor device according to claim 7, wherein the gate of the third transistor and the gate of the fourth transistor are able to be in a floating state.

9. The semiconductor device according to claim 7,
wherein the one of the source and the drain of the first transistor, one of the source and the drain of the second transistor, the one of the source and the drain of the third transistor, and the first electrode of the capacitor are directly connected to the first node,
wherein the gate of the first transistor, the one of the source and the drain of the fourth transistor, the one of the source and the drain of the fifth transistor, the one of the source and the drain of the sixth transistor, and the second electrode of the capacitor are directly connected to the second node, and
wherein the gate of the third transistor and the gate of the fourth transistor are electrically connected to the third node.

10. The semiconductor device according to claim 7, wherein each of the first transistor, the second transistor, the third transistor, the fourth transistor, the fifth transistor, and the sixth transistor comprises a channel formation region comprising an amorphous silicon.

11. The semiconductor device according to claim 7,
wherein the gate of the third transistor is electrically connected to one of a source and a drain of a seventh transistor, and wherein the gate of the fourth transistor is electrically connected to one of a source and a drain of an eighth transistor.

12. A portable information terminal comprising:
a display portion comprising the semiconductor device according to claim 7.

13. A semiconductor device comprising:
a first transistor;
a second transistor;
a third transistor;
a fourth transistor;
a fifth transistor;
a sixth transistor;
a seventh transistor; and
a capacitor,
wherein one of a source and a drain of the first transistor, one of a source and a drain of the second transistor, one of a source and a drain of the third transistor, and a first electrode of the capacitor are electrically connected to a first node,
wherein a gate of the first transistor, one of a source and a drain of the fourth transistor, one of a source and a drain of the fifth transistor, one of a source and a drain of the sixth transistor, and a second electrode of the capacitor are electrically connected to a second node,
wherein a gate of the third transistor and a gate of the fourth transistor are electrically connected to a third node,
wherein the other of the source and the drain of the second transistor is electrically connected to a power source line of VSS,
wherein the other of the source and the drain of the third transistor is electrically connected to the power source line of VSS,
wherein the other of the source and the drain of the fourth transistor is electrically connected to the power source line of VSS,
wherein the other of the source and the drain of the sixth transistor are electrically connected to the power source line of VSS,
wherein the other of the source and the drain of the fifth transistor is electrically connected to a power source line of VDD,
wherein the other of the source and the drain of the first transistor is able to be input a first clock signal,
wherein the gate of the third transistor and the gate of the fourth transistor are able to be controlled by the first clock signal,
wherein a gate of the second transistor is able to be controlled by a second clock signal, and
wherein the seventh transistor is able to make the gate of the third transistor and the gate of the fourth transistor be in a floating state.

14. The semiconductor device according to claim 13,
wherein the one of the source and the drain of the first transistor, one of the source and the drain of the second transistor, the one of the source and the drain of the third transistor, and the first electrode of the capacitor are directly connected to the first node,
wherein the gate of the first transistor, the one of the source and the drain of the fourth transistor, the one of the source and the drain of the fifth transistor, the one of the source and the drain of the sixth transistor, and the second electrode of the capacitor are directly connected to the second node, and wherein the gate of the third transistor and the gate of the fourth transistor are electrically connected to the third node.

15. The semiconductor device according to claim 13, wherein each of the first transistor, the second transistor, the third transistor, the fourth transistor, the fifth transistor, and the sixth transistor comprises a channel formation region comprising an amorphous silicon.

16. The semiconductor device according to claim 13,
wherein the gate of the third transistor is electrically connected to one of a source and a drain of an eighth transistor, and
wherein the gate of the fourth transistor is electrically connected to one of a source and a drain of a ninth transistor.

17. The semiconductor device according to claim 13, wherein the other of the source and the drain of the seventh transistor is electrically connected to the power source line of VSS.

18. A portable information terminal comprising:
a display portion comprising the semiconductor device according to claim 13.

19. A semiconductor device comprising:
a stage comprising:
a first transistor;
a second transistor;
a third transistor;
a fourth transistor;
a fifth transistor;
a sixth transistor;
a seventh transistor; and
a capacitor,
wherein one of a source and a drain of the first transistor, one of a source and a drain of the second transistor, one of a source and a drain of the third transistor, a first electrode of the capacitor, and an output terminal of the stage are electrically connected to one another,
wherein a gate of the first transistor, one of a source and a drain of the fourth transistor, one of a source and a drain of the fifth transistor, one of a source and a drain of the sixth transistor, one of a source and a drain of the seventh transistor, and a second electrode of the capacitor are electrically connected to one another,
wherein a gate of the fourth transistor, the other of the source and the drain of the fourth transistor, and an output terminal of a preceding stage are electrically connected to one another,
wherein a power source line is electrically connected to the other of the source and the drain of the second transistor, the other of the source and the drain of the third transistor, the other of the source and the drain of the fifth transistor, the other of the source and the drain of the sixth transistor, and the other of the source and the drain of the seventh transistor,
wherein a first clock signal line is electrically connected to the other of the source and the drain of the first transistor,
wherein a second clock signal line is electrically connected to a gate of the second transistor and a gate of the fifth transistor,
wherein a third clock signal line is electrically connected to a gate of the third transistor and a gate of the sixth transistor,
wherein the first clock signal line has a wider width than the power source line, and
wherein the power source line is located between the first to third clock signal lines and the output terminal of the stage, and each of the first to third clock signal lines is not located between the power source line and the output terminal of the stage.

20. A semiconductor device comprising:
a stage comprising:
a first transistor;
a second transistor;
a third transistor;
a fourth transistor;
a fifth transistor;
a sixth transistor;
a seventh transistor; and
a capacitor,
wherein one of a source and a drain of the first transistor, one of a source and a drain of the second transistor, one of a source and a drain of the third transistor, a first electrode of the capacitor, and an output terminal of the stage are electrically connected to one another,
wherein a gate of the first transistor, one of a source and a drain of the fourth transistor, one of a source and a drain of the fifth transistor, one of a source and a drain of the sixth transistor, one of a source and a drain of the seventh transistor, and a second electrode of the capacitor are electrically connected to one another,
wherein a gate of the fourth transistor, the other of the source and the drain of the fourth transistor, and an output terminal of a preceding stage are electrically connected to one another,
wherein a power source line is electrically connected to the other of the source and the drain of the second transistor, the other of the source and the drain of the third transistor, the other of the source and the drain of the fifth transistor, the other of the source and the drain of the sixth transistor, and the other of the source and the drain of the seventh transistor,
wherein a first clock signal line is electrically connected to the other of the source and the drain of the first transistor,
wherein a second clock signal line is electrically connected to a gate of the second transistor and a gate of the fifth transistor,
wherein a third clock signal line is electrically connected to a gate of the third transistor and a gate of the sixth transistor,
wherein the first clock signal line has a wider width than the power source line,
wherein the power source line is located between the first to third clock signal lines and the output terminal of the stage, and each of the first to third clock signal lines is not located between the power source line and the output terminal of the stage, and
wherein each of the first transistor, the second transistor, the third transistor, the fourth transistor, the fifth transistor, the sixth transistor, and the seventh transistor comprises amorphous silicon.

* * * * *